US012718873B2

(12) United States Patent
Sugahara et al.

(10) Patent No.: US 12,718,873 B2
(45) Date of Patent: Aug. 25, 2026

(54) MEMORY CIRCUIT WITH MEMORY CELLS HAVING BISTABLE CIRCUIT AND NON-VOLATILE ELEMENT

(71) Applicant: JAPAN SCIENCE AND TECHNOLOGY AGENCY, Kawaguchi (JP)

(72) Inventors: Satoshi Sugahara, Tokyo (JP); Daiki Kitagata, Tokyo (JP); Shuichiro Yamamoto, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 120 days.

(21) Appl. No.: 18/926,916

(22) Filed: Oct. 25, 2024

(65) Prior Publication Data

US 2025/0046365 A1 Feb. 6, 2025

Related U.S. Application Data

(60) Division of application No. 17/536,493, filed on Nov. 29, 2021, now Pat. No. 12,165,697, which is a (Continued)

(30) Foreign Application Priority Data

May 30, 2019 (JP) ................................ 2019-101720
Oct. 9, 2019 (JP) ................................ 2019-186042

(51) Int. Cl.
*G11C 11/412* (2006.01)
*G11C 11/418* (2006.01)

(Continued)

(52) U.S. Cl.
CPC .......... *G11C 11/412* (2013.01); *G11C 11/418* (2013.01); *G11C 11/419* (2013.01);

(Continued)

(58) Field of Classification Search
CPC ... G11C 11/412; G11C 11/418; G11C 11/419; G11C 11/56; G11C 14/0054; G11C 14/0081; G11C 11/4125; H03K 3/356
See application file for complete search history.

(56) References Cited

U.S. PATENT DOCUMENTS 11,145,348 B1 * 10/2021 Jaiswal ............... G11C 11/1657
2003/0076705 A1 4/2003 Yamaoka et al.

(Continued)

FOREIGN PATENT DOCUMENTS

JP 2003-132683 A 5/2003
TW 201638953 A 11/2016

(Continued)

OTHER PUBLICATIONS

International Search Report dated Jun. 9, 2020, issued in counterpart International Application No. PCT/JP2020/012099 (4 pages).

(Continued)

*Primary Examiner* — Donald HB Braswell
(74) *Attorney, Agent, or Firm* — WHDA, LLP

(57) ABSTRACT

An electronic circuit includes a cell array including memory cells each including a bistable circuit that includes first and second inverter circuits, each having a first mode characterized by there being substantially no hysteresis in transfer characteristics and a second mode characterized by there being hysteresis in the transfer characteristics, and being switchable between the first and second modes, and a control circuit configured to, after powering off a first memory cell that store data that are not required to be retained, put the bistable circuit in a remaining second memory cell into the second mode, and supply a second power supply voltage that allows the bistable circuit in the second mode to retain data and is lower than a first power supply voltage supplied to the bistable circuit when data is read and/or written, to the (Continued)

bistable circuit in the second memory cell while maintaining the second mode.

5 Claims, 69 Drawing Sheets

Related U.S. Application Data continuation of application No. PCT/JP2020/012099, filed on Mar. 18, 2020.

(51) Int. Cl.

| | |
|---|---|
| ***G11C 11/419*** | (2006.01) |
| ***G11C 11/56*** | (2006.01) |
| ***G11C 14/00*** | (2006.01) |
| ***G11C 29/00*** | (2006.01) |
| ***G11C 29/04*** | (2006.01) |
| ***H03K 3/356*** | (2006.01) |

(52) U.S. Cl.

CPC .......... *G11C 11/56* (2013.01); *G11C 14/0054* (2013.01); *G11C 29/04* (2013.01); *G11C 29/70* (2013.01); *G11C 29/838* (2013.01); *G11C 29/883* (2013.01); *H03K 3/356* (2013.01); *G11C 14/0081* (2013.01)

(56) References Cited

U.S. PATENT DOCUMENTS

| | | | | |
|---|---|---|---|---|
| 2006/0192596 | A1* | 8/2006 | Ramaraju | H03K 3/0375 327/55 |
| 2011/0273925 | A1 | 11/2011 | Yamamoto et al. | |
| 2015/0070974 | A1 | 3/2015 | Shuto et al. | |
| 2015/0070975 | A1 | 3/2015 | Yamamoto et al. | |
| 2016/0225442 | A1 | 8/2016 | Asnaashari et al. | |
| 2017/0117890 | A1* | 4/2017 | Kanda | G11C 5/14 |
| 2017/0229179 | A1 | 8/2017 | Sugahara et al. | |
| 2018/0069534 | A1* | 3/2018 | Sugahara | H03K 3/02337 |
| 2021/0166759 | A1* | 6/2021 | Shuto | G11C 14/0072 |

FOREIGN PATENT DOCUMENTS

| | | | |
|---|---|---|---|
| WO | 2009/028298 | A1 | 3/2009 |
| WO | 2013/172065 | A1 | 11/2013 |
| WO | 2013/172066 | A1 | 11/2013 |
| WO | 2016/024527 | A1 | 2/2016 |
| WO | 2016/158691 | A1 | 10/2016 |

OTHER PUBLICATIONS

"Computer Memory", Wikipedia, accessed Dec. 16, 2023, archived Nov. 24, 2018, <https://en.wikipedia.org/w/Index.php?title=Computer_memory&oldid=870370986> (Year:2018).

Office Action dated Apr. 7, 2025, issued in counterpart TW Application No. 113130022. (3 pages).

* cited by examiner

| STATE | VPG1 | VPG2 | VVDD - VGND |
|---|---|---|---|
| READ/WRITE | L | L | V2 |
| SLEEP | H | H | V1 |
| SHUTDOWN | H | L | V0 |

24a
24a
24a
STANDBY
23
STANDBY
STANDBY
STANDBY
STORE
23a
STANDBY
23
STANDBY
STANDBY
STORE
23b
STANDBY
STORE
23c
23
STANDBY
STANDBY
STANDBY
STANDBY

| CELL ARRAY SIZE | 32 kB | 256 kB | 2 MB |
|---|---|---|---|
| X [bit] | 2 | 5 | 8 |
| Y [bit] | 3 | 3 | 3 |
| Nblock | 8 | 8 | 8 |
| NSA | 4 | 32 | 256 |

28
44
BLOCK 24A
BLOCK 24B
BLOCK 24C
BLOCK 24A
BLOCK 24B
BLOCK 24C
PS1A
PS1B
PS1C
PS2A
PS2B
PS2C
VPG1A
VPG1B
VPG1C
VPG2A
VPG2B
VPG2C
58
59
56
57
50
51
54
55
52
53
ENSLP
ENNLB
STORE CONTROL SIGNAL
a
b
40
40A
40B
40C
UDF
41
41A
41B
41C
SFBF
UDF
CONTROL CIRCUIT
43
42
DECODER
ADDRESS

FIG. 13A

READ/WRITE

| a | b | ENNLB | ENSLP |
|---|---|---|---|
| L | L | L | L |

| BLOCK | UDF | SFBF | VPG1 | PS1 | VPG2 | PS2 | VVDD - VGND |
|---|---|---|---|---|---|---|---|
| A | L | L | L | ON | L | OFF | V2 |
| B | L | H | L | ON | L | OFF | V2 |
| C | H | L | L | ON | L | OFF | V2 |

FIG. 13B

SLEEP

| a | b | ENNLB | ENSLP |
|---|---|---|---|
| L | L | L | H |

| BLOCK | UDF | SFBF | VPG1 | PS1 | VPG2 | PS2 | VVDD - VGND |
|---|---|---|---|---|---|---|---|
| A | L | L | H | OFF | H | ON | V1 |
| B | L | H | H | OFF | H | ON | V1 |
| C | H | L | H | OFF | H | ON | V1 |

FIG. 13C

START STORING READ/WRITE→S42

| a | b | ENNLB | ENSLP |
|---|---|---|---|
| L→H | L | L→H | L |

| BLOCK | UDF | SFBF | VPG1 | PS1 | VPG2 | PS2 | VVDD - VGND |
|---|---|---|---|---|---|---|---|
| A | L | L | L→H | ON→OFF | L→H | OFF→ON | V2→V1 |
| B | L | H | L→H | ON→OFF | L | OFF | V2→V0 |
| C | H | L | L→H | ON→OFF | L | OFF | V2→V0 |

FIG. 13D

EXECUTION OF STORING S42(T1)→S46(T2)→S48(T3)

| a | b | ENNLB | ENSLP |
|---|---|---|---|
| H→L→H | L→H→H | H | L |

| BLOCK | UDF | SFBF | VPG1 | PS1 | VPG2 | PS2 | VVDD - VGND |
|---|---|---|---|---|---|---|---|
| A | L | L | H→L→H | OFF→ON→OFF | H→L→L | ON→OFF→OFF | V1→V2→V0 |
| B | L | H | H | OFF | L | OFF | V0 |
| C | H | L | H | OFF | L | OFF | V0 |

FIG. 13E

SHUTDOWN

| a | b | ENNLB | ENSLP |
|---|---|---|---|
| H | H | H | L |

| BLOCK | UDF | SFBF | VPG1 | PS1 | VPG2 | PS2 | VVDD - VGND |
|---|---|---|---|---|---|---|---|
| A | L | L | H | OFF | L | OFF | V0 |
| B | L | H | H | OFF | L | OFF | V0 |
| C | H | L | H | OFF | L | OFF | V0 |

| STATE | VPG1 | VPG2 | VPG3 | VVDD - VGND |
|---|---|---|---|---|
| STANDBY | L | L | H | V3 |
| SLEEP | H | H | H | V2 |
| RETENTION | H | L | L | V1 |
| SHUTDOWN | H | L | H | V0 |

SHUT-DOWN
SHUT-DOWN
STANDBY (ST)
22
22a
STANDBY (ST)
STANDBY (ST)
STANDBY (ST)
SHUT-DOWN
STANDBY (ST)
SHUT-DOWN
STANDBY (BI)
RETENTION
STANDBY (ST)
SHUTDOWN

SHUT-DOWN
SHUT-DOWN
RETEN-TION
22
22a
RETEN-TION
RETEN-TION
RETEN-TION
SHUT-DOWN
RETEN-TION
SHUT-DOWN
STANDBY (BI)
RETENTION
STANDBY (ST)
SHUTDOWN 24
22
STANDBY (BI)
RETENTION
STANDBY (ST)
SHUTDOWN 24
22
STANDBY (BI)
RETENTION
STANDBY (ST)
SHUTDOWN 24
22
24a
STANDBY (BI)
RETENTION
STANDBY (ST)
SHUTDOWN

SLEEP (BI) | SLEEP (BI) | SLEEP (BI) 22
SLEEP (BI) | SLEEP (BI) | SLEEP (BI)
SLEEP (BI) | SLEEP (BI) | SLEEP (BI)

SLEEP (BI) RETENTION
SLEEP (ST) SHUTDOWN

SHUT-DOWN | SHUT-DOWN | SLEEP (BI) 22
SLEEP (BI) | SLEEP (BI) | SLEEP (BI)
SHUT-DOWN | SLEEP (BI) | SHUT-DOWN

SLEEP (BI) RETENTION
SLEEP (ST) SHUTDOWN

SHUT-DOWN | SHUT-DOWN | SLEEP (BI) 22
SLEEP (ST) 22a | SLEEP (BI) | SLEEP (BI)
SHUT-DOWN | SLEEP (BI) | SHUT-DOWN

SLEEP (BI) RETENTION
SLEEP (ST) SHUTDOWN

SHUT-DOWN
SHUT-DOWN
SLEEP (ST)
22
SLEEP (ST)
SLEEP (ST)
SLEEP (ST)
22a
SHUT-DOWN
SLEEP (ST)
SHUT-DOWN
SLEEP (BI)
RETENTION
SLEEP (ST)
SHUTDOWN

SHUT-DOWN
SHUT-DOWN
RETEN-TION
22
RETEN-TION
RETEN-TION
RETEN-TION
22a
SHUT-DOWN
RETEN-TION
SHUT-DOWN
SLEEP (BI)
RETENTION
SLEEP (ST)
SHUTDOWN

FIG. 35A

STANDBY(BI)

| ENRB | ENNLB | ENSLP | VCTRL |
|---|---|---|---|
| H | L | L | H |

| BLOCK | UDF | VPG1 | PS1 | VPG2 | PS2 | VPG3 | PS3 | VVDD - VGND |
|---|---|---|---|---|---|---|---|---|
| A | L | L | ON | L | OFF | H | OFF | V3 |
| B | H | L | ON | L | OFF | H | OFF | V3 |

FIG. 35B

SLEEP(BI) S70

| ENRB | ENNLB | ENSLP | VCTRL |
|---|---|---|---|
| H | L | H | H |

| BLOCK | UDF | VPG1 | PS1 | VPG2 | PS2 | VPG3 | PS3 | VVDD - VGND |
|---|---|---|---|---|---|---|---|---|
| A | L | H | OFF | H | ON | H | OFF | V2 |
| B | H | H | OFF | H | ON | H | OFF | V2 |

FIG. 35C

UDF SHUTDOWN S70→S58

| ENRB | ENNLB | ENSLP | VCTRL |
|---|---|---|---|
| H | L→H | L | H |

| BLOCK | UDF | VPG1 | PS1 | VPG2 | PS2 | VPG3 | PS3 | VVDD - VGND |
|---|---|---|---|---|---|---|---|---|
| A | L | L→H | ON→OFF | L→H | OFF→ON | H | OFF | V3→V2 |
| B | H | L→H | ON→OFF | L | OFF | H | OFF | V3→V0 |

FIG. 35D

MODE SWITCHING S58(T1)→S72(T2)

| ENRB | ENNLB | ENSLP | VCTRL |
|---|---|---|---|
| H | H | L | H→L |

| BLOCK | UDF | VPG1 | PS1 | VPG2 | PS2 | VPG3 | PS3 | VVDD - VGND |
|---|---|---|---|---|---|---|---|---|
| A | L | H | OFF | H | ON | H | OFF | V2 |
| B | H | H | OFF | L | OFF | H | OFF | V0 |

FIG. 35E

RETENTION S72(T2)→S68(T3)

| ENRB | ENNLB | ENSLP | VCTRL |
|---|---|---|---|
| H→L | H | L | L |

| BLOCK | UDF | VPG1 | PS1 | VPG2 | PS2 | VPG3 | PS3 | VVDD - VGND |
|---|---|---|---|---|---|---|---|---|
| A | L | H | OFF | H→L | ON→OFF | H→L | OFF→ON | V2→V1 |
| B | H | H | OFF | L | OFF | H | OFF | V0 |

BLOCK 24A
BLOCK 24B
BLOCK 24A
BLOCK 24B
BLOCK 24A
BLOCK 24B
28C
PS1A
PS1B
PS2A
PS2B
PS3A
PS3B
44
VPG1A
VPG1B
VPG2A
VPG2B
VPG3A
VPG3B
73
62
67
72
61
66
71
ENSLP
ENNLB
65
75
60
74
ENRB
VCTRL
MODE CONTROL CIRCUIT
UDF
40
40A
40B
45
UDF

HEADER PS
VDD
15c
PS
30
15a
VVDD
10
15b
VVGND
15d
VGND

FOOTER PS
VDD
15c
15a
VVDD
10
15b
VVGND
PS
30
15d
VGND

DUAL PS
VDD
15c
PS
30
15a
VVDD
10
15b
VVGND
PS
30
15d
VGND

HEADER PS
15c
VDD1
VDD2
15c
30a
30b
30
15a
VVDD
10
15b
VVGND
15d
VGND

FOOTER PS
VDD
15c
15a
VVDD
10
15b
VVGND
30c
30d
30
15d
VGND1
VGND2
15d

DUAL PS
15c
VDD1
VDD2
15c
30a
30b
30
15a
VVDD
10
15b
VVGND
30c
30d
30
15d
VGND1
VGND2
15d

MEMORY CIRCUIT WITH MEMORY CELLS HAVING BISTABLE CIRCUIT AND NON-VOLATILE ELEMENT

CROSS-REFERENCE TO RELATED APPLICATION

This application is a Division of U.S. patent application Ser. No. 17/536,493, filed Nov. 29, 2021, which is a Continuation of International Patent Application No. PCT/JP2020/012099, filed on Mar. 18, 2020, which claims the benefits of priorities of Japanese Patent Application No. 2019-101720 filed on May 30, 2019 and Japanese Patent Application No. 2019-186042 filed on Oct. 9, 2019, the entire contents of which are incorporated herein by reference.

FIELD

The present invention relates to an electronic circuit and a bistable circuit, for example, to a bistable circuit and an electronic circuit including a plurality of memory cells each having the bistable circuit.

BACKGROUND

It is known that virtually nonvolatile retention SRAMs (VNR-SRAMs) can be structured using an inverter composed of only a complementary metal oxide semiconductor (CMOS) without using a non-volatile element as disclosed in, for example, International Publication No. 2016/158691 (Patent Document 1). Used in the VNR-SRAM is a dual-mode inverter capable of switching between a Schmitt trigger (ST) mode, which allows for ultra-low voltage (ULV) retention, and a boosted inverter (BI) mode, which can achieve circuit performance equivalent to that of the SRAM at a normal voltage. This ULV retention can be used for power gating (PG).

There has been known a memory circuit using a memory cell (an NV-SRAM) having a bistable circuit and a non-volatile element as disclosed in, for example, International Publication No. 2009/028298 (Patent Document 2). In the NV-SRAM, data in the bistable circuit is stored in the non-volatile element, and the data in the non-volatile element is restored to the bistable circuit.

In the NV-SRAMs, there has been known a memory circuit that performs the following operations: a static random access memory (SRAM) operation that writes and reads data to and from the bistable circuit like a typical SRAM, a sleep operation that decreases a power supply voltage and retains data, a store operation that stores data in the bistable circuit in the non-volatile element, a shutdown operation that powers off the memory cell, and a restore operation that writes data stored in the non-volatile storage element back to the bistable circuit as disclosed in, for example, International Publication No. 2013/172066 (Patent Document 3). Use of the store operation, the shutdown operation, and the restore operation allows for power gating (PG) by power shutdown without losing the memory content of the cell.

There has been known a memory circuit that executes a control to skip storing (a store-free operation) when data stored in the bistable circuit matches data stored in the non-volatile element as disclosed in, for example, International Publication No. 2013/172065 (Patent Document 4). It has been known to divide a cell array into a plurality of blocks and to power off the block for which the store operation has been completed as disclosed in, for example, International Publication No. 2016/024527 (Patent Document 5).

SUMMARY

In the VNR-SRAM in Patent Document 1, the standby power can be reduced without losing the memory content of the cell by performing the ULV retention. Thus, the power consumption can be reduced. However, in the VNR-SRAM, the rate of reduction in the energy consumption due to the leakage current during PG is limited because the ULV retention is also performed on data that are data unnecessary after PG. Additionally, switching between the ST mode and the BI mode is performed for all cells during PG. This generates the time for mode switching (latency) and the energy overhead. The leakage current and the energy consumption for mode switching lead to increase in the break-even time (BET).

In addition, the NV-SRAMs in Patent Documents 4 and 5 can avoid storing of data that are not required to be stored, by performing the store-free operation. However, as the memory capacity of the cell array increases, the effect of the store-free is reduced by the power consumption due to the leakage current generated in the block waiting for the store operation. Additionally, in the store-free operation, the store operation is performed on data that has been rewritten during the normal operation, even if the data are not required to be stored after PG. This results in unnecessary energy overhead and the overhead of the latency required for storing.

The present invention has been made in view of above problems, and the objective thereof is to reduce the power consumption and the energy consumption.

According to an aspect of the embodiments, there is provided an electronic circuit including: a cell array including memory cells each including a bistable circuit that includes a first inverter circuit and a second inverter circuit, each of the first inverter circuit and the second inverter circuit having a first mode characterized by there being substantially no hysteresis in transfer characteristics of a corresponding one of the first inverter circuit and the second inverter circuit and a second mode characterized by there being hysteresis in the transfer characteristics, wherein each of the first inverter circuit and the second inverter circuit are configured to be switchable between the first mode and the second mode, an output node and an input node of the first inverter circuit being coupled to an input node and an output node of the second inverter circuit, respectively; and a control circuit configured to, after powering off one or more first memory cells that store data that are not required to be retained among the memory cells, put the bistable circuits in remaining one or more second memory cells of the memory cells into the second mode, and supply a second power supply voltage, at which the bistable circuit in the second mode can retain data, to the bistable circuits in the one or more second memory cells while maintaining the second mode, the second power supply voltage being lower than a first power supply voltage that is supplied to the bistable circuit when data is read and/or written.

In the above configuration, the cell array may be divided into blocks each including at least two memory cells, and the control circuit may be configured to, after extracting one or more first blocks that store data that are not required to be retained from among the blocks and powering off the one or more first blocks, put the bistable circuits in remaining one or more second blocks of the blocks into the second mode, and supply the second power supply voltage to the bistable circuits in the one or more second blocks while maintaining the second mode.

In the above configuration, the control circuit may be configured to, before putting the bistable circuits in the one or more second blocks into the second mode, supply a third power supply voltage, at which the bistable circuit in the first mode can retain data, to the one or more second blocks, the third power supply voltage being lower than the first power supply voltage and higher than the second power supply voltage.

In the above configuration, the control circuit may be configured to put the bistable circuits in the one or more second blocks into the second mode while supplying the third power supply voltage to the bistable circuits in the one or more second blocks.

In the above configuration, the one or more second blocks may be provided in plural, and the control circuit may be configured to: put the bistable circuits in one or more third blocks of the second blocks into the second mode while supplying the third power supply voltage to the bistable circuits in the one or more third blocks, supply the second power supply voltage while maintaining the bistable circuits in the one or more third blocks in the second mode, then put the bistable circuits in one or more fourth blocks of the second blocks into the second mode while supplying the third power supply voltage to the bistable circuits in the one or more fourth blocks, and supply the second power supply voltage while maintaining the bistable circuits in the one or more fourth blocks in the second mode, the one or more fourth blocks being different from the one or more third blocks.

In the above configuration, the one or more second blocks may be provided in plural, and the control circuit may be configured to, after putting the bistable circuits in the second blocks into the second mode while supplying the third power supply voltage to the bistable circuits in the second blocks, supply the second power supply voltage while maintaining the bistable circuits in the second blocks in the second mode.

In the above configuration, the electronic circuit may further include a memory circuit that is provided outside of the cell array and stores information indicating a block that stores the data that are not required to be retained, the information being received from an external circuit, and the control circuit may be configured to extract the one or more first blocks that store the data that are not required to be retained based on the information.

In the above configuration, each of the first inverter circuit and the second inverter circuit may include: a first FET of which a source is coupled to a first power supply line, a drain is coupled to an output node, and a gate is coupled to an input node, the first FET having a channel of a first conductivity type, a second FET of which a source is coupled to a second power supply line, a drain is coupled to an intermediate node, and a gate is coupled to the input node, a power supply voltage being supplied between the second power supply line and the first power supply line, the second FET having a channel of a second conductivity type, the second conductivity type being opposite to the first conductivity type, a third FET of which a source is coupled to the intermediate node, a drain is coupled to the output node, and a gate is coupled to the input node, the third FET having a channel of the second conductivity type, and a fourth FET, one of a source and a drain of the fourth FET being coupled to the intermediate node, another one of the source and the drain being coupled to a control node, and a gate of the fourth FET of the first inverter circuit may be coupled to one of the following nodes: the input node of the first inverter circuit, the output node of the first inverter circuit, the input node of the second inverter circuit, and the output node of the second inverter circuit, and a gate of the fourth FET of the second inverter circuit may be coupled to one of the following nodes: the input node of the second inverter circuit, the output node of the second inverter circuit, the input node of the first inverter circuit, and the output node of the first inverter circuit, and the fourth FET of the first inverter circuit may be an FET having a channel of the second conductivity type in the case that the gate of the fourth FET of the first inverter circuit is coupled to the output node of the first inverter circuit or the input node of the second inverter circuit, and may be an FET having a channel of the first conductivity type in the case that the gate of the fourth FET of the first inverter circuit is coupled to the input node of the first inverter circuit or the output node of the second inverter circuit, and the fourth FET of the second inverter circuit may be an FET having a channel of the second conductivity type in the case that the gate of the fourth FET of the second inverter circuit is coupled to the output node of the second inverter circuit or the input node of the first inverter circuit, and may be an FET having a channel of the first conductivity type in the case that the gate of the fourth FET of the second inverter circuit is coupled to the input node of the second inverter circuit or the output node of the first inverter circuit.

In the above configuration, a fixed bias may be applied to a control node of the first inverter circuit and a control node of the second inverter circuit, and the first inverter circuit and the second inverter circuit may enter the first mode when the first power supply voltage is supplied, and enter the second mode when the second power supply voltage is supplied.

According to another aspect of the embodiments, there is provided a bistable circuit including: a first inverter circuit and a second inverter circuit, each including: a first FET of which a source is coupled to a first power supply line, a drain is coupled to an output node, and a gate is coupled to an input node, the first FET having a channel of a first conductivity type, a second FET of which a source is coupled to a second power supply line, a drain is coupled to an intermediate node, and a gate is coupled to the input node, a power supply voltage being supplied between the second power supply line and the first power supply line, the second FET having a channel of a second conductivity type, the second conductivity type being opposite to the first conductivity type, a third FET of which a source is coupled to the intermediate node, a drain is coupled to the output node, and a gate is coupled to the input node, the third FET having a channel of the second conductivity type, and a fourth FET, one of a source and a drain of the fourth FET being coupled to the intermediate node, another one of the source and the drain being coupled to a control node, the fourth FET having a channel of the first conductivity type; a first memory node to which the output node of the first inverter circuit and the input node of the second inverter circuit are coupled; and a second memory node to which the input node of the first inverter circuit and the output node of the second inverter circuit are coupled, wherein a gate of the fourth FET of the first inverter circuit is coupled to the input node of the first inverter circuit or the output node of the second inverter circuit, wherein a gate of the fourth FET of the second inverter circuit is coupled to the input node of the second inverter circuit or the output node of the first inverter circuit.

According to another aspect of the embodiments, there is provided an electronic circuit including: the above bistable circuit; and a power supply circuit that switches the power supply voltage between a first voltage, at which the bistable circuit can write and read data, and a second voltage, at which the bistable circuit can retain data, and supplies the power supply voltage, the second voltage being lower than the first voltage.

In the above configuration, a fixed bias may be supplied to the control node even when the power supply circuit supplies either the first voltage or the second voltage to the bistable circuit.

In the above configuration, the fixed bias may be a bias between a voltage of the first power supply line and a voltage of the second power supply line when the first voltage is supplied.

In the above configuration, the fixed bias may be closer to a voltage of the second power supply line than a voltage intermediate between the voltage of the first power supply line and the voltage of the second power supply line when the first voltage is supplied.

In the above configuration, the electronic circuit may include a control circuit configured to: in the case that the fourth FET is a P channel FET, supply a low level to the control node when the power supply circuit supplies the first voltage, and supply a high level higher than the low level to the control node when the power supply circuit supplies the second voltage, and in the case that the fourth FET is an N channel FET, supply a high level to the control node when the power supply circuit supplies the first voltage, and supply a low level lower than the high level to the control node when the power supply circuit supplies the second voltage.

According to another aspect of the embodiments, there is provided an electronic circuit including: a bistable circuit including: a first inverter circuit and a second inverter circuit, each including: a first FET of which a source is coupled to a first power supply line, a drain is coupled to an output node, and a gate is coupled to an input node, the first FET having a channel of a first conductivity type, a second FET of which a source is coupled to a second power supply line, a drain is coupled to an intermediate node, and a gate is coupled to the input node, a power supply voltage being supplied between the second power supply line and the first power supply line, the second FET having a channel of a second conductivity type, the second conductivity type being opposite to the first conductivity type, a third FET of which a source is coupled to the intermediate node, a drain is coupled to the output node, and a gate is coupled to the input node, the third FET having a channel of the second conductivity type, and a fourth FET, one of a source and a drain of the fourth FET being coupled to the intermediate node, another one of the source and the drain being coupled to a control node, a first memory node to which the output node of the first inverter circuit and the input node of the second inverter circuit are coupled, and a second memory node to which the input node of the first inverter circuit and the output node of the second inverter circuit are coupled, wherein the gate of the fourth FET of the first inverter circuit is coupled to one of the following nodes: the input node of the first inverter circuit, the output node of the first inverter circuit, the input node of the second inverter circuit, and the output node of the second inverter circuit, wherein the gate of the fourth FET of the second inverter circuit is coupled to one of the following nodes: the input node of the second inverter circuit, the output node of the second inverter circuit, the input node of the first inverter circuit, and the output node of the first inverter circuit; and a power supply circuit that switches the power supply voltage between a first voltage, at which the bistable circuit can write and read data, and a second voltage, at which the bistable circuit can retain data, and supplies the power supply voltage, the second voltage being lower than the first voltage, wherein a fixed bias is supplied to the control node even when the power supply circuit supplies either the first voltage or the second voltage to the bistable circuit.

In the above configuration, the power supply circuit may supply a constant third voltage to the second power supply line and switch a voltage supplied to the first power supply line between a fourth voltage and a fifth voltage when switching the power supply voltage between the first voltage and the second voltage.

In the above configuration, the fixed bias may be a bias between the third voltage and the fourth voltage.

In the above configuration, the fourth FET of the first inverter circuit may be an FET having a channel of the second conductivity type in the case that the gate of the fourth FET of the first inverter circuit is coupled to the output node of the first inverter circuit or the input node of the second inverter circuit, and may be an FET having a channel of the first conductivity type in the case that the gate of the fourth FET of the first inverter circuit is coupled to the input node of the first inverter circuit or the output node of the second inverter circuit, and the fourth FET of the second inverter circuit may be an FET having a channel of the second conductivity type in the case that the gate of the fourth FET of the second inverter circuit is coupled to the output node of the second inverter circuit or the input node of the first inverter circuit, and may be an FET having a channel of the first conductivity type in the case that the gate of the fourth FET of the second inverter circuit is coupled to the input node of the second inverter circuit or the output node of the first inverter circuit.

According to another aspect of the embodiments, there is provided an electronic circuit including: a cell array including memory cells, each of the memory cells including a bistable circuit that stores data in a volatile manner, and a non-volatile element that stores the data stored in the bistable circuit in a non-volatile manner and restores the data stored in a non-volatile manner to the bistable circuit; and a control circuit configured to power off one or more first memory cells, which store, in a volatile manner, data that are not required to be stored in a non-volatile manner, among the memory cells regardless of whether the one or more first memory cells are rewritten in a volatile manner when powering off the cell array, and after powering off the one or more first memory cells, perform a store operation that stores, in the non-volatile element, the data stored in the bistable circuit in a volatile manner in remaining one or more second memory cells of the memory cells, and then power off the one or more second memory cells.

In the above configuration, the cell array may be divided into blocks each including at least two memory cells, and the control circuit may be configured to, when powering off the cell array, extract one or more first blocks, which store, in a volatile manner, data that are not required to be stored in a non-volatile manner, from among the blocks regardless of whether memory cells in a block are rewritten in a volatile manner, power off the one or more first blocks, perform the store operation in the memory cells in remaining one or more second blocks of the blocks after powering off the one or more first blocks, and power off the second block for which the store operation is completed.

In the above configuration, the control circuit may be configured to perform the store operation in the memory cells in the one or more second blocks after powering off all the one or more first blocks.

In the above configuration, the electronic circuit may include a memory circuit that is provided outside the cell array and stores information indicating the one or more first blocks, the information being received from an external circuit, and the control circuit may be configured to extract the one or more first blocks based on the information.

In the above configuration, the control circuit may be configured to extract, from among the blocks, a block that stores, in a volatile manner, data that are not required to be stored in a non-volatile manner regardless of whether the memory cells in the block are rewritten in a volatile manner and a block in which no memory cell is rewritten in a volatile manner, as the one or more first blocks, power off the one or more first blocks, perform the store operation in the memory cells in remaining one or more second blocks of the blocks after powering off the one or more first blocks, and power off the second block for which the store operation is completed.

BRIEF DESCRIPTION OF THE DRAWINGS

FIG. 13A to FIG. 13E present the level of each signal and the operations of power switches in the first embodiment;

FIG. 35A to FIG. 35E present the level of each signal and the operations of the power switches in the type B of the retention operation;

DESCRIPTION OF EMBODIMENTS

Hereinafter, with reference to the drawings, embodiments will be described.

First Embodiment

In Patent Document 3, the store operation is performed only on the memory cells that have been rewritten during the typical SRAM operation (i.e., a read/write operation). In this method, as the size of the cell array increases, the power consumption due to the leakage current in the memory cells waiting for the store operation increases. Since the data in the bistable circuit and the data in the non-volatile element are the same in the memory cell that has not been rewritten, the memory cell is shut down without performing the store operation. Then, it is conceivable to perform the store operation on the memory cells that have been rewritten in which the data in the bistable circuit and the data in the non-volatile element are different. However, the store operation is performed even when the data in the memory cell that has been rewritten is data that will not be used after the restoring. Examples of the data that will not be used include, but are not limited to, data that has not been used for a long period of time, data that is used infrequently, and data that was written a long time ago. This increases the power consumption and the latency.

The objective of a first embodiment is to reduce the power consumption and the energy consumption. More specifically, the objective is to reduce the power consumption and the energy consumption during PG (power gating) (during power shutdown), during transition to PG, and during return from PG, and to shorten the BET associated with PG.

In the first embodiment, regardless of whether the memory cells have been rewritten or not, the memory cells storing data that are not required to be stored are shut down first, and then the store operation is performed on the remaining memory cells. This can reduce the power consumption and the latency.

More specifically, the cell array is divided into a plurality of blocks. In the higher hierarchy than the memory hierarchy, store-free of each block is determined. In this case, even when the block has been rewritten in the typical SRAM operation, if the data stored in the block are data unnecessary after the restoring, it is determined that the block is a store-free block. The higher hierarchy generates a useless data flag (UDF) that specifies the block having data that are data unnecessary after restoring. In the memory hierarchy, the shutdown operation and the store operation are performed on each block based on the UDF. This can efficiently reduce the power consumption. For example, an external circuit determines whether the data are data unnecessary after the restoring.

Hereinafter, details of the first embodiment will be described.

[Description of a Memory Cell]

Figure 1:
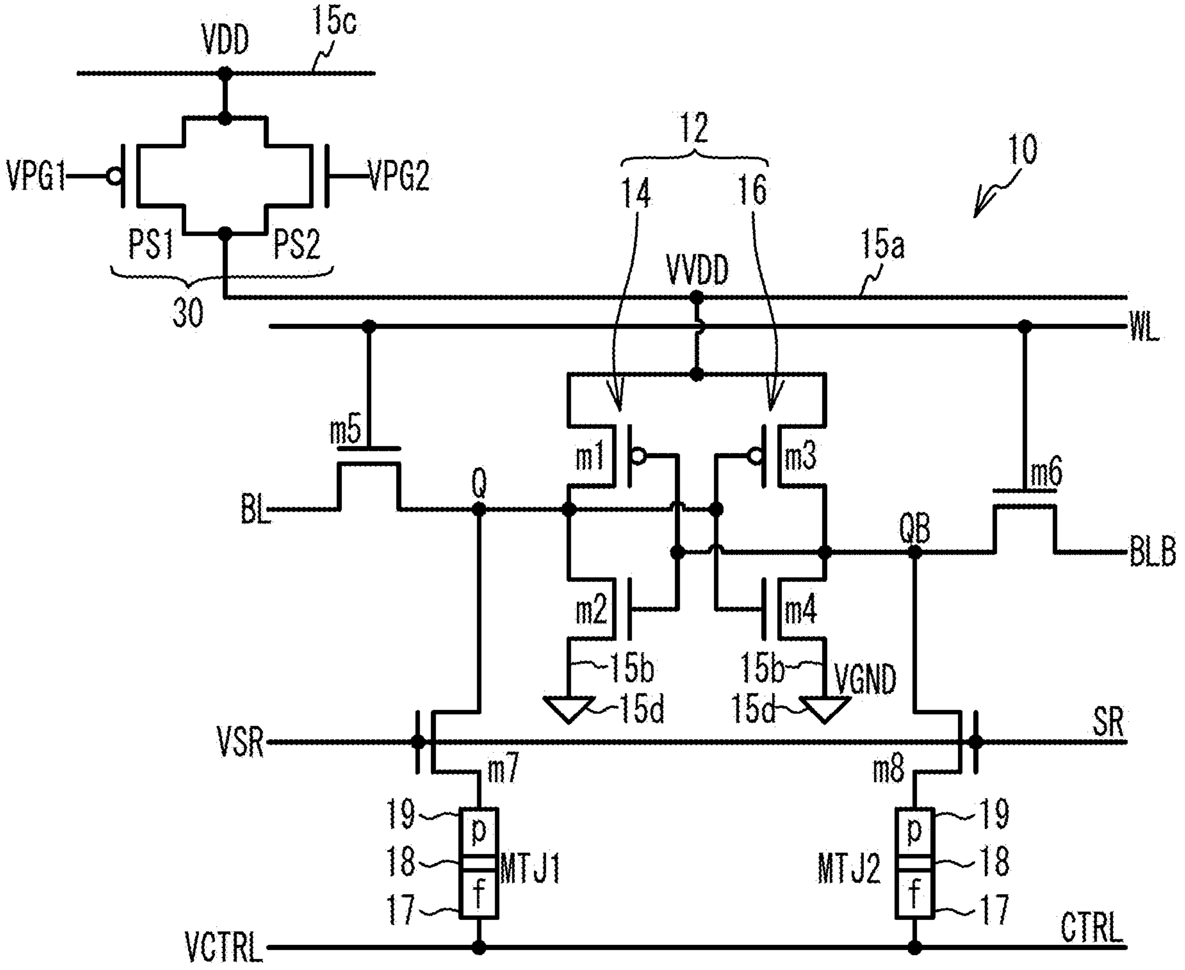
FIG. 1 is a circuit diagram of a memory cell in a first embodiment.

FIG. 1 is a circuit diagram of a memory cell in the first embodiment. As illustrated in FIG. 1, a memory cell 10 includes inverter circuits 14 and 16, spin transfer torque magnetic tunnel junction devices (STT-MTJs: hereinafter simply referred to as ferromagnetic tunnel junction devices) MTJ1 and MTJ2.

The inverter circuits 14 and 16 are connected in a loop shape to form a bistable circuit 12. The inverter circuit 14 includes field effect transistors (FETs) m1 and m2. The inverter circuit 16 includes FETs m3 and m4. The FETs m1 and m3 are P-channel MOSFETs, and the FETs m2 and m4 are N-channel MOSFETs. The sources of the FETs m1 and m3 are coupled to a power supply line 15*a* to which a virtual power supply voltage VVDD is applied, and the sources of the FETs m2 and m4 are coupled to ground lines 15*b* to which a ground voltage VGND is applied. Accordingly, the bistable circuit 12 is supplied with a power supply voltage (VVDD−VGND).

The nodes to which the inverter circuits 14 and 16 are coupled are nodes Q and QB, respectively. The node Q and the node QB are nodes complementary to each other. The bistable circuit 12 enters a stable state when the nodes Q and QB become at a high level and at a low level, respectively, or when the nodes Q and QB become at the low level and at the high level, respectively. The bistable circuit 12 can store data by entering the stable state.

The nodes Q and QB are coupled to bit lines BL and BLB through N channel FETs m5 and m6, respectively. The gates of the FETs m5 and m6 are coupled to a word line WL. The FETs m1 to m6 form a 6-transistor (FET) type SRAM.

An FET m7 and the ferromagnetic tunnel junction device MTJ1 are connected between the node Q and a control line CTRL, and an FET m8 and the ferromagnetic tunnel junction device MTJ2 are connected between the node QB and the control line CTRL. One of the drain and the source of the FET m7 is coupled to the node Q, and the other of the drain and the source of the FET m7 is coupled to the ferromagnetic tunnel junction device MTJ1, while one of the drain and the source of the FET m8 is coupled to the node QB, and the other of the drain and the source of the FET m8 is coupled to the ferromagnetic tunnel junction device MTJ2. The gates of the FETs m7 and m8 are coupled to a switch line SR. The FET m7 may be connected between the ferromagnetic tunnel junction device MTJ1 and the control line CTRL, and the FET m8 may be connected between the ferromagnetic tunnel junction device MTJ2 and the control line CTRL. Alternatively, the FETs m7 and m8 may be omitted.

Each of the ferromagnetic tunnel junction devices MTJ1 and MTJ2 includes a free layer 17, a tunnel insulating film 18, and a pin layer 19. The free layer 17 and the pin layer 19 are made of a ferromagnetic substance. In a state where the magnetization directions of the free layer 17 and the pin layer 19 are parallel (a parallel state), the resistance values of the MTJ1 and the MTJ2 are low. When the magnetization directions of the free layer 17 and the pin layer 19 are antiparallel (an antiparallel state), the resistance values of the MTJ1 and the MTJ2 are higher than those in the parallel state. The MTJ1 and the MTJ2 store data according to the resistance values of the MTJ1 and the MTJ2. In the virtual power supply system described later, the free layer 17 is coupled to the control line CTRL, while in the virtual ground system, the pin layer 19 is coupled to the control line CTRL. In the virtual power supply system, the FETs m7 and m8 are N channel FETs, while in the virtual ground system, the FETs m7 and m8 are P channel FETs.

A power switch 30 is connected between the power supply line 15*a* and a power source 15*c*. The power switch 30 includes power switches PS1 and PS2 connected in parallel between the power supply line 15*a* and the power source 15*c*. The power switch PS1 is, for example, a P channel FET, and the power switch PS2 is, for example, an N channel FET. PS control signals VPG1 and VPG2 are applied to the gates of the power switches PS1 and PS2, respectively. The power switch 30 may be provided between the ground line 15*b* and a ground 15*d*. In this case, the voltage VDD of the power source is applied to the power supply line 15*a*, and a virtual ground voltage VVGND equal to or greater than the ground voltage VGND is applied to the ground line 15*b*. This is called the virtual ground system. The power switch 30 may be provided both between the power supply line 15*a* and the power source 15*c* and between the ground line 15*b* and the ground 15*d*.

[Description of Each State]

Figures 2A, 2B:
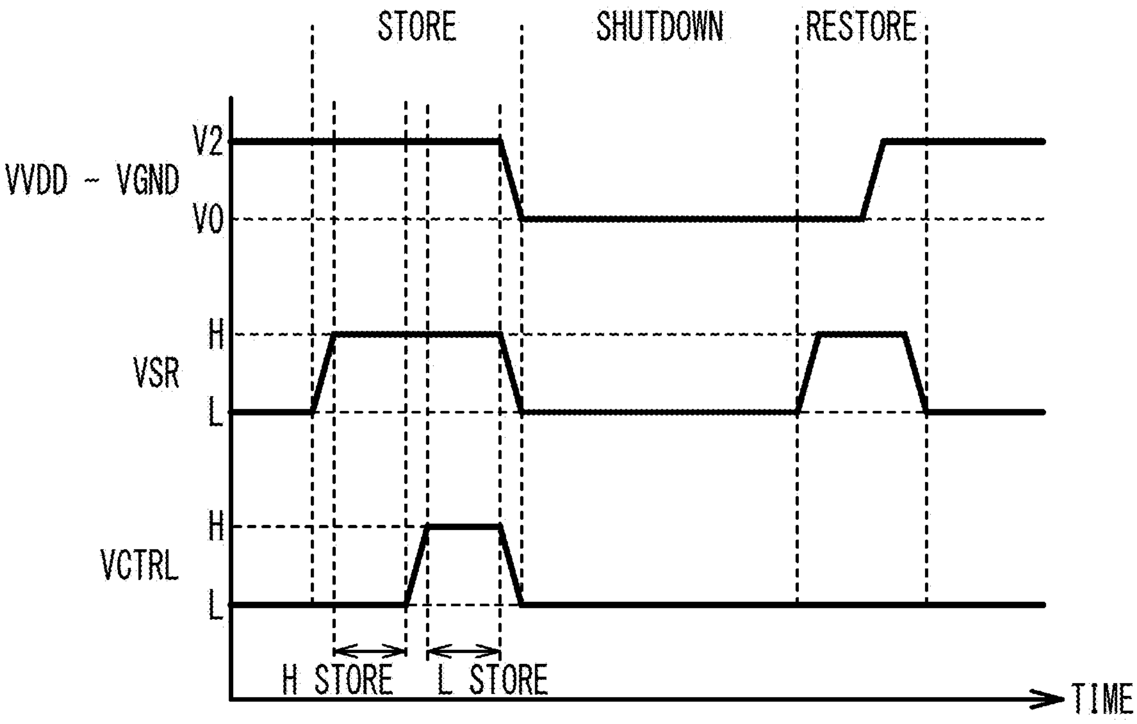
FIG. 2A and FIG. 2B present voltages applied in each state in the first embodiment.

FIG. 2A and FIG. 2B present voltages applied in each state in the first embodiment. As illustrated in FIG. 2A, in a read/write state, the VPG1 and the VPG2 have low levels L. The power switches PS1 and PS2 are ON and OFF, respectively. As a result, the power supply voltage VVDD−VGND supplied between the power supply line 15*a* and the ground line 15*b* is a voltage V2. The voltage V2 is, for example, 1.2 V.

In a sleep state, the VPG1 and the VPG2 have high levels H. The power switches PS1 and PS2 are OFF and ON, respectively. As a result, the power supply voltage VVDD−VGND is a voltage V1 lower than the voltage V2. The voltage V1 is, for example, 0.8 V that is 0.4 V lower than the voltage V2.

In a shutdown state, the VPG1 and the VPG2 have the high level H and the low level L, respectively. The power switches PS1 and PS2 are OFF. No power supply voltage is applied to the power supply line 15*a*. As a result, the power supply voltage VVDD−VGND is a voltage V0 lower than the voltage V1. The voltage V0 is, for example, substantially 0 V.

The period of the read/write state is a period during which data in the bistable circuit 12 is rewritten as a typical SRAM and the data is retained in a volatile manner (this will be described as "data is rewritten in a volatile manner"). Writing and reading of data to and from the bistable circuit 12 are performed in the same manner as in the SRAM. That is, by setting the word line WL at the high level and causing the FETs m5 and m6 to be conducting, the data of the bit lines BL and BLB are written in the bistable circuit 12. In addition, by putting the bit lines BL and BLB into an equipotential floating state, setting the word line WL at the high level, and causing the FETs m5 and m6 to be conducting, data in the bistable circuit 12 can be read out to the bit lines BL and BLB. The power supply voltage VVDD−VGND is the voltage V2 at which the bistable circuit 12 can rewrite data and retain data.

The period of the sleep state is a period during which the memory cell 10 is in a sleep mode. In the sleep state, the bistable circuit 12 only retains data and does not rewrite data. The power supply voltage VVDD−VGND is the voltage V1 at which the bistable circuit 12 cannot rewrite data but can retain data. Since the voltage V1 is lower than the voltage V2, the power consumption can be reduced.

In the read/write state and the sleep state, a control signal VCTRL in the control line CTRL and a control signal VSR in the switch line SR have the low levels, and the FETs m7 and m8 are OFF. By turning off the FETs m5 and m6, data in the bistable circuit 12 is retained. When data is written to, read from, and retained in the bistable circuit 12, the switch line SR is preferably set at the low level and the FETs m7 and m8 are preferably OFF. This substantially shuts off the current between the node Q and the control line CTRL and the current between the node QB and the control line CTRL, achieving the stable operation, and also reducing the increase in the power consumption.

As illustrated in FIG. 2B, a store period is a period during which the store operation is performed, and a period during which data stored in the bistable circuit 12 is stored in the ferromagnetic tunnel junction devices MTJ1 and MTJ2, and is retained in a non-volatile manner (this is described as "data is stored in a non-volatile manner"). During the store period, the power supply voltage VVDD−VGND is the voltage V2 that is the same as that in the read/store state. The control signal VSR is set at the high level.

During an H store period, the control signal VCTRL is set at the low level. This causes the MTJ corresponding to the node at the high level among the nodes Q and QB to have a high resistance. During an L store period, the control signal VCTRL is set at the high level. This causes the MTJ1 and the MTJ2 corresponding to the node at the low level among the nodes Q and QB to have a low resistance. The order of the H store period and the L store period may be reversed. As described above, data in the bistable circuit 12 is stored in the ferromagnetic tunnel junction devices MTJ1 and MTJ2.

The period of the shutdown state is a period during which the memory cell 10 is shut down. In the shutdown state, the power supply voltage VVDD−VGND is set at the voltage V0, which is substantially 0 V. At this time, almost no current flows through the memory cell 10, therefore reducing the power consumption.

During the restore period, restoring is performed by raising the power supply voltage VVDD−VGND from the voltage V0 to the voltage V2 while setting the control signal VCTRL at the low level and the control signal VSR at the high level. The node Q or QB corresponding to the ferromagnetic tunnel junction device having a higher resistance of the ferromagnetic tunnel junction devices MTJ1 and MTJ2 becomes at the high level. The node Q or QB corresponding to the ferromagnetic tunnel junction device having a lower resistance of the MTJ1 and the MTJ2 becomes at the low level. As described above, the data stored and retained in the ferromagnetic tunnel junction devices MTJ1 and MTJ2 in a non-volatile manner (this is described as "data stored in a non-volatile manner") is restored to the bistable circuit 12.

The high levels of the control signals VCTRL and VSR are, for example, the VDD or the VVDD, and the low levels of the control signals VCTRL and VSR are, for example, the VGND. The high level in the control signal VCTRL can be any voltage higher than that of the low level, and the high level in the control signal VSR can be any voltage higher than that of the low level.

Figure 3:
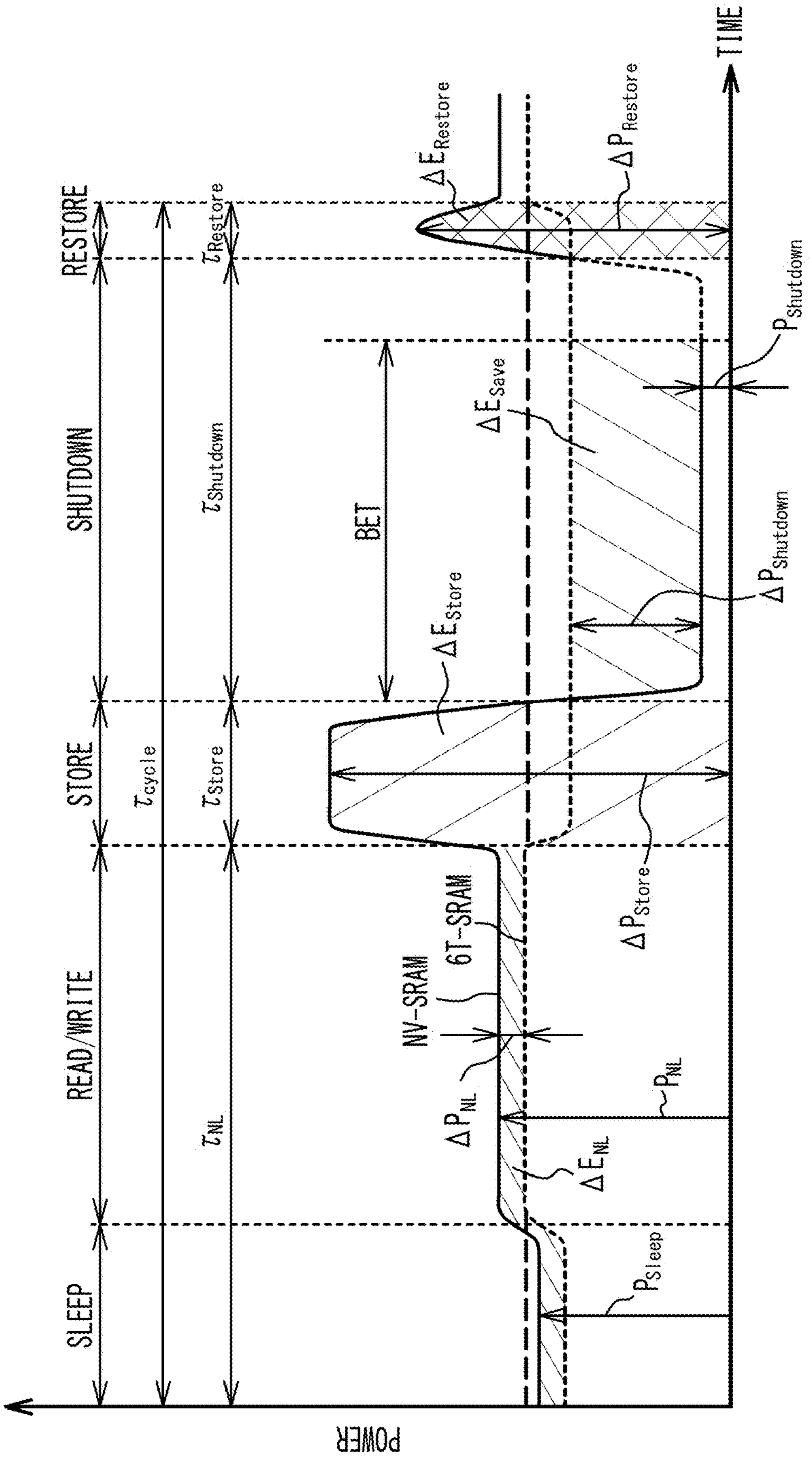
FIG. 3 illustrates power consumption during each period in the first embodiment.

FIG. 3 illustrates the power consumption during each period in the first embodiment. The solid line indicates the power consumption (power) of the memory circuit having the memory cell 10 (an NV-SRAM) illustrated in FIG. 1. The power consumption indicated by the solid line includes the electric power due to the leakage current and the electric power used to store and restore data, and does not include the electric power used to read and write data during the read/write period. The dotted line indicates the power consumption of the memory circuit using a 6-transistor SRAM (6T-SRAM) cell without the FET m7, the FET m8, the MTJ1, and the MTJ2. The dashed line indicates the power consumption during the read/write period of the memory circuit using a 6T-SRAM cell. The power consumption indicated by the dashed line and the power consumption indicated by the dotted line include the electric power due to the leakage current but do not include the electric power used to read and write data during the read/write period. Note that the dashed line and the dotted line overlap in the read/write period and after the restore period, but only the dotted line is presented.

As illustrated in FIG. 3, the operation period of the memory cell 10 includes the sleep period (the period of the sleep state), the read/write period (the period of the read/write state), the store period, the shutdown period (the period of the shutdown state), and the restore period. The length of the sleep period and the length of the read/write period are represented by $\tau_{NL}$. The length of the store period, the length of the shutdown period, and the length of the restore period are represented by $\tau_{Store}$, $\tau_{Shutdown}$, and $\tau_{Restore}$, respectively.

The power consumption of the NV-SRAM during the sleep period and the power consumption of the NV-SRAM during the read/write period are represented by $P_{sleep}$ and $P_{NL}$, respectively. $P_{Sleep}$ and $P_{NL}$ of the NV-SRAM are greater than the power consumption of the 6T-SRAM during the sleep period and the read/write period by $\Delta P_{NL}$. This is because the leakage current flows through the FETs m7 and m8 in the NV-SRAM.

In the NV-SRAM, during the store period, the electric power $\Delta P_{store}$ for storing is consumed. During the shutdown period, the electric power $P_{Shutdown}$ is consumed. The power consumption $P_{Shutdown}$ is due to the leakage current. During the restore period, the electric power $\Delta P_{Restore}$ for restoring is consumed. In the 6T-SRAM, the periods corresponding to the store period, the shutdown period, and the restore period in the NV-SRAM are defined as the sleep period. Thus, the power consumption of the 6T-SRAM during these periods is $P_{Sleep}-\Delta P_{NL}$. The difference between the power consumption of the NV-SRAM during the shutdown period and the power consumption of the 6T-SRAM during the shutdown period is $\Delta P_{Shutdown}$.

The increase in the energy of the NV-SRAM cell relative to that of the 6T-SRAM cell is the sum of the energy increase $\Delta E_{NL}$ due to $\Delta P_{NL}$ during the sleep period and the read/write period, the energy increase $\Delta E_{Store}$ due to $\Delta P_{Store}$ during the store period, and the energy increase $\Delta E_{Restore}$ due to $\Delta P_{Restore}$ during the restore period. The energy that the NV-SRAM cell can save by shutdown is the energy decrease $\Delta E_{save}$ due to $\Delta P_{Shutdown}$ during the shutdown period. Here, $\tau_{Shutdown}$ required for $\Delta E_{NL}+\Delta E_{Store}+\Delta E_{Restore}$ to equal $\Delta E_{Save}$ is the BET (Break-even time). When the waiting period during which reading/writing of data from/to the bistable circuit 12 is not performed is equal to or greater than the BET, the NV-SRAM cell is put into the shutdown state, and when the waiting period is equal to or less than the BET, the NV-SRAM cell is put into the sleep state. This allows for highly efficient reduction in the energy consumption.

[Description of an Electronic Circuit]

Figure 4:
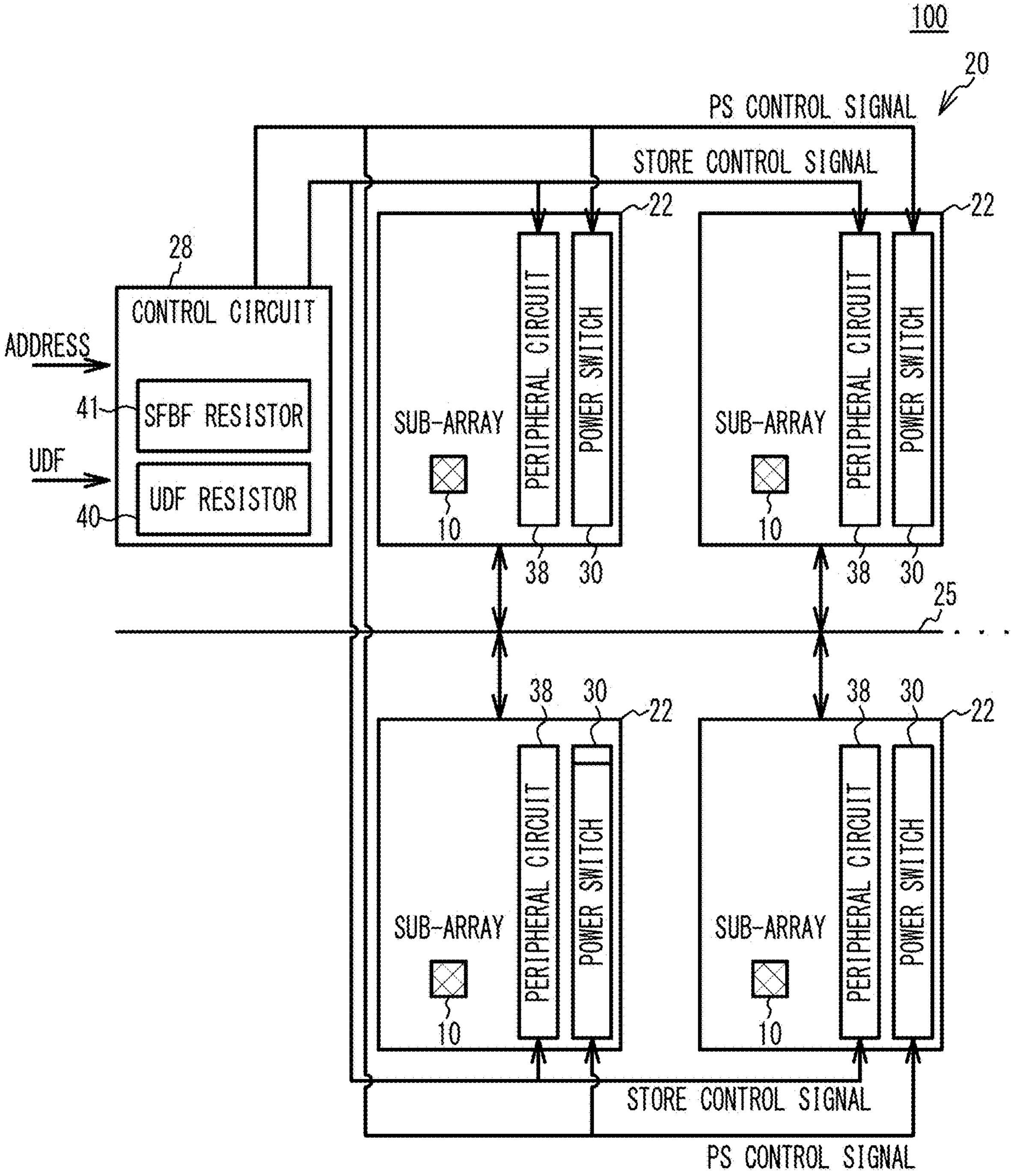
FIG. 4 is a block diagram illustrating an electronic circuit in the first embodiment.

FIG. 4 is a block diagram of an electronic circuit in the first embodiment. As illustrated in FIG. 4, an electronic circuit 100 includes a cell array 20 and a control circuit 28. The cell array 20 is divided into a plurality of sub-arrays 22. The memory capacity of the sub-array 22 is, for example, 8 kbytes. A plurality of memory cells 10 are provided in a matrix form in the sub-array 22. The sub-array 22 is coupled to a bus 25. The number of the sub-arrays 22 can be freely designed.

The sub-array 22 includes the power switch 30 and a peripheral circuit 38. The power switch 30 sets the power supply voltage for the corresponding sub-array 22. The peripheral circuit 38 performs a store-free control for the corresponding sub-array 22.

The control circuit 28 includes a store free block flag (SFBF) resistor 41 and a useless data flag (UDF) resistor 40. The control circuit 28 generates the SFBF for each block based on the address, and stores the generated SFBFs in the resistor 41. The control circuit 28 stores the UDF of each block received from an external circuit in the resistor 40. The control circuit 28 controls the power with respect to each sub-array 22 by controlling the power switch 30 of each sub-array 22 using a PS control signal. Accordingly, the control circuit 28 serves as a power management unit. In addition, the control circuit 28 controls the store-free operation with respect to each sub-array 22 by controlling the peripheral circuit 38 of each sub-array 22 using a store control signal. Accordingly, the control circuit 28 serves as a store-free management unit. Further, the control circuit 28 inputs and outputs data to and from the sub-array 22 through the bus 25. At least one of the functions of the control circuit 28 may be implemented by the cooperation between a processor circuit such as an external central processing unit (CPU) and software.

[Description of the Sub-Array]

Figure 5:
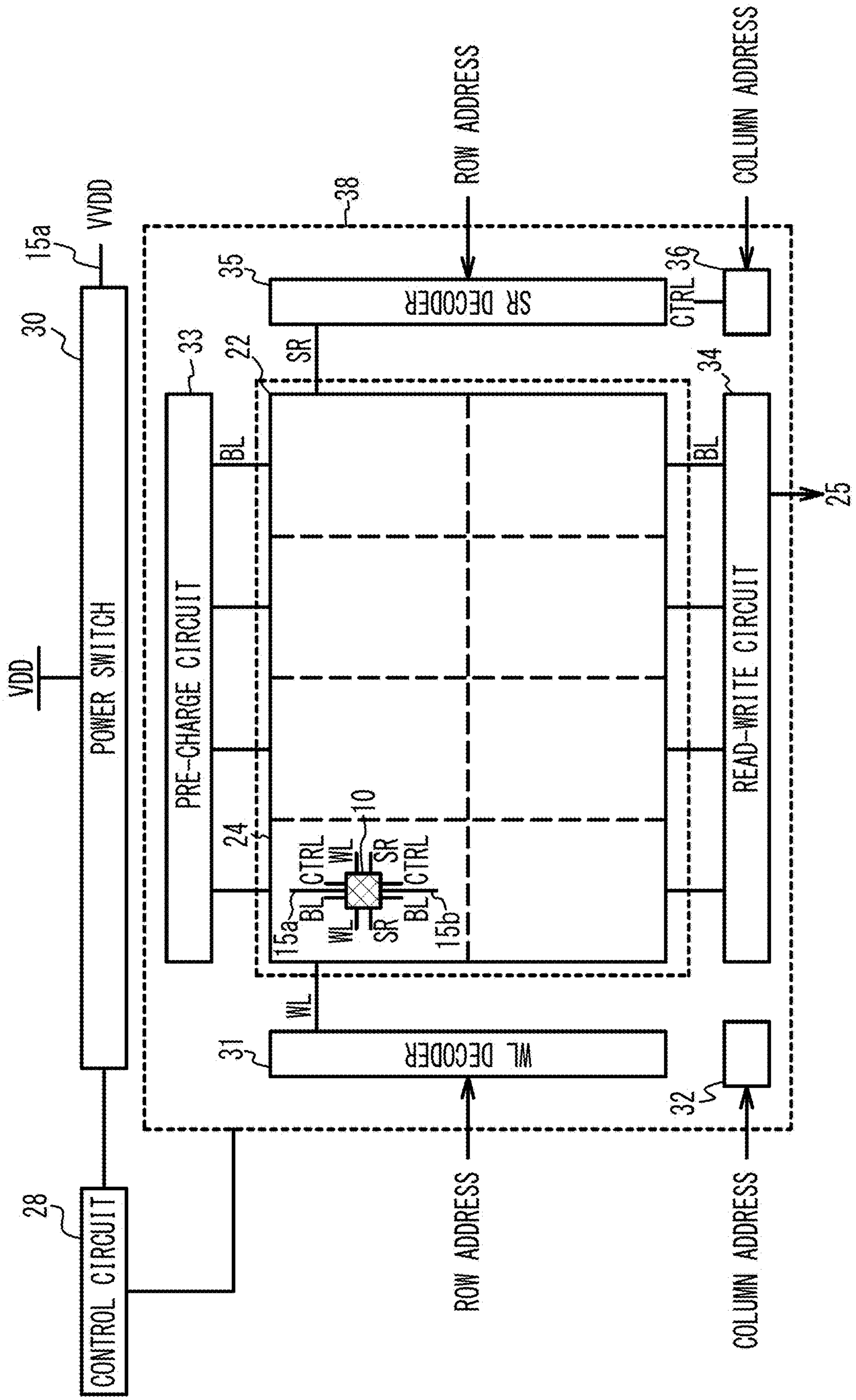
FIG. 5 is a block diagram of a sub-array in the first embodiment.

FIG. 5 is a block diagram of the sub-array in the first embodiment. As illustrated in FIG. 5, the sub-array 22 is divided into a plurality of blocks 24 (for example, 8 blocks) each including the memory cell 10. The memory capacity of the block 24 is, for example, 1 kbyte. The number of the blocks 24 can be freely designed. In the sub-array 22, a plurality of the memory cells 10 are arranged in a matrix form. In the sub-array 22, the word line WL and the switch line SR extend in the row direction, and the bit line BL (corresponding to the bit lines BL and BLB in FIG. 1) and the control line CTRL extend in the column direction. The word line WL, the switch line SR, the bit line BL, the control line CTRL, the power supply line 15*a*, and the ground line 15*b* are coupled to each memory cell 10.

The power switch 30 and the peripheral circuit 38 are provided so as to correspond to each sub-array 22. The control circuit 28 controls the power switch 30 and the peripheral circuit 38. The power switch 30 can set the power supply voltage VVDD–VGND at the voltages V2, V1, and V0 with respect to the corresponding block 24. The peripheral circuit 38 includes a WL decoder 31, column decoders 32 and 36, a pre-charge circuit 33, a read-write circuit 34, and an SR decoder 35.

During the read/write period, the WL decoder 31 selects the word line WL based on a row address. The column decoder 32 selects the bit line BL based on a column address. The pre-charge circuit 33 pre-charges the bit line BL. The read-write circuit 34 writes data in the bistable circuit 12 of the memory cell 10 selected by the WL decoder 31 and the column decoder 32 or reads data from the bistable circuit 12 and outputs the read data to the bus 25.

During the store period, the SR decoder 35 selects the switch line SR based on the row address. The column decoder 36 selects the control line CTRL based on the column address. In the memory cell 10 selected by the WL decoder 31 and the column decoder 32, data in the bistable circuit 12 is stored in the ferromagnetic tunnel junction devices MTJ1 and MTJ2 in a non-volatile manner.

[Description of the Operation]

Figure 6:
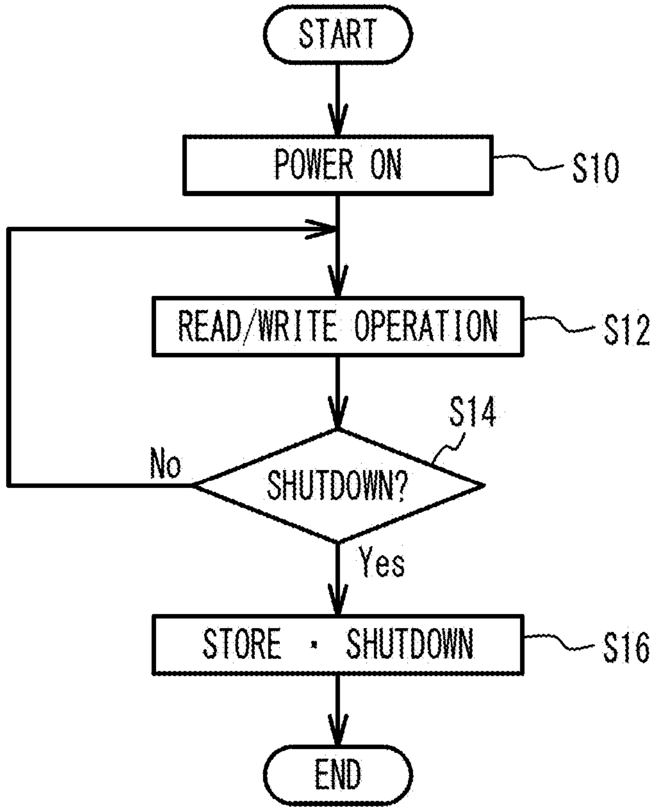
FIG. 6 is a flowchart illustrating an operation in the first embodiment.

FIG. 6 is a flowchart illustrating the operation in the first embodiment. As illustrated in FIG. 6, the control circuit 28 powers on the cell array 20 according to an instruction from the external circuit (step S10). For example, the control circuit 28 turns on the FETs m7 and m8 by setting the control signal VSR at the high level in all the blocks 24, and turns on the power switch PS1 and turns off the power switch PS2. This causes data in the ferromagnetic tunnel junction devices MTJ1 and MTJ2 to be restored to the bistable circuit 12 in each memory cell 10 of the cell array 20.

The control circuit 28 performs a read and write operation (step S12). The control circuit 28 determines whether an instruction to shut down the cell array 20 has been received from the external circuit (step S14). When the determination is No, the process returns to step S12. When the determination is Yes, the control circuit 28 performs the store operation and shutdown (step S16). Thereafter, the process ends, and returns to step S10.

[Description of the Read/Write Operation]

Figure 7A:
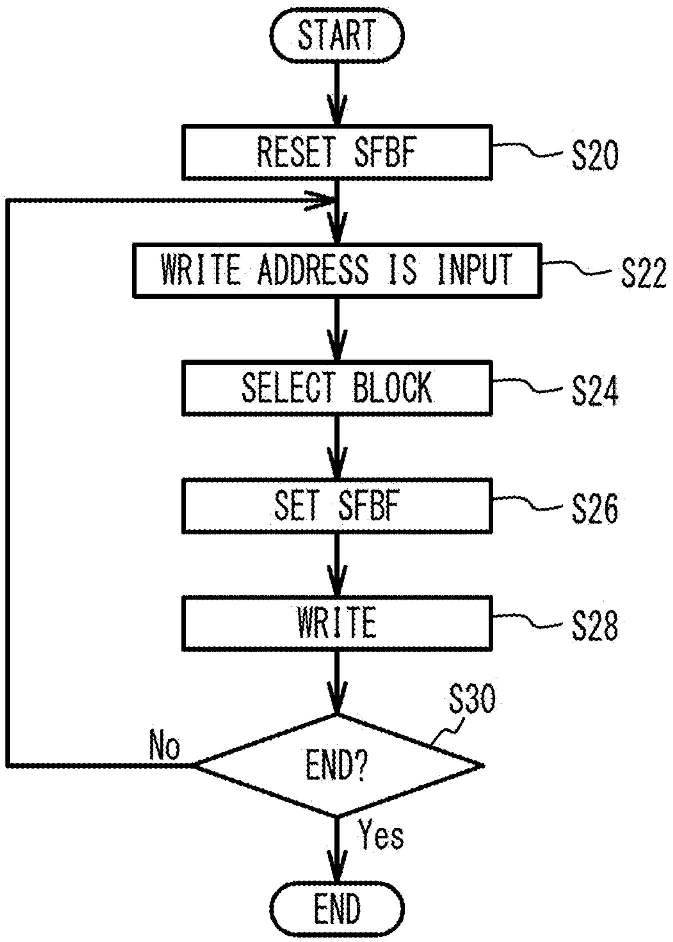
FIG. 7A is a flowchart illustrating a read/write operation in the first embodiment.

The operation in step S12 of FIG. 6 will be described. FIG. 7A is a flowchart illustrating the read/write operation in the first embodiment. As illustrated in FIG. 7A, the control circuit 28 resets the SFBFs corresponding to all the blocks 24, in the resistor 41 (step S20). For example, the control circuit 28 sets the SFBFs corresponding to all the blocks 24 at the high level H. The write address is input to the control circuit 28 (step S22). The control circuit 28 selects the block 24 to which data is to be written (the block 24 containing the memory cell 10 to which data is to be written) (step S24). The control circuit 28 sets the SFBF to the resistor 41 corresponding to the block 24 selected using the WL decoder 31 and the column decoder 32 (step S26). For example, the control circuit 28 sets the corresponding SFBF at the low level L. The control circuit 28 writes data in the memory cell 10 in the selected block 24 using the read-write circuit 34 (step S28). The control circuit 28 determines whether to end the operation (step S30). When the determination is No, the process returns to step S22. When the determination is Yes, the process ends.

[Description of the UDF Setting]

Figure 7B:
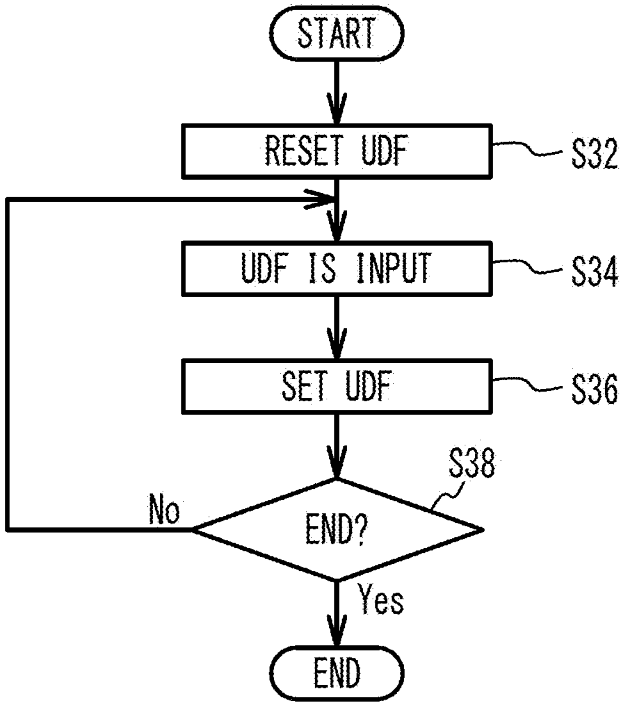
FIG. 7B is a flowchart illustrating setting of a UDF in the first embodiment.

The operation of setting the UDF will be described. The UDF is information indicating that data in the block 24 is data that are not required to be stored (i.e., data that are not required to be restored after shutdown). FIG. 7B is a flowchart illustrating the setting of the UDF in the first embodiment. As illustrated in FIG. 7B, the control circuit 28 resets the UDFs corresponding to all the blocks 24, in the resistor 40 (step S32). For example, the control circuit 28 sets the UDFs corresponding to all the blocks at the low level L. The UDF is input to the control circuit 28 from the external circuit (step S34). The UDF is input when data is written in the block 24, for example. Alternatively, regardless of reading or writing of data, the UDF is input at regular intervals or at irregular intervals. The control circuit 28 sets the UDF for the resistor 40 corresponding to the block 24 specified by the UDF (step S36). For example, the control circuit 28 sets the corresponding UDF at the high level H. The control circuit 28 determines whether to end the operation (step S38). When the determination is No, the process returns to step S34. When the determination is Yes, the process ends.

The UDF is generated by software such as the operating system (OS) or a program in the CPU of the external circuit, for example. Alternatively, part of the generation of the UDF may be performed by a dedicated hardware circuit. The algorithm for generating the UDF may be implemented in a compiler, and the compiler may generate the UDF automatically. The user may specify data to be the UDF on the program. The data to be the UDF may be learned through the machine learning to generate the UDF. Two or more of the above UDF generation methods may be used in combination. In the case that the electronic circuit 100 is a cache memory, the data that are not required to be stored is, for example, data that has not been used for a long period of time, data that is used infrequently, or data that was written a long time ago.

[Description of the Store Operation]

Figure 8:
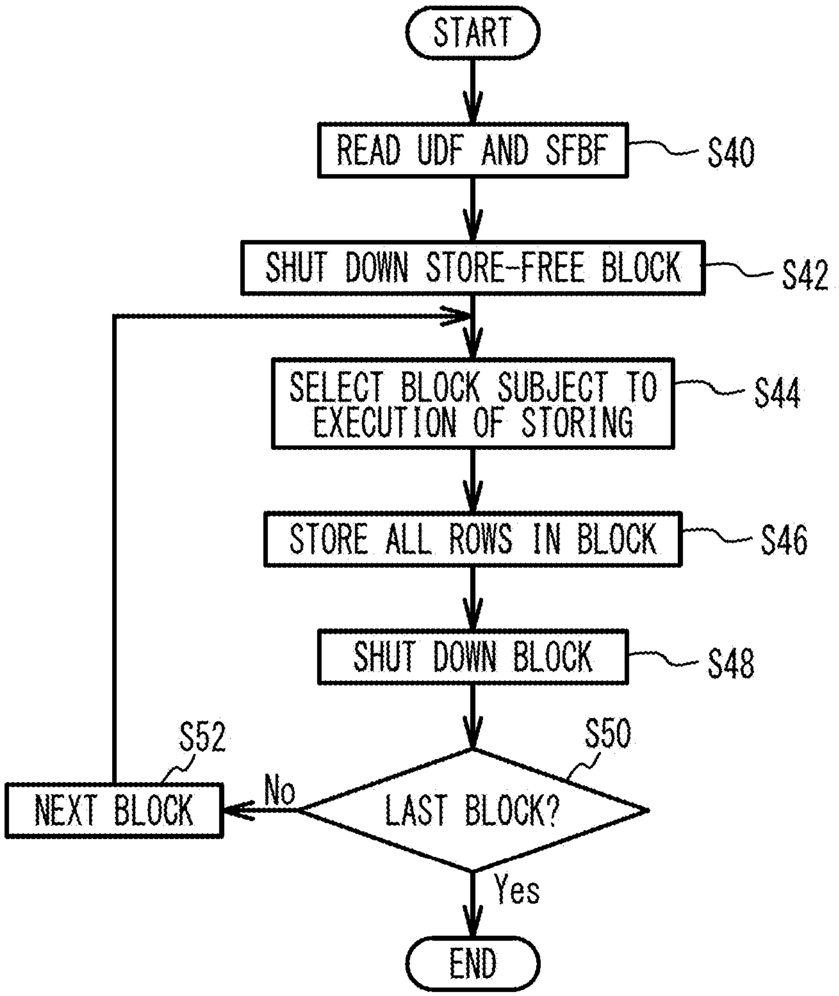
FIG. 8 is a flowchart of a store operation in the first embodiment.

A description will be given of the operation in step S16 in FIG. 6. FIG. 8 is a flowchart illustrating the store operation in the first embodiment.

FIG. 9A to FIG. 9D schematically illustrate the cell array and the blocks in the first embodiment. In FIG. 9A to FIG. 9D, the description will be given of the structure where 9 (3×3) sub-arrays 22 are provided in the cell array 20 and 8 (4×2) blocks 24 are provided in one sub-array 22. "SLEEP" indicates the block 24 that is in the sleep state (i.e., the state where all the memory cells 10 in the block 24 are in the sleep mode). "STORE" indicates the block 24 that is in the store operation. "SFBF SHUTDOWN" indicates the block 24 that is in the shutdown state based on the SFBF (i.e., all the memory cells 10 are in the shutdown state), "UDF SHUTDOWN" indicates the block 24 that is in the shutdown state based on the UDF, and "SHUTDOWN AFTER STORING" indicates the block 24 that is in the shutdown state subsequent to the store operation.

Figure 10A:
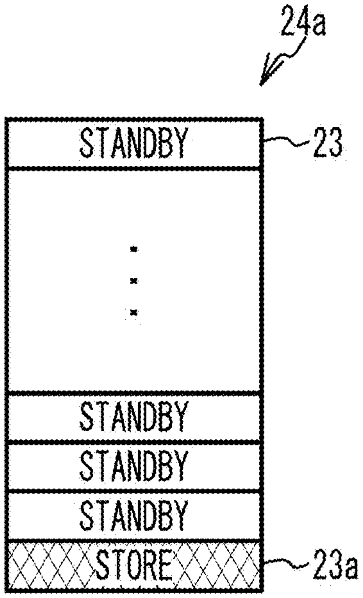
FIG. 10A to FIG. 10C schematically illustrate the block in the first embodiment.
Figure 10B:
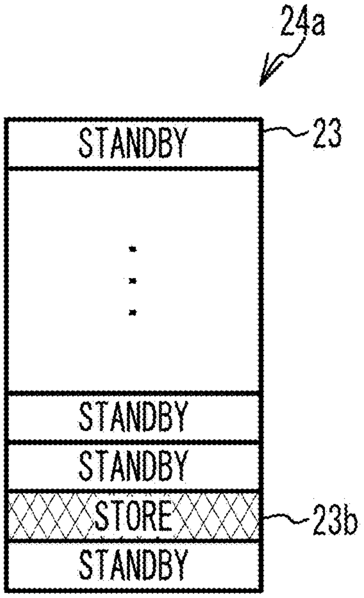
Figure 10C:
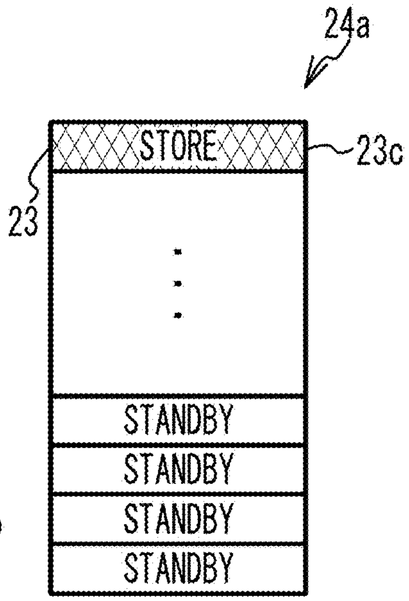

FIG. 10A to FIG. 10C schematically illustrate the block in the first embodiment. In FIG. 10A to FIG. 10C, a plurality of rows 23 are provided in a block 24$a$. "STANDBY" indicates the row 23 that is in the state of waiting for storing. "STORE" indicates the row 23 that is in the store operation. Rows 23$a$ to 23$c$ indicate specific rows among the rows 23.

As illustrated in FIG. 8, when the control circuit 28 starts the store operation in step S16 of FIG. 6, the control circuit 28 reads the UDF and the SFBF corresponding to each block 24 from the resistors 40 and 41, respectively (step S40). The control circuit 28 extracts, as a store-free block, the blocks 24 for which at least one of the UDF and the SFBF (for example, the blocks 24 with the high level H) is set. The store-free blocks are collectively shut down (step S42). For example, the control circuit 28 causes the power switch 30 to set the power supply voltage VVDD−VGND of the store-free block at the V0.

Figure 9A:
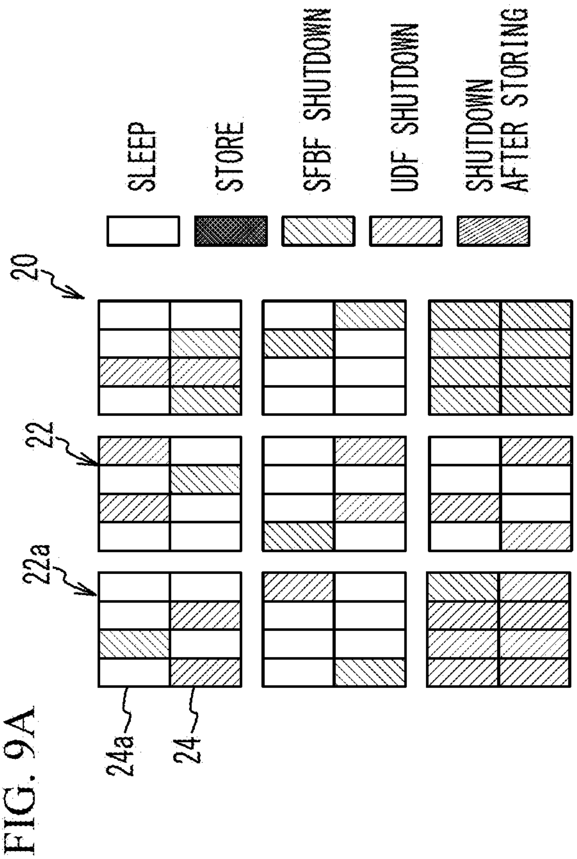
FIG. 9A to FIG. 9D schematically illustrate a cell array and blocks in the first embodiment.

As illustrated in FIG. 9A, the control circuit 28 collectively shuts down 36 blocks 24, which include 17 blocks 24 for which the SFBF is set and 19 blocks 24 for which the UDF is set, among the 72 blocks 24 (9 subarrays 22×8 blocks 24). The remaining 36 blocks 24 are put into the sleep state.

Figure 9B:
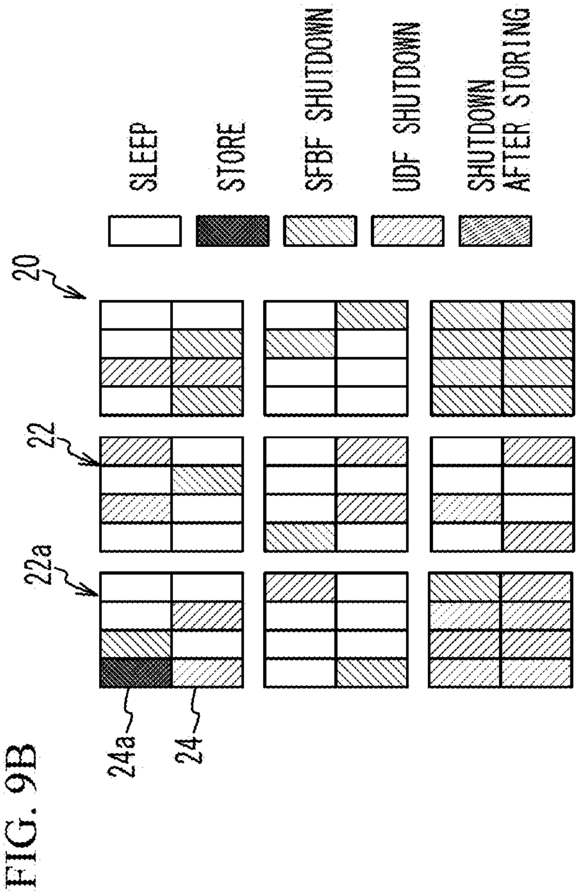

The control circuit 28 selects the first block 24*a* for which the store operation is performed (step S44). As illustrated in FIG. 9B, the control circuit 28 selects the block 24*a* of a sub-array 22*a*, and starts the store operation.

As the store operation for the selected block 24*a*, the control circuit 28 performs the store operation on each row in the selected block 24*a* (step S46).

As illustrated in FIG. 10A, the control circuit 28 performs the store operation on the first row 23*a*. Other rows 23 are put into a standby. For example, the control circuit 28 turns on the FETs m7 and m8 of the row 23*a*, and turns off the FETs m7 and m8 of the rows 23 in the standby state. The control circuit 28 applies a voltage for the store operation to the control line CTRL extending in the column direction. This causes data in the bistable circuit 12 to be stored in the ferromagnetic tunnel junction devices MTJ1 and MTJ2 in a non-volatile manner in the memory cell 10 where the FETs m7 and m8 have been turned on and the voltage has been applied to the control line CTRL. The voltage may be applied to the control lines CTRL one by one or simultaneously. When the store operation on all the memory cells 10 in the row 23*a* is completed, the store operation for the row 23*a* is finished.

As illustrated in FIG. 10B, the control circuit 28 performs the store operation on the next row 23*b*. As illustrated in FIG. 10C, the control circuit 28 performs the store operation on the rows 23 sequentially, and performs the store operation on the last row 23*c*. When the store operation on all the rows 23 is completed, the store operation for the block 24*a* is finished.

The control circuit 28 shuts down the block 24*a* (step S48). The control circuit 28 determines whether the store operation for the last block in the selected sub-array 22 is completed (step S50). When the determination is No, the control circuit 28 proceeds to the processing of a next block 24*b* (step S52), and the process returns to step S44.

Figure 9C:
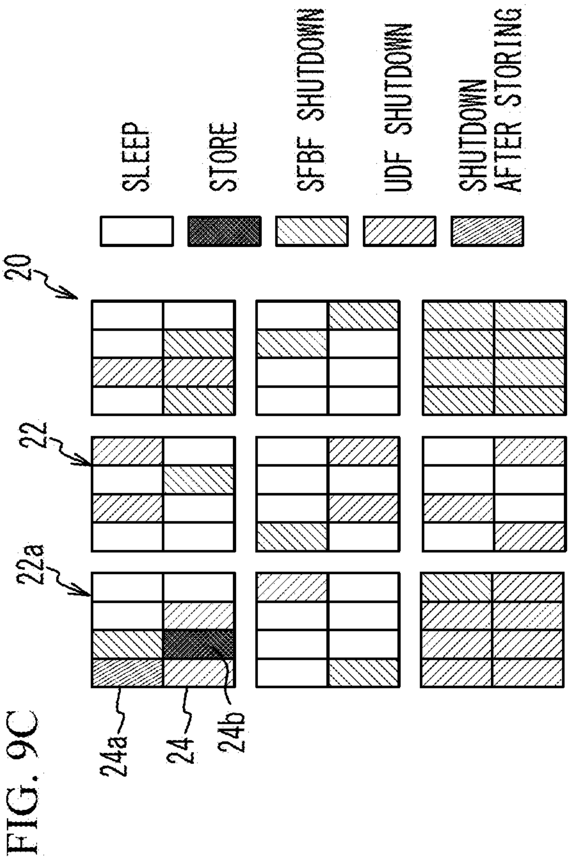

As illustrated in FIG. 9C, in step S44, the control circuit 28 selects the block 24*b*, and performs the store operation for the block 24*b* in step S46. In step S48, the control circuit 28 shuts down the block 24*b*. Thereafter, steps S44 to S52 are repeated in sequence.

Figure 9D:
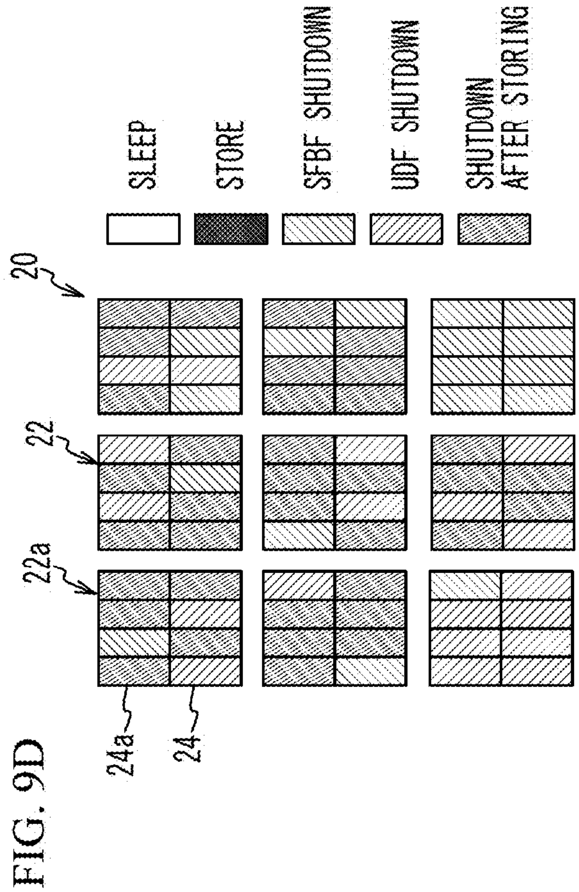

As illustrated in FIG. 9D, the store operation for the last block 24 is completed, and all the blocks 24 enter the shutdown state. The control circuit 28 determines that the determination in step S50 is Yes, and finishes the store operation.

[Example of the Control Circuit]

Figures 11A, 11B:
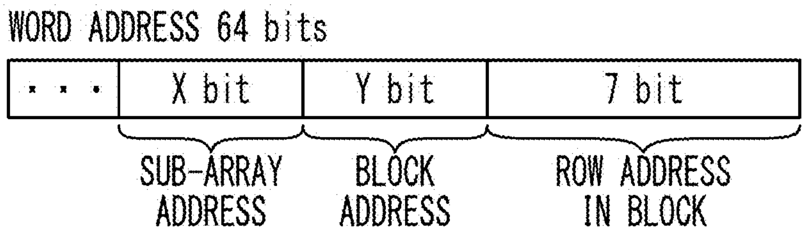
FIG. 11A presents sizes of cell arrays in the first embodiment.
FIG. 11B illustrates an example of a word address.

FIG. 11A and FIG. 11B present sizes of cell arrays and an example of a word address in the first embodiment, respectively. As presented in FIG. 11A, the size of the cell array 20 is, for example, 32 kbytes, 256 kbytes, and 2 Mbytes. When the size of one block 24 is 1 kbyte and the number Nblock of the blocks 24 in one sub-array 22 is 8, the number NSA of the sub-arrays 22 is 4 when the size of the cell array 20 is 32 kbytes, 32 when the size of the cell array 20 is 256 kbytes, and 256 when the size of the cell array 20 is 2 Mbytes. The number X of bits of the address of the sub-array 22 is 2 bits when the size of the cell array 20 is 32 kbytes, 5 bits when the size of the cell array 20 is 256 kbytes, and 8 bits when the size of the cell array 20 is 2 Mbytes. The number Y of bits of the address of the block 24 is 3 bits.

As illustrated in FIG. 11B, the word address is composed of, from the top, a sub-array address of X bits, a block address of Y bits, and a row address in the block (for example, 7 bits for 1 kbyte).

Figure 12:
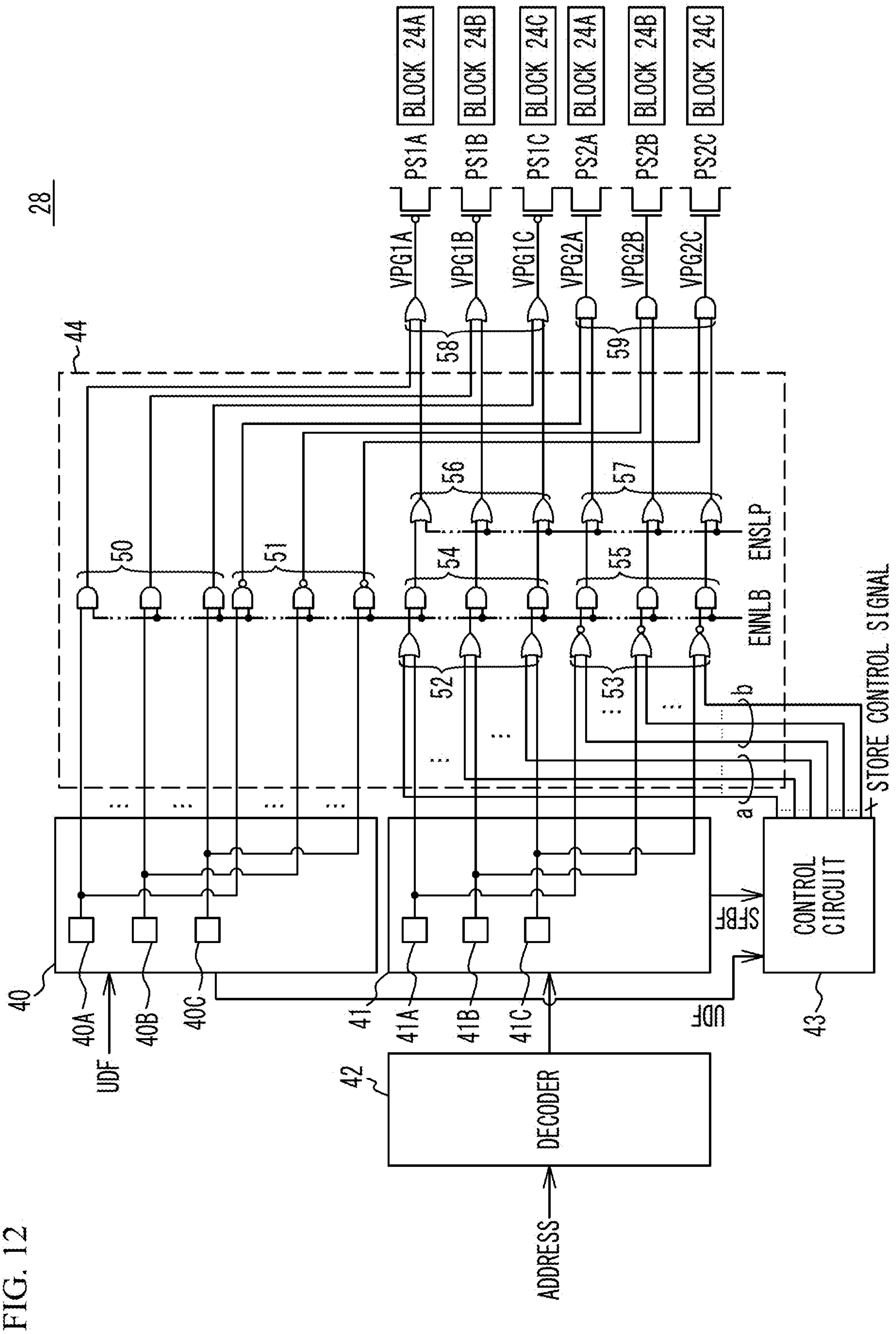
FIG. 12 is a block diagram illustrating an exemplary control circuit in the first embodiment.

FIG. 12 is a block diagram illustrating an exemplary control circuit in the first embodiment. The control circuit 28 includes a decoder 42, the resistors 40 and 41, a control circuit 43, and a PS control circuit 44. The number of bits of each of the resistors 40 and 41 is equal to or greater than NSA×Nblock, which is the number of the blocks 24. Among the NSA×Nblock blocks 24, blocks 24A to 24C will be described.

UDF storage units 40A to 40C are 1-bit latch circuits corresponding to the blocks 24A to 24C, respectively. In step S32 of FIG. 7B, all the storage units 40A to 40C are reset to the low level L. When the UDFs are input to the control circuit 28 in step S34, the storage units 40A to 40C of the corresponding blocks 24A to 24C are set at the high level H in step S36.

SFBF storage units 41A to 41C are 1-bit latch circuits corresponding to blocks 24A to 24C, respectively. In step S20 of FIG. 7A, all the storage units 41A to 41C are reset to the high level H. In step S22, a write address signal is input to the decoder 42. In step S24, the corresponding block 24 is selected based on the sub-array address X and the block address Y. In step S26, the storage units 40A to 40C of the corresponding blocks 24A to 24C are set at the low level L.

The control circuit 43 outputs store control signals a and b. The PS control circuit 44 obtains the UDFs and the SFBFs held in the resistors 40 and 41 and controls power switches PS1A to PS1C and PS2A to PS2C of the respective blocks 24A to 24C based on the obtained UDFs and the obtained SFBFs.

The PS control circuit 44 includes the same number of AND circuits 50, NAND circuits 51, OR circuits 52, NOR circuits 53, AND circuits 54, AND circuits 55, OR circuits 56, OR circuits 57, OR circuits 58, and AND circuits 59 as the number of the blocks 24A to 24C.

Each of control signals a, b, ENNLB, and ENSLP input to the PS control circuit 44 is a control signal common to the blocks 24A to 24C, and each of control signals VCTRL and VSR is a signal individual for each block 24A to 24C. The control signals ENNLB and ENSLP are generated by, for example, the control circuit 28.

The output signals of the UDF storage units 40A to 40C and the control signal ENNLB are input to the respective AND circuits 50. The output signals of the UDF storage units 40A to 40C and the control signal ENNLB are input to the respective NAND circuits 51.

The output signals of the SFBF storage units 41A to 41C and the control signal a are input to the respective OR circuits 52. The output signals of the SFBF storage units 41A to 41C and the control signal b are input to the respective NOR circuits 53. The output signals of the OR circuits 52 and the control signal ENNLB are input to the respective AND circuits 54. The output signals of the NOR circuits 53 and the control signal ENNLB are input to the respective AND circuits 55. The output signals of the AND circuits 54 and the control signal ENSLP are input to the respective OR circuits 56. The output signals of the AND circuits 55 and the control signal ENSLP are input to the respective OR circuits 57.

The output signals of the AND circuits 50 and the output signals of the OR circuits 56 are input to the respective OR circuits 58. PS control signals VPG1A to VPG1C are output from the respective OR circuits 58. The PS control signals VPG1A to VPG1C are input to the gates of the power switches PS1A to PS1C of the blocks 24A to 24C, respectively.

The output signals of the NAND circuits 51 and the output signals of the OR circuits 57 are input to the respective AND circuits 59. PS control signals VPG2A to VPG2C are output from the respective AND circuits 59. The PS control signals VPG2A to VPG2C are input to the gates of the power switches PS2A to PS2C of the blocks 24A to 24C, respectively.

FIG. 13A to FIG. 13E present the level of each signal and the operations of the power switches in the first embodiment. As illustrated in FIG. 13A, during the read/write period, all the control signals a, b, ENNLB, and ENSLP have the L. Assume that the UDFs of the blocks 24A to 24C are the L, the L, and the H, respectively. Assume that the SFBFs of the blocks 24A to 24C are the L, the H, and the L, respectively. In this case, the VPG1A to the VPG1C have the L, and the power switches PS1A to PS1C are ON. The VPG2A to the VPG2C have the L, and the power switches PS2A to PS2C are OFF. As seen from the above, during the read/write period, regardless of the UDFs and the SFBFs, the power switches PS1A to PS1C are ON, and the power switches PS2A to PS2C are OFF. Thus, the voltage V2 for reading/writing is applied to all the blocks 24A to 24C, as the power supply voltage VVDD−VGND.

As illustrated in FIG. 13B, during the sleep period, the control signal ENSLP has the H, the control signals a, b, and ENNLB have the L. The VPG1A to the VPG1C have the H, and the power switches PS1A to PS1C are OFF. The VPG2A to the VPG2C have the H, and the power switches PS2A to PS2C are ON. As seen from the above, during the sleep period, regardless of the UDFs and the SFBFs, the power switches PS1A to PS1C are OFF, and the power switches PS2A to PS2C are ON. Therefore, the voltage V1 for sleep is applied to all the blocks 24A to 24C, as the power supply voltage VVDD−VGND.

In step S42 of FIG. 8, the store-free blocks 24B and 24C are collectively put into the shutdown state from the read/write state. As illustrated in FIG. 13C, compared with FIG. 13A, the control signals a and ENNLB change from the L to the H. The control signals b and ENSLP maintain the L. The VPG1A to the VPG1C change from the L to the H, and the power switches PS1A to PS1C are turned OFF from ON. The VPG2A changes from the L to the H, and the VPG2B and the VPG2C maintain the L. The power switch PS2A is turned ON from OFF, and the power switches PS2B and PS2C maintain OFF. As a result, the power supply voltages VVDD−VGND of the blocks 24B and 24C of which at least one of the UDF and the SFBF is the H become V0, and the blocks 24B and 24C enter the shutdown state. The power supply voltage VVDD−VGND of the block 24A of which the UDF and the SFBF are both the L becomes the V1, and the block 24A enters the sleep state.

From the state in step S42 of FIG. 8 (this period is represented by T1), in step S46, the store operation is performed for the selected block 24A. As illustrated in FIG. 13D, in steps S42 to S46, the control signal a changes from the H to the L, and the control signal b changes from the L to the H. The control signals ENNLB and ENSLP maintain the H and the L, respectively. The VPG1A changes from the H to the L, and the PS1A is turned ON from OFF. The VPG2A changes from the H to the L, and the PS2A is turned OFF from ON. The PS1B, the PS1C, the PS2B, and the PS2C maintain OFF. The power supply voltage VVDD−VGND of the block 24A becomes the voltage V2 for standby, and the power supply voltages VVDD−VGND of the blocks 24B and 24C become the V0. As a result, the block 24A enters the standby state for the store operation, and the blocks 24B and C are maintained in the shutdown state. The control signals VCTRL and VSR are applied to the block 24A according to the store control signal output from the control circuit 43. As a result, as illustrated in FIG. 10A to FIG. 10C, the store operation for the target block 24A is performed. This period is represented by T2.

In step S48 of FIG. 8, when the store operation on the block 24A is completed, the control signal a changes from the L to the H. The control signals b, ENNLB, and ENSLP maintain the H, the H, and the L, respectively. The VPG1A changes from the L to the H, and the PS1A is turned OFF from ON. As a result, the power supply voltage VVDD−VGND of the block 24A changes from the voltage V2 to the voltage V0, and the block 24A enters the shutdown state. This period is represented by T3. By performing the loop from steps S44 to S52 in FIG. 8, for the block 24 subject to the store operation, the control signals (a, b) are sequentially set at (H, L), (L, H), and (H, H) in this order. As a result, the store operation is performed on the blocks 24 subject to the store operation, sequentially.

As illustrated in FIG. 13E, in the shutdown state, the control signals a, b, ENNLB, and ENSLP have the H, the H, the H, and the L, respectively. The PS1A to the PS1C and the PS2A to the PS2C are OFF regardless of the UDFs and the SFBFs. As a result, the power supply voltages VVDD−VGND of all the blocks 24 are the V0, and all the blocks 24 are in the shutdown state.

Figure 14:
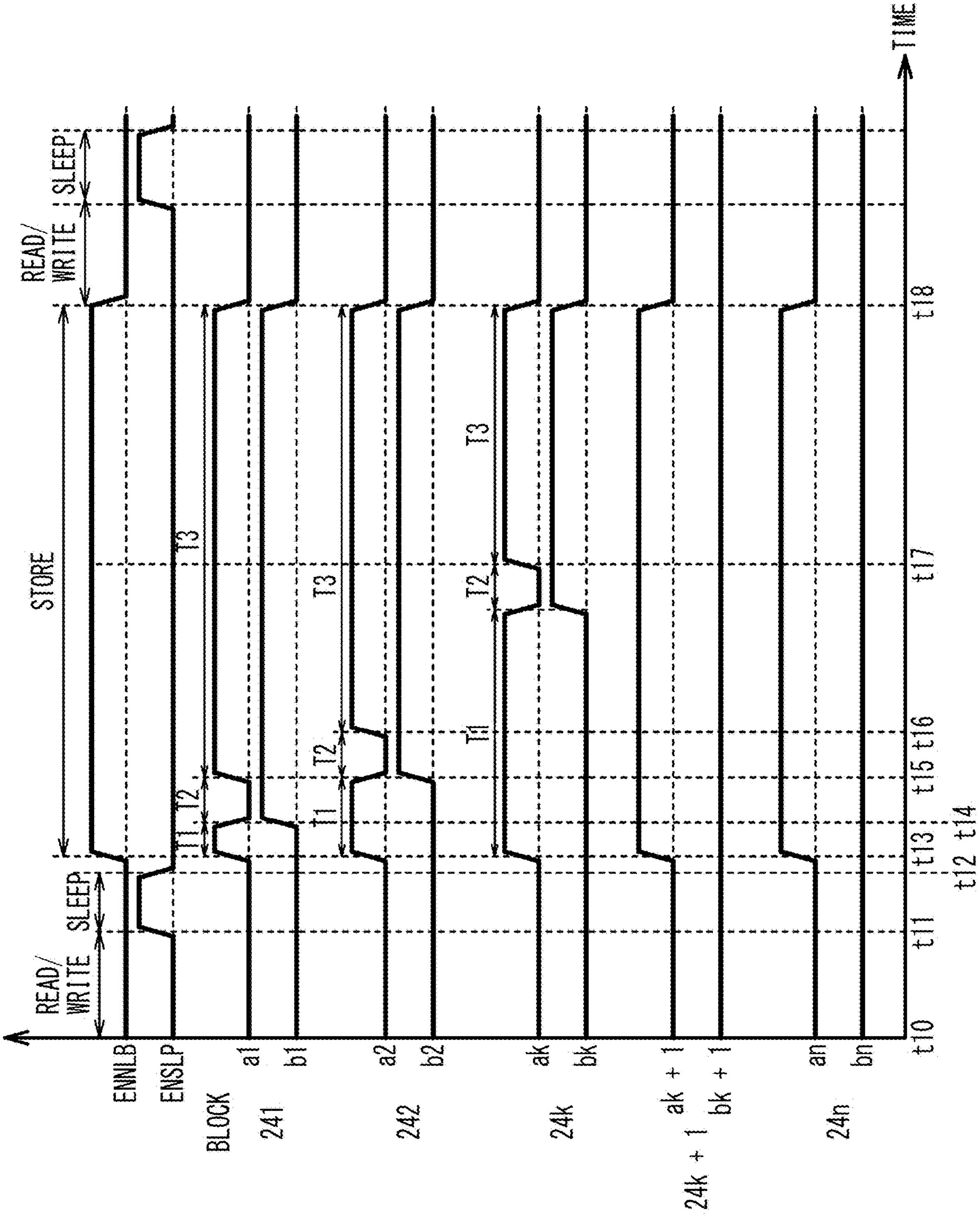
FIG. 14 is a timing chart of control signals in the first embodiment.

FIG. 14 is a timing chart of the control signals in the first embodiment. Control signals a1 to an are the control signals a corresponding to blocks 241 to 24*n*, respectively, and control signals b1 to bn are the control signals b corresponding to the blocks 241 to 24*n*, respectively. The blocks 241 to 24*k* are blocks subject to the store operation, and the blocks 24*k*+1 to the block 24*n* are the store-free blocks.

As illustrated in FIG. 14, the period between time t10 and time t11 is the read/write period, and the control signals a1 to an, b1 to bn, ENNLB, and ENSLP have the L. The period between time t11 and time t12 is the sleep period, and the control signal ENSLP has the H, and other control signals have the L.

When the store operation is started, at time t13 (in step S42 of FIG. 8), the control signals ENNLB and a1 to an become the H. As a result, the blocks 241 to 24*k* subject to the store operation enter the sleep state of the period T1, and the store-free blocks 24*k*+1 to 24*n* enter the shutdown state. This state corresponds to the period T1.

At time t14, the control signals a1 and b1 corresponding to the block 241 subject to the store operation become the L and the H, respectively. The period between time t14 and time t15 is the period T2 of the block 241, and the block 241 is in the store operation. At time t15, the control signal a1 becomes the H, and the control signal b1 maintains the H. The period at and after time t15 is the period T3 of the block 241, and the block 241 is in the shutdown state. At time t15, the control signals a2 and b2 corresponding to the block 242 become the L and the H, respectively. The period between time t15 and time t16 is the period T2 of the block 242, and the block 242 is in the store operation. At time t16, the control signal a2 becomes the H, and the control signal b2 maintains the H. The period at and after time t16 is the period T3 of the block 242, and the block 242 is in the shutdown state.

Steps S46 and S48 are performed on the blocks 241 to 24*k* subject to the store operation in sequence. When the store operation is completed for all the blocks 241 to 24*k* subject to the store operation at time t17, all the blocks 241 to 24*n* are in the shutdown state. When the control signals a1 to an, b1 to bn, ENNLB, and ENSLP become the L at time t18, the period at and after time t18 becomes the read/write period.

As described above, at time t13, the blocks 241 to 24*k* collectively enter the sleep state (the period T1), and the blocks 24*k*+1 to 24*n* collectively enter the shutdown state. Thereafter, the store operation (the period T2) is performed for the blocks 241 to 24*k* sequentially. The blocks for which the store operation has been completed enter the shutdown state (the period T3) sequentially.

Figure 15:
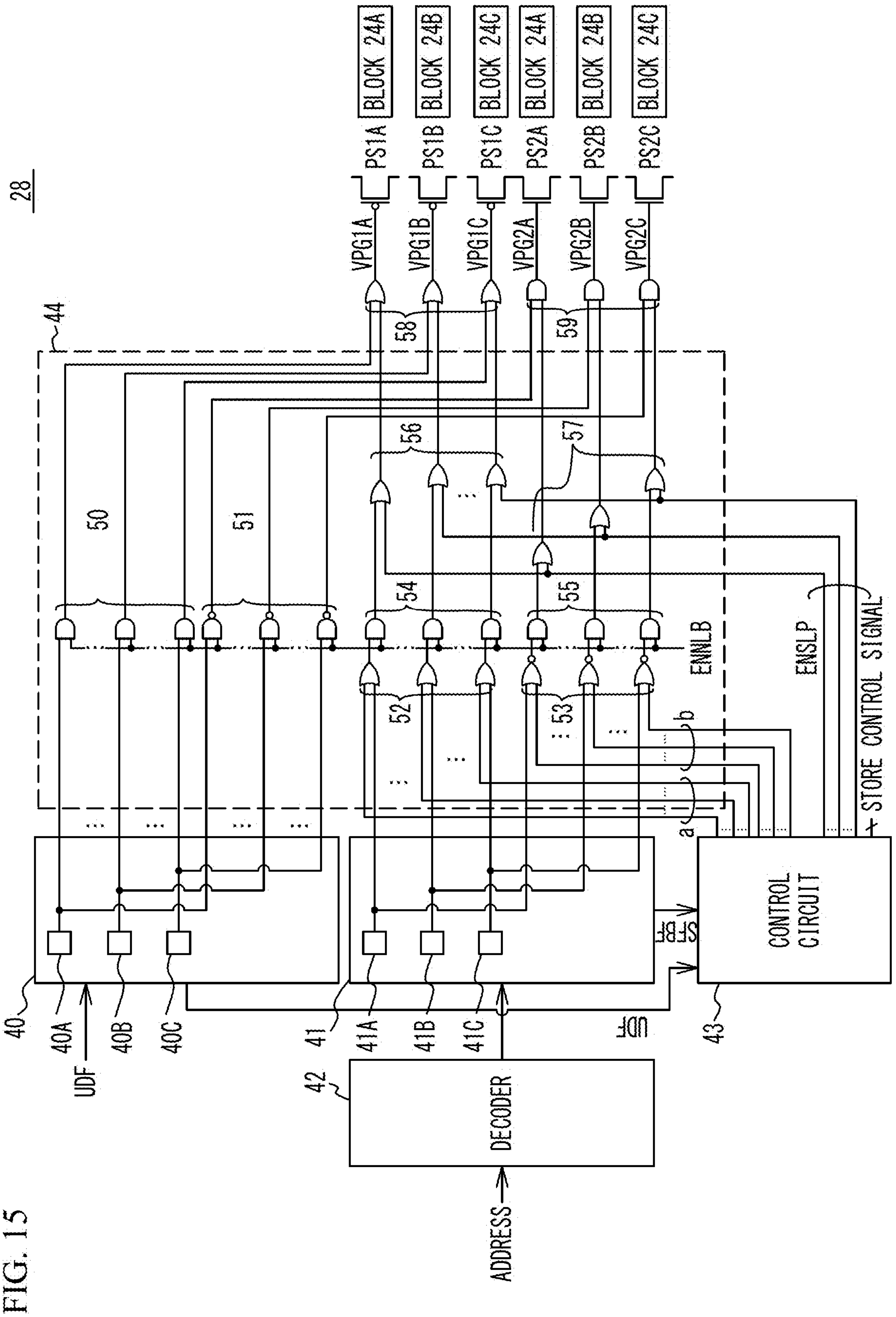
FIG. 15 is a block diagram of another example of a control circuit 28 in the first embodiment.

FIG. 15 is a block diagram of another example of the control circuit 28 in the first embodiment. As illustrated in FIG. 15, by making the control signal ENSLP an individual signal for each block 24A to 24C, the blocks 24A to 24C can be put into the sleep state individually. Other configurations are the same as those of FIG. 12, and the description thereof is thus omitted.

[Simulation]

The BET and the latency of the store operation were simulated for the electronic circuit in accordance with the first embodiment. A comparative example 1-1 and a comparative example 1-2 were also simulated. In the comparative example 1-1, the sub-arrays 22 and the blocks 24 are not shut down collectively, and the store operations for the blocks 24 for which the SFBF is set are skipped sequentially. In the comparative example 1-2, the collective shutdown based on the UDFs is not performed, and only the collective shutdown based on the SFBFs is performed.

The simulation conditions are as follows. The voltage V2, which is the power supply voltage VVDD−VGND during the read/write period, the store period, and the restore period, was set at 1.2 V. The voltage V1, which is the power supply voltage VVDD−VGND during the sleep period, was set at 0.8 V, and the voltage of the control line CTRL was set at 0 V. The voltage of the switch line SR during the store period was set at 0.75 V. The voltages of the high level and the low level of the control line CTRL during the store period was set at 0.45 V and at 0 V, respectively. The memory capacities of the sub-array 22 and the block 24 were configured to be 8 kbytes and 1 kbyte, respectively.

The proportion of the number of store-free memory cells based on the SFBFs to the number of all memory cells in the cell array 20 was defined as an SFBF store-free proportion. The proportion of the number of store-free memory cells based on the UDFs to the number of all memory cells in the cell array 20 was defined as a UD proportion. Considering that the memory cells 10 written in a volatile manner are concentrated in the specific sub-array 22 and the specific block 24 in the cell array 20, the time taken for the store operation was defined as the store latency. Simulations were conducted for the cases where the memory capacity of the cell array 20 was 32 kbytes, 256 kbytes, and 2 Mbytes.

Figure 16A:
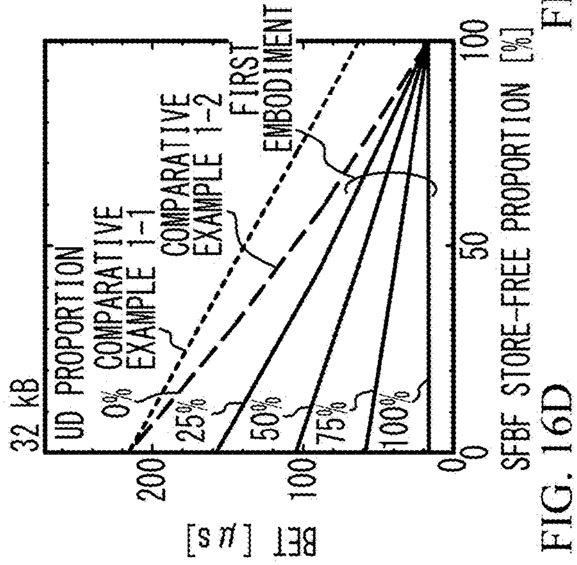
FIG. 16A to FIG. 16C are graphs of BET versus an SFBF store-free proportion in the first embodiment and comparative examples 1-1 and 1-2.
Figure 16B:
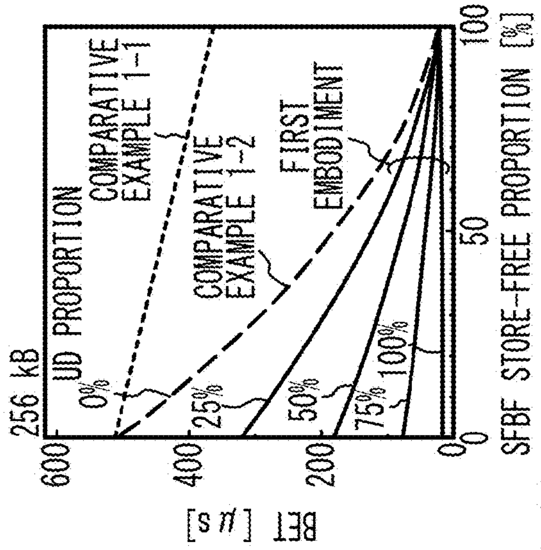
Figure 16C:
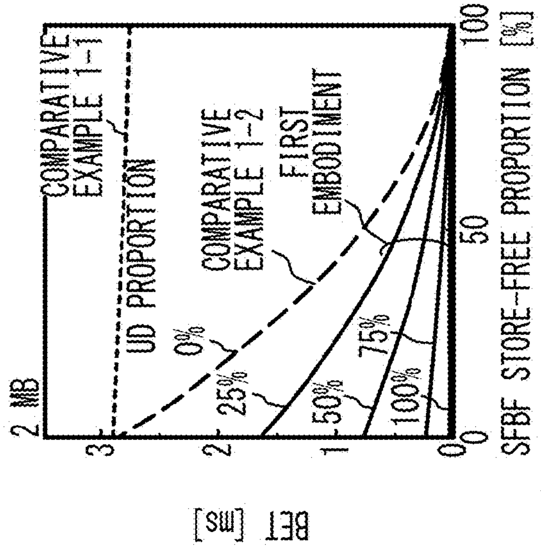
Figure 16D:
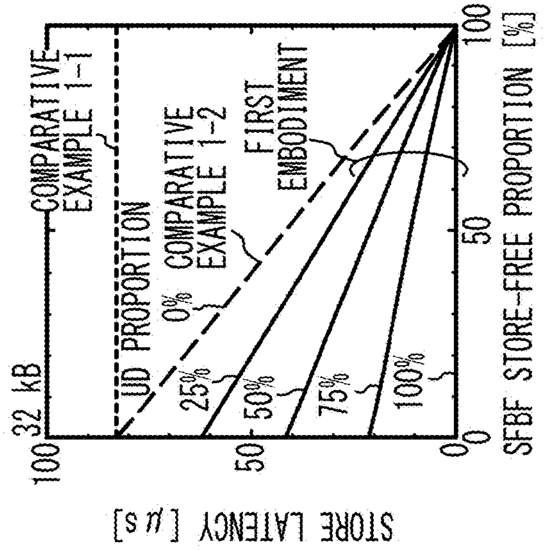
FIG. 16D to FIG. 16F are graphs of store latency versus the SFBF store free proportion.
Figure 16E:
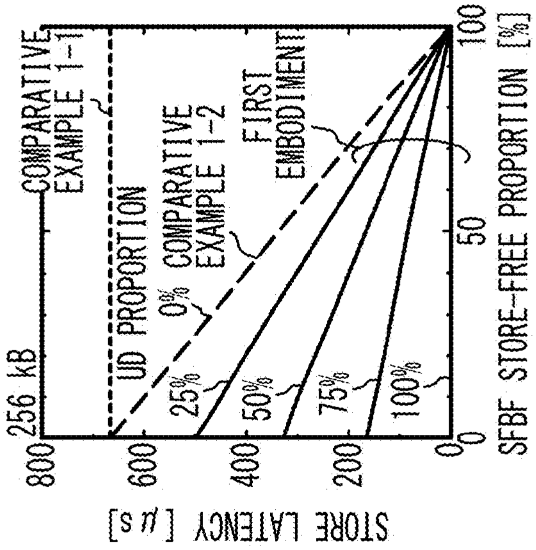
Figure 16F:
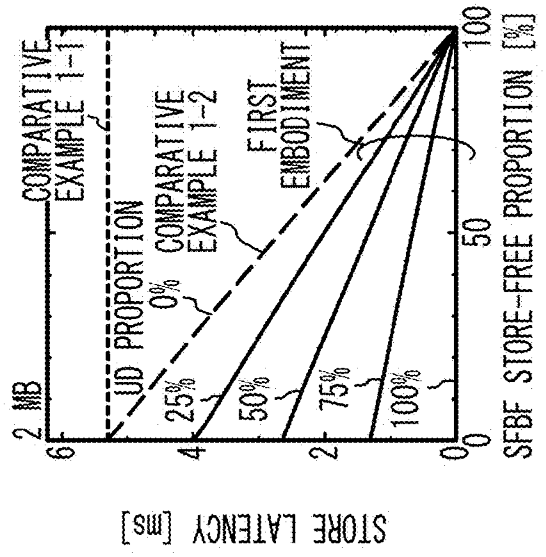

FIG. 16A to FIG. 16C are graphs of the BET versus the SFBF store-free proportion in the first embodiment and the comparative examples 1-1 and 1-2, and FIG. 16D to FIG. 16F are graphs of the store latency versus the SFBF store-free proportion. As illustrated in FIG. 16A, in the comparative example 1-1, in the case of 32 kbytes, as the store-free proportion increases, the BET decreases.

As presented in FIG. 16B and FIG. 16C, in the comparative example 1-1, when the memory capacity is large such as 256 kbytes and 2 Mbytes, the BET does not become as small as the BET when the memory capacity is 32 kbytes illustrated in FIG. 16A even though the SFBF store-free proportion increases. This is because of the following reasons. That is, as the memory capacity increases, the number of the blocks 24 waiting for the store operation become larger. Leakage current flows through the memory cell 10 even during standby for the store operation. Thus, the leakage current in the entire cell array 20 is large, and therefore, the BET does not decrease even though the store-free proportion increases.

As illustrated in FIG. 16D to FIG. 16F, in the comparative example 1-1, the store latency is constant regardless of the store-free proportion.

As presented in FIG. 16A to FIG. 16C, in the comparative example 1-2, as the memory capacity increases, the absolute value of the BET increases. In all the memory capacities, as the store-free proportion increases, the BET decreases. As presented in FIG. 16D to FIG. 16F, in the comparative example 1-2, as the memory capacity increases, the store latency increases. In all the memory capacities, as the store-free proportion increases, the store latency decreases. This is because the store-free block 24 is shut down first in the comparative example 1-2.

As presented in FIG. 16A to FIG. 16C, in the first embodiment, compared with the comparative example 1-2, as the UD proportion increases, the BET decreases. As presented in FIG. 16D to FIG. 16F, in the first embodiment, compared with the comparative example 1-2, as the UD proportion increases, the store latency decreases.

In the first embodiment, as illustrated in FIG. 1, each memory cell 10 includes the bistable circuit 12 that stores data in a volatile manner, and a non-volatile element that stores the data stored in the bistable circuit 12 in a non-volatile manner and restores the data stored in a non-volatile manner to the bistable circuit 12. As described in step S42 of FIG. 8, when shutting down (powering off) the cell array 20, the control circuit 28 shuts down one or more first memory cells that store, in a volatile manner, data that are not required to be stored in a non-volatile manner among the memory cells 10 regardless of whether the one or more first memory cells 10 have been rewritten in a volatile manner. As in steps S44 and S46, after the first memory cells are shut down, the store operation that stores data stored in a volatile manner in the bistable circuit 12 in the non-volatile element is performed in remaining one or more second memory cells of the memory cells. As in step S48, thereafter, the control circuit 28 shuts down the second memory cells.

This can reduce the power consumption for performing the store operation on the remaining second memory cells after the first memory cells, which store, in a volatile manner, data that are not required to be stored in a non-volatile manner regardless of whether the first memory cells are rewritten in a volatile manner, are shut down. In addition, the store latency can be reduced.

As illustrated in FIG. 4 and FIG. 5, the cell array 20 is divided into a plurality of the blocks 24 each including at least two memory cells 10. As in step S40 of FIG. 8, when shutting down (powering off) the cell array 20, the control circuit 28 extracts one or more first blocks that store, in a volatile manner, data that are not required to be stored in a non-volatile manner (i.e., the blocks for which the UDF is set) regardless of whether the memory cells 10 in the block 24 are rewritten in a volatile manner. As in step S42 of FIG. 8 and FIG. 9A, the control circuit 28 shuts down the first blocks. As illustrated in step S46 of FIG. 8 and FIG. 9B, after shutting down the first blocks, the control circuit 28 performs the store operation that stores data stored in the bistable circuit 12 in the non-volatile element in the memory cells 10 of the remaining one or more second blocks of the blocks 24. As described in step S48 of FIG. 8 and FIG. 9C, the control circuit 28 shuts down the second block for which the store operation is completed.

As described above, since the first blocks for which the UDF is set are shut down among the blocks 24, the power consumption for performing the store operation on the first blocks can be reduced. In addition, the store latency can be reduced. In addition, since the first blocks for which the UDF is set are shut down first, the power consumption due to the leakage current during standby for the store operation can be reduced.

As described in FIG. 9A, after shutting down all the first blocks that have been extracted, the control circuit 28 performs the store operation in the memory cells 10 in the remaining second blocks as illustrated in FIG. 9B to FIG. 9D. This can reduce the power consumption during the period when the first blocks for which the UDF is set wait for shutdown.

The resistor 40 (a memory circuit) is provided outside the cell array 20, and stores the UDFs (information indicating the first blocks that store, in a volatile manner, data that are not required to be stored in a non-volatile manner) received from the external circuit. The control circuit 28 extracts the first blocks based on the UDFs. As a result, compared with a method that provides a memory circuit that stores the UDF to each sub-array 22 or each block 24, the control is simplified because the UDF is not required to be transferred to the control circuit 28 through the bus 25 or the like.

As described in step S40 of FIG. 8, the control circuit 28 extracts, from among the blocks 24, the block for which the UDF is set and the block 24 for which the SFBF is set (i.e., the block in which none of the memory cells 10 in the block 24 has been rewritten in a volatile manner), as the first block. As a result, the block for which the UDF is set and the block for which the SFBF is set are shut down first. Thus, the power consumption due to the leakage current during the standby for the store operation can be reduced. In addition, the store latency can be reduced.

The resistor 41 (the memory circuit) is provided outside the cell array 20. Thus, compared with the method that stores the SFBF in each sub-array 22 or each block 24, the control is simplified because it is not necessary to transfer the SFBF to the control circuit 28 through the bus 25.

The first embodiment describes an example where the MTJ1 and the MTJ2 are coupled to the nodes Q and QB, respectively. However, it is sufficient if one of the MTJ1 and the MTJ2 is coupled to the node Q or QB. It is sufficient if the memory cell includes the bistable circuit 12 and the non-volatile element. The MTJ is described as an example of the non-volatile element, but the non-volatile element can be a giant magnetoresistive (GMR) element, a variable resistive element used in a resistance random access memory (ReRAM), or a phase change element used in a phase change RAM (PRAM).

Second Embodiment

When the technique of Patent Document 5 is applied to the cell array, the ULV retention of the VNR-SRAM is performed by decreasing the power supply voltage after switching the mode from a boosted inverter (BI) mode to a Schmitt trigger (ST) mode. As the size of the cell array increases, the power consumption due to the leakage current in the memory cell waiting for the mode switching increases. In addition, due to the standby period, the latency increases. In addition, even when data in the memory cell are unnecessary data, the retention is performed. This increases the power consumption and the latency.

The objective of a second embodiment is to reduce the power consumption and the energy consumption. More specifically, the objective is to reduce the power consumption and the energy consumption during PG (during the retention), during the transition to PG, and during the return from PG and reduce the BET associated with PG.

In the second embodiment, when data is written in the cell array, or data is processed, the memory cells storing data that are data unnecessary after power recovery are shut down, and the retention is performed on the remaining memory cells. This can reduce the power consumption and the latency because the mode switching for the memory cells that store data that are not required to be retained is not required.

More specifically, the cell array is divided into a plurality of blocks. The UDF that specifies the block having the memory cell having data that are data unnecessary after power recovery is generated. During the retention, based on the UDF, the block that stores data that are not required to be retained is shut down. Thereafter, the retention is performed in other blocks. This reduces the power consumption and the latency because the mode switching for the block that stores data that are not required to be retained is not required. In addition, since the block that stores data that are not required to be retained is shut down, the power consumption can be further reduced.

Hereinafter, the details of the second embodiment will be described.

[Description of the Memory Cell]

Figure 17:
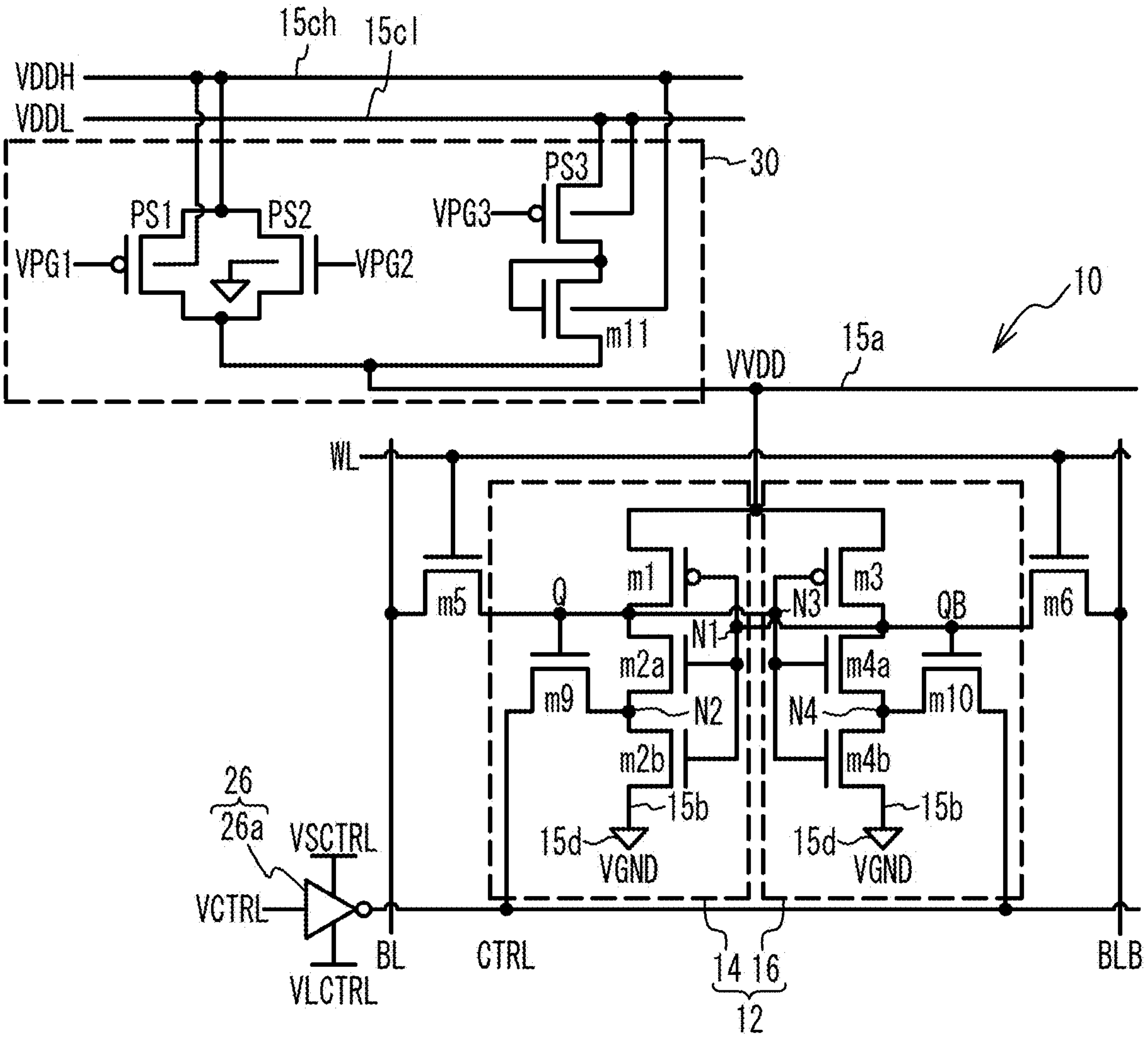
FIG. 17 is a circuit diagram of a memory cell in accordance with a second embodiment.

FIG. 17 is a circuit diagram of the memory cell in the second embodiment. As illustrated in FIG. 17, the memory cell 10 mainly includes the inverter circuits 14 and 16.

The inverter circuits 14 and 16 are connected in a loop shape to form the bistable circuit 12. The inverter circuit 14 includes FETs m1, m2*a*, m2*b*, and m9. The inverter circuit 16 includes FETs m3, m4*a*, m4*b*, and m10. The FETs m1 and m3 are P channel MOSFETs, and the FETs m2*a*, m2*b*, m4*a*, m4*b*, m9, and m10 are N channel MOSFETs. The sources of the FETs m1 and m3 are coupled to the power supply line 15*a* to which the virtual power supply voltage VVDD is applied, and the drains are coupled to the nodes Q and QB, respectively. The FETs m2*a* and m2*b* are connected in series between the node Q and the ground line 15*b* to which the ground voltage VGND is applied, the source of the FET m2*b* is coupled to the ground line 15*b*, and the drain of the FET m2*a* is coupled to the node Q. The FETs m4*a* and m4*b* are connected between the node QB and the ground line 15*b* in the similar manner.

The input node of the inverter circuit 14 is a node N1 to which the FETs m1, m2*a*, and m2*b* are commonly connected, and the output node of the inverter circuit 14 is the node Q. The input node of the inverter circuit 16 is a node N3 to which the FETs m3, m4*a*, and m4*b* are commonly coupled, and the output node of the inverter circuit 16 is coupled to the node QB. The input node and the output node of the inverter circuit 14 are coupled to the output node and the input node of the inverter circuit 16, respectively.

One of the source and the drain of the FET m9 is coupled to a node N2 between the FETs m2*a* and m2*b*, the other is coupled to the control line CTRL, and the gate is coupled to the node Q. One of the source and the drain of the FET m10 is coupled to a node N4 between the FETs m4*a* and m4*b*, the other is coupled to the control line CTRL, and the gate is coupled to the node QB.

An inverter 26*a* is a driver 26 for the control line CTRL, inverts the control signal VCTRL, and outputs a control signal of which the voltage of the high level is a voltage VSCTRL and the voltage of the low level is a voltage VLCTRL. When the control signal VCTRL has the high level, the control line CTRL has the VLCTRL, and the inverter circuits 14 and 16 are in the BI mode. When the control signal VCTRL has the low level, the control line CTRL has the VSCTRL, and the inverter circuits 14 and 16 are in the ST mode.

The nodes Q and QB are coupled to the bit lines BL and BLB through the MOSFETs m5 and m6, respectively. The gates of the MOSFETs m5 and m6 are coupled to the word line WL.

The BI mode is a mode characterized by there being substantially no hysteresis in the transfer characteristics of the inverter circuits 14 and 16, and the inverter circuits 14 and 16 can operate at high speed. The ST mode is a mode characterized by there being hysteresis in the transfer characteristics of the inverter circuits 14 and 16, and the inverter circuits 14 and 16 operate at low speed. The term "substantially no hysteresis" means no intentional hysteresis such as the hysteresis in the ST mode, and unintentional hysteresis is acceptable.

In the BI mode, the memory cell 10 serves as a typical SRAM cell. In the ST mode, data in the bistable circuit 12 is retained even when the power supply voltage VVDD−VGND) is set at, for example, 0.2 V, which is ultralow voltage (ULV).

The power switch 30 includes power switches PS1, PS2, and PS3. The power switches PS1 and PS2 are connected in parallel between a power source 15*ch* with high voltage and the power supply line 15*a*. The power switches PS1 and PS2 are, for example, a P channel FET and an N channel FET, respectively. The PS control signals VPG1 and VPG2 are applied to the gates of the power switches PS1 and PS2, respectively. The substrate bias of the power switch PS1 and the substrate bias of the power switch PS2 are, for example, a VDDH and the VGND, respectively.

The power switch PS3 and an FET m11 are connected in series between a power source 15*cl* with low voltage and the power supply line 15*a*. The power switch PS3 and the FET m11 are a P channel FET and an N channel FET, respectively. The FET m11 serves as a load. A PS control signal VPG3 is applied to the gate of the power switch PS3. The substrate bias of the power switch PS3 and the substrate bias of the FET m11 are, for example, a VDDL and the VDDH, respectively. As in the first embodiment, the power switch 30 may be provided between the ground line 15*b* and the ground 15*d*. The power switch 30 may be provided both between the power supply line 15*a* and at least one of the power sources 15*ch* and 15*cl* and between the ground line 15*b* and the ground 15*d*.

[Description of Each State]

Figures 18A, 18B:
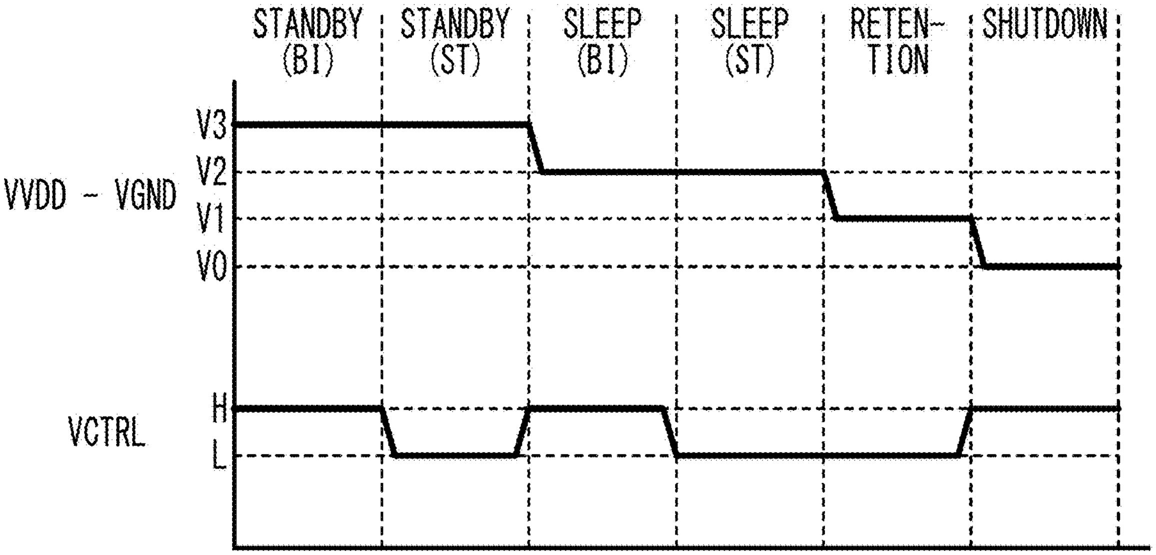
FIG. 18A and FIG. 18B present voltages applied in each state in the second embodiment.

FIG. 18A and FIG. 18B present voltages applied in each state in the second embodiment. As presented in FIG. 18A, in the standby state, the VPG1, the VPG2, and the VPG3 have the low level L, the low level L, and the high level H, respectively. The power switches PS1, PS2, and PS3 are ON, OFF, and OFF, respectively. As a result, the power supply voltage VVDD−VGND is a voltage V3. The voltage V3 is, for example, 1.2 V.

In the sleep state, the VPG1, the VPG2, and the VPG3 have the H, the H, and the H, respectively. The power switches PS1, PS2, and PS3 are OFF, ON, and OFF, respectively. As a result, the power supply voltage VVDD−VGND is the voltage V2 lower than the voltage V3. The voltage V2 is, for example, 0.8 V.

In the retention state, the VPG1, the VPG2, and the VPG3 have the H, the L, and the L, respectively. The power switches PS1, PS2, and PS3 are OFF, OFF and ON, respectively. As a result, the power supply voltage VVDD−VGND is the voltage V1 lower than the voltage V2. The voltage V1 is, for example, 0.2 V.

In the shutdown state, the VPG1, the VPG2, and the VPG3 have the H, the L, and the H, respectively. The power switches PS1, PS2, and PS3 are OFF, OFF, and OFF, respectively. The power supply voltage VVDD−VGND is the voltage V0 lower than the voltage V1. The voltage V0 is approximately 0 V.

As illustrated in FIG. 18B, in the standby state, the power supply voltage VVDD−VGND is the voltage V3. The control signal VCTRL may have either the L or the H. When the VCTRL has the H, the memory cell 10 is in the BI mode, and when the VCTRL has the L, the memory cell 10 is in the ST mode. The standby (BI) state is the same as the read/write state of the first embodiment, and is a state where data in the bistable circuit 12 can be rewritten as a typical SRAM. The power supply voltage VVDD−VGND is the voltage V3 at which the bistable circuit 12 can rewrite data and retain data.

In the sleep state, the power supply voltage VVDD−VGND is the voltage V2 lower than the voltage V3. The control signal VCTRL may have either the L or the H. When the VCTRL has the H, the memory cell 10 is in the BI mode, and when the VCTRL is the L, the memory cell 10 is in the ST mode. The power supply voltage VVDD−VGND is the voltage V2 at which the bistable circuit 12 cannot rewrite data but can retain data. Since the voltage V2 is lower than the voltage V3, the power consumption can be reduced.

In the retention state, the power supply voltage VVDD−VGND is the voltage V1 lower than the voltage V2. The control signal VCTRL has the L, and the memory cell 10 is in the ST mode. The power supply voltage VVDD−VGND is the voltage V1 at which the bistable circuit 12 cannot retain data in the BI mode but can retain data in the ST mode. In the retention state, the memory cell 10 is in a virtually nonvolatile state, and the voltage V1 can be therefore made to be lower than the voltage V2. Thus, the power consumption can be significantly reduced.

In the shutdown state, the power supply voltage VVDD−VGND is the voltage V0 lower than the voltage V1. The control signal VCTRL has the H, and the memory cell 10 is in the BI mode. In the shutdown state, the power consumption of the memory cell 10 is substantially 0.

Figure 19A:
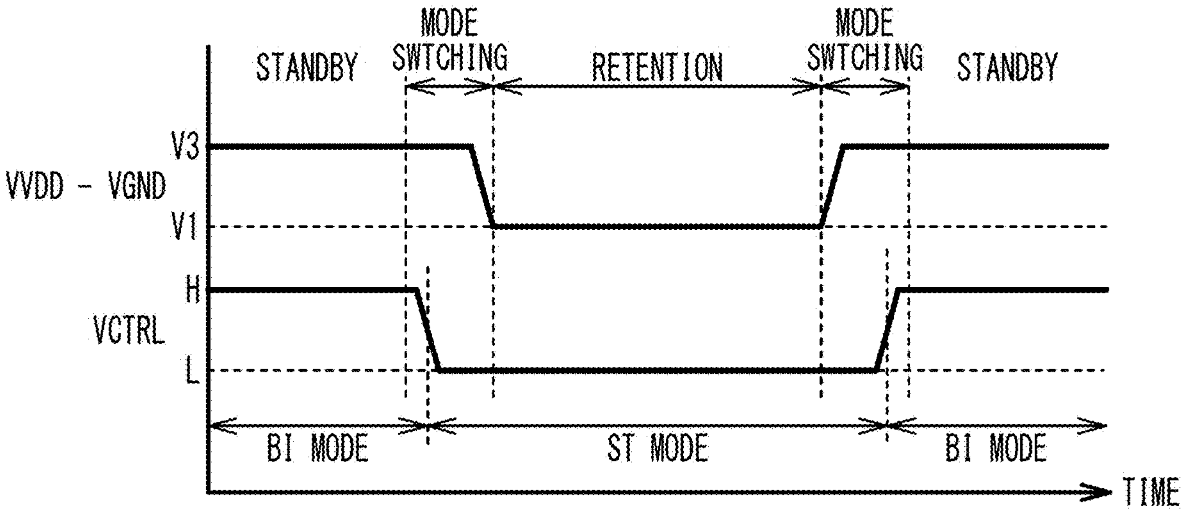
FIG. 19A and FIG. 19B illustrate voltages applied during retention and during shutdown in the second embodiment, respectively.
Figure 19B:
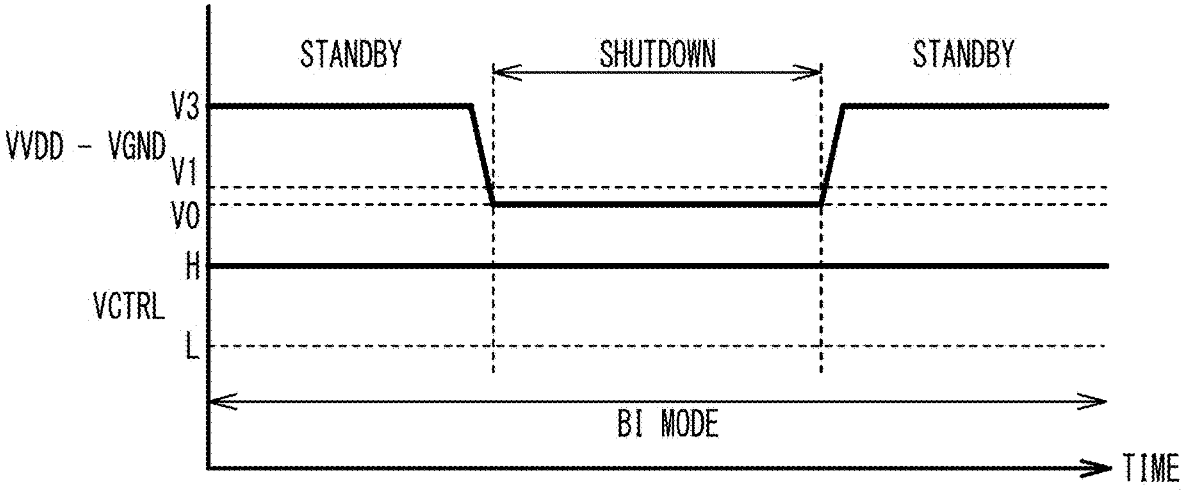

FIG. 19A and FIG. 19B illustrate voltages applied during retention and during shutdown in the second embodiment. As illustrated in FIG. 19A, in the standby state, the power supply voltage VVDD−VGND is the voltage V3, the control signal VCTRL has the H, and the memory cell 10 is in the BI mode. During the mode switching period, the VCTRL is set at the L first. As a result, the memory cell 10 enters the ST mode. Thereafter, the power supply voltage VVDD−VGND is set at the voltage V1. As a result, the memory cell 10 enters the retention state. Thereafter, during the mode switching period, the power supply voltage VVDD−VGND is set at the voltage V3. Thereafter, the VCTRL is set at the H. This causes the memory cell 10 to return to the standby state. As described above, before and after the memory cell 10 is put into the retention state, the mode switching is performed.

As illustrated in FIG. 19B, in the standby state, when the power supply voltage VVDD−VGND is changed to the voltage V0, the memory cell 10 enters the shutdown state. At this time, the VCTRL maintains the H, and the memory cell 10 maintains the BI mode. When the power supply voltage VVDD−VGND is changed to the voltage V3, the memory cell 10 returns to the standby state.

Figure 20:
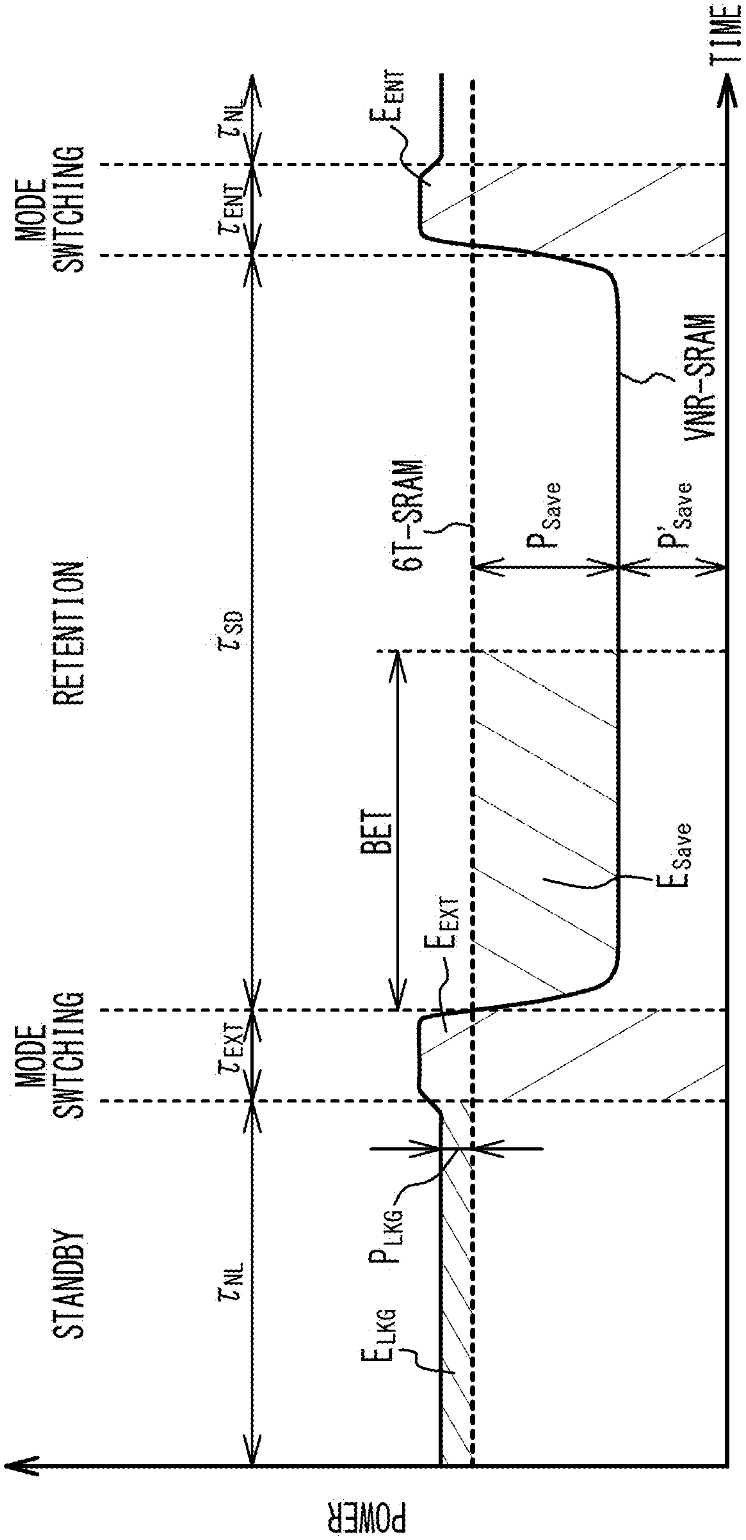
FIG. 20 illustrates power consumption during each period in the second embodiment.

FIG. 20 illustrates the power consumption during each period in the second embodiment. The solid line indicates the power consumption (power) of the memory circuit including the memory cell 10 (the VNR-SRAM) illustrated in FIG. 17. The dotted line indicates the power consumption of the memory circuit using a 6-transistor SRAM (6T-SRAM) cell.

As illustrated in FIG. 20, the operation period of the memory cell 10 includes the standby period, the mode switching period, and the retention period. The length of the standby period is represented by $\tau_{NL}$. The length of the mode switching period before the retention period is represented by $\tau_{EXT}$. The length of the retention period is represented by $\tau_{SD}$. The length of the mode switching period after the retention period is represented by $\tau_{ENT}$.

The power consumption during the standby period of the VNR-SRAM is larger than the power consumption of the 6T-SRAM by $P_{LKG}$. This is due to the leakage currents of the FETs m9 and m10. In the VNR-SRAM, the power consumption for mode switching is required during the mode switching period. During the retention period, the power consumption of the VNR-SRAM is $P'_{Save}$, and the VNR-SRAM can reduce the power consumption by $P_{Save}$ compared with the 6T-SRAM.

The energy increase of the VNR-SRAM cell relative to the 6T-SRAM cell is the sum of the energy increase $E_{LKG}$ due to $P_{LKG}$ during the standby period and the energy increases $E_{EXT}$ and $E_{ENT}$ during the mode switching period. The energy that the VNR-SRAM cell can save by the retention is the energy decrease $E_{Save}$ due to $P_{Save}$ during the retention period. $E_{LKG}+E_{EXT}+E_{ENT}=P_{Save}\times$BET. When the standby period during which reading/writing of the bistable circuit 12 is not performed is equal to or greater than the BET, the memory cell 10 is put into the retention state, and when is equal to or less than the BET, the memory cell 10 is put into the standby state. This can reduce the energy at significantly high efficiency.

Figure 21A:
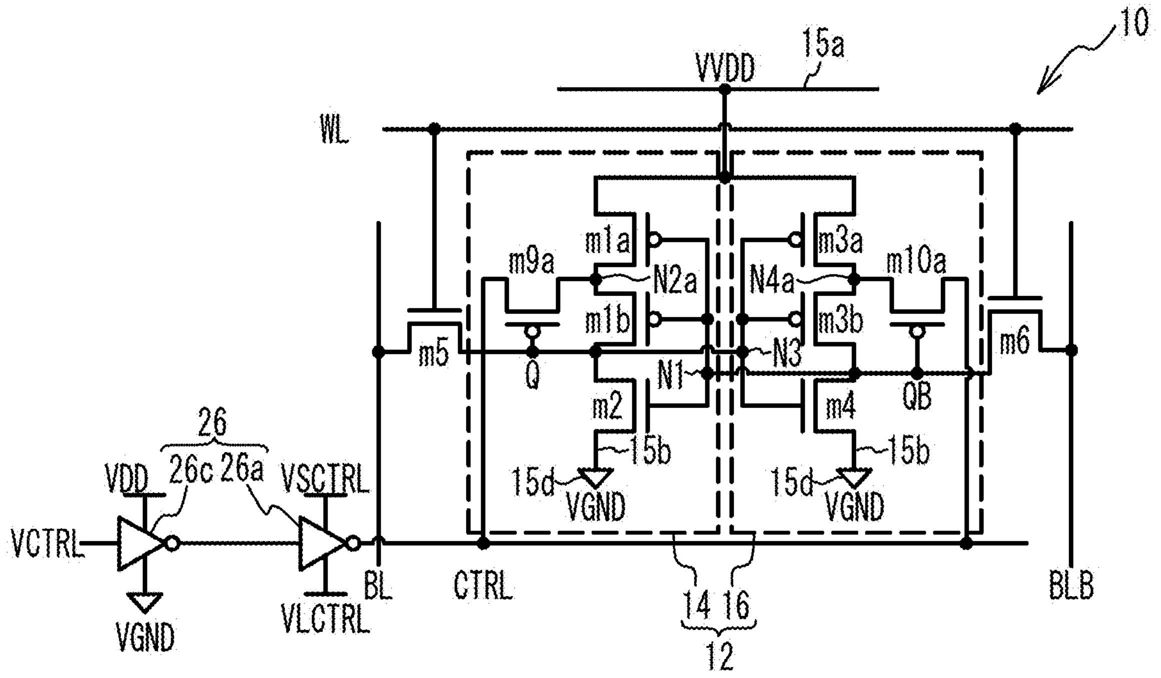
FIG. 21A and FIG. 21B illustrate other examples of the memory cell in the second embodiment.
Figure 21B:
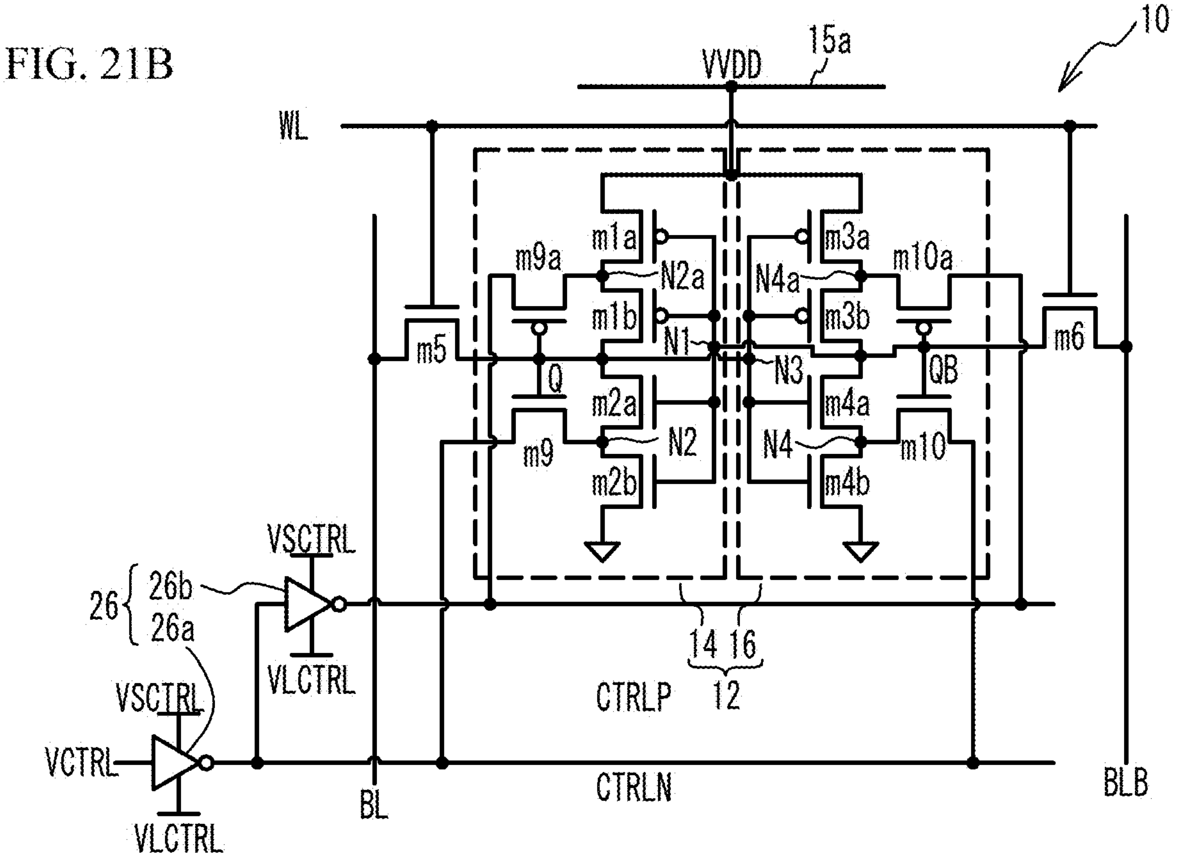

FIG. 21A and FIG. 21B are other examples of the memory cell in the second embodiment. As illustrated in FIG. 21A, the inverter circuit 14 includes FETs m1*a*, m1*b*, m2, and m9*a*, and the inverter circuit 16 includes FETs m3*a*, m3*b*, m4, and m10*a*. The FETs m1*a*, m1*b*, m3*a*, m3*b*, m9*a*, and m10*a* are P channel FETs, and the FETs m2 and m4 are N channel FETs. One of the source and the drain of the FET m9*a* is coupled to a node N2*a* between the FETs m1*a* and m1*b*, and one of the source and the drain of the FET m10*a* is coupled to a node N4*a* between the FETs m3*a* and m3*b*.

The driver 26 includes an inverter 26*c* in the previous stage of the inverter 26*a*. When the VCTRL has the L, the inverter 26*c* outputs the VDD, the inverter 26*a* outputs the VLCTRL as the CTRL, and the inverter circuits 14 and 16 are in the BI mode. When the VCTRL has the H, the inverter 26*c* outputs the VGND, the inverter 26*a* outputs the VSCTRL as the CTRL, and the inverter circuits 14 and 16 are in the ST mode. Other configurations are the same as those illustrated in FIG. 17, and the description thereof is thus omitted. The power supply voltage and the ground voltage of the inverter 26*c* are the VDD and the VGND, respectively, but as with the inverter 26*a*, the power supply voltage and the ground voltage may be the VSCTRL and the VLCTRL, respectively. The driver 26 may be composed of only the inverter 26*a* instead of the inverters 26*a* and 26*c*.

As illustrated in FIG. 21B, the inverter circuit 14 includes the FETs m1*a*, m1*b*, m2*a*, m2*b*, m9, and m9*a*, and the inverter circuit 16 includes the FETs m3*a*, m3*b*, m4*a*, m4*b*, m10, and m10*a*. The FETs m1*a*, m1*b*, m3*a*, m3*b*, m9*a*, and m10*a* are P channel FETs, and the FETs m2*a*, m2*b*, m4*a* and m4*b*, m9, and m10 are N channel FETs.

One of the source and the drain of the FET m9*a* and one of the source and the drain of the FET m10*a* are coupled to a control line CTRLP, and the other of the source and the drain of the FET m9 and the other of the source and the drain of the FET m10 are coupled to a control line CTRLN. The driver 26 includes inverters 26*a* and 26*b*. The inverter 26*a* outputs a signal to the control line CTRLN. The inverter 26*b* inverts the output of the inverter 26*a*, and outputs the resulting output to the control line CTRLP. Other configurations are the same as those illustrated in FIG. 17 and FIG. 21A, and the description thereof is thus omitted.

As illustrated in FIG. 21A and FIG. 21B, in the inverter circuits 14 and 16, it is sufficient if at least, the P channel FETs m1*a* and m3*a* are connected in series in plural or the N channels FET m2 and m4 are connected in series in plural. It is sufficient if at least, the P channel FETs m9*a* and m10*a* are provided or the N channel FETs m9 and m10 are provided.

[Description of the Electronic Circuit]

Figure 22:
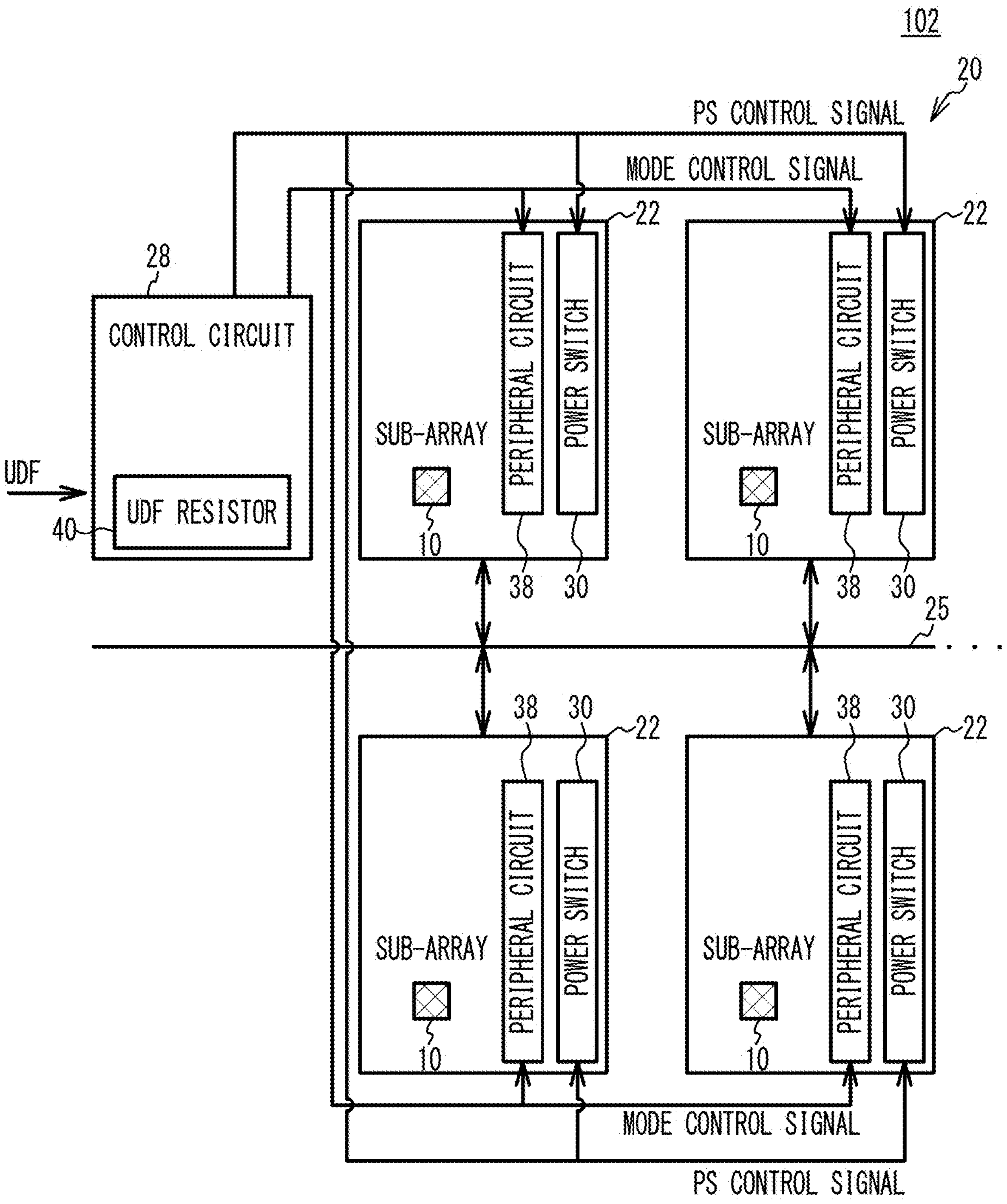
FIG. 22 is a block diagram illustrating the electronic circuit in the second embodiment.

FIG. 22 is a block diagram of the electronic circuit in the second embodiment. As illustrated in FIG. 22, an electronic circuit 102 includes the cell array 20 and the control circuit 28. The cell array 20 is divided into a plurality of the sub-arrays 22. The memory capacity of the sub-array 22 is, for example, 8 kbytes. A plurality of the memory cells 10 are provided in a matrix form in the sub-array 22. The sub-array 22 is coupled to the bus 25. The number of the sub-arrays 22 can be freely designed.

The sub-array 22 includes the power switch 30 and the peripheral circuit 38. The power switch 30 sets a power supply voltage for the corresponding sub-array 22. The peripheral circuit 38 controls the mode of each memory cell 10 based on a mode control signal.

The control circuit 28 includes the resistor 40. The control circuit 28 stores the UDF of each block received from the external circuit in the resistor 40. The control circuit 28 controls the power switch 30 of each sub-array 22 using the PS control signal. The control circuit 28 inputs/outputs data to/from the sub-array 22 through the bus 25. At least one of the functions of the control circuit 28 may be implemented by cooperation between a processor circuit such as an external CPU and software.

[Description of the Sub-Array]

Figure 23:
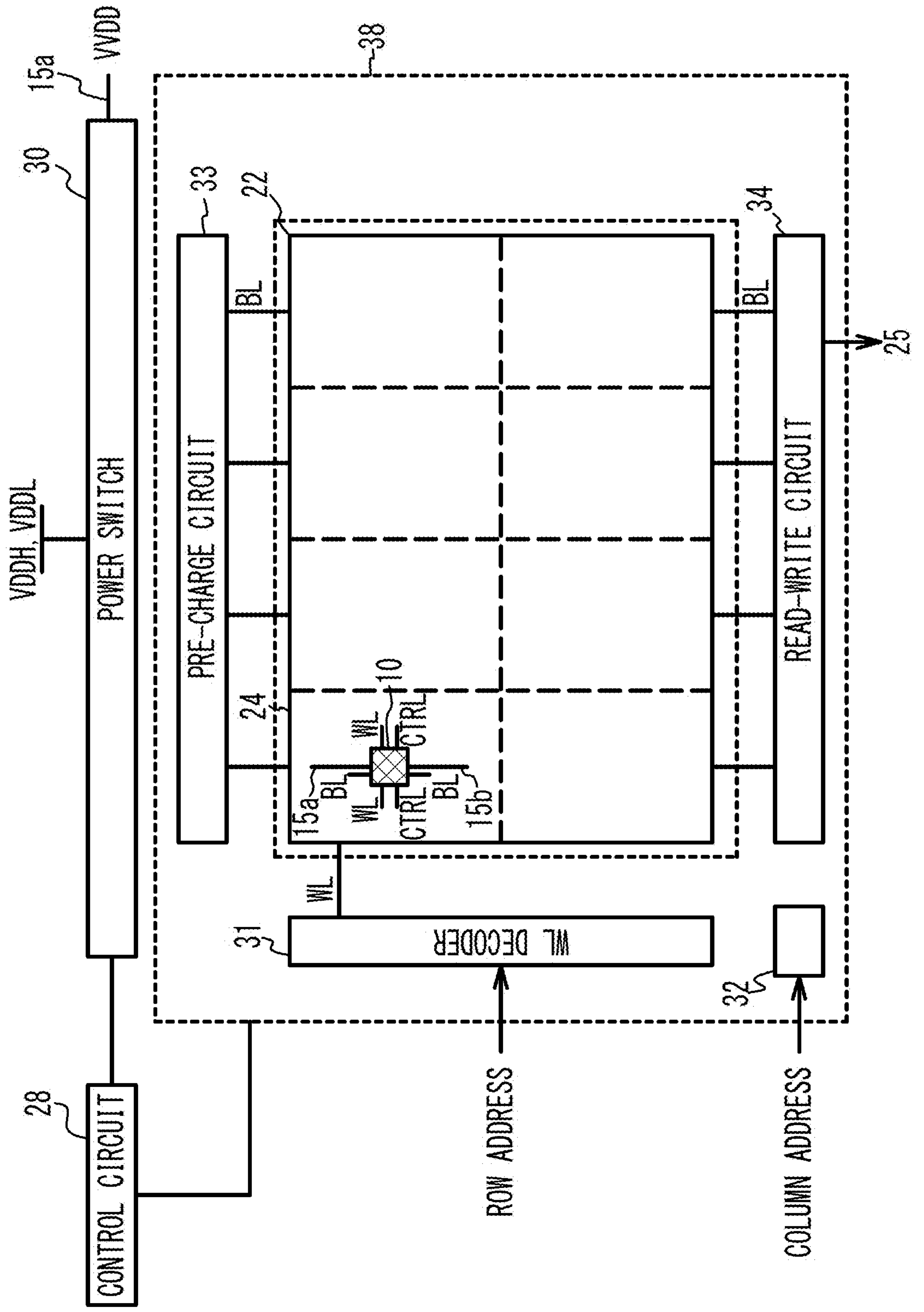
FIG. 23 is a block diagram of the sub-array in the second embodiment.

FIG. 23 is a block diagram of the sub-array in the second embodiment. As illustrated in FIG. 23, the sub-array 22 is divided into a plurality of the blocks 24 (for example, 8 blocks 24) each including the memory cell 10. The memory capacity of the block 24 is, for example, 1 kbyte. The number of the blocks 24 can be freely designed. A plurality of the memory cells 10 are arranged in a matrix form in the sub-array 22. In the sub-array 22, the word line WL and the control line CTRL extend in the row direction, and the bit line BL extends in the column direction. The word line WL, the bit line BL, the control line CTRL, and the power supply line 15*a*, and the ground line 15*b* are coupled to each memory cell 10.

The power switch 30 and the peripheral circuit 38 are provided to correspond to each sub-array 22. The control circuit 28 controls the power switch 30 and the peripheral circuit 38.

The power switch 30 can set the power supply voltage VVDD−VGND at the voltage V3, V2, V1, and V0 individually for each block 24. The peripheral circuit 38 includes the WL decoder 31, the column decoder 32, the pre-charge circuit 33, and the read-write circuit 34.

During the standby period, the WL decoder 31 selects the word line WL based on the row address. The column decoder 32 selects the bit line BL based on the column address. The pre-charge circuit 33 pre-charges the bit line BL. The read-write circuit 34 writes data in the bistable circuit 12 of the memory cell 10 selected by the WL decoder 31 and the column decoder 32 or reads data from the bistable circuit 12 and outputs the read data to the bus 25.

During the retention period, the control circuit 28 puts one or more memory cells 10 into the ST mode, and sets the VVDD at the voltage V1. As a result, the memory cell 10 enters the retention state.

[Description of the Operation]

Figure 24:
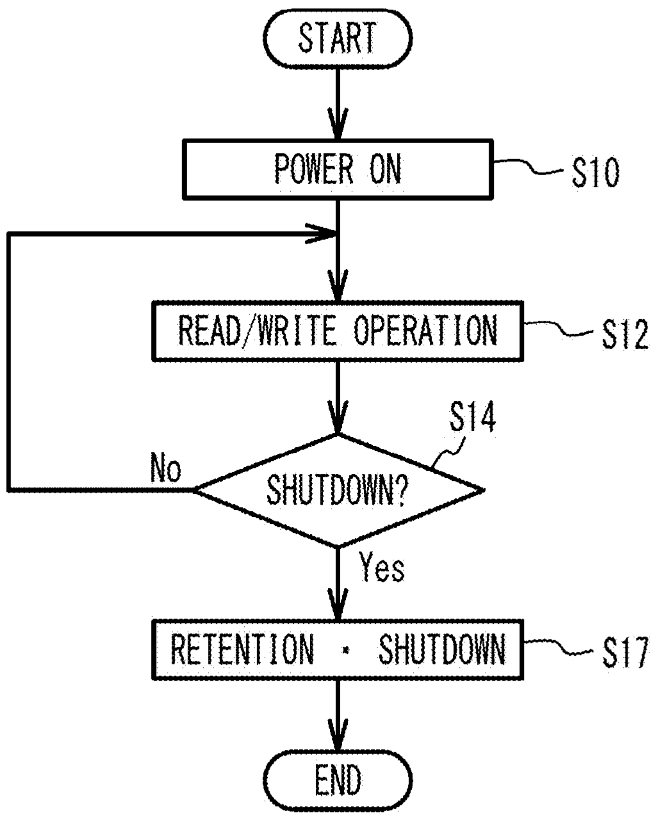
FIG. 24 is a flowchart illustrating the operation in the second embodiment.

FIG. 24 is a flowchart illustrating the operation in the second embodiment. As illustrated in FIG. 24, the control circuit 28 powers on the cell array 20 according to an instruction from the external circuit (step S10). For example, the control circuit 28 puts the memory cells 10 of all the blocks 24 into the BI mode, turns on the power switch PS1, and turns off the power switches PS2 and PS3. As a result, all the blocks 24 enter the standby state.

The control circuit 28 performs the read and write operation in the standby state (step S12). The control circuit 28 determines whether an instruction to shut down the cell array 20 has been received from the external circuit (step S14). When the determination is No, the process returns to step S12. When the determination is Yes, the control circuit 28 performs the retention operation and shutdown (step S17). Thereafter, the process returns to step S10.

[Description of the UDF Setting]

The operation of setting the UDF is the same as that of the first embodiment illustrated in FIG. 7B, and the description thereof is thus omitted.

[Description of a Type A of the Retention Operation]

Figure 25:
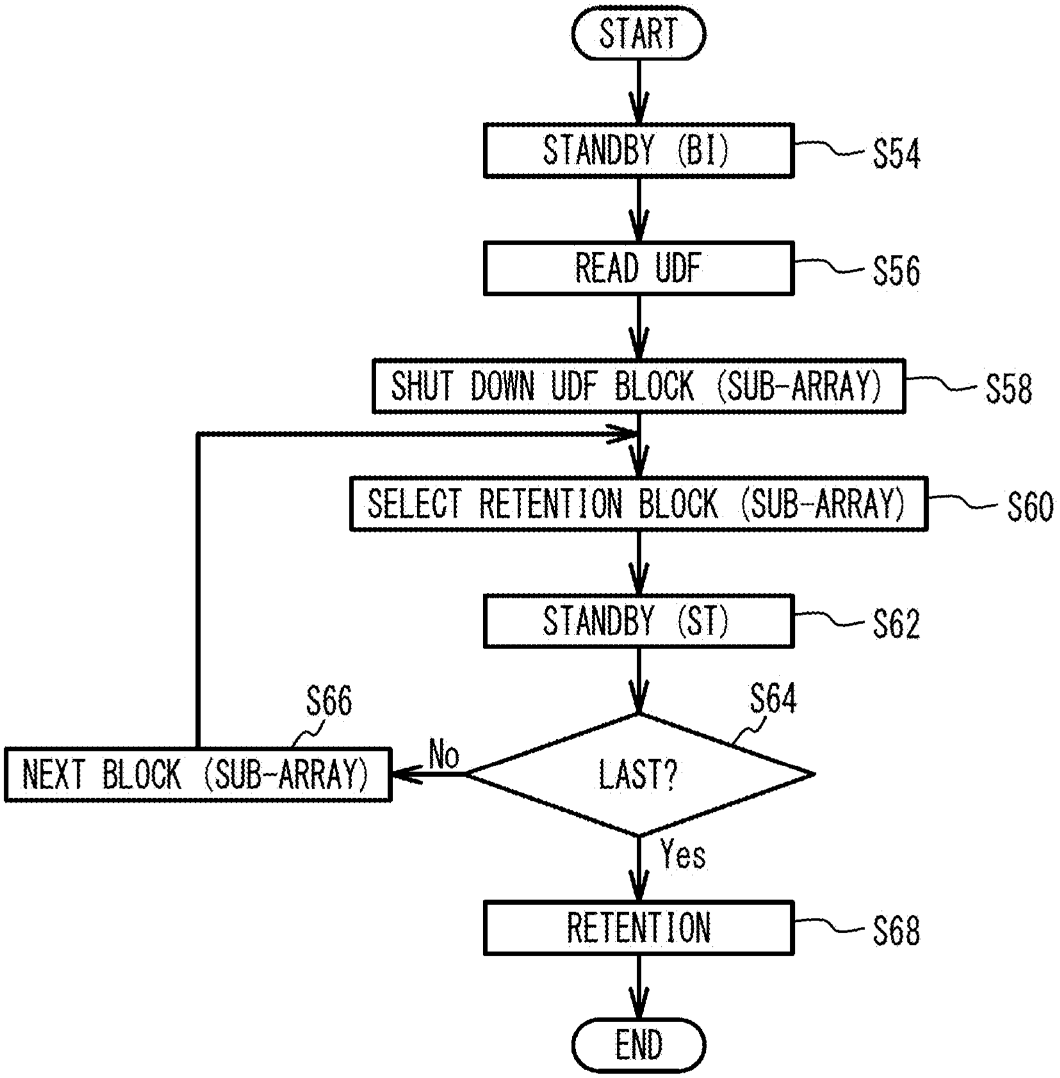
FIG. 25 is a flowchart illustrating a type A of a retention operation in the second embodiment.

As the operation in step S17 of FIG. 24, a type A of the retention operation will be described. FIG. 25 is a flowchart illustrating the type A of the retention operation in the second embodiment. FIG. 26A to FIG. 26E schematically illustrate the cell array in the type A of the retention operation in the second embodiment. FIG. 27A to FIG. 27E schematically illustrate the cell array and the blocks in the type A of the retention operation in the second embodiment. FIG. 26A to FIG. 26E illustrate an example where the retention operation is performed in a unit of the sub-array 22, and FIG. 27A to FIG. 27E illustrate an example where the retention operation is performed in a unit of the block 24. The basic operation is the same regardless of whether the retention operation is performed in a unit of the sub-array 22 or a unit of the block 24. The same applies to types B and C of the retention operation.

Figure 26A:
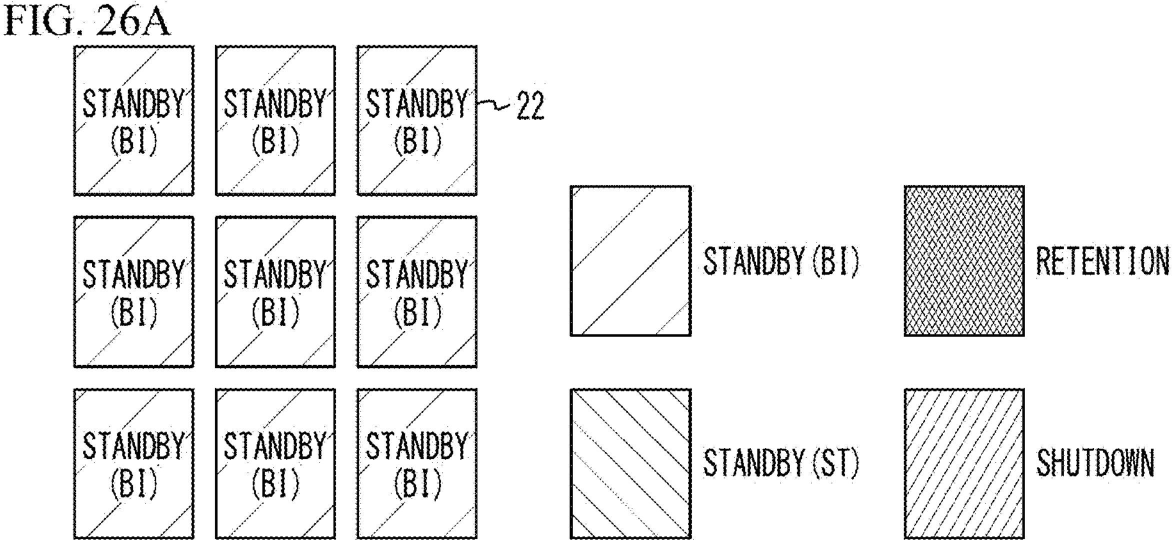
FIG. 26A to FIG. 26E schematically illustrate the cell array in the type A of the retention operation in the second embodiment.
Figure 27A:
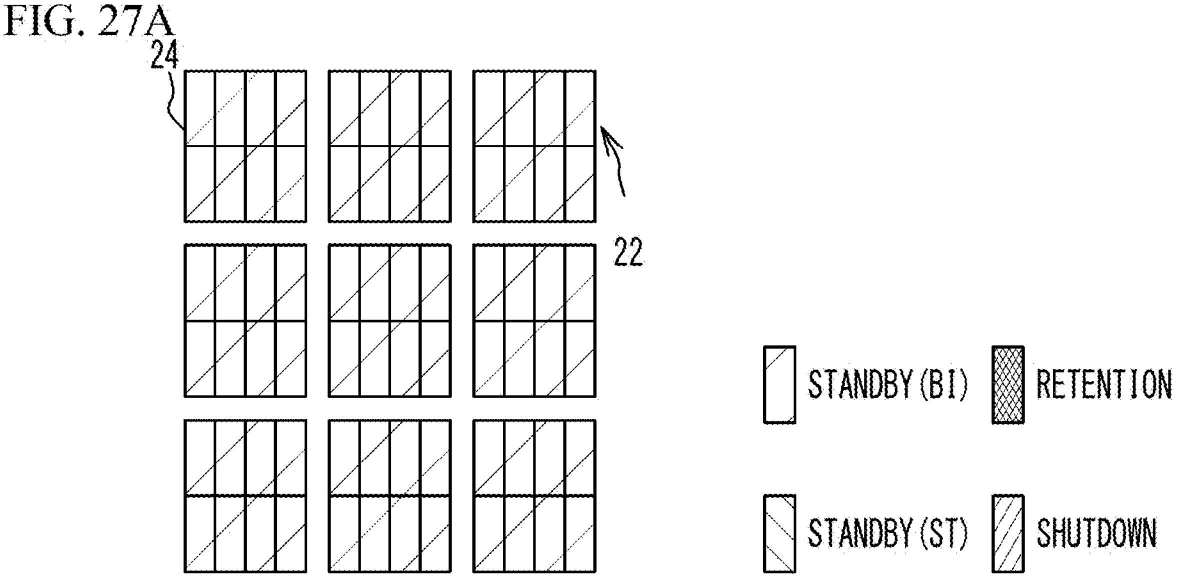
FIG. 27A to FIG. 27E schematically illustrate the cell array and the blocks in the type A of the retention operation in the second embodiment.

In step S17 of FIG. 24, the control circuit 28 starts the retention operation. As illustrated in FIG. 25, at this time, each block 24 (or each sub-array 22) is in the standby (BI) state (step S54). For example, the control circuit 28 sets the power supply voltages VVDD–VGND of all the blocks 24 (the sub-arrays 22) at the voltage V3, and sets the control signals VCTRL at the H. As illustrated in FIG. 26A, all the sub-arrays 22 are in the standby (BI) state. As illustrated in FIG. 27A, all the blocks 24 are in the standby (BI) state.

Figure 26B:
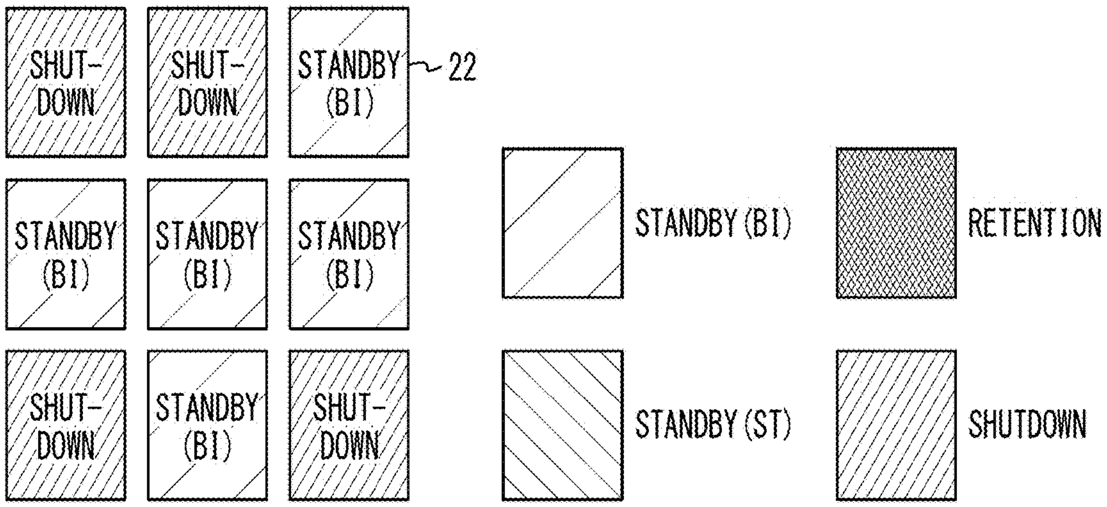
Figure 27B:
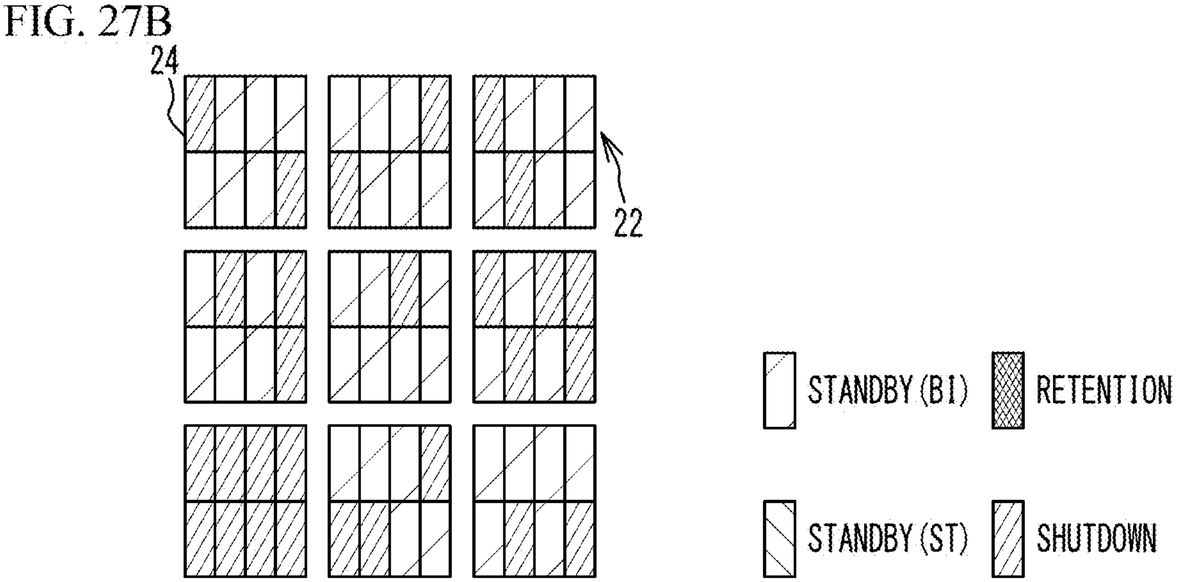

The control circuit 28 reads the UDFs corresponding to the blocks 24 (or the sub-arrays 22) from the resistor 40 (step S56). The control circuit 28 extracts the blocks 24 (the sub-arrays 22) for which the UDF is set (for example, the blocks 24 with the high level H), and collectively shuts down the extracted blocks 24 (the extracted sub-arrays 22) (step S58). For example, the control circuit 28 sets the power supply voltages VVDD–VGND of the extracted blocks 24 (the extracted sub-arrays 22) at the voltage V0. As illustrated in FIG. 26B, the control circuit 28 puts 4 sub-arrays 22 into the shutdown state among the 9 sub-arrays 22, collectively. As illustrated in FIG. 27B, the control circuit 28 puts 28 blocks 24 into the shutdown state among the 72 blocks 24, collectively.

Figure 26C:
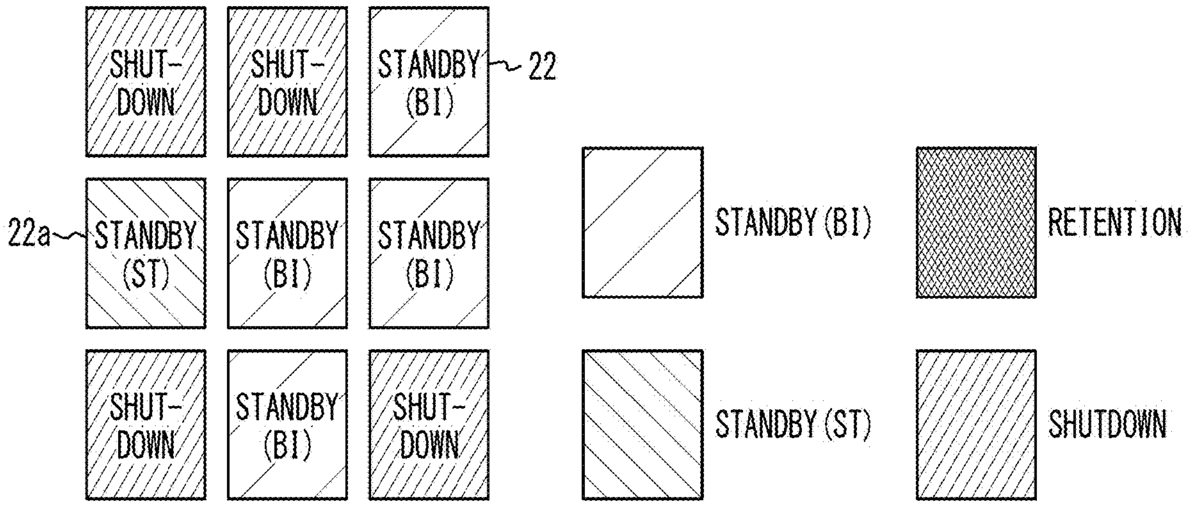
Figure 27C:
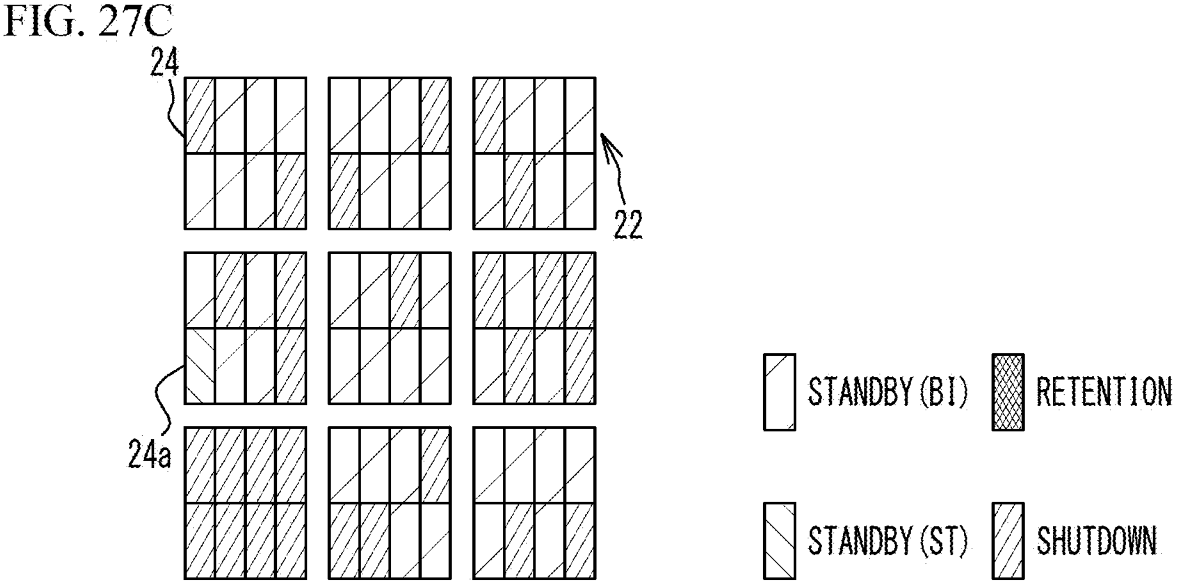

The control circuit 28 selects the first block 24*a* (the sub-array 22*a*) for which the UDF is not set (i.e., the first block 24*a* (the sub-array 22*a*) subject to the retention) (step S60). The control circuit 28 puts the first block 24*a* (the sub-array 22*a*) into the standby (ST) state (step S62). For example, the control circuit 28 sets the control signal VCTRL at the L while setting the power supply voltage VVDD–VGND of the block 24*a* (the sub-array 22*a*) at the voltage V3. As illustrated in FIG. 26C, the sub-array 22*a* enters the standby (ST) state. As illustrated in FIG. 27C, the block 24*a* enters the standby (ST) state.

Figure 26D:
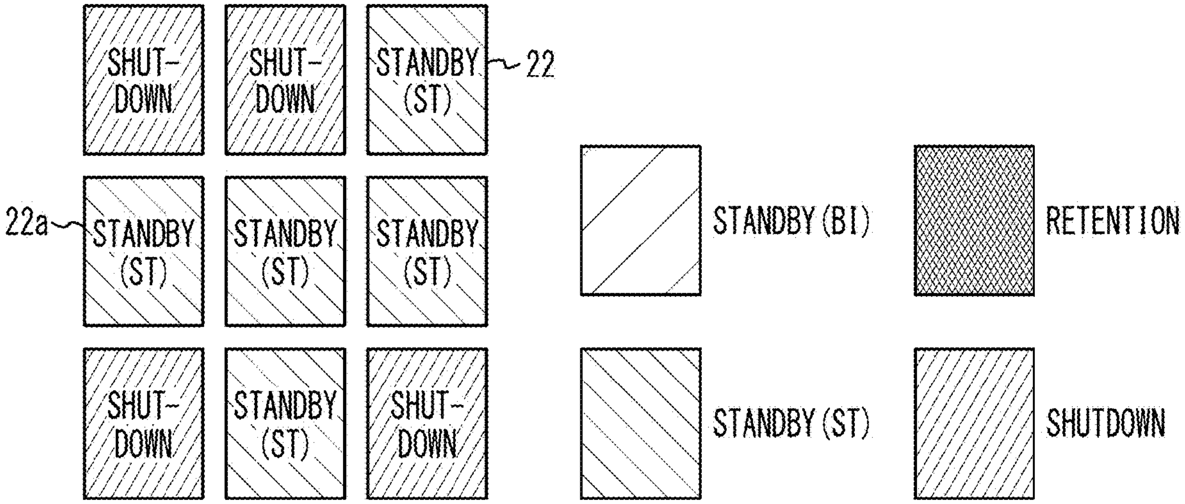
Figure 27D:
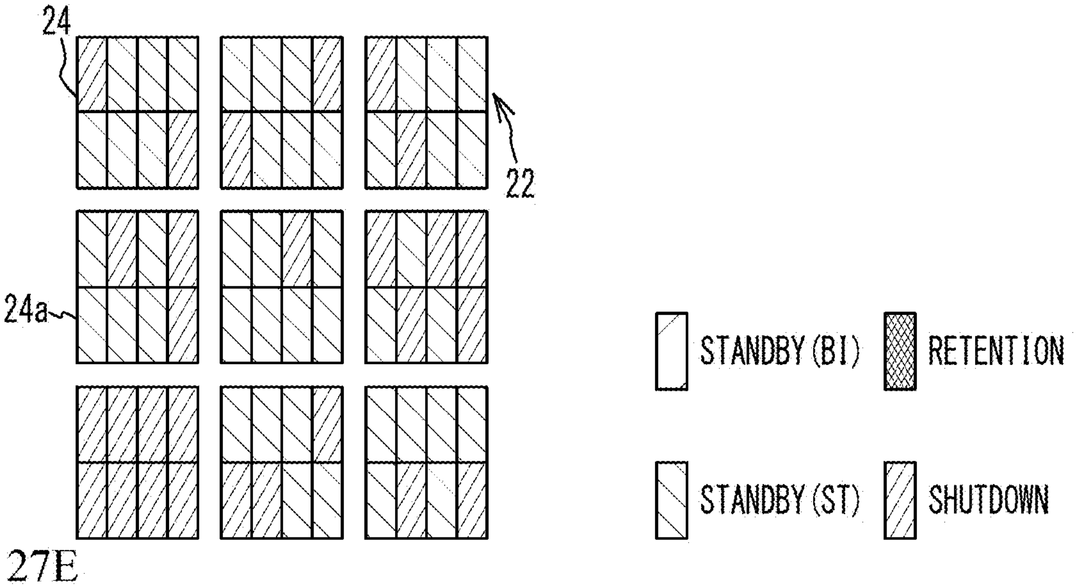

The control circuit 28 determines whether the block 24 (the sub-array 22) is the last block 24 (the last sub-array 22) (step S64). When the determination is No, the control circuit 28 proceeds to the processing of the next block 24 (the next sub-array 22) (step S66), and the process returns to step S60. The blocks 24 (the sub-arrays 22) subject to the retention are put into the standby (ST) state, sequentially. As illustrated in FIG. 26D, all the sub-arrays 22 subject to the retention enter the standby (ST) state. As illustrated in FIG. 27D, all the blocks 24 subject to the retention enter the standby (ST) state.

Figure 26E:
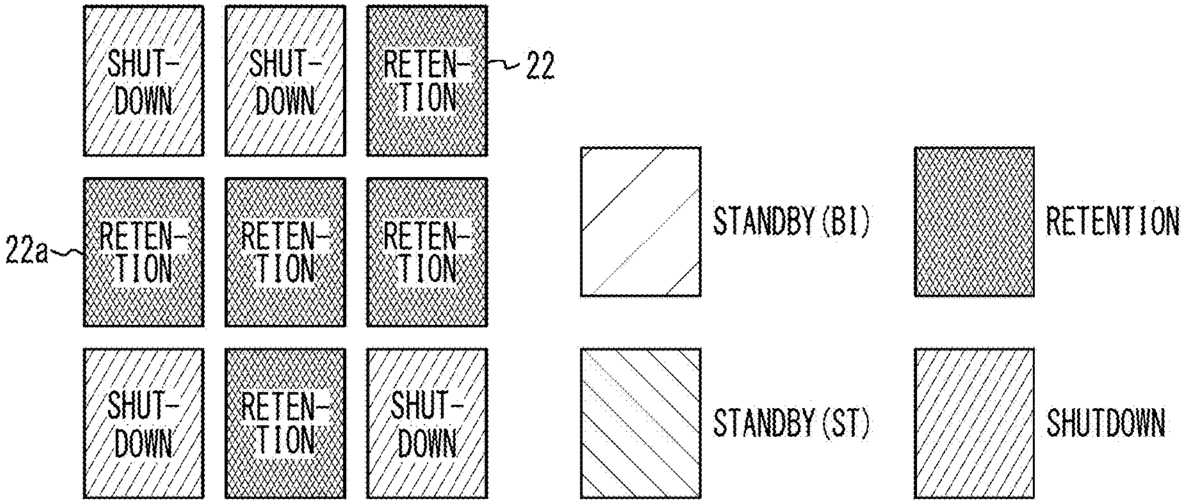
Figure 27E:
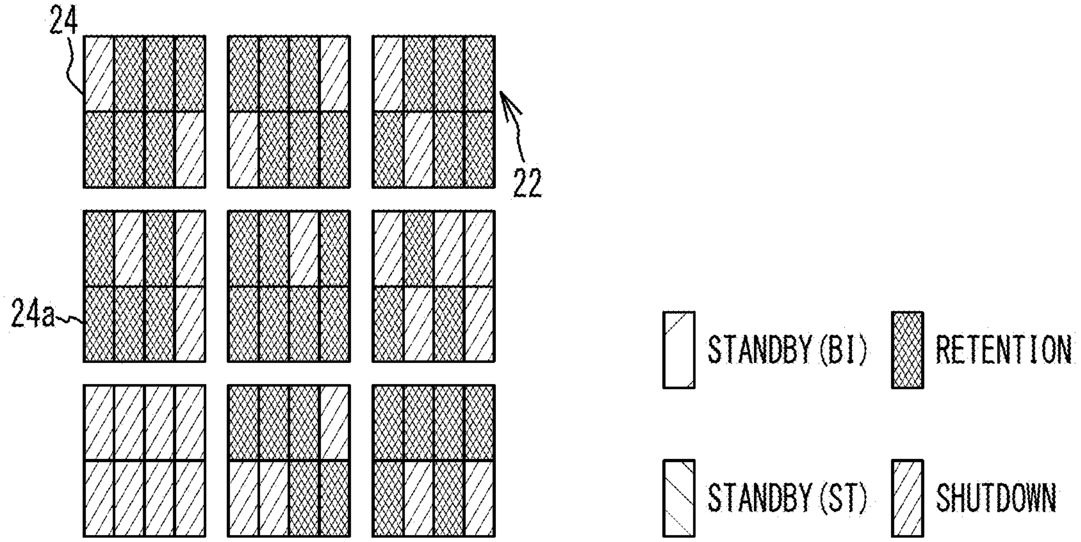

When the determination is Yes in step S64, the control circuit 28 puts all the blocks 24 (the sub-arrays 22) subject to the retention into the retention state collectively or in a unit of multiple blocks 24 (the sub-arrays 22) (step S68). As illustrated in FIG. 26E, all the sub-arrays 22 subject to the retention enter the retention state. As illustrated in FIG. 27E, all the blocks 24 subject to the retention enter the retention state. Thereafter, the process ends.

[Description of a Type B of the Retention Operation]

Figure 28:
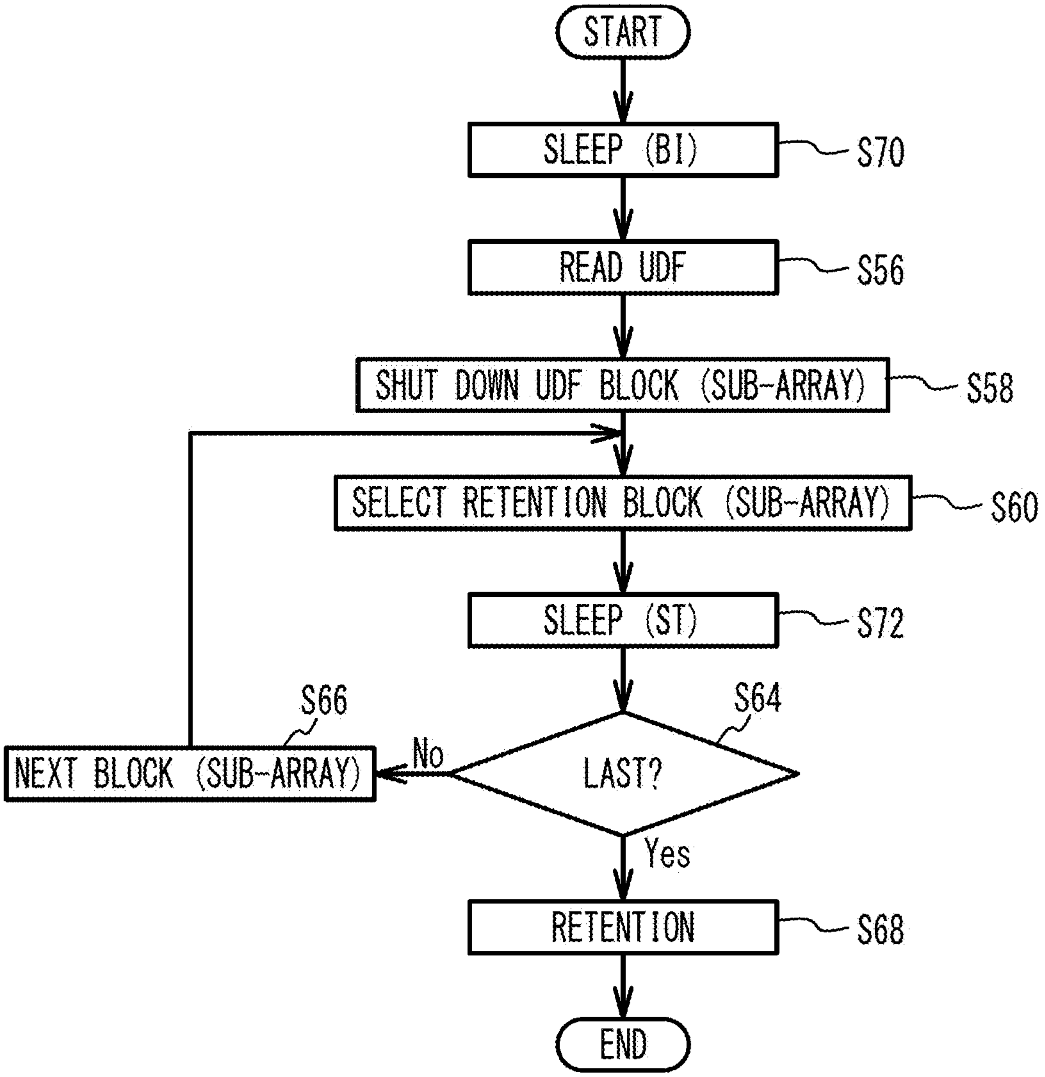
FIG. 28 is a flowchart illustrating a type B of the retention operation in the second embodiment.

A type B of the retention operation will be described. FIG. 28 is a flowchart illustrating the type B of the retention operation in the second embodiment. FIG. 29A to FIG. 29E schematically illustrate the cell array in the type B of the retention operation in the second embodiment. FIG. 30A to FIG. 30E schematically illustrate the cell array and the blocks in the type B of the retention operation in the second embodiment.

Figure 29A:
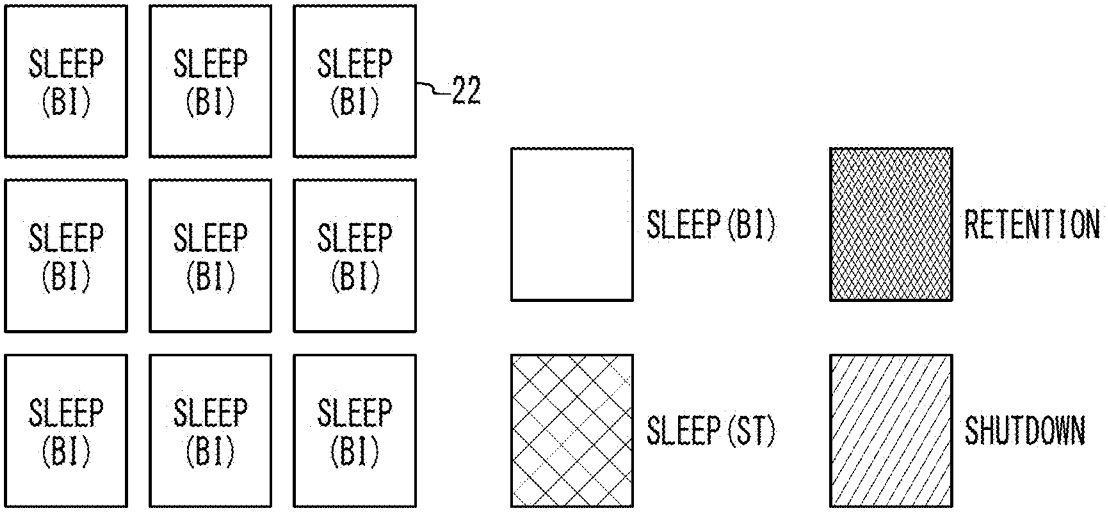
FIG. 29A to FIG. 29E schematically illustrate the cell array in the type B of the retention operation in the second embodiment.
Figure 30A:
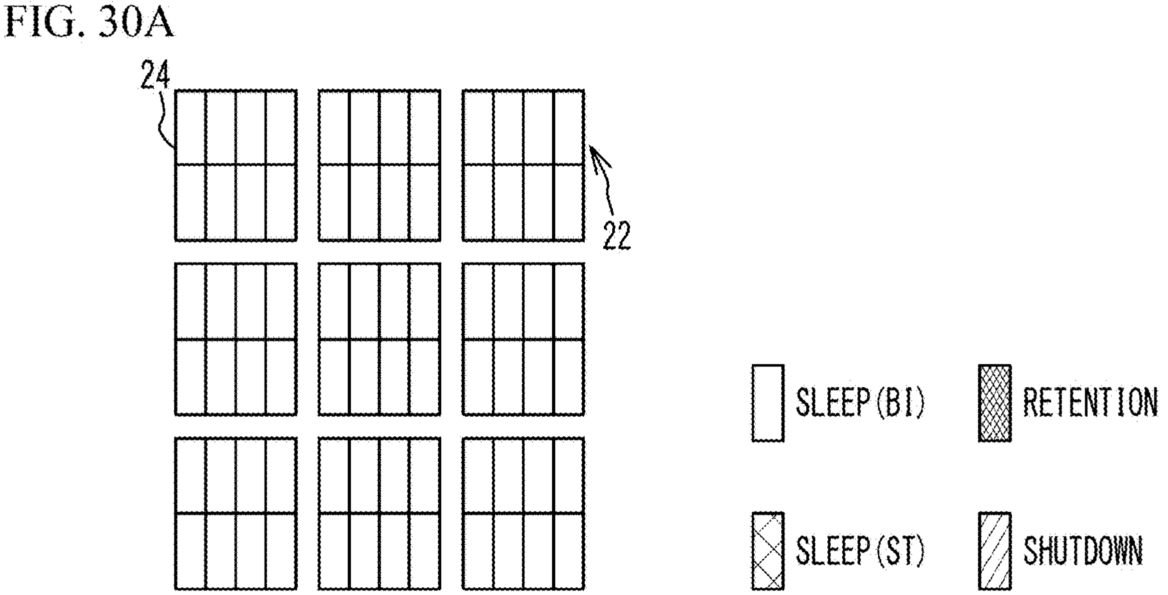
FIG. 30A to FIG. 30E schematically illustrate the cell array and the blocks in the type B of the retention operation in the second embodiment.

As illustrated in FIG. 28, the control circuit 28 sets each block 24 (or each sub-array 22) into the sleep (BI) state (step S70). For example, the control circuit 28 sets the power supply voltages VVDD–VGND of all the blocks 24 (all the sub-arrays 22) at the voltage V2, and sets the control signals VCTRL at the H. As illustrated in FIG. 29A, all the sub-arrays 22 are in the sleep (BI) state. As illustrated in FIG. 30A, all the blocks 24 are in the sleep (BI) state.

Figure 29B:
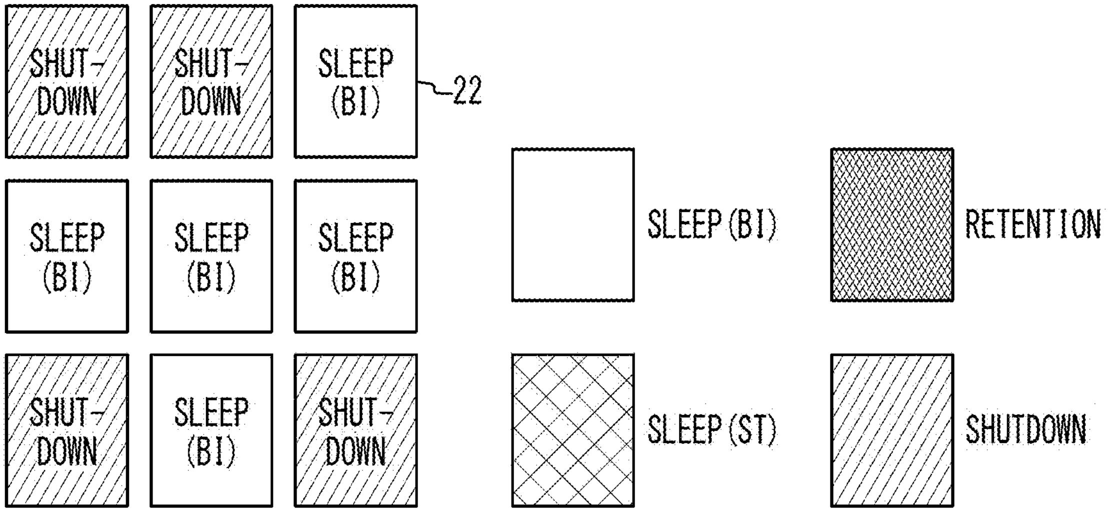
Figure 30B:
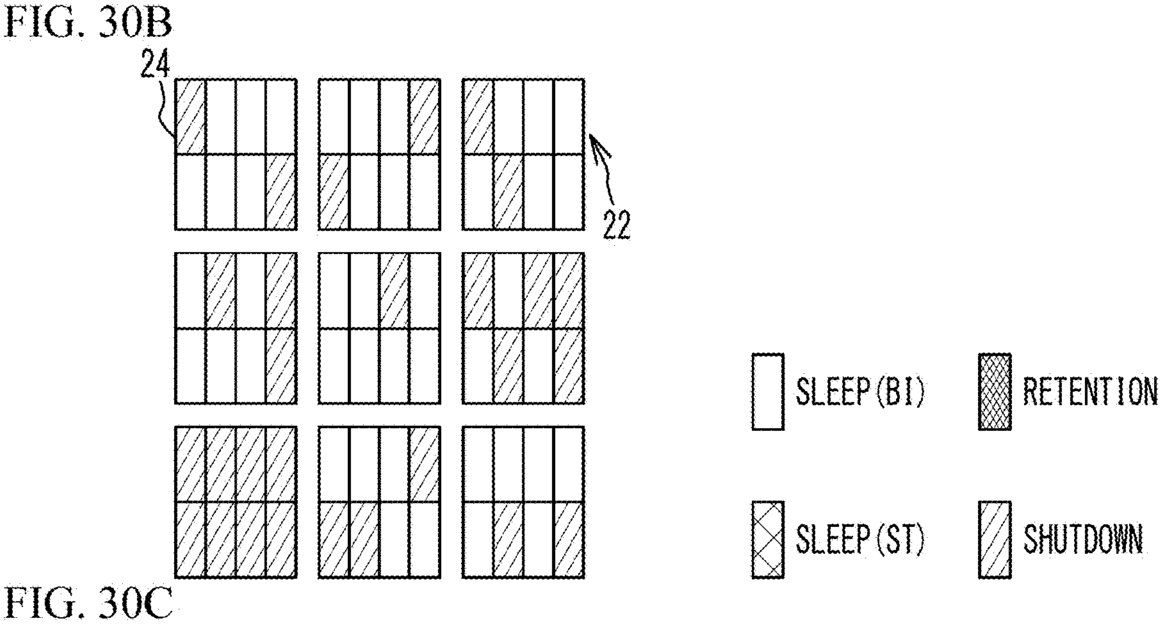

The control circuit 28 extracts the blocks 24 (the sub-arrays 22) for which the UDF read in step S56 is set (for example, the blocks 24 with the high level H), and shuts down the extracted blocks 24 (the extracted sub-arrays 22) collectively (step S58). As illustrated in FIG. 29B, the control circuit 28 shuts down 4 sub-arrays 22 collectively. As illustrated in FIG. 30B, the control circuit 28 shuts down 28 blocks 24 collectively.

Figure 29C:
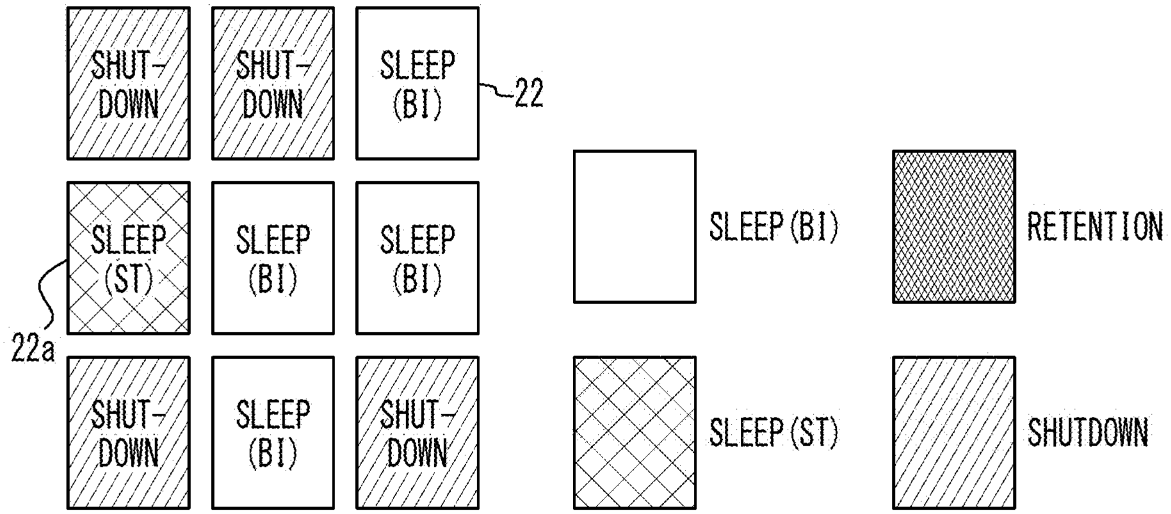
Figure 30C:
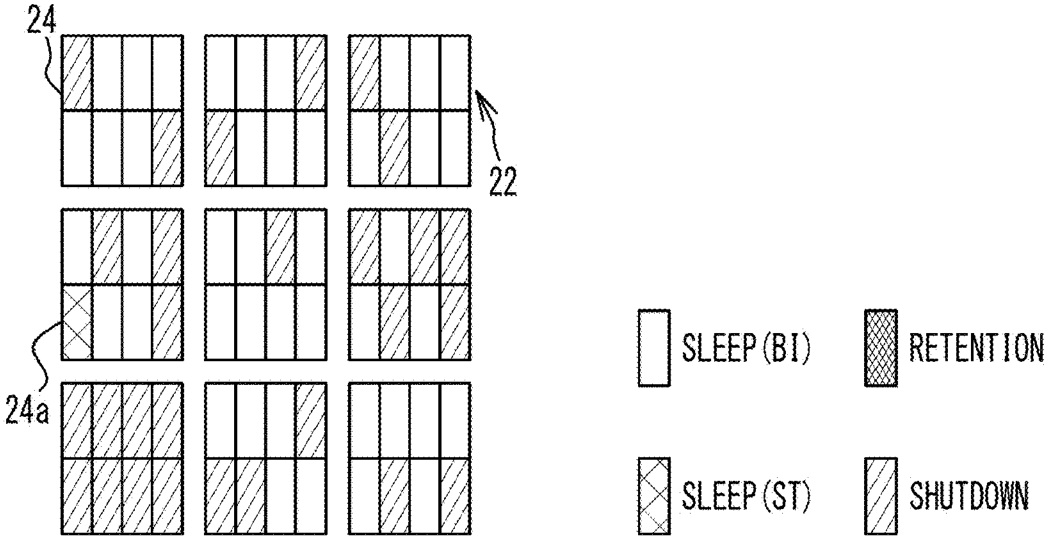

The control circuit 28 puts the first block 24*a* (the first sub-array 22*a*) selected in step S60 into the sleep (ST) state (step S72). For example, the control circuit 28 sets the power supply voltage VVDD–VGND of the block 24*a* (the sub-array 22*a*) at the voltage V2, and sets the control signal VCTRL at the L. As illustrated in FIG. 29C, the sub-array 22*a* enters the sleep (ST) state. As illustrated in FIG. 30C, the block 24*a* enters the sleep (ST) state.

Figure 29D:
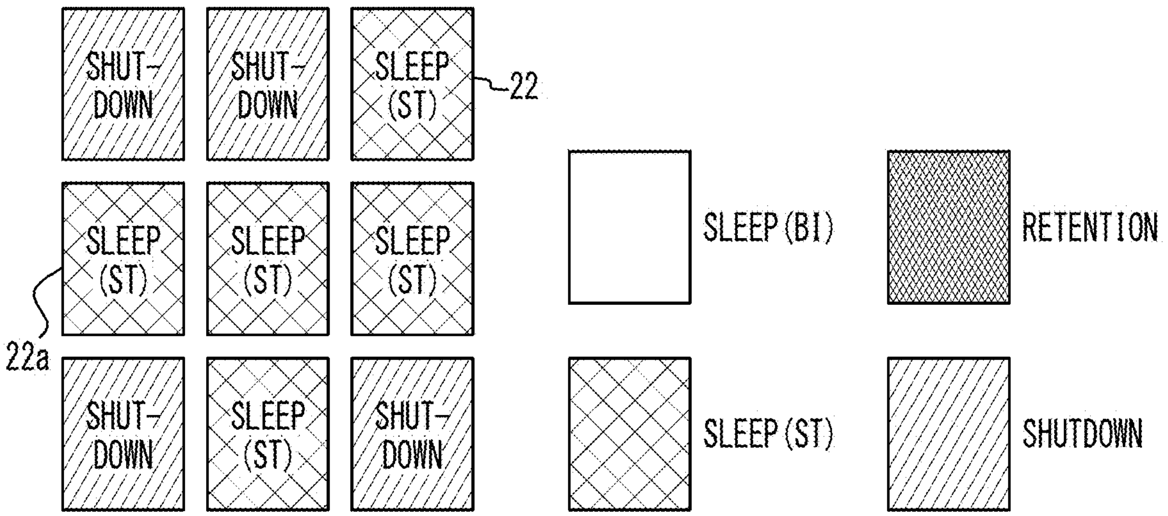
Figure 30D:
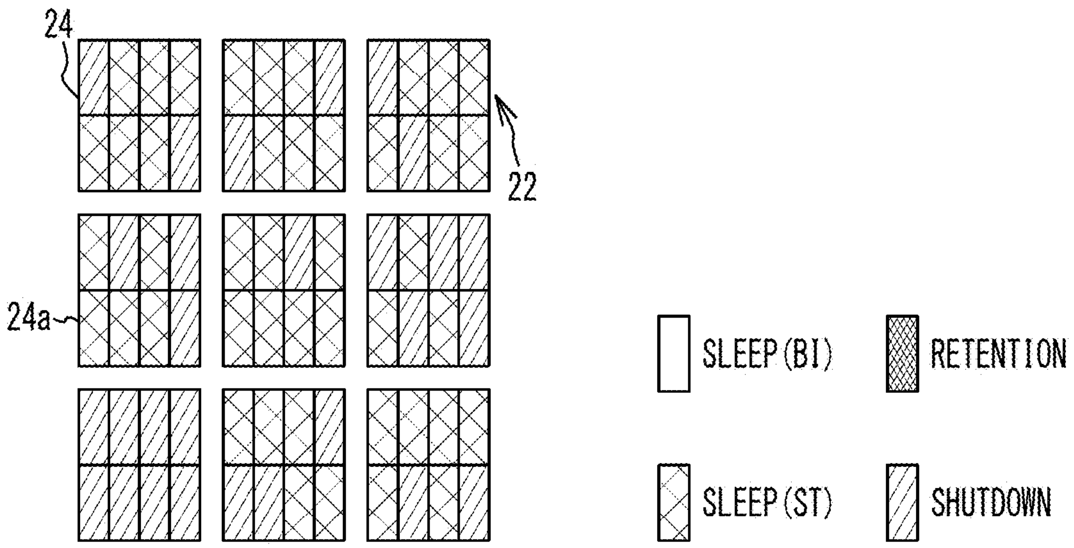

When the determination is No in step S64, steps S60 and S72 are performed for the next block 24 (the next sub-array 22). As illustrated in FIG. 29D, all the sub-arrays 22 subject to the retention enter the sleep (ST) state. As illustrated in FIG. 30D, all the blocks 24 subject to the retention enter the sleep (ST) state.

Figure 29E:
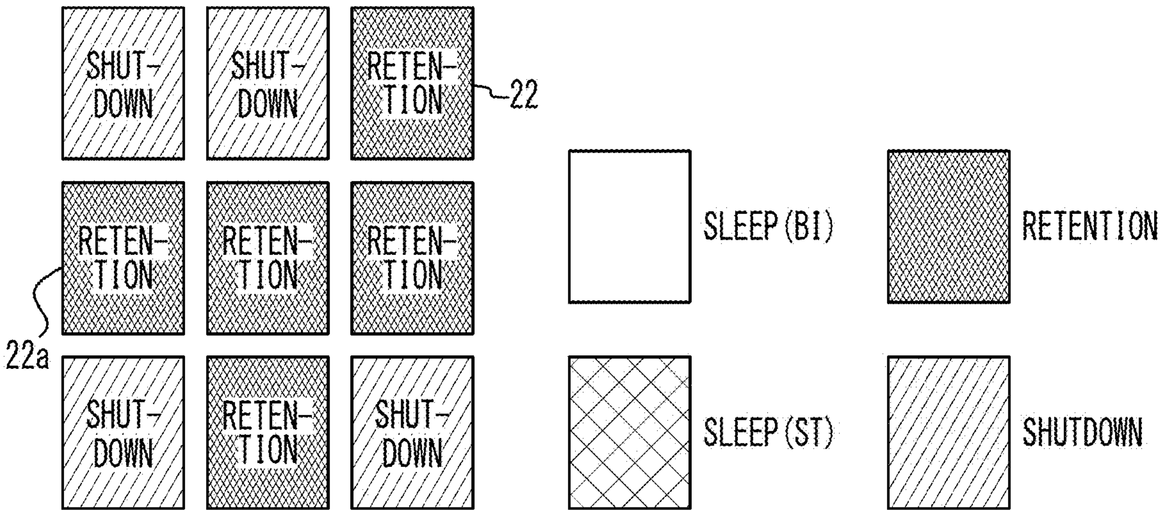
Figure 30E:
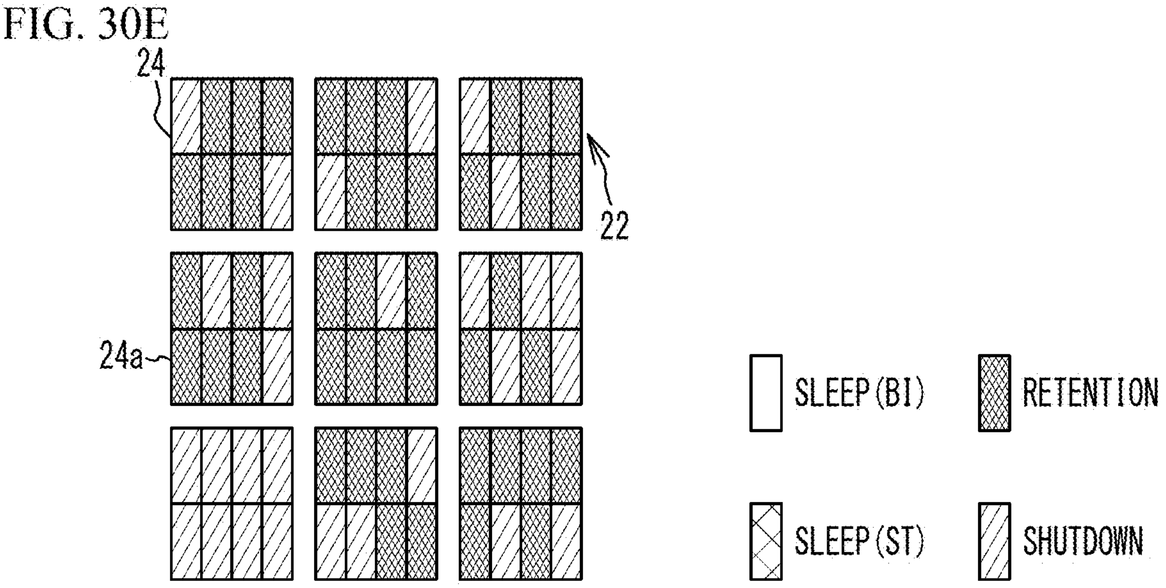

When the determination is Yes in step S64, the control circuit 28 puts all the blocks 24 (the sub-arrays 22) subject to the retention into the retention state, collectively (step S68). As illustrated in FIG. 29E, all the sub-arrays 22 subject to the retention enter the retention state. As illustrated in FIG. 30E, all the blocks 24 subject to the retention enter the retention state. Thereafter, the process ends. Other operations are the same as those of the type A of the retention operation.

[Description of a Type C of the Retention Operation]

Figure 31:
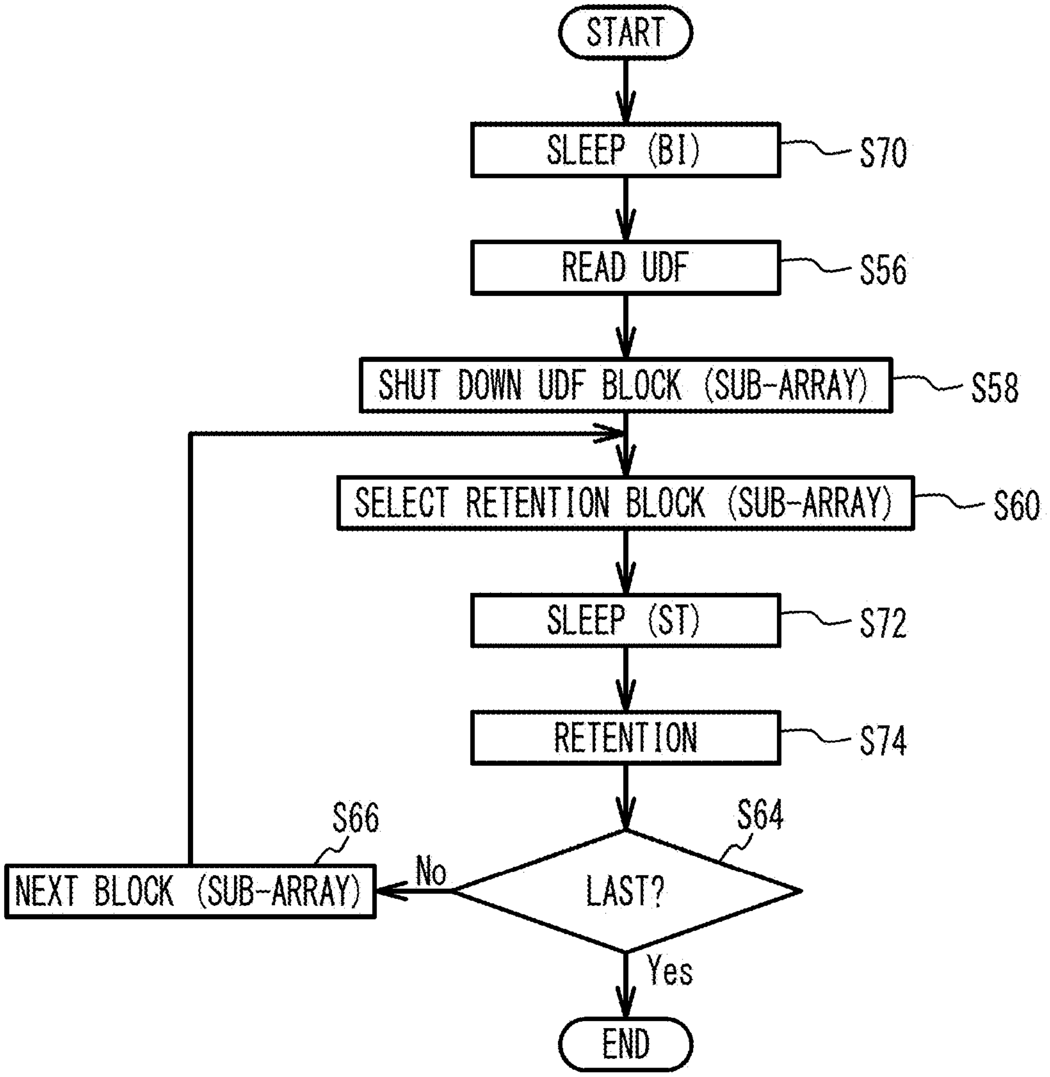
FIG. 31 is a flowchart illustrating a type C of the retention operation in the second embodiment.

A type C of the retention operation will be described. FIG. 31 is a flowchart illustrating the type C of the retention operation in the second embodiment. FIG. 32A to FIG. 32E schematically illustrate the cell array in the type C of the retention operation. FIG. 33A to FIG. 33E schematically illustrate the cell array and the blocks in the type C of the retention operation.

As illustrated in FIG. 31, steps S70, S56, S58, S60, and S72 are the same as those of the type B of the retention operation, and FIG. 32A to FIG. 32C and FIG. 33A to FIG. 33C are the same as FIG. 29A to FIG. 29C and FIG. 30A to FIG. 30C, respectively.

Figure 32A:
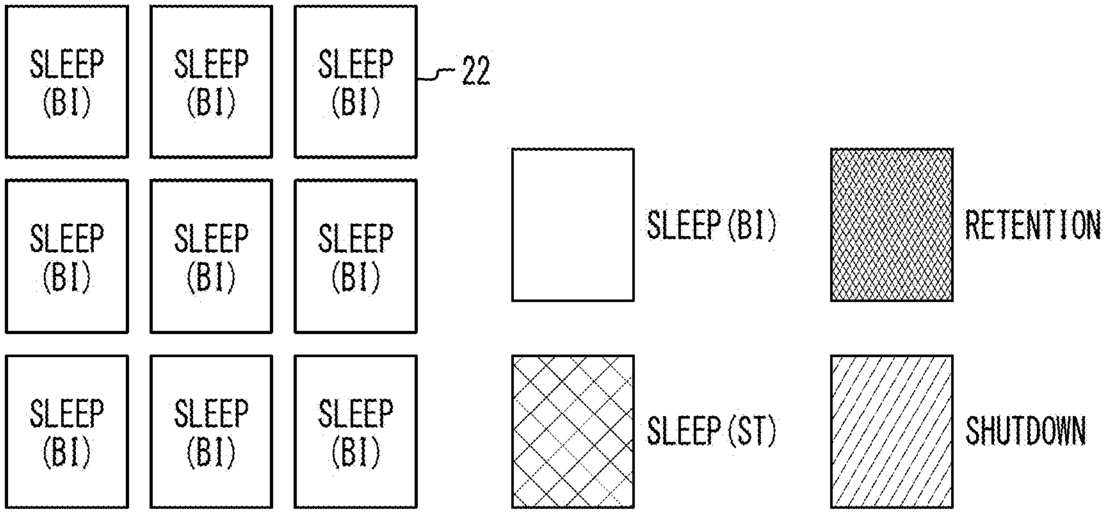
FIG. 32A to FIG. 32E schematically illustrate the cell array in the type C of the retention operation.
Figure 32B:
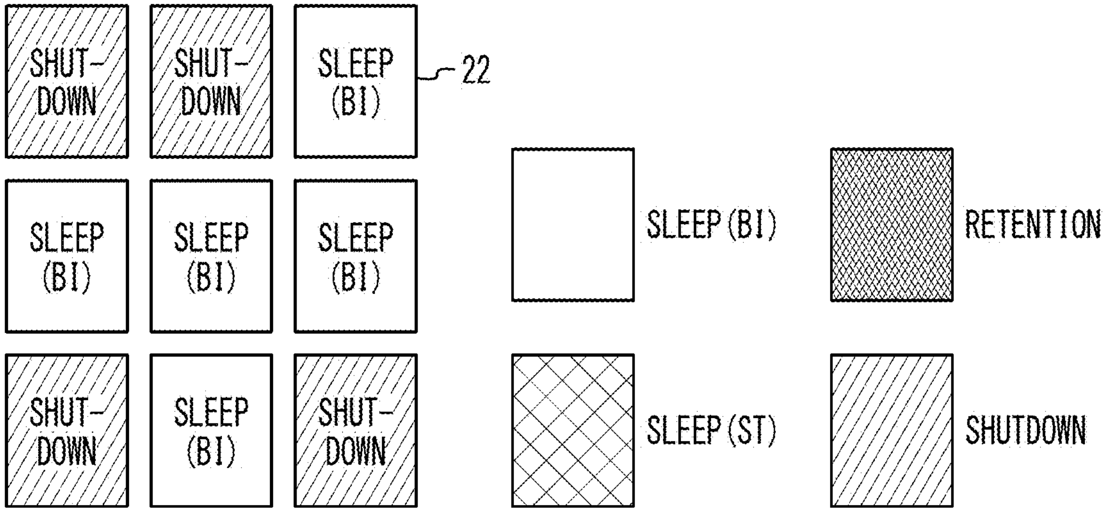
Figure 32C:
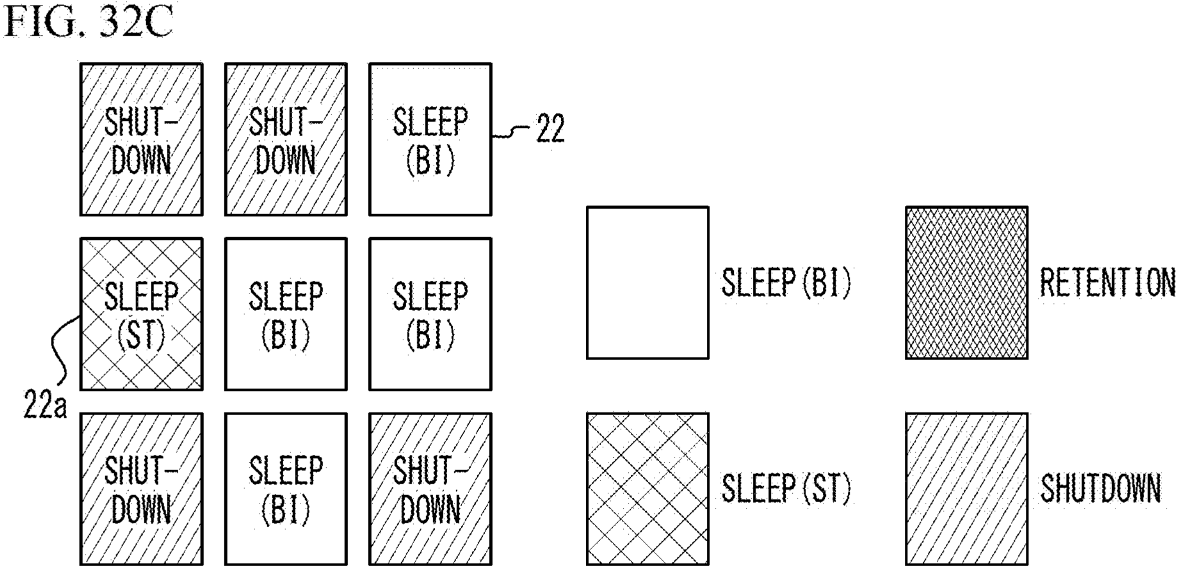
Figure 32D:
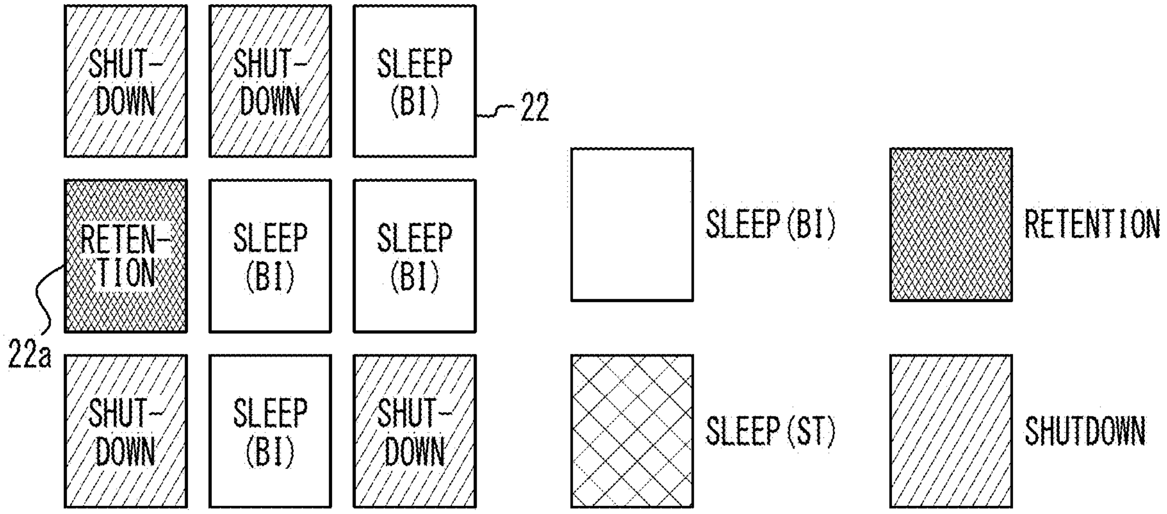
Figure 33A:
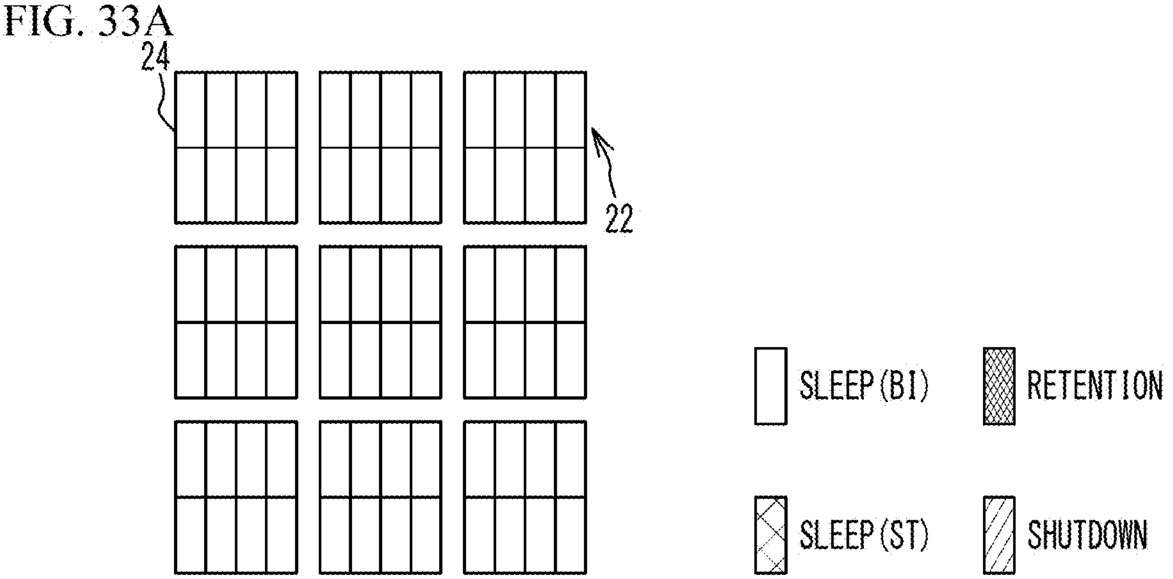
FIG. 33A to FIG. 33E schematically illustrate the cell array and the blocks in the type C of the retention operation.
Figure 33B:
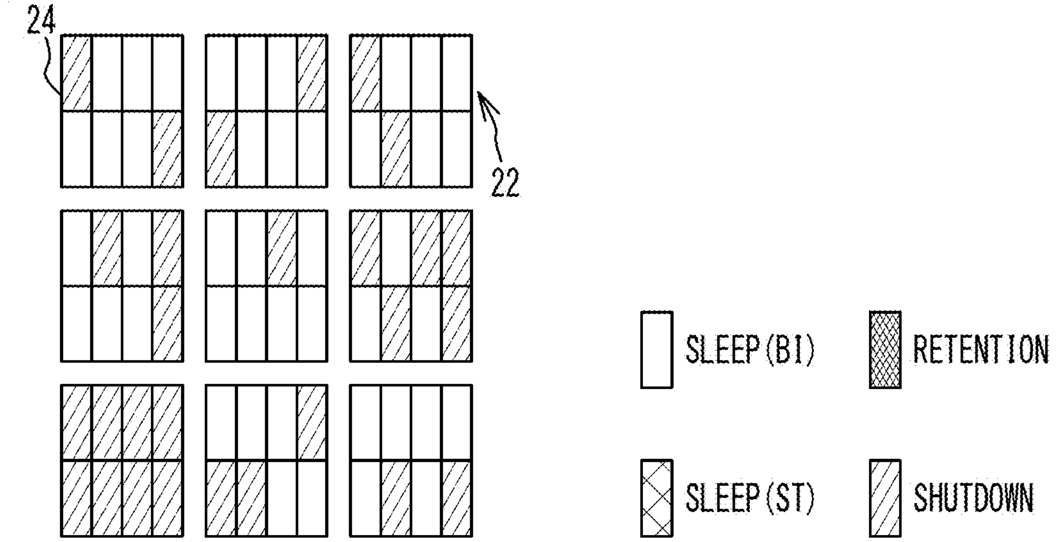
Figure 33C:
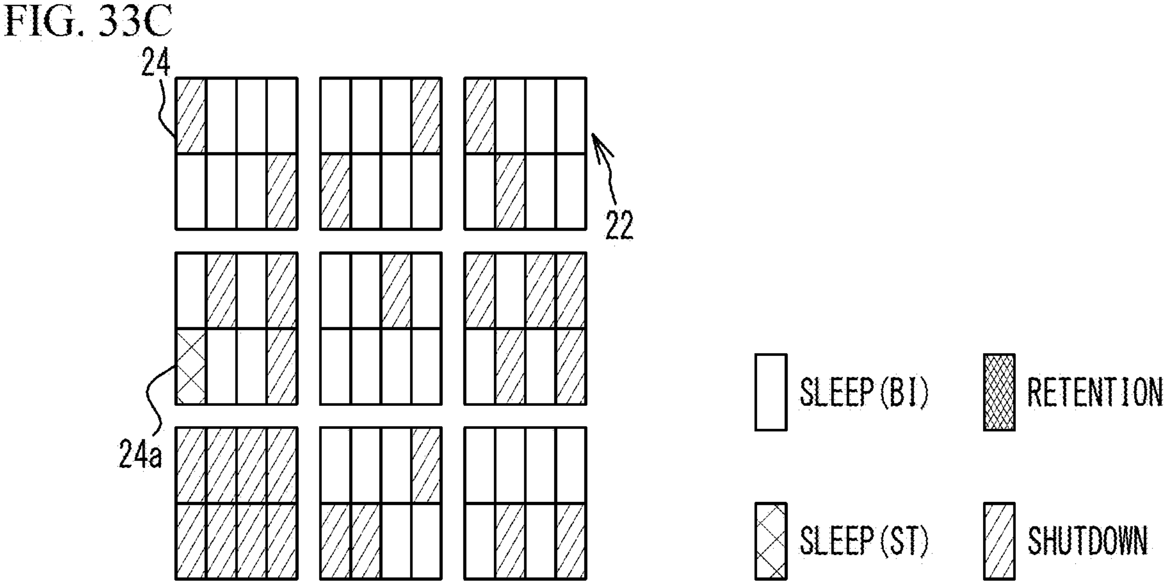
Figure 33D:
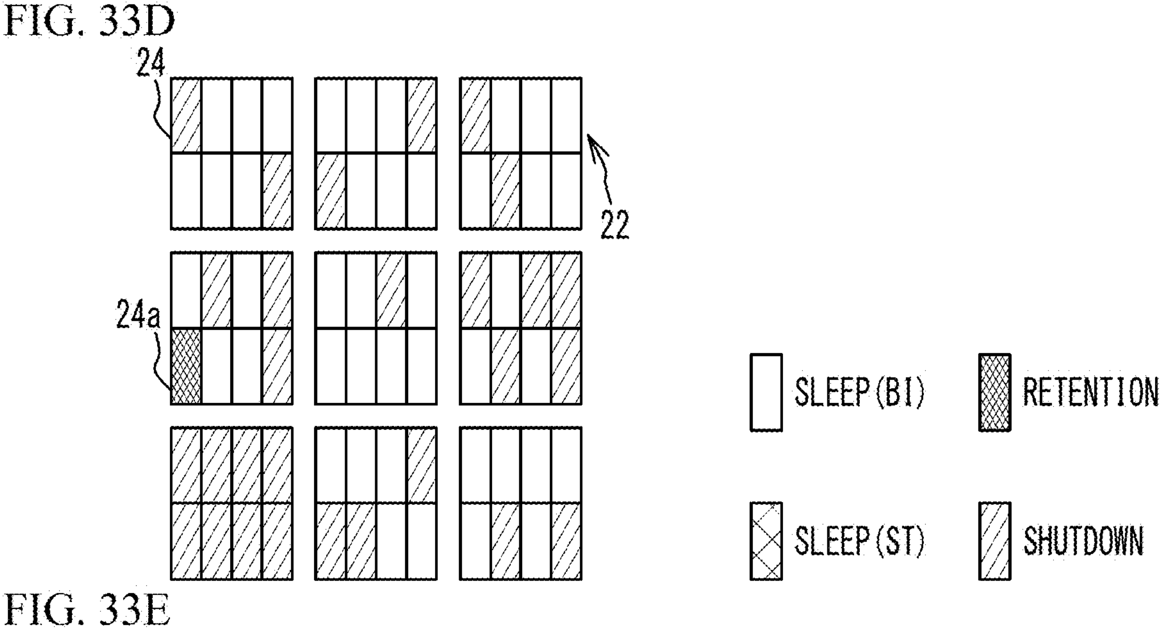

After putting the first block 24*a* (or the first sub-array 22*a*) subject to the retention into the sleep (ST) state in step S72, the control circuit 28 puts the block 24*a* (or the sub-array 22*a*) into the retention state (step S74). As illustrated in FIG. 32D, the sub-array 22*a* enters the retention state. As illustrated in FIG. 33D, the block 24*a* enters the retention state.

Figure 32E:
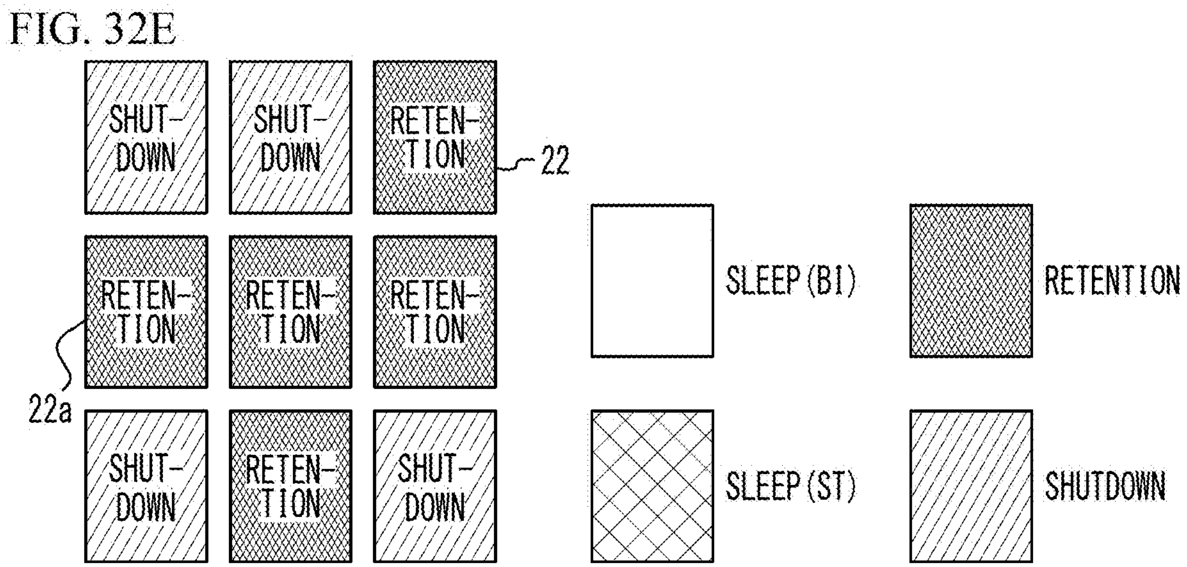
Figure 33E:
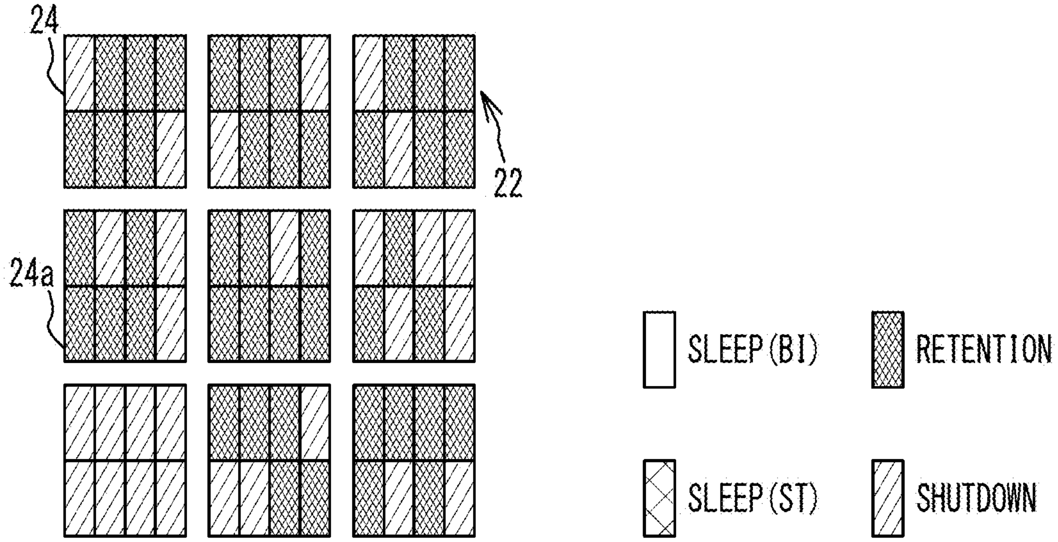

Thereafter, the blocks 24 (the sub-arrays 22) subject to the retention are put into the sleep (ST) state sequentially (step S72), and thereafter, put into the retention state (step S74). When the determination is Yes in step S64, all the sub-arrays 22 subject to the retention enter the retention state as illustrated in FIG. 32E. As illustrated in FIG. 33E, all the blocks 24 subject to the retention are in the retention state. Thereafter, the process ends. Other operations are the same as those of the type B of the retention operation.

[Exemplary Control Circuit of the Type B of the Retention Operation]

Figure 34:
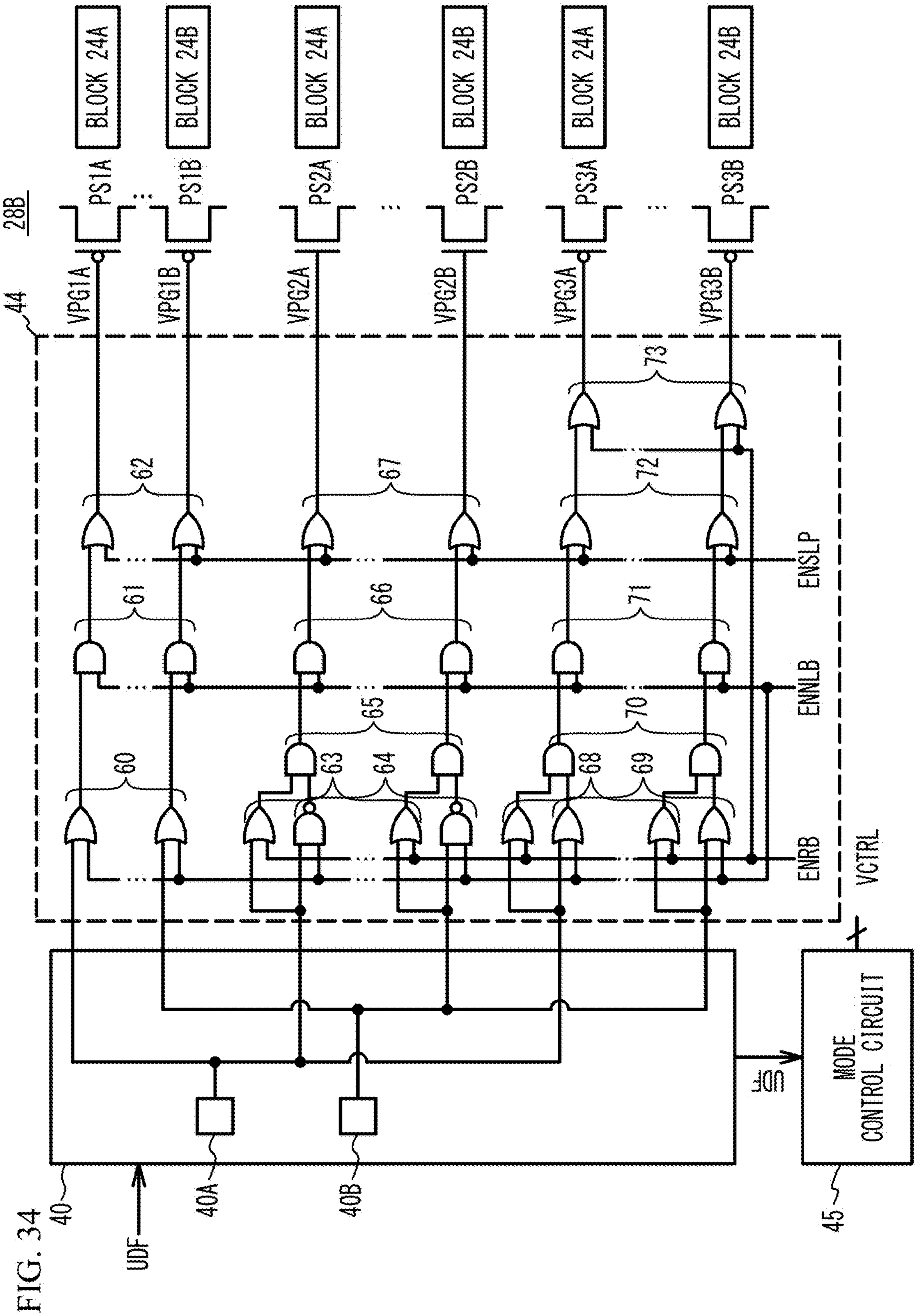
FIG. 34 is a block diagram illustrating an exemplary control circuit in the type B of the retention operation.

FIG. 34 is a block diagram illustrating an exemplary control circuit in the type B of the retention operation. A control circuit 28B includes the resistor 40, a mode control circuit 45, and the PS control circuit 44. The number of bits of the resistor 40 is equal to or greater than NSA×Nblock, which is the number of the blocks 24. Among the NSA×Nblock blocks 24, the blocks 24A to 24B will be described.

As in step S32 of FIG. 7B in the first embodiment, all the storage units 40A to 40B are reset to the low level L. When the UDFs are input to the control circuit 28B in step S34, the storage units 40A to 40B of the corresponding blocks 24A to 24B are set at the high level H in step S36.

The mode control circuit 45 outputs the mode control signal VCTRL. The PS control circuit 44 obtains the UDFs held in the resistor 40 and controls the power switches PS1A to PS1B, PS2A to PS2B, and PS3A to PS3B of the blocks 24A to 24B based on the obtained UDFs.

The PS control circuit 44 includes the same number of OR circuits 60, AND circuits 61, OR circuits 62, OR circuits 63, NAND circuits 64, AND circuits 65, AND circuits 66, OR circuits 67, OR circuits 68, OR circuits 69, AND circuits 70, AND circuits 71, OR circuits 72, and OR circuits 73 as the number of the blocks 24A to 24B.

The output signals of the UDF storage units 40A to 40B and the control signal ENNLB are input to the respective OR circuits 60. The output signals of the OR circuits 60 and the control signal ENNLB are input to the respective AND circuits 61. The output signals of the AND circuits 61 and the control signal ENSLP are input to the respective OR circuits 62. The PS control signals VPG1A to VPG1B are output from the respective OR circuits 62. The PS control signals VPG1A to VPG1B are input to the power switches PS1A to PS1B of the blocks 24A to 24B, respectively.

The output signals of the UDF storage units 40A to 40B and a control signal ENRB are input to the respective OR circuits 63. The output signals of the UDF storage units 40A to 40B and the control signal ENNLB are input to the respective NAND circuits 64. The output signals of the OR circuits 63 and the output signals of the NAND circuits 64 are input to the respective AND circuits 65. The output signals of the AND circuits 65 and the control signal ENNLB are input to the respective AND circuits 66. The output signals of the AND circuits 65 and the control signal ENSLP are input to the respective OR circuits 67. The PS control signals VPG2A to VPG2B are input to the respective OR circuits 67. The PS control signals VPG2A to VPG2B are input to the gates of the power switches PS2A to PS2B of the blocks 24A to 24B, respectively.

The output signals of the UDF storage units 40A to 40B and the control signal ENRB are input to the respective OR circuits 68. The output signals of the UDF storage units 40A to 40B and the control signal ENNLB are input to the respective OR circuits 69. The output signals of the OR circuits 68 and the output signals of the OR circuits 69 are input to the respective AND circuits 70. The output signals of the AND circuits 70 and the control signal ENNLB are input to the respective AND circuits 71. The output signals of the AND circuits 71 and the control signal ENSLP are input to the respective OR circuits 72. The output signals of the OR circuits 72 and the control signal ENRB are input to the respective OR circuits 73. PS control signals VPG3A to VPG3B are output from the respective OR circuits 73. The PS control signals VPG3A to VPG3B are input to the gates of the power switches PS3A to PS3B of the blocks 24A to 24B, respectively.

FIG. 35A to FIG. 35E present the level of each signal and the operations of the power switches in the type B of the retention operation. As presented in FIG. 35A, in the standby (BI) state, the control signals ENRB, ENNLB, ENSLP, and VCTRL have the H, the L, the L, and the H, respectively. Assume that the UDFs of the blocks 24A and 24B are the L and the H, respectively. In this case, the VPG1A to the VPG1B have the L, and the power switches PS1A to PS1B are ON. The VPG2A to the VPG2B have the L, and the power switches PS2A to PS2B are OFF. The VPG3A to the VPG3B have the H, and the power switches PS3A to PS3B are OFF. As described above, in the standby (BI) state, regardless of the UDF, the power switches PS1A to PS1B are ON, and the power switches PS2A to PS2B and PS3A to PS3B are OFF. Therefore, the power supply voltages VVDD−VGND of all the blocks 24A to 24B are the voltage V3.

As presented in FIG. 35B, in the sleep (BI) state, the control signals ENRB, ENNLB, ENSLP, and VCTRL have the H, the L, the H, and the H, respectively. The VPG1A to the VPG1B have the H, and the power switches PS1A to PS1B are OFF. The VPG2A to the VPG2B have the H, and the power switches PS2A to PS2B are ON. The VPG3A to VPG3B have the H, and the power switches PS3A to PS3B are OFF. As described above, in the sleep (BI) state, regardless of the UDF, the power switches PS1A to PS1B and PS3A to PS3B are OFF, and the power switches PS2A to PS2B are ON. Thus, the power supply voltages VVDD−VGND of all the blocks 24A to 24B are the voltage V2, and the blocks 24A to 24B enter the sleep (BI) state. In step S70 of FIG. 28, as presented in FIG. 35B, all the blocks enter the sleep (BI) state.

In steps S70, S56, and S58 of FIG. 28, the blocks 24 of which the UDF is the H are put into the sleep (BI) state, and the blocks of which the UDF is the L are collectively shut down. As presented in FIG. 35C, the control signal ENNLB changes from the L to the H from the standby (BI) state in FIG. 35A. The VPG1A to the VPG1B change from the L to the H, and the VPG2A changes from the L to the H. As a result, the power switch PS2A is turned ON from OFF. The power switches PS1A and PS1B are turned OFF from ON. The power switches PS2B, PS3A, and PS3B maintain OFF. Thus, the power supply voltage VVDD−VGND of the block 24A subject to the retention changes from the voltage V3 to the voltage V2, and the block 24A enters the sleep (BI) state. The power supply voltage VVDD−VGND of the block 24B for which the UDF is set becomes the voltage V0, and the block 24B enters the shutdown state.

In step S72 of FIG. 28, the block 24A is switched from the sleep (BI) state to the sleep (ST) state. As presented in FIG. 35D, the control signals ENRB, ENNLB, and ENSLP maintain the states of FIG. 35C. The state of each power switch does not change, and the power supply voltages VVDD−VGND of the blocks 24A and 24B are maintained at the voltages V2 and V0, respectively. The control signal VCTRL changes from the H to the L. As a result, the mode of the target block 24A is switched from the BI mode to the ST mode. As a result, the block 24A enters the sleep (ST) state.

By performing the loop from step S60 to step S66 in FIG. 28, for all the blocks 24 subject to the retention, the sleep (BI) state is switched to the sleep (ST) state.

In step S68 of FIG. 28, all the blocks 24A subject to the retention are put into the retention state from the sleep (ST) state. As presented in FIG. 35E, the control signals ENNLB, ENSLP, and VCTRL maintain the states in FIG. 35D, and the control signal ENRB is changed from the H to the L. As a result, the VPG2A and the VPG3A change from the H to the L, the power switch PS2A is turned OFF from ON, and the power switch PS3A is turned ON from OFF. As a result, the power supply voltage VVDD−VGND of the block 24A subject to the retention changes from the voltage V2 to the voltage V1, and all the blocks 24A subject to the retention enter the retention state. The power supply voltage VVDD−VGND of the block 24B is maintained at the voltage V0.

Figure 36:
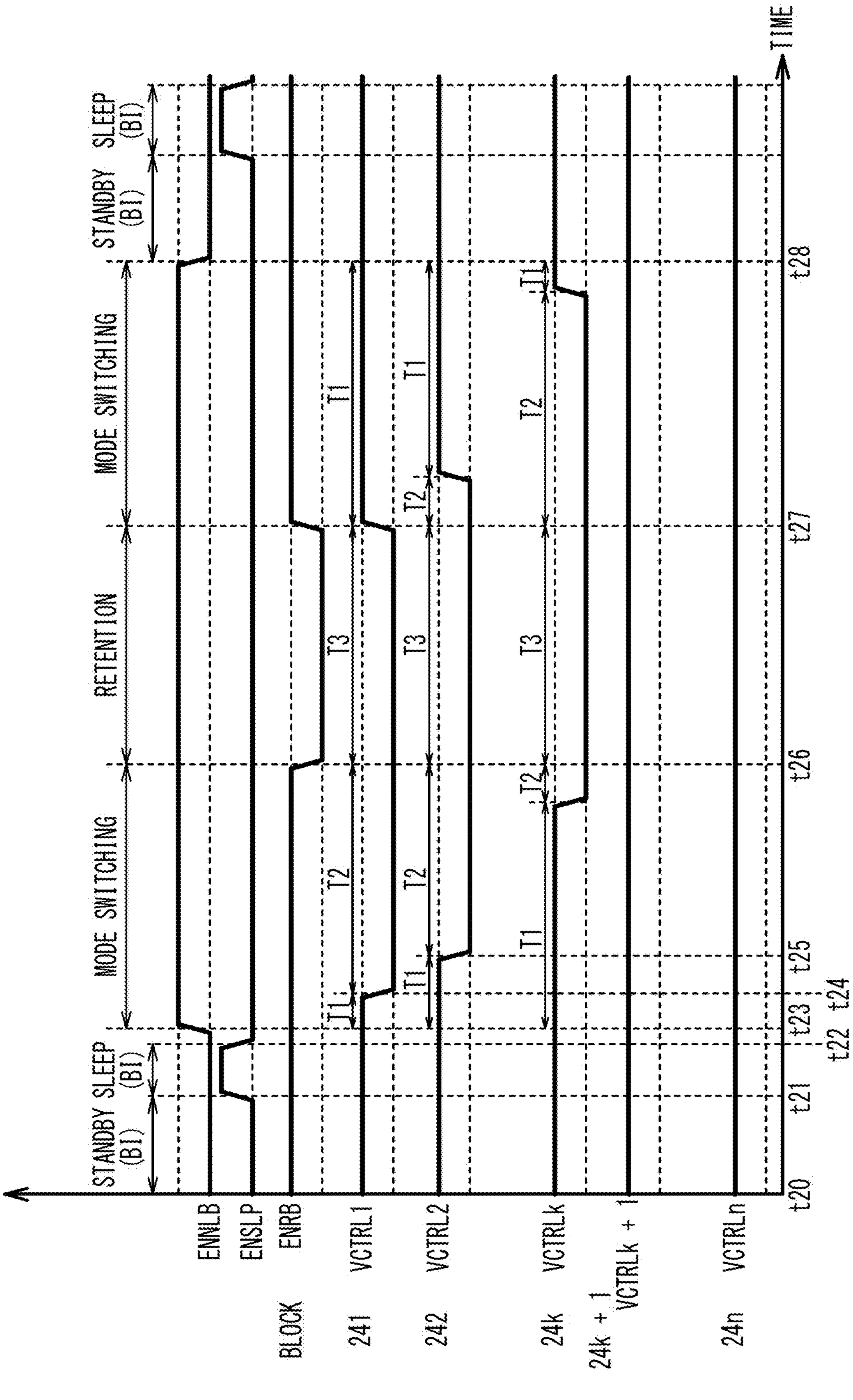
FIG. 36 is a timing chart of the control signals in the type B of the retention operation.

FIG. 36 is a timing chart of the control signals in the type B of the retention operation. Control signals VCTRL1 to VCTRLn are the control signals VCTRL corresponding to the blocks 241 to 24*n*, respectively. The blocks 241 to 24*k* are blocks subject to the retention, and the blocks 24*k*+1 to the block 24*n* are blocks subject to shutdown.

As illustrated in FIG. 36, the period between time t20 and time t21 is the standby (BI) period, the control signals ENNLB and ENSLP have the L, and the ENRB and the VCTRL1 to the VCTRLn have the H. The period between time t21 and time t22 are the sleep (BI) period, and the control signal ENSLP has the H.

At time t23 (in step S58 of FIG. 28), the control signal ENNLB becomes the H. As a result, the blocks 241 to 24*k* subject to the retention maintain the sleep (BI) state, and the blocks 24*k*+1 to 24*n* of the UDFs enter the shutdown state. This state corresponds to the period T1.

At time t24 (step S72 of FIG. 28), the control signal VCTRL1 of the first block 241 subject to the retention becomes the L. This switches the mode of the block 241 from the BI mode to the ST mode, and the block 241 enters the sleep (ST) state. The period at and after time t24 is the period T2 of the block 241 and is the period during which the block 241 is in the ST mode. At time t25, for the second block 242 subject to the retention, the control signal VCTRL2 is set at the L. The block 242 enters the sleep (ST) state, and the period at and after time t25 becomes the period T2.

By performing the loop from step S60 to step S66 in FIG. 28, step S68 is executed for all the blocks 241 to 24*k* subject to the retention sequentially. For all the blocks 241 to 24*k* subject to the retention, the BI mode is switched to the ST mode. At time t26 (step S68 of FIG. 28), the control signal ENRB becomes the L. As a result, all the blocks 241 to 24*n* subject to the retention enter the retention state.

At time t27, the control signal ENRB becomes the H. This causes the blocks 241 to 24*k* subject to the retention to enter the sleep (ST) state. The control signals VCTRL1 to VCTRLk are set at the H, sequentially. The blocks 241 to 24*k* enter the sleep (BI) state, sequentially. At time t28, the switching of the mode from the ST mode to the BI mode is completed.

[Exemplary Control Circuit of the Type C of the Retention Operation]

Figure 37:
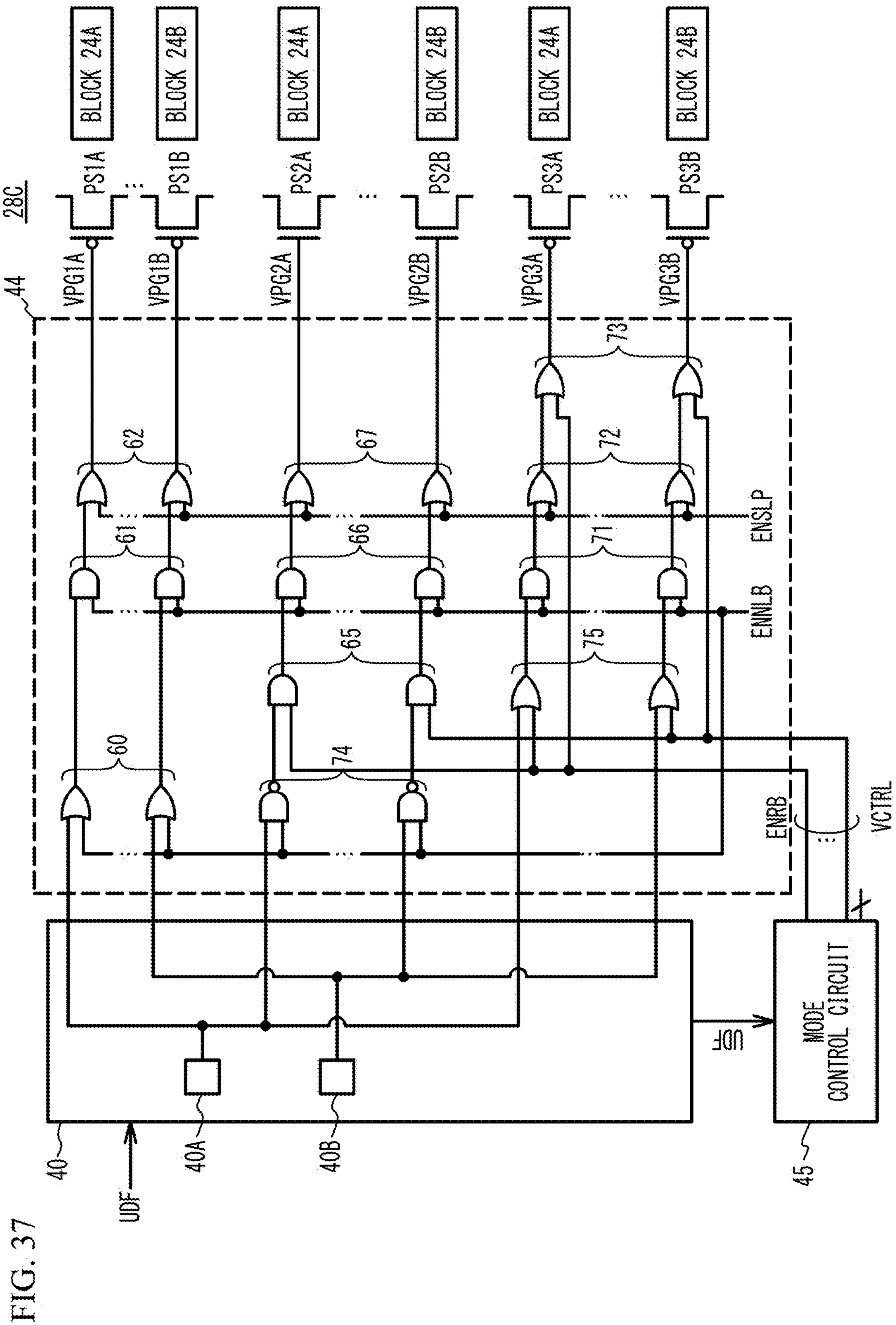
FIG. 37 is a block diagram illustrating an exemplary control circuit in the type C of the retention operation.

FIG. 37 is a block diagram illustrating an exemplary control circuit in the type C of the retention operation. Compared with the control circuit 28B of FIG. 34, in a control circuit 28C, the OR circuits 63, the NAND circuits 64, and the AND circuits 65 are replaced by NAND circuits 74, and the OR circuits 68 and 69 and the AND circuits 70 are replaced by OR circuits 75. The mode control circuit 45 outputs the respective control signals ENRB for the blocks 24A to 24B.

The output signals of the UDF storage units 40A to 40B and the control signal ENNLB are input to the respective NAND circuits 74. The output signals of the NAND circuits 74 and the individual control signals ENRB of the blocks 24A to 24B are input to the respective AND circuits 65. The output signals of the UDF storage units 40A to 40B and the respective control signals ENRB of the blocks 24A to 24B are input to the respective OR circuits 75. The output signals of the OR circuits 75 are input to the respective AND circuits 71. Other configurations are the same as those of the control circuit 28B illustrated in FIG. 34, and the description thereof is thus omitted. In the control circuit 28C, the retention can be performed for the blocks 24A to 24B, separately.

The level of each signal and the operations of the power switches are the same as those presented in FIG. 35A to FIG. 35E, and the description thereof is thus omitted.

Figure 38:
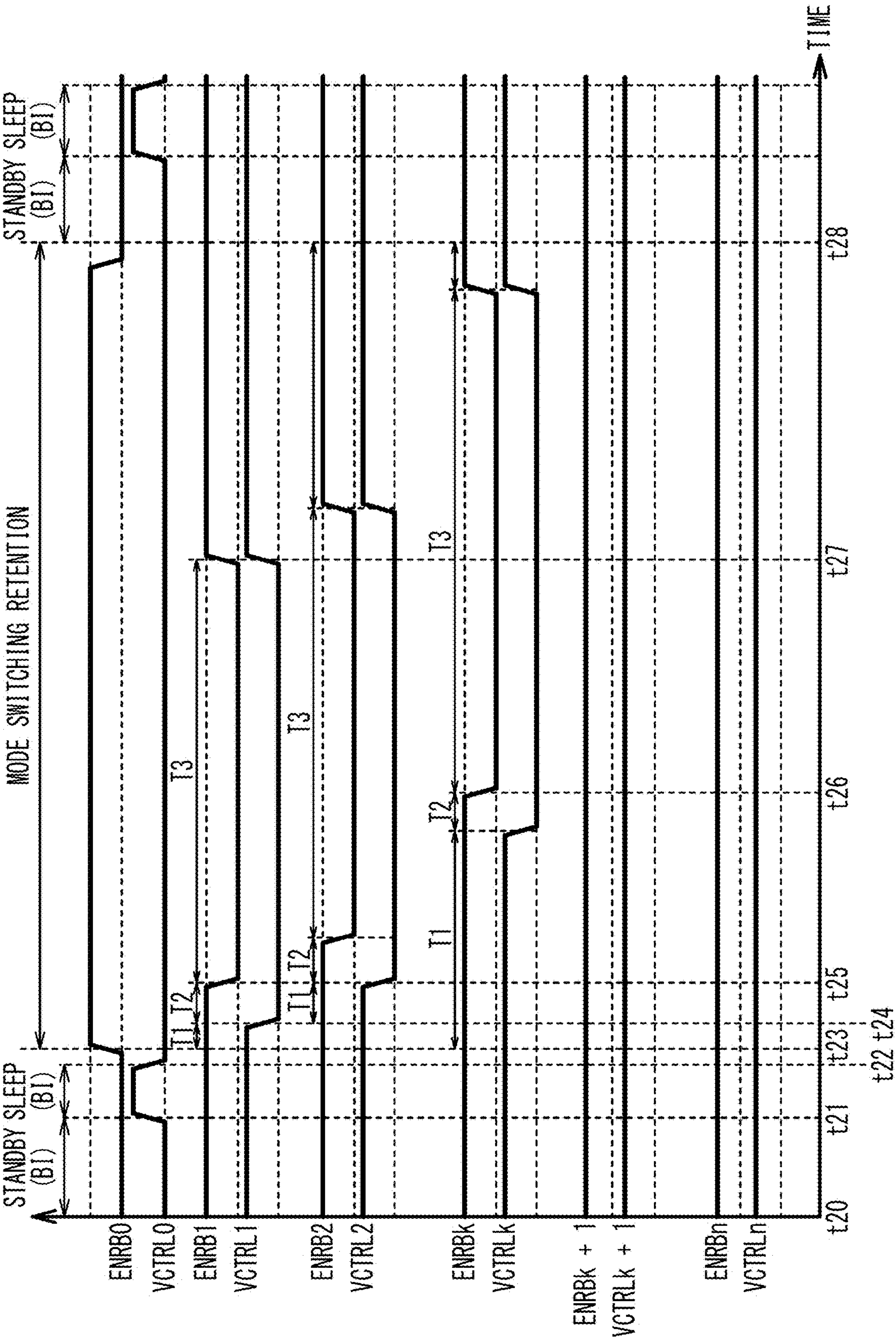
FIG. 38 is a timing chart of the control signals in the type C of the retention operation.

FIG. 38 is a timing chart of the control signals in the type C of the retention operation. Control signals ENRB1 to ENRBn are the control signals ENRB corresponding to the blocks 241 to 24*n*, respectively.

As illustrated in FIG. 38, during the period between time t20 and time t23, the control signals ENRB1 to ENRBn have the H. Other operations are the same as those illustrated in FIG. 36.

At time t24 (step S72 of FIG. 31), the control signal VCTRL1 becomes the L for the first block 241 subject to the retention. As a result, the mode of the block 241 switches from the BI mode to the ST mode, and the block 241 enters the sleep (ST) state. At time t25, the control signal ENRB1 becomes the L for the block 241. This causes the block 241 to enter the retention state. For the second block 242 subject to the retention, the control signal VCTRL2 becomes the L. The block 242 enters the sleep (ST) state.

By performing the loop from step S60 to step S66 in FIG. 31, steps S72 and S74 are performed for all the blocks 241 to 24*k* subject to the retention, sequentially. When the mode switching and the retention are completed for all the blocks 241 to 24*k* subject to the retention, all the blocks 241 to 24*n* subject to the retention enter the retention state at time t26.

At and after time t27, the control signals ENRB1 to ENRBk and the control signals VCTRL1 to VCTRLk become the H, sequentially for the respective blocks 241 to 24*k*. The blocks 241 to 24*k* enter the sleep (BI) state, sequentially. At time t28, the mode switching from the ST mode to the BI mode is completed.

[Simulation]

The BET and the latency of the mode switching between the standby (BI) state and the standby (ST) state for the retention were simulated for the electronic circuit of the second embodiment. The simulation was also conducted for a comparative example 2. In the comparative example 2, the collective shutdown of the sub-arrays 22 and the blocks 24 using the UDFs is not performed, and all the blocks are put into the standby (BI) state, and the mode switching is performed for each block sequentially. Finally, all the blocks 24 are collectively put into the retention state.

The simulation conditions are as follows. The VDDH, the VDDL, the VGND, the VSCTRL, the VLCTRL, and the WL were 1.2 V, 0.2 V, 0 V, 0.3 V, 0.1 V, and 0 V, respectively. The H and the L of the VPG1 were 1.4 V and 0 V, respectively. The H and the L of the VPG2 were 1.2 V and −0.2 V, respectively. The H and the L of the VPG3 were 1.4 V and 0 V, respectively. The H and the L of the VCTRL were 1.2 V and 0 V, respectively. The bit lines BL and BLB were at 1.2 V in the standby state and the sleep state, and were at 0 V in the retention state and the shutdown state. The time to charge the driver 26 during the mode switching was determined to be 15 ns for each sub-array 22. The memory capacity of the sub-array 22 was 8 kbytes, and the memory capacity of the block 24 was 1 kbyte.

The proportion of the number of the memory cells for which the UDF is set to the total number of the memory cells in the cell array 20 was defined as the UD proportion. Cases where the memory capacity of the cell array 20 is 32 kbytes, 256 kbytes, and 2 Mbytes were simulated.

Figure 39A:
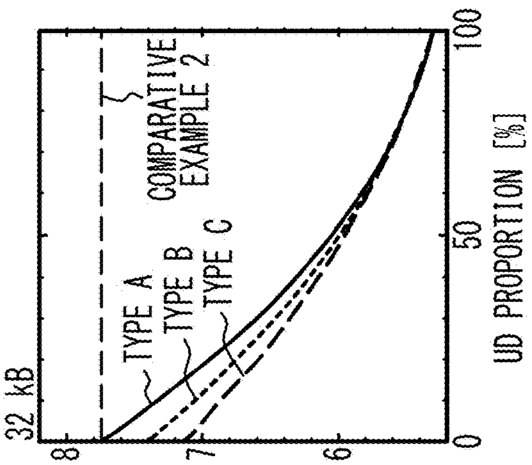
FIG. 39A to FIG. 39C are graphs of BET versus a UD proportion in the types A to C and a comparative example 2.
Figure 39B:
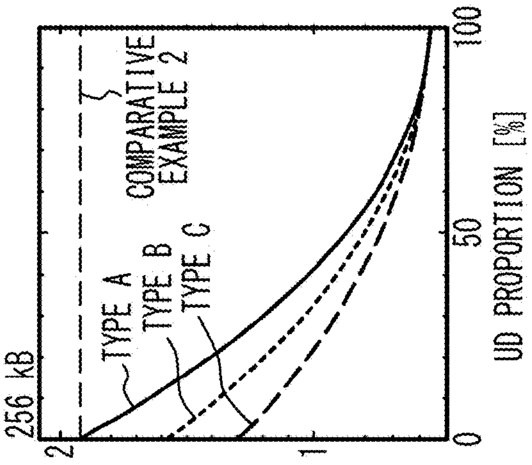
Figure 39C:
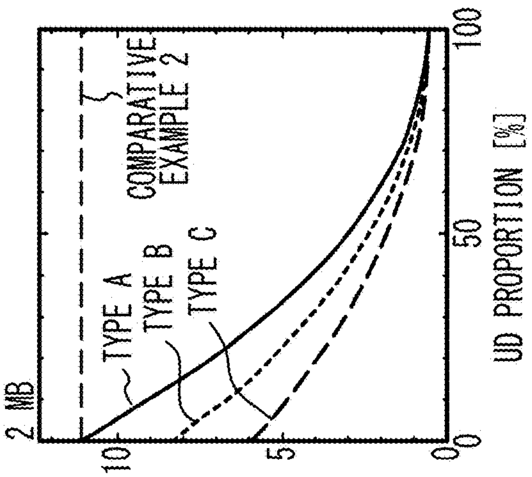
Figure 39D:
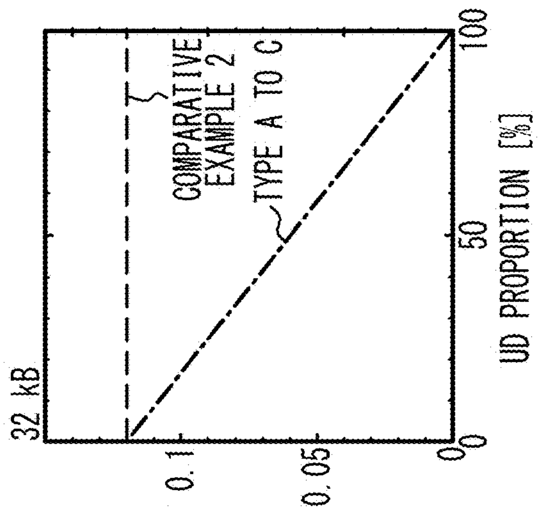
FIG. 39D to FIG. 39F are graphs of latency versus the UD proportion.
Figure 39E:
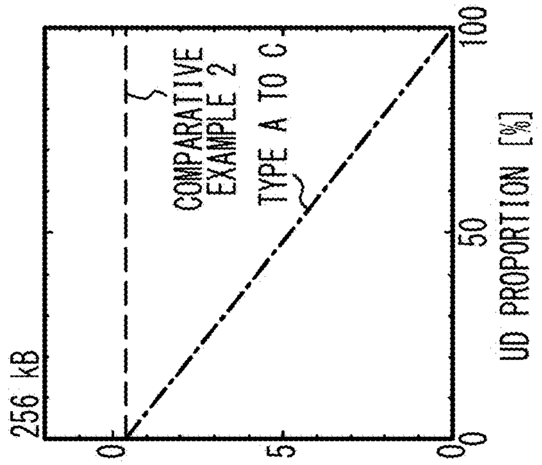
Figure 39F:
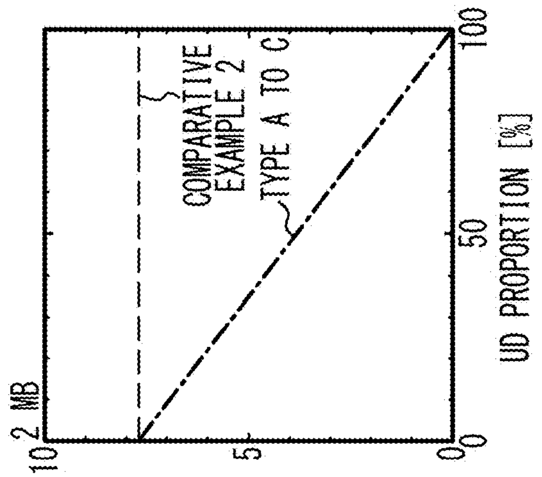

FIG. 39A to FIG. 39C are graphs of the BET versus the UD proportion in the types A to C and the comparative example 2, and FIG. 39D to FIG. 39F are graphs of the latency versus the UD proportion. As presented in FIG. 39A to FIG. 39C, in the comparative example 2, the BET is constant regardless of the UD proportion. In the type A, when the UD proportion is 0%, the BET is the same as that of the comparative example 2. As the UD proportion increases, the BET decreases. In the type B, when the UD proportion is 0%, the BET is smaller than that of the comparative example 2. This is because in the type B, all the blocks are collectively put into the sleep (BI) state before the retention, and therefore, the power consumption due to the leakage currents of the blocks waiting for the retention can be reduced. In the type C, when the UD proportion is 0%, the BET is smaller than that of the type B. This is because the switching from the sleep (BI) state to the sleep (ST) state and the retention are performed for each subject block sequentially, and therefore, the standby time in the sleep (ST) state can be reduced and the power consumption can be thereby reduced.

As presented in FIG. 39D to FIG. 39F, in the types A to C, compared with the comparative example 2, the latency can be reduced as the UD proportion increases. Among the types A to C, the latency is the same.

As is clear from the above simulation, in the type A, although the BET is long, the control is simple because it is unnecessary to set the sleep state. In the type B, the BET is between the BET of the type A and the BET of the type C. Since the control of the type B sets the sleep state, the control of the type B is more complicated than that of the type A, but is simpler than that of the type C because the retention is collectively performed. In the type C, although the BET is short, the control is complicated because the retention is performed sequentially.

Next, the standby power was simulated for a comparative example 2-1, which does not perform collective shutdown using the UDF and waits in the standby (BI) state when the retention is performed, a comparative example 2-2, which does not perform collective shutdown using the UDF and waits in the sleep (BI) when the retention is performed, and the type C.

Figure 40A:
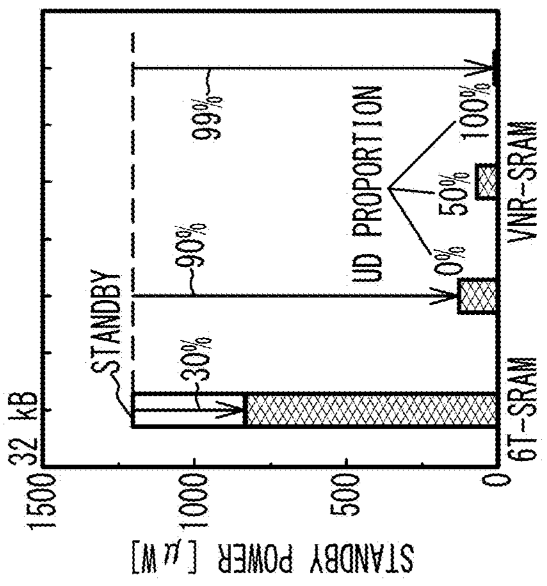
FIG. 40A to FIG. 40C present standby power with respect to the UD proportion in the type C and comparative examples 2-1 and 2-2.
Figure 40B:
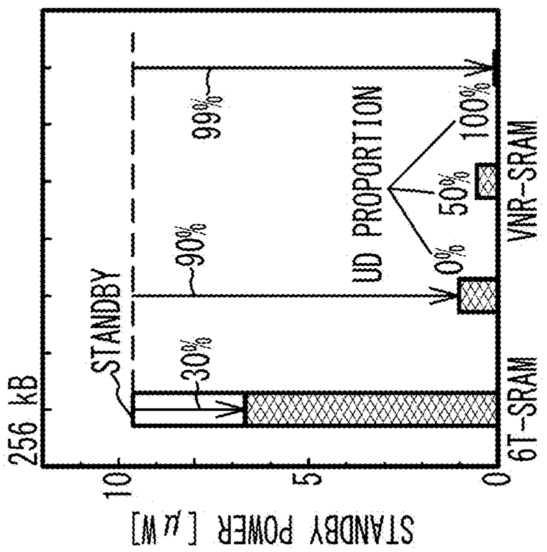
Figure 40C:
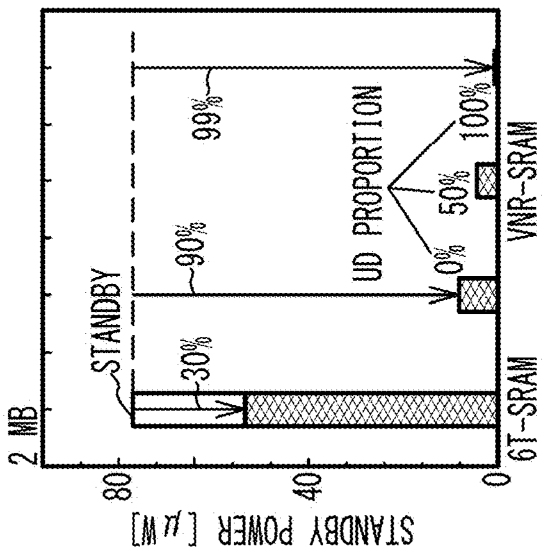

FIG. 40A to FIG. 40C are diagrams comparing the VNR-SRAM in the second embodiment with the 6T-SRAM. The standby power in the standby state of the 6T-SRAM, the standby power in the sleep state of the 6T-SRAM, and the standby power of the VNR-SRAM of the type C are compared. As presented in FIG. 40A to FIG. 40C, in the 6T-SRAM, the standby power in the sleep state can be reduced by approximately 30% compared with the standby power in the standby state. In the case of the type C of the retention operation, even when the UD proportion is 0%, the standby voltage can be reduced by 90%. When the UD proportion is 100%, the standby power can be reduced by 99%.

In the second embodiment, as illustrated in FIG. 17, FIG. 21A, and FIG. 21B, the memory cell 10 includes the bistable circuit 12 that includes the inverter circuit 14 (a first inverter circuit) and the inverter circuit 16 (a second inverter circuit) that are configured to be switchable between the BI mode (a first mode) characterized by there being substantially no hysteresis in the transfer characteristics and the ST mode (a second mode) characterized by there being hysteresis in the transfer characteristics. In the bistable circuit 12, the output node and the input node of the inverter circuit 14 are coupled to the input node and the output node of the inverter circuit 16, respectively.

As in steps S56 and S58 of FIG. 25, FIG. 28, and FIG. 31, the control circuit 28 shuts down (powers off) one or more first memory cells that store data that are not required to be retained among the memory cells 10. The control circuit 28 puts the bistable circuits 12 in remaining one or more second memory cells of the memory cells 10 into the ST mode as in steps S62 and S72, and supplies the voltage V1 (a second power supply voltage) to the bistable circuits 12 in the second memory cells while maintaining the ST mode as in the steps S68 and S74. The voltage V1 is a voltage at which the bistable circuit 12 in the ST mode can retain data, and is lower than the voltage V3 (a first power supply voltage) supplied to the bistable circuit 12 when data is read and/or written.

As described above, since the memory cells that store data that are not required to be retained are shut down, the power consumption for switching the modes of the memory cells that store the data that are not required to be retained and maintaining the retention state can be reduced. In addition, the latency can be reduced.

As illustrated in FIG. 22 and FIG. 23, the cell array 20 is divided into a plurality of the blocks 24 each including at least two memory cells 10. As in step S56 of FIG. 25, FIG. 28, and FIG. 31, the control circuit 28 extracts one or more first blocks that store data that are not required to be retained among the blocks 24. As in step S58, the control circuit 28 shuts down (powers off) the first blocks. Thereafter, as in steps S62 and S72, the control circuit 28 puts the bistable circuit in remaining one or more second blocks of the blocks 24 into the ST mode. As in steps S68 and S74, the control circuit 28 supplies the voltage V1 to the bistable circuits 12 in the second blocks while maintaining the ST mode.

As described above, since the first blocks for which the UDF is set are shut down in a unit of the block, the power consumption for switching the modes of the first blocks and maintaining the retention state can be reduced. In addition, the latency can be reduced. Since the first blocks for which the UDF is set are shut down first, the power consumption due to the leakage current during standby for the mode switching operation can be reduced.

As with the types B and C of the retention operation, the control circuit 28 supplies the voltage V2 (a third power supply voltage) as the power supply voltage to the second blocks subject to the retention (i.e., puts the second blocks subject to the retention into the sleep state) before putting the blocks subject to the retention into the ST mode as in step S70 of FIG. 28 and FIG. 31. The voltage V2 is a power supply voltage that is lower than the voltage V3, is higher than the voltage V1, and at which the bistable circuit 12 in the BI mode can retain data. This can reduce the power consumption during the period waiting for the shutdown and the period waiting for the retention.

As in step S72, the control circuit 28 puts the bistable circuits 12 in the second blocks into the ST mode while supplying the voltage V2 to the bistable circuits 12 in the second blocks. This can reduce the power consumption during the period waiting for the retention.

As in FIG. 38 illustrating the type C of the retention operation, the control circuit 28 puts the bistable circuit 12 in the block 241 (a third block) into the ST mode while supplying the voltage V2 to the bistable circuit of the block 241 among the second blocks (step S72 in FIG. 31, the period T2), and supplies the voltage V1 while maintaining the bistable circuit 12 in the block 241 in the ST mode (step S74, the period T3). Thereafter, the control circuit 28 puts the bistable circuit 12 in the block 242 (a fourth block), which is different from the block 241, into the ST mode while supplying the voltage V1 to the bistable circuit 12 in the block 242 among the second blocks, and supplies the voltage V1 while maintaining the bistable circuit 12 in the ST mode. This can shorten the period waiting for the retention, and can reduce the power consumption.

As in FIG. 36 illustrating the type B of the retention operation, after putting the bistable circuits 12 in the second blocks into the ST mode while supplying the voltage V2 to the bistable circuits 12 in the second blocks, the control circuit 28 supplies the voltage V1 while maintaining the bistable circuits 12 in the second blocks in the ST mode (step S74 of FIG. 28, time t26 of FIG. 36). This simplifies the control compared with the type C. The control circuit 28 may collectively supply the voltage V2 while maintaining the bistable circuits 12 in the second blocks in the ST mode. In addition, the control circuit 28 may divide the second blocks into a plurality of groups each including one or more second blocks, and supply the voltage V2 to each group sequentially.

The resistor 40 (a memory circuit) is provided outside the cell array 20, and stores the UDFs (information indicating a block that stores data that are not required to be retained) received from the external circuit. The control circuit 28 extracts the blocks that store data that are not required to be retained based on the UDFs (step S56). This simplifies the control compared with a method that provides the memory circuit storing the UDF to each sub-array 22 or each block 24 because it is not necessary to transfer the UDF to the control circuit 28 through the bus 25 and the like.

As illustrated in FIG. 17, the inverter circuits 14 and 16 include the FETs m1 and m3 (a first FET), the FETs m2*b* and m4*b* (a second FET), the FETs m2*a* and m4*a* (a third FET), and the FETs m9 and m10 (a fourth FET), respectively. The FETs m1 and m3 are P channel (a channel of a first conductivity type) FETs, the sources are coupled to the power supply line 15*a* (a first power supply line), the drains are coupled to the output nodes Q and QB, respectively, and the gates are coupled to the input nodes N1 and N3, respectively. The FETs m2*b* and m4*b* are N channel (a channel of a second conductive type opposite to the first conductive type) FETs, the sources are coupled to the ground line 15*b* (a second power supply line), the drains are coupled to the intermediate nodes N2 and N4, respectively, and the gates are coupled to the input nodes N1 and N3, respectively. The FETs m2*a* and m4*a* are N channel FETs, the sources are coupled to the intermediate nodes N2 and N4, respectively, the drains are coupled to the output nodes Q and QB, respectively, and the gates are coupled to the nodes N1 and N3, respectively. The FETs m9 and m10 (the fourth FET) are N channel FETs, and one of the source and the drain of the FET m9 and one of the source and the drain of the FET m10 are coupled to the intermediate nodes N2 and N4, respectively, the other of the source and the drain of the FET m9 and the other of the source and the drain of the FET m10 are coupled to the control line CTRL (a control node), and the gates are coupled to the output nodes Q and QB, respectively. This allows for switching between the BI mode and the ST mode according to the voltage of the control line CTRL.

As illustrated in FIG. 21A, the first FET may be the FETs m2 and m4, the second FET may be the FETs m1*a* and m3*a*, the third FET may be the FETs m1*b* and m3*b*, and the fourth FET may be the FETs m9*a* and m10*a*. In this case, the channel of the first conductivity type is the N channel, and the channel of the second conductivity type is the P channel.

As illustrated in FIG. 21B, the FETs m1*a* and m1*b* connected in series between the power supply line 15*a* and the output node Q, and the FETs m3*a* and m3*b* connected in series between the power supply line 15*a* and the output node QB may be provided as the first FET.

Third Embodiment

In the memory cell 10 illustrated in FIG. 17, FIG. 21A, and FIG. 21B of the second embodiment, the FETs m9 and m10, which are pull-down side feedback transistors FBTr, are N channel FETs. The FETs m9*a* and m10*a*, which are pull-up side feedback transistors FBTr, are P channel FETs.

The type where the FETs m9 and m10 are provided is referred to as a pull-down type feedback PDFB. The type where the FETs m9*a* and m10*a* are provided is referred to as a pull-up type feedback PUFB. The type where the FETs m9, m9*a*, m10, and m10*a* are provided is referred to as a pull-up pull-down type feedback PUPDFB. The type where the power switch 30 is provided between the power supply line 15*a* and the power source 15*c* is referred to as a header PS.

The type where the power switch 30 is provided between the ground line 15*b* and the ground 15*d* is referred to as a footer PS. The memory cell illustrated in FIG. 17 is of a header PS·PDFB. The memory cell illustrated in FIG. 21A is of a header PS·PUFB. The memory cell illustrated in FIG. 21B is of a header PS·PUPDFB.

Hereinafter, the problem of the second embodiment will be described using the header PS·PDFB as an example. In FIG. 17, the VVDD and the voltage of the CTRL in the standby state and the retention state are as follows.

Standby state (BI mode): VVDD=VVDDH, the voltage of the CTRL is a VFNL.

Retention state (ST mode): VVDD=VVDDL, the voltage of the CTRL is a VFNH.

Voltages have the following relationships, for example.

$$VFNL < VFNH = VVDDL < VVDDH,$$

$$VFNL < VVDDL < VFNH < VVDDH, \text{ or}$$

$$VFNL < VFNH < VVDDL < VVDDH.$$

The VVDDL, the VVDDH, the VGND, the VFNL, and the VFNH are, for example, 0.2 V, 1.2 V, 0.0 V, 0.0 V, and 0.2 V, respectively.

For example, when the node Q is at the high level, the FET m9 is ON, and the node N2 is charged from the control line CTRL of which the voltage is the VFNH. However, since the FET m9 is an N channel, and the threshold voltage Vth of the FET m9 is positive, the charging potential from the control line CTRL is practically VFNH-Vth. This may decrease the feedback effect of the FET m9, which is the FBTr, resulting in decrease in the operation stability (for example, noise margin) of the bistable circuit in the retention state.

[Header PS·PDFB]

Figure 41:
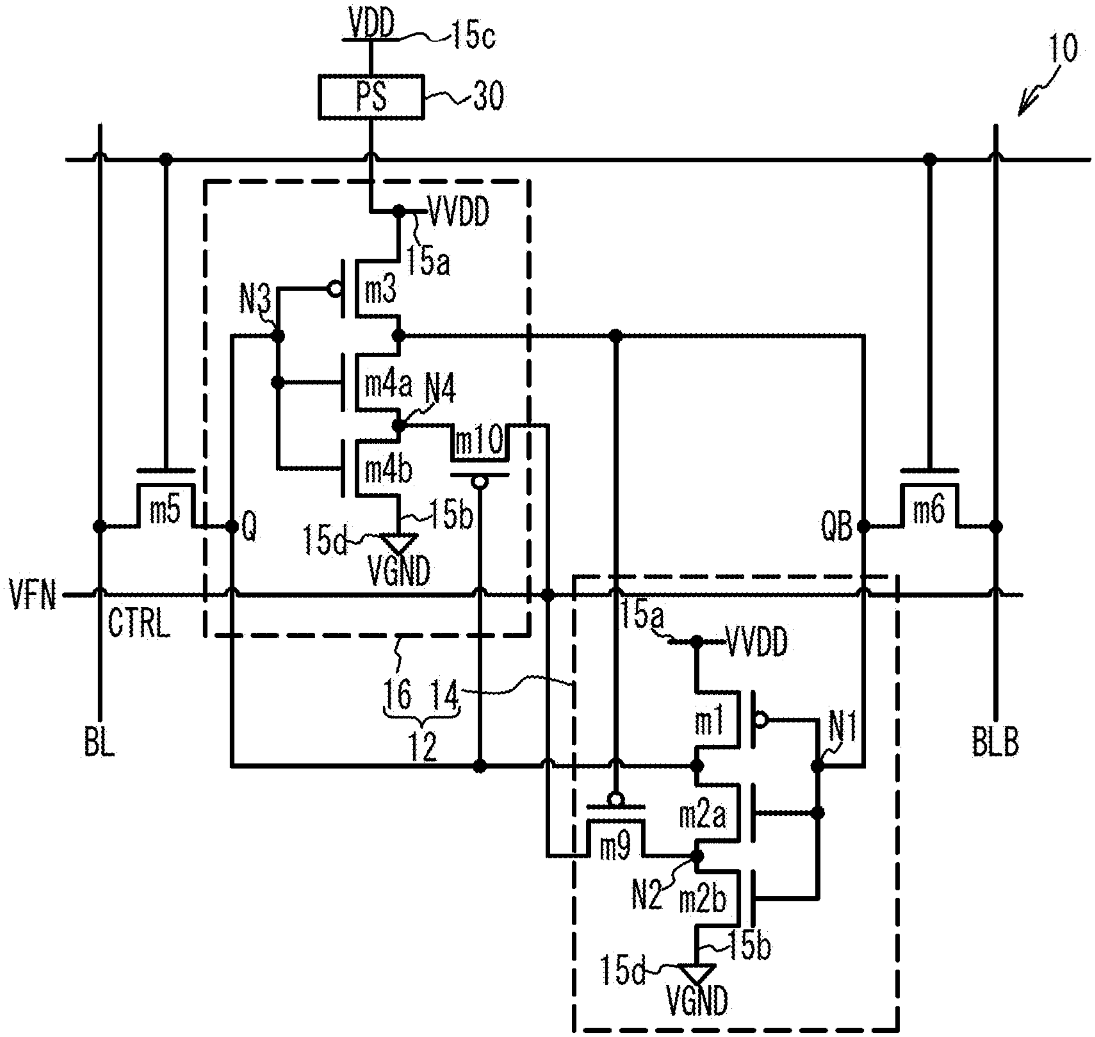
FIG. 41 is a circuit diagram of a header PS·PDFB·type 1 memory cell in a third embodiment.
Figure 42:
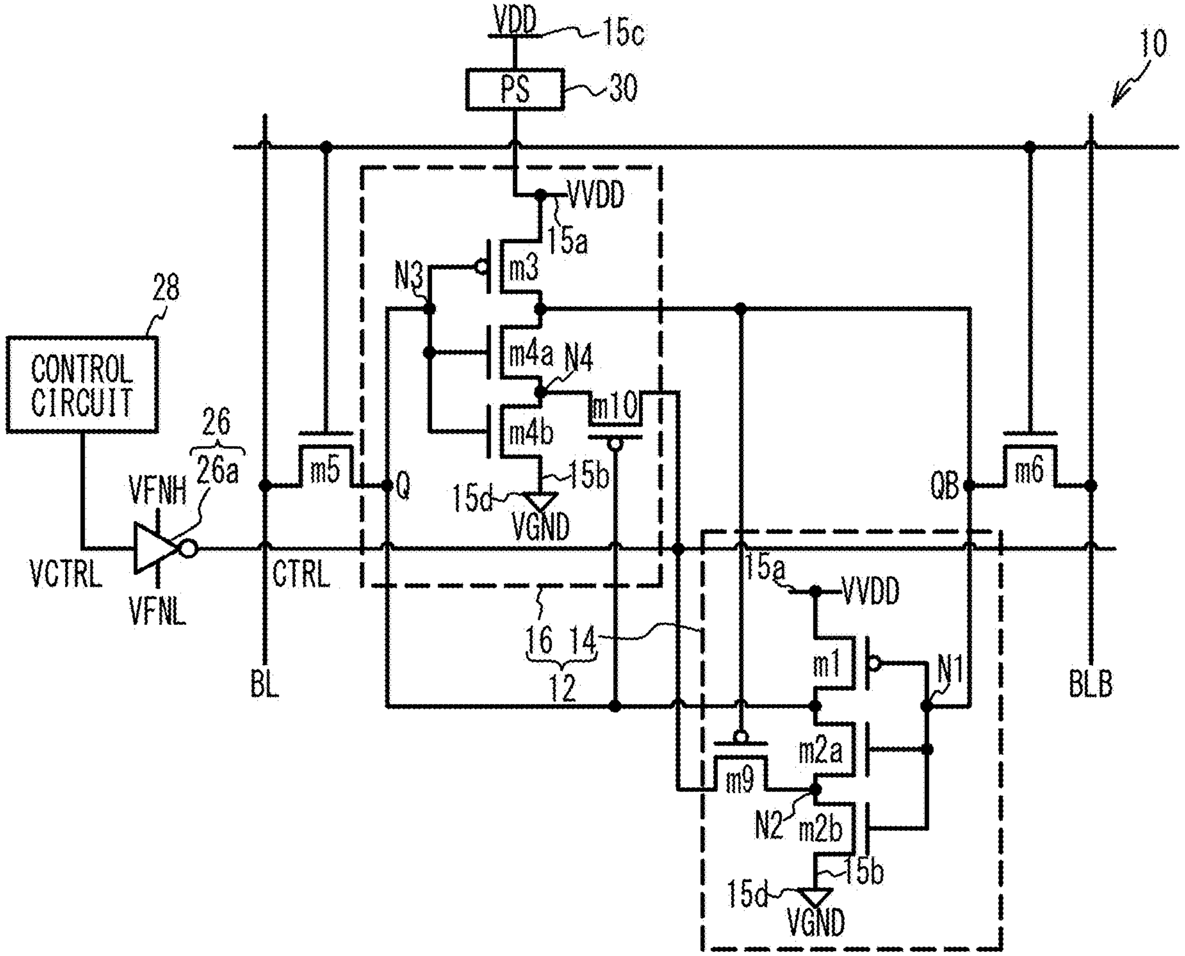
FIG. 42 is a circuit diagram of a header PS·PDFB·type 2 memory cell in the third embodiment.

A third embodiment that solves the above problem of the memory cell in the second embodiment will be described. FIG. 41 is a circuit diagram of a header PS·PDFB·type 1 memory cell in the third embodiment, and FIG. 42 is a circuit diagram of a header PS·PDFB·type 2 memory cell in the third embodiment. The type 1 is a type including no driver 26, and the type 2 is a type including the driver 26. As illustrated in FIG. 41 and FIG. 42, the FETs m9 and m10, which are the FBTrs, are P channel FETs. The gates of the FETs m9 and m10 are coupled to the nodes QB and Q, respectively. The power switch 30 applies the virtual power supply voltage VVDD to the power supply line 15*a*.

In the type 1 illustrated in FIG. 41, no driver 26 is provided, and a constant voltage VFN is applied to the control line CTRL. In the type 2 illustrated in FIG. 42, the driver 26 is provided. The driver 26 is the inverter 26*a*, supplies the voltage VFNL to the control line CTRL when the control signal VCTRL has the high level, and supplies the voltage VFNH to the control line CTRL when the control signal VCTRL has the low level. Other configurations are the same as those of the second embodiment illustrated in FIG. 17, and the description thereof is thus omitted.

The VVDD and the voltage of the CTRL in the standby state and the retention state in the header PS·PDFB·type 1 illustrated in FIG. 41 are as follows.

Standby state (BI mode): VVDD=VVDDH, the voltage of the CTRL is a VFN.

Retention state (ST mode): VVDD=VVDDL, the voltage of the CTRL is the VFN.

Voltages have the following relationships, for example.

$$VFN = VVDDL < VVDDH,$$

$$VVDDL < VFN < VVDDH,$$

(However, this relationship is not preferable because the nodes N3 and N4 are difficult to charge from the control line CTRL in this relationship).

The VVDDL, the VVDDH, the VGND, and the VFN are, for example, 0.2 V, 1.2 V, 0.0 V, and 0.2 V, respectively.

The VVDD and the voltage of the CTRL in the standby state and the retention state in the header PS·PDFB·type 2 illustrated in FIG. 42 are the same as the voltages illustrated in FIG. 17.

In the memory cell of the third embodiment illustrated in FIG. 41 and FIG. 42, when the node Q is at the high level, the node QB becomes at the low level, for example. Thus, the FET m9 is turned on, and the node N2 is charged from the control line CTRL of which the voltage is the VFN (FIG. 41) or the VFNH (FIG. 42). Since the FET m9 is a P channel FET and a voltage sufficiently lower than the voltages of the source and the drain is applied to the gate of the FET m9, the voltage of the node N2 can be pulled up to the VFN (FIG. 41) or the VFNH (FIG. 42). This produces the feedback effect of the FET m9 sufficiently. Thus, the operation stability of the bistable circuit in the retention state can be improved.

In the type 1 illustrated in FIG. 41, by making the VFN lower than the VVDDH, switching between the ST mode and the BI mode is possible even when the VFN is set at the constant voltage. For example, when the node Q is at the high level, the voltage of the node N2 is sufficiently lower than the VVDDH even when the FET m9 is turned on. Thus, the bistable circuit 12 functions as the BI mode. This eliminates the need for the driver 26 for the control line CTRL in FIG. 17, and the chip area can be therefore reduced. Further, by making the VFN sufficiently lower than the VVDDH, the leakage current in the standby state and the retention state can be reduced.

In the type 1, when the VVDDH is close to the VFN, the transition to the BI mode may become insufficient. As illustrated in FIG. 42, in the type 2, the voltage of the CTRL is set at the VFNH in the ST mode, and the voltage of the CTRL is set at the VFNL in the BI mode. This allows for the adequate transition to the BI mode.

[Simulation]

Simulations were conducted for the memory cell (a comparative example 3) of the 6T-SRAM, the memory cell of the second embodiment illustrated in FIG. 17, the header PS·PDFB·type 1 memory cell of the third embodiment illustrated in FIG. 41, and the header PS·PDFB·type 2 memory cell of the third embodiment illustrated in FIG. 42.

The channel width W/the channel length L of each FET is as follows.

*FETs* $m1$ and $m3$: 100 nm/60 nm

*FETs* $m2a$, $m2b$, $m4a$, and $m4b$: 150 nm/60 nm

*FETs* $m5$ and $m16$: 100 nm/120 nm

*FETs* $m9$ and $m10$: 150 nm/60 nm

-continued $PS1$: 300 nm/60 nm $PS3$: 150 nm/60 nm

FET of the inverter 26$a$: 100 nm/60 nm

Each voltage is as follows.

$$VVDDH = 1.2\ V$$

$$VVDDL = 0.2\ V$$

$$VGND = 0\ V$$

$$VFNH = 0.2\ V$$

$$VFNL = 0\ V$$

$$VFN = 0.2\ V$$

Figure 43A:
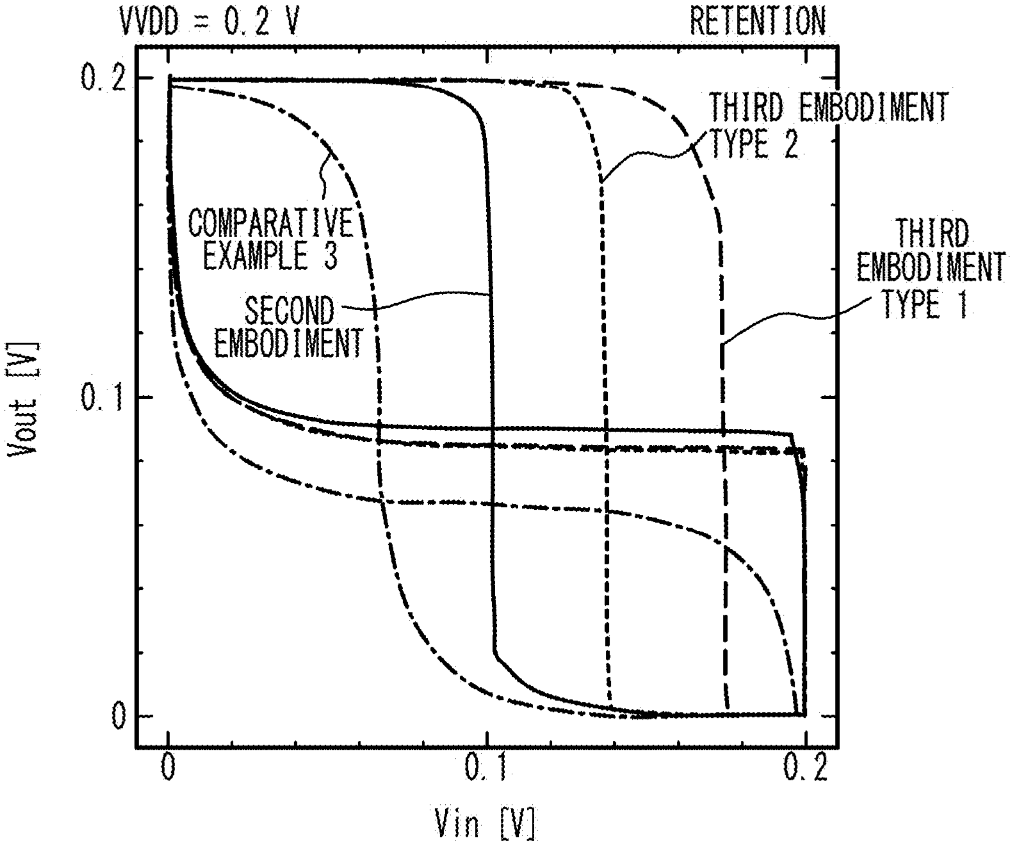
FIG. 43A presents transfer characteristics of inverter circuits in a retention state.

FIG. 43A presents the transfer characteristics of the inverter circuits in the retention state. The comparative example 3 exhibits the characteristics of the 6T-SRAM in the normal state. As presented in FIG. 43A, in the second embodiment, compared with the comparative example 3, the opening of the butterfly characteristics is large, and the noise margin is large. In the types 1 and 2 of the third embodiment, the noise margin is larger than that in the second embodiment.

Figure 43B:
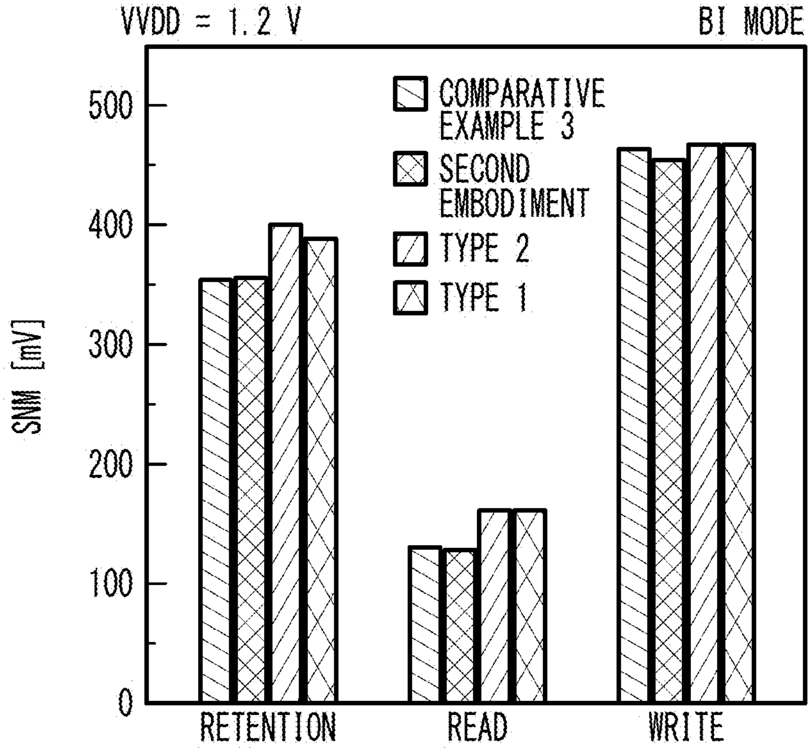
FIG. 43B presents SNMs in a BI mode.

FIG. 43B presents the static noise margins (SNMs) in the standby state. VVDD=1.2 V, and the mode is the BI mode. RETENTION does not indicate the ULV retention state, and indicates the state where the FETs m5 and m6 are turned off and data is retained. READ indicates the state where the FETs m5 and m6 are turned on and the bit lines BL and BLB are set at 1.2 V. WRITE indicates the state where the FETs m5 and m6 are turned on, one of the bit lines BL and BLB is set at 1.2 V, and the other is set at 0 V.

As presented in FIG. 43B, in the third embodiment, the SNM is slightly larger than those in the comparative example 3 and the second embodiment. The reason is as follows. In the third embodiment, since the FETs m9 and m10 are P channel FETs, the electric potentials of the nodes N3 and N4 are slightly higher than those in the second embodiment. Therefore, in the BI mode, the feedback by the FETs m9 and m10 is applied a little. This increases the SNM a little.

Figure 44A:
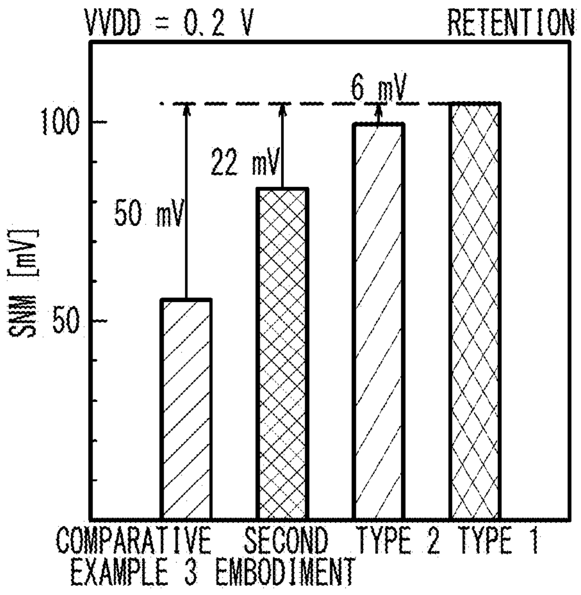
FIG. 44A presents SNMs in the retention state.

FIG. 44A presents the SNMs in the retention state. As presented in FIG. 44A, the SNM is approximately 50 mV in the comparative example 3, while the SNM can be made to be as large as approximately 80 mV in the second embodiment. In the third embodiment, the SNM is approximately 100 mV, and the SNM can be made to be larger than that in the second embodiment by approximately 20 mV, and the SNM can be made to be larger than that of the comparative example 3 by approximately 50 mV. The SNM of the type 1 of the third embodiment and the SNM of the type 2 of the third embodiment are approximately equal. In the third embodiment, the SNM can be made to be approximately two times that of the comparative example 2. As seen from the above, in the third embodiment, the SNM in the retention state can be made to be larger than that of the second embodiment, and the operation stability improves. When the SNM (for example, 80 mV) approximately equal to that of the second embodiment is secured, the VVDDL can be made to be lower than that of the second embodiment. Thus, the power consumption can be reduced.

The SNM of the type 1 of the third embodiment is larger than the SNM of the type 2 of the third embodiment by approximately 6 mV. This is because no driver 26 is provided in the type 1, and thereby, the bias is applied to the control line CTRL effectively. That is, in both the type 1 and the type 2, the VFNH and the VFN are 0.2 V. However, in the type 2, the VFNH is applied to the control line CTRL through the driver 26. By contrast, in the type 1, the VFN is applied to the control line CTRL not through the driver 26. Therefore, in the type 1, the VFN is effectively applied to the control line CTRL. Although the illustration is omitted, the PUPDFB described later can expand the noise margin more than the PUFB and the PDFB.

Figure 44B:
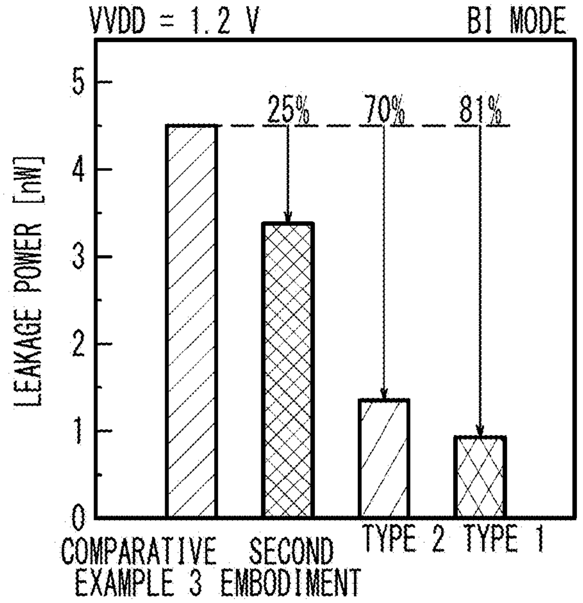
FIG. 44B presents leakage power in the BI mode.

FIG. 44B presents the leakage power in the BI mode. As presented in FIG. 44B, in the standby state (the BI mode) of the second embodiment, the leakage power can be reduced by 25% compared with that of the comparative example 3. Compared with the comparative example 3, the third embodiment can reduce the leakage power by 70% in the type 2, by 81% in the type 1. In the PDFB type, the FBTr is an N channel FET in the second embodiment as illustrated in FIG. 17, and the FBTr is a P channel FET in the third embodiment as illustrated in FIG. 41 and FIG. 42. As described above, in the simulation illustrated in FIG. 43A to FIG. 44B, the size (the channel width W and the length L) of the FBTr (the FETs m9 and m10) is the same between the second embodiment and the third embodiment, and the absolute value of the threshold value of the FBTr is also substantially the same between the second embodiment and the third embodiment. In addition, in the BI mode, the bias voltage of the control node (the control line CTRL) of the FBTr of the second embodiment is greater than the bias voltage of the control node (the control line CTRL) of the FBTr of the third embodiment. In such a case, the leakage current of the P channel FET is less than the leakage current of the N channel FET. Therefore, the third embodiment can reduce the leakage power in the standby state more than the second embodiment. In the simulation, the size of the FBTr (the FETs m9 and m10) is configured to be the same between the second embodiment and the third embodiment, and the sizes of the driver FETs (the FETs m2$a$, m2$b$, m4$a$, and m4$b$) in the inverters 14 and 16 are configured to be the same between the second embodiment and the third embodiment. However, even when the size of the FBTr, the sizes of the driver FETs in the inverters 14 and 16, and the bias voltage of the control line CTRL are optimized in each of the second and third embodiments, the third embodiment can reduce the leakage power in the standby state more than the second embodiment in the PDFB type.

Figure 44C:
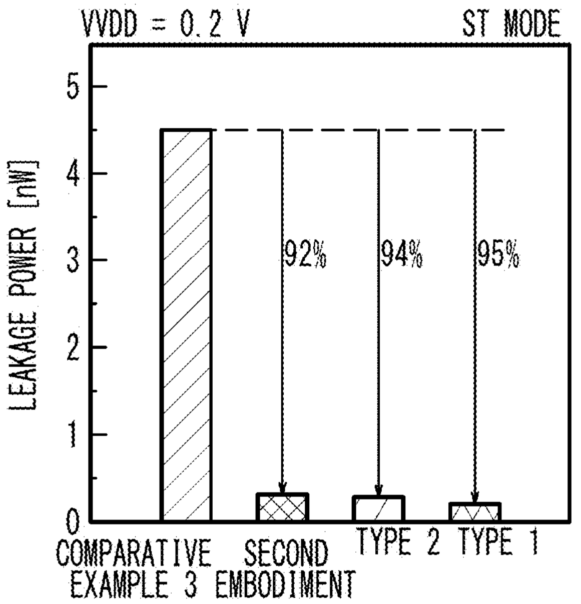
FIG. 44C and FIG. 44D present leakage power in an ST mode.
Figure 44D:
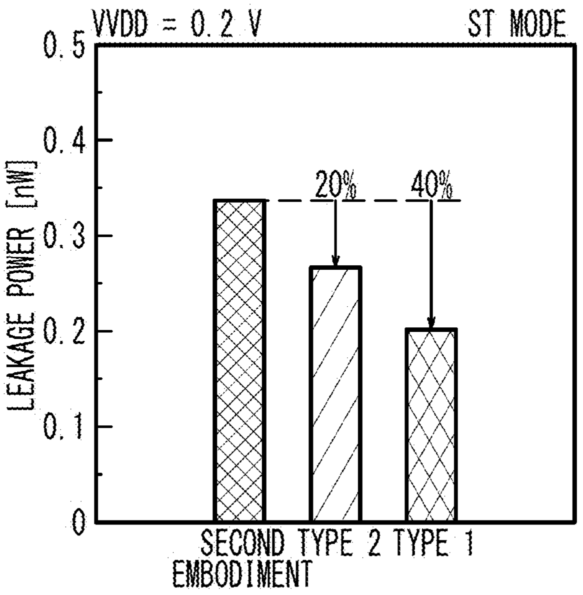

FIG. 44C and FIG. 44D present the leakage power in the ST mode. The comparative example 3 of FIG. 44C indicates the leakage power of the 6T-SRAM in the standby state. As presented in FIG. 44C, in the retention state (the ST mode) of the second embodiment, the leakage power can be reduced by 92% compared with that in the standby state of the comparative example 3. Compared with the comparative example 3, the types 1 and 2 of the third embodiment can reduce the leakage power by 95% and 94%, respectively. As presented in FIG. 44D, compared with the second embodiment, the types 1 and 2 of the third embodiment can reduce the leakage power by 40% and 20%, respectively. Since no driver 26 is provided in the type 1, the type 1 can reduce the leakage current of the driver 26 more than the type 2. Thus, as illustrated in FIG. 44D, the type 1 can reduce the leakage power more than the type 2. Hereinafter, examples other than the header PS·PDFB will be described.

[Footer PS·PDFB]

Figure 45:
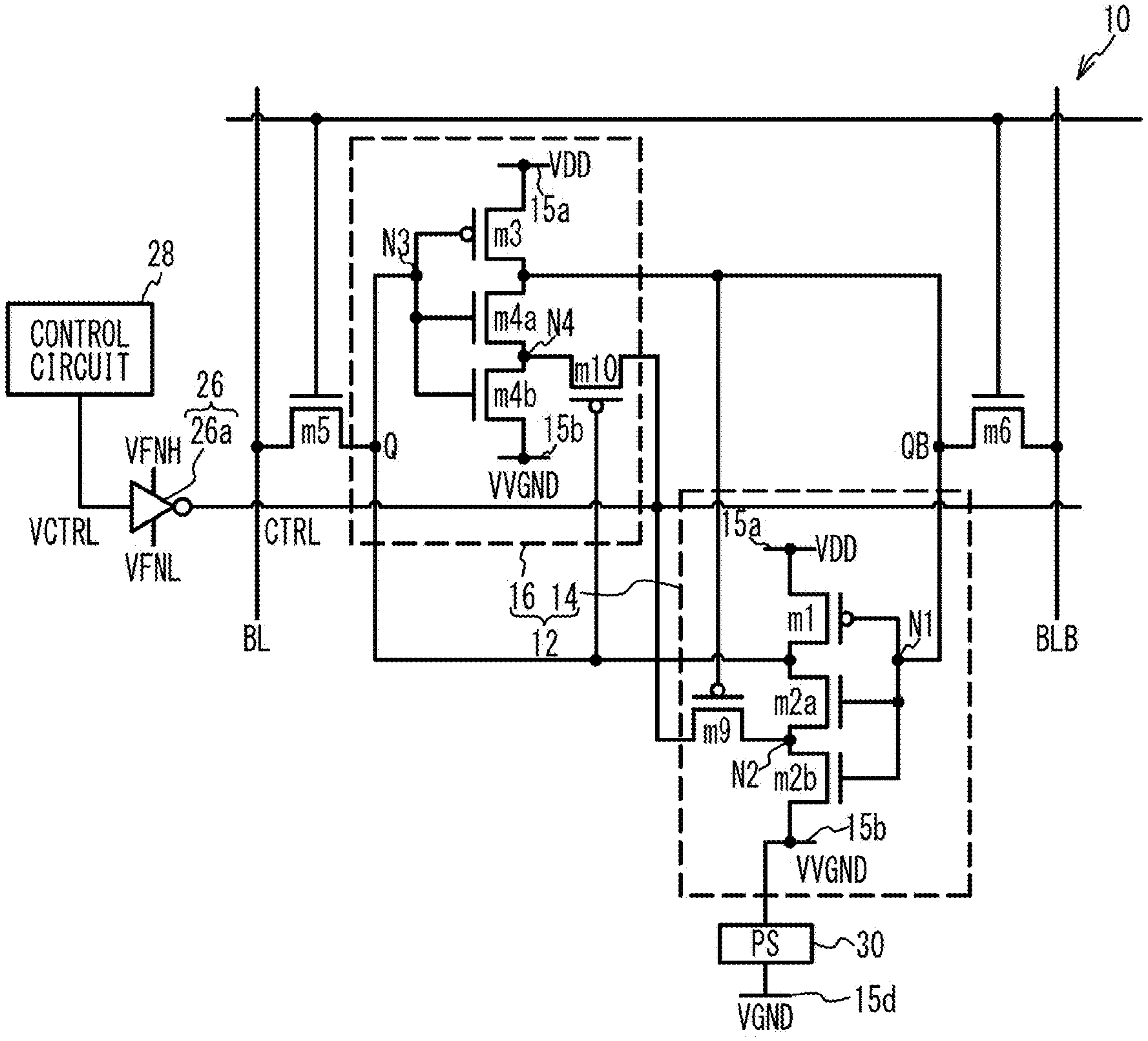
FIG. 45 is a circuit diagram of a footer PS·PDFB·type 2 memory cell in the third embodiment.

FIG. 45 is a circuit diagram of a footer PS·PDFB·type 2 memory cell in the third embodiment. As illustrated in FIG. 45, the power supply line 15*a* is supplied with the VDD, and the power switch 30 is provided between the ground lines 15*b* and a ground. The ground line 15*b* has a virtual ground voltage VVGND.

The VVGND and the voltage of the CTRL in the standby state and the retention state are as follows.

Standby state (BI mode): VVGND=VVGNDL, the voltage of the CTRL is the VFNL.

Retention state (ST mode): VVGND=VVGNDH, the voltage of the CTRL is the VFNH.

Voltages have the following relationships, for example.

$$VVGNDL < VVGNDH,$$

$$VFNL \sim VVGNDL, \text{ and}$$

$$VFNH \sim VVGNDH.$$

Note that "~" means neighborhood. The VVGNDL, the VVGNDH, the VDD, the VFNL, and the VFNH are, for example, 0.0 V, 1.0 V, 1.2 V, 0.0 V, and 1.2 V, respectively.

[PDFB]

In the PDFB, in the case that the memory cell is configured to be of the header PS as illustrated in FIG. 41, when VVDDH−VGND is large, for example, 0.5 V or greater and VFN−VGND<(VVDDH−VGND)/2, the memory cell can be configured to be of the type 1. When VVDDH−VGND is small, for example, 0.5 V or less, the transition to the BI mode may be insufficient in the type 1. Thus, by configuring the memory cell to be of the type 2, the transition to the sufficient BI mode is possible.

[Footer PS·PUFB]

Figure 46:
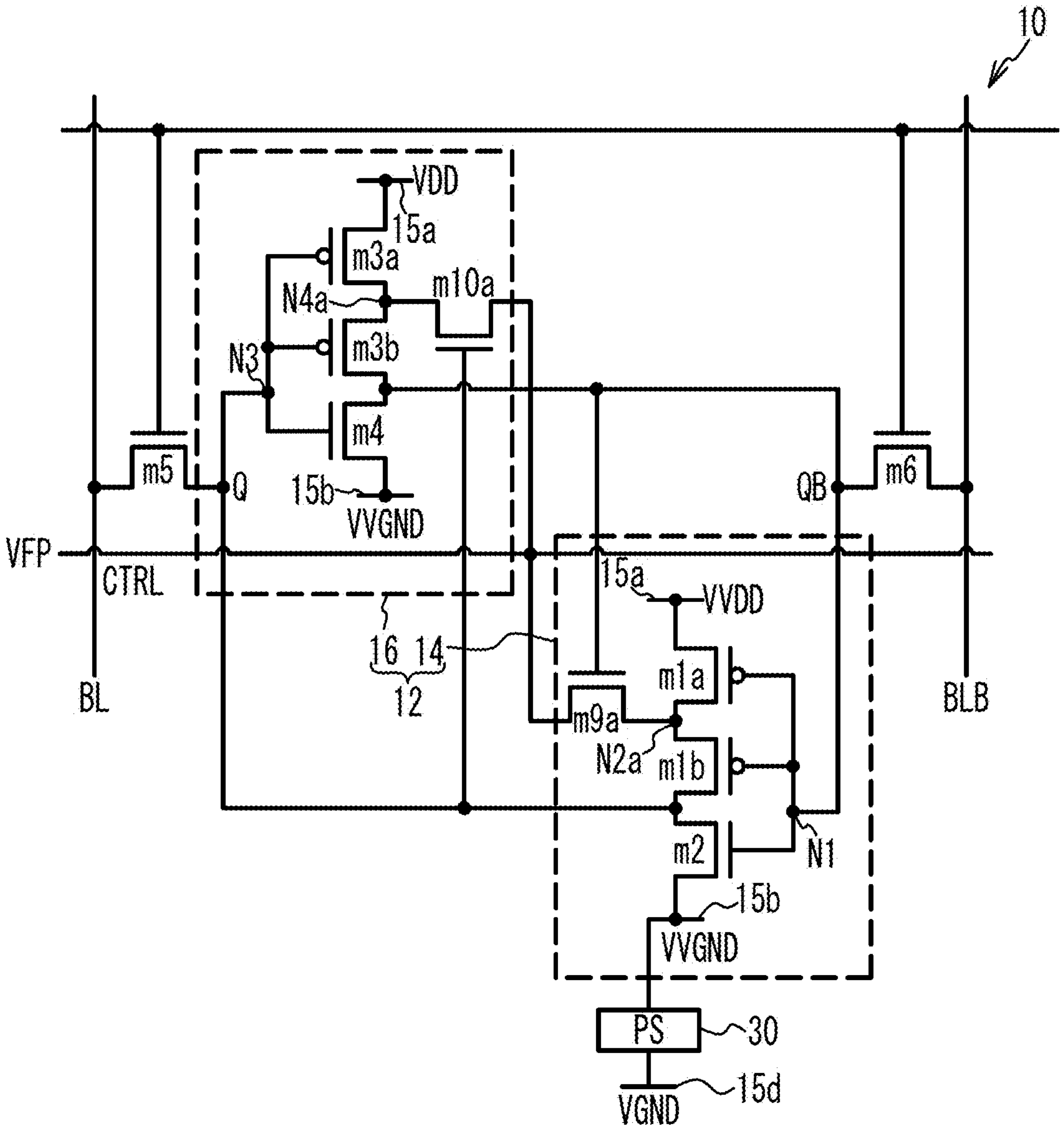
FIG. 46 is a circuit diagram of a footer PS·PUFB·type 1 memory cell in the third embodiment.

FIG. 46 is a circuit diagram of a footer PS·PUFB·type 1 memory cell in the third embodiment. The FETs m9*a* and m10*a* are N channel FETs. The gates of the FETs m9*a* and m10*a* are coupled to the nodes QB and Q, respectively. The power supply line 15*a* is supplied with the VDD, and the power switch 30 is provided between the ground line 15*b* and the ground 15*d*. The ground line 15*b* has the virtual ground voltage VVGND. A constant voltage VFP is applied to the control line CTRL. Other configurations are the same as those of the second embodiment illustrated in FIG. 21A, and the description thereof is thus omitted.

The VVGND and the voltage of the CTRL in the standby state and the retention state are as follows.

Standby state (BI mode): VVGND=VVGNDL, the voltage of the CTRL is the VFP.

Retention state (ST mode): VVGND=VVGNDH, the voltage of CTRL is the VFP.

Voltages have the following relationships, for example.

$$VVGNDL < VFP = VVGNDH,$$

$$VVGNDL < VFP < VVGNDH,$$

(However, this relationship is not preferable because the nodes N2*a* and N4*a* are difficult to charge from the control line CTRL in this relationship).

The VVGNDL, the VVGNDH, the VDD, and the VFP are, for example, 0.0 V, 1.0 V, 1.2 V, and 1.0 V, respectively.

[Header PS·PUFB]

Figure 47:
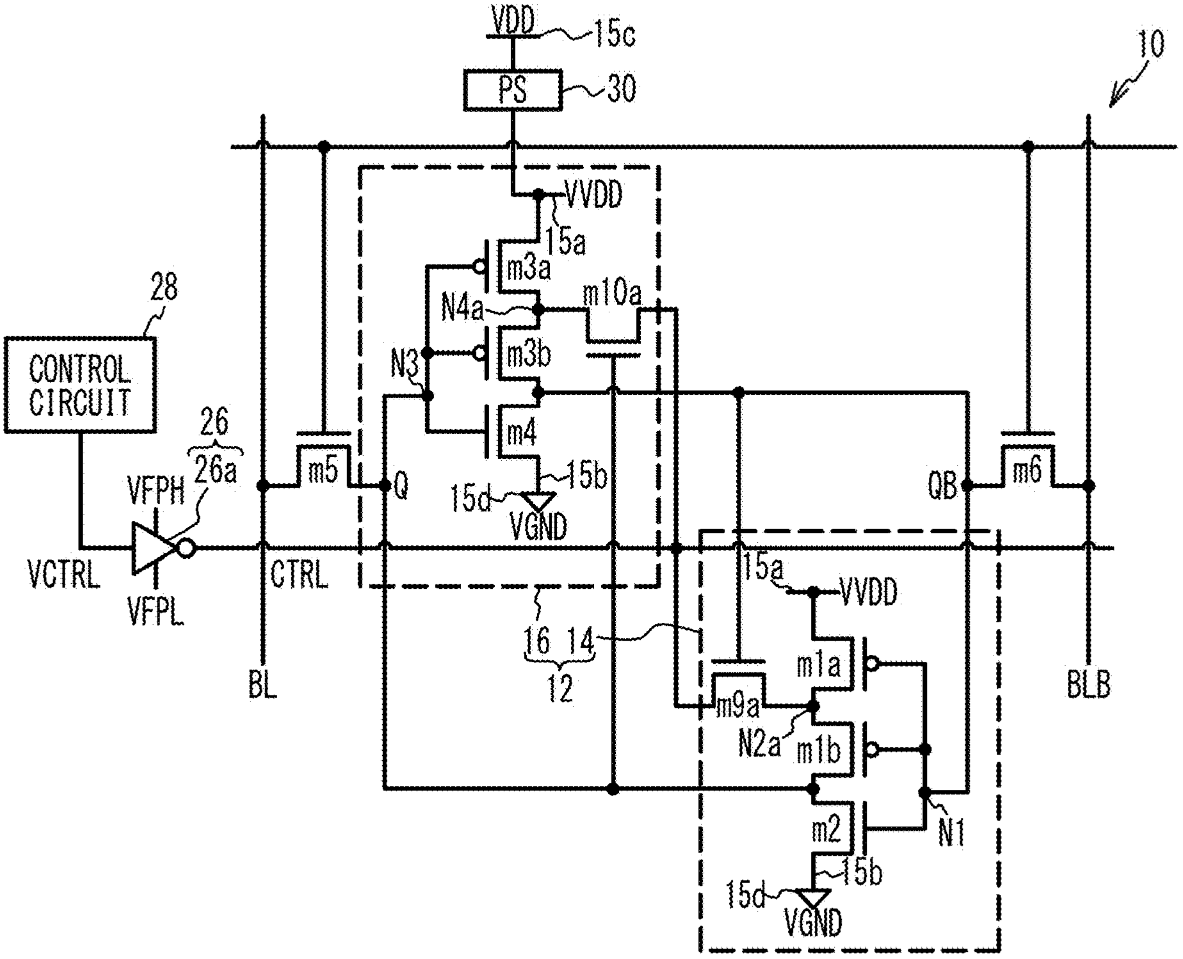
FIG. 47 is a circuit diagram of a header PS·PUFB·type 2 memory cell in the third embodiment.

FIG. 47 is a circuit diagram of a header PS·PUFB·type 2 memory cell in the third embodiment. Compared with FIG. 46, the driver 26 is provided. The driver 26 is the inverter 26*a*, outputs a voltage VFPH to the control line CTRL when the control signal VCTRL output by the control circuit 28 has the low level, and outputs a voltage VFPL to the control line CTRL when the VCTRL has the high level.

The VVDD and the voltage of the CTRL in the standby state and the retention stat are as follows.

Standby state (BI mode): VVDD=VVDDH, the voltage of the CTRL is the VFPH.

Retention state (ST mode): VVDD=VVDDL, the voltage of CTRL is the VFPL.

Voltages have the following relationships, for example.

$$VVDDL < VVDDH,$$

$$VFPL \sim VGND, \text{ and}$$

$$VFPH \sim VVDDH.$$

Note that "~" means neighborhood.

The VVDDL, the VVDDH, the VGND, the VFNL, and the VFNH are, for example, 0.2 V, 1.2 V, 0.0 V, 0.0 V, and 1.2 V, respectively.

[PUFB]

In the PUFB, in the case that the memory cell is configured to be of the footer PS as illustrated in FIG. 46, when VDD−VVGNDL is large, for example, 0.5 V or greater and, for example, VDD−VFP<(VDD−VVGNDL)/2, the memory cell can be configured to be of the type 1. When VDD−VVGNDL is small, for example, 0.5 V or less, the transition to the BI mode may be insufficient in the type 1. Thus, by configuring the memory cell to be of the type 2, the transition to the sufficient BI mode is possible.

[Header PS·PUPDFB]

Figure 48:
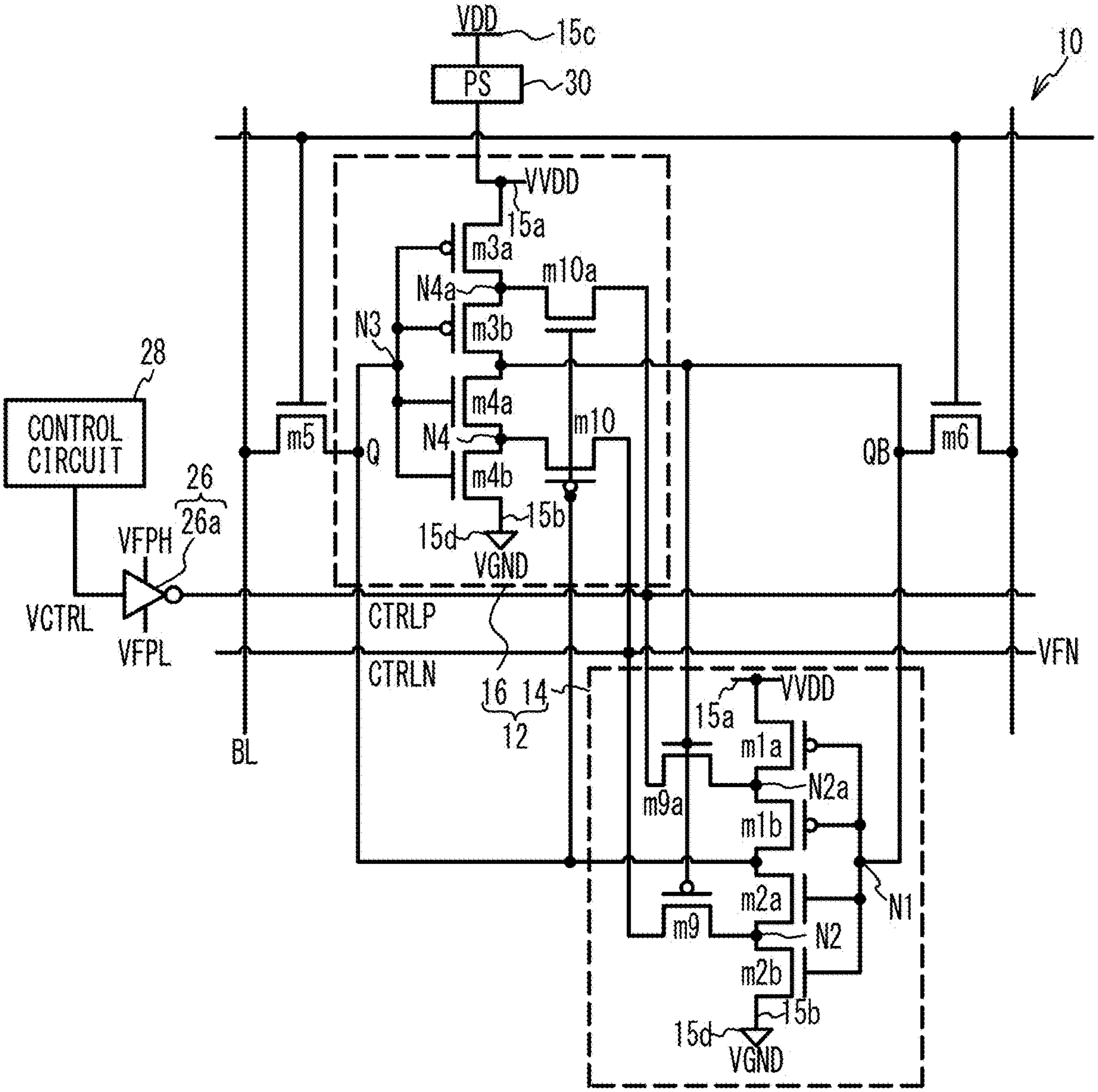
FIG. 48 is a circuit diagram of a header PS·PUPDFB memory cell in the third embodiment.

FIG. 48 is a circuit diagram of a header PS·PUPDFB memory cell in the third embodiment. The FETs m9 and m10 are P channel FETs, and the FETs m9*a* and m10*a* are N channel FETs. The gates of the FETs m9 and m9*a* are coupled to the node QB, and the gates of the FETs m10 and m10*a* are coupled to the node Q. The power switch 30 is provided between the power supply line 15*a* and the power source 15*c*, and the ground line 15*b* is supplied with the ground voltage VGND. The control line CTRLN of the FETs m9 and m10 is supplied with the constant voltage VFN. The driver 26 applies a voltage to the control line CTRLP of the FETs m9*a* and m10*a*. The driver 26 is the inverter 26*a*, outputs the voltage VFPH to the control line CTRLP when the control signal VCTRL output by the control circuit 28 has the low level, and outputs the voltage VFPL to the control line CTRLP when the VCTRL has the high level. Other configurations are the same as those of the second embodiment illustrated in FIG. 21B, and the description thereof is thus omitted.

The operation condition of the header PS·PUPDFB memory cell illustrated in FIG. 48 is the combination of the operation condition of the header PS·PDFB·type 1 memory cell illustrated in FIG. 41 and the operation condition of the header PS·PUFB·type 2 memory cell illustrated in FIG. 47.

[Footer PS·PUPDFB]

Figure 49:
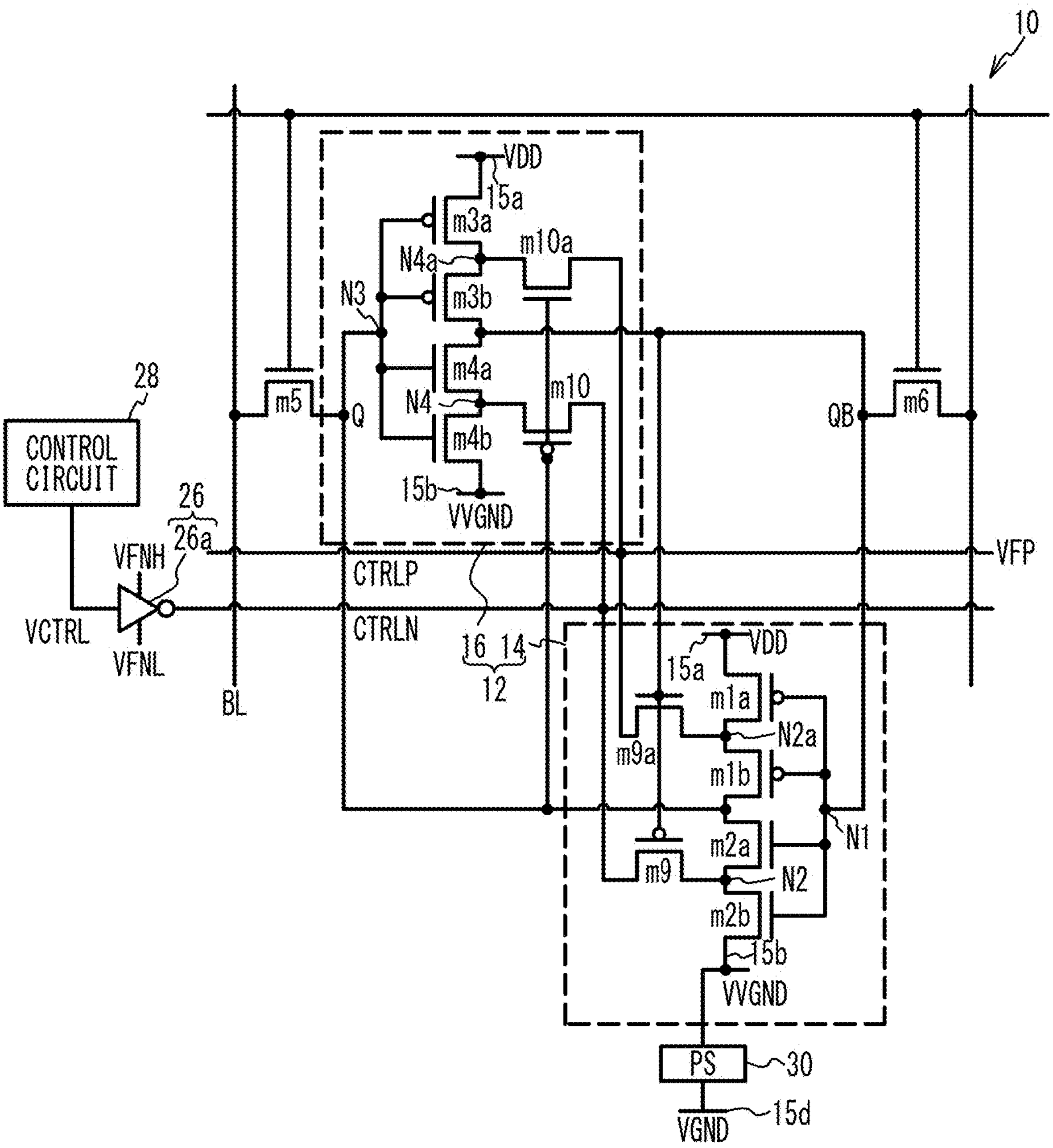
FIG. 49 is a circuit diagram of a footer PS·PUPDFB memory cell in the third embodiment.

FIG. 49 is a circuit diagram of a footer PS·PUPDFB memory cell in the third embodiment. The power supply line 15*a* is supplied with the power supply voltage VDD, and the power switch 30 is provided between the ground line 15*b* and the ground 15*d*. The control lines CTRLP of the FETs m9*a* and m10*a* are supplied with the constant voltage VFP. The driver 26 applies a voltage to the control lines CTRLN of the FETs m9 and m10. The driver 26 is the inverter 26*a*, outputs the voltage VFNH to the control line CTRLN when the control signal VCTRL output by the control circuit 28 has the low level, and outputs the voltage VFNL to the control line CTRLN when the VCTRL has the high level. Other configurations are the same as those illustrated in FIG. 48, and the description thereof is thus omitted.

The operation condition of the footer PS·PUPDFB memory cell in FIG. 49 is the combination of the operation condition of the footer PS·PDFB·type 2 memory cell illustrated in FIG. 45 and the operation condition of the footer PS·PUFB·type 1 memory cell illustrated in FIG. 46. In the footer PS·PUPDFB memory cell, since the feedback of the PUFB and the PDFB are applied, the SNM can be increased.

In the header PS, the VVDD in the standby state may be set at a VVDDHS that is slightly lower than the VVDDH in the normal operation state. In the footer PS, the VVGND in the standby state may be set at a VVGNDLS that is slightly higher than the VVGNDL in the normal operation state. For a low-voltage operation, in the header PS, a VVDDM that establishes VVDDL<VVDDM<VVDDH may be used, and in the footer PS, a VVGNDM that establishes VVGNDL<VVGNDM<VVGNDL may be used.

In the third embodiment, in the case of the PDFB, in each of the inverter circuits 14 (the first inverter circuit) and 16 (the second inverter circuit), the sources of the P channel FETs m1 and m3 (a first FET having a channel of a firs conductivity type) are coupled to the power supply line 15*a* (a first power supply line), the drains are coupled to the nodes Q and QB (an output node), respectively, and the gates are coupled to the nodes N1 and N3 (an input node), respectively. In the N channel FETs m2*b* and m4*b* (a second FET having a channel of a second conductivity type), the sources are coupled to the ground line 15*b* (a second power supply line), the drains are coupled to the nodes N2 and N4 (an intermediate node), respectively, and the gates are coupled to the nodes N1 and N3, respectively, wherein the power supply voltage VVDD−VGND is supplied between the power supply line 15*a* and the ground line 15*b*. In the N channel FETs m2*a* and m4*a* (a third FET having a channel of the second conductivity type), the sources are coupled to the nodes N2 and N4, respectively, the drains are coupled to the nodes Q and QB, respectively, and the gates are coupled to the nodes N1 and N3, respectively.

In the P channel FET m9 (a fourth FET having a channel of the first conductivity type), one of the source and the drain is coupled to the node N2, the other of the source and the drain is coupled to the control line CTRL (a control node), and the gate is coupled to the node N1, and in the P channel FET m10 (a fourth FET having a channel of the first conductivity type), one of the source and the drain is coupled to the node N4, the other of the source and the drain is coupled to the control line CTRL (the control node), and the gate is coupled to the node N3. The output node of the inverter circuit 14 and the input node N3 of the inverter circuit 16 are coupled to the node Q (a first memory node), and the input node N1 of the inverter circuit 14 and the output node of the inverter circuit 16 are coupled to the node QB (a second memory node). This improves the operation stability in the ST mode by appropriately setting the power supply voltage VVDD−VGND and the voltage of the control line CTRL.

The gate of the FET m9 of the inverter circuit 14 may be coupled to the output node of the inverter circuit 16, and the gate of the FET m10 of the inverter circuit 16 may be coupled to the output node of the inverter circuit 14.

In the case of the PUFB, the N channel FETs m2 and m4 correspond to a first FET, the P channel FETs m1*a* and m3*a* correspond to a second FET, the P channel FETs m1*b* and m3*b* correspond to a third FET, and the N channel FETs m9*a* and m10*a* correspond to a fourth FET. The ground line 15*b* and the power supply line 15*a* correspond to a first power supply line and a second power supply line, respectively.

In the case of the PDFB, the power switch 30 (a power supply circuit) switches between the voltage VVDDH−VGND (a first voltage) and the voltage VVDDL−VGND (a second voltage) lower than the voltage VVDDH−VGND and supplies the voltage VVDDH−VGND or the voltage VVDDL−VGND as the power supply voltage VVDD−VGND. The voltage VVDDH−VGND is a voltage at which the bistable circuit 12 can write and read data, and the voltage VVDDL−VGND is a voltage at which the bistable circuit 12 cannot write or read data but can retain data, and is lower than the voltage VVDDH−VGND. This can reduce the power consumption when data is retained.

The power supply circuit may generate a first voltage and a second voltage using a transistor such as a power switch from one power source, and supplies the generated voltage to the bistable circuit. Alternatively, the control circuit may supply the first voltage and the second voltage to the bistable circuit by controlling power switches each connected to the corresponding one of two power sources.

In the case of the PUFB, the voltages VDD−VVGNDL and VDD−VVGNDH correspond to a first voltage and a second voltage, respectively.

As in the type 1, even when the power switch 30 supplies either the first voltage or the second voltage to the bistable circuit 12, the control line CTRL is supplied with a fixed bias (the VFN in the case of the PDFB, and the VFP in the case of the PUFB). This eliminates the need for the driver 26, and the chip size can be thereby reduced.

In the header PS·PDFB in FIG. 41, the fixed bias (the VFN) is any bias between the voltage VVDDH of the power supply line 15*a* (a first power supply line) and the voltage VGND of the ground line 15*b* (a second power supply line) when VVDDH−VGND (a first voltage) is supplied as the power supply voltage. In the footer PS·PUFB in FIG. 46, the fixed bias (the VFP) is any bias between the voltage VVGNDL of the ground line 15*b* (a first power supply line) and the voltage VDD of the power supply line 15*a* (a second power supply line) when VDD−VVGNDL (a first voltage) is supplied as the power supply voltage. This configuration allows the ST mode and the BI mode to be switched by switching of the power supply voltage even when a constant voltage is applied to the control line CTRL as in the type 1.

In the header PS·PDFB in FIG. 41, the fixed bias (the VFN) is closer to the voltage VGND of the ground line 15*b* than the voltage (VVDDH−VGND)/2+VGND, which is intermediate between the voltage VVDDH of the power supply line 15*a* (a first power supply line) and the voltage VGND of the ground line 15*b* (a second power supply line), when VVDDH−VGND (a first voltage) is supplied as the power supply voltage. In the footer PS·PUFB in FIG. 46, the fixed bias (VFP) is closer to the voltage VDD of the power supply line 15*a* than the voltage (VDD−VVGNDL)/2+VVGNDL, which is intermediate between the voltage VVGNDL of the ground line 15*b* (a first power supply line) and the voltage VDD of the power supply line 15*a* (a second power supply line), when VDD−VVGNDL (a first voltage) is supplied as the power supply voltage. This allows the ST mode and the BI mode to be switched by switching of the power supply voltage even when a constant voltage is applied to the control line CTRL as in the type 1.

In the header PS·PDFB, the VFN is preferably closer to the VGND than (VVDDH−VGND)/3+VGND, and in the footer PS·PUFB, the VFN is preferably closer to the VDD than 2(VDD−VVGNDL)/3+VVGNDL.

In the type 2, in the case that the memory cell is of the PDFB, the control circuit 28 supplies the low level to the control line CTRL when the power switch 30 supplies VVDDH−VGND, and supplies the high level higher than the low level to the control line CTRL when the power switch 30 supplies VVDDL−VGND. In the case that the memory cell is of the PUFB, the control circuit 28 supplies the high level to the control line CTRL when the power switch 30 supplies VDD−VVGNDL, and supplies the low level lower than the high level when the power switch 30 supplies VDD−VVGNDH. This configuration can reduce the power consumption when data is retained. The high level is any voltage higher than the low level.

The example where the FBTr is a P channel FET when the memory cell is of the header PS·PDFB as illustrated in FIG. 41 and the example where the FBTr is an N channel FET when the memory cell is of the footer PS·PUFB as illustrated in FIG. 46 have been described as the type 1 in the third embodiment. As with the memory cell used in the second embodiment, even when the FBTr is an N channel FET in the case that the memory cell is of the PDFB, the memory cell can be configured to be of the type 1 that applies a fixed bias to the control line CTRL. In addition, even when the FBTr is a P channel FET in the case that the memory cell is of the PUFB, the memory cell can be configured to be of the type 1 that applies a fixed bias to the control line CTRL. In this case, the inverter circuits 14 and 16 are in the BI mode when the voltage V3 is supplied as the power supply voltage, and are in the ST mode when the voltage V1 is supplied. This eliminates the need for the control signal VCTRL. The details thereof will be described in a fourth embodiment.

Fourth Embodiment

[Description of the Header PS, the Footer PS, and a Dual PS]

Figure 50A:
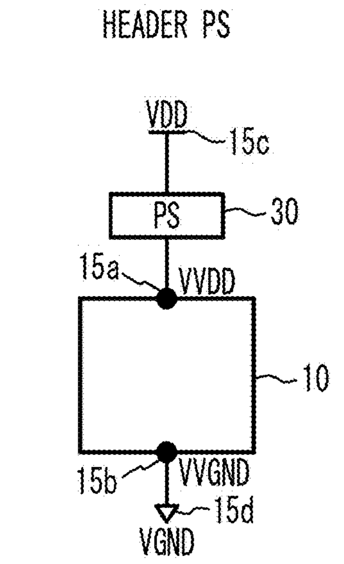
FIG. 50A to FIG. 50F illustrate the arrangement of the power switch coupled to a cell.

First, each name is summarized. FIG. 50A to FIG. 50F illustrate the arrangement of the power switch connected to the cell. As illustrated in FIG. 50A, the voltage of the power source 15*c* is the VDD, and the voltage of the ground 15*d* is the VGND. In the header PS, the power switch 30 is connected between the power supply line 15*a* of the memory cell 10 and the power source 15*c*. The power switch 30 switches the virtual power supply voltage VVDD of the power supply line 15*a* between the VVDDH and the VVDDL. Even when the virtual power supply voltage VVDD is switched between the VVDDH and the VVDDL, the voltage VVGND of the ground line 15*b* is the ground voltage VGND, and constant. The power supply voltage in the standby state (the BI mode) is VVDDH−VGND, and the power supply voltage in the low-voltage (ULV) retention state (the ST mode) is VVDDL−VGND.

Figure 50B:
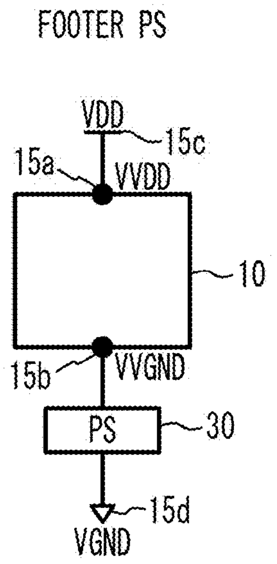

As illustrated in FIG. 50B, in the footer PS, the power switch 30 is connected between the ground line 15*b* of the memory cell 10 and the ground 15*d*. The power switch 30 switches the virtual ground voltage VVGND of the ground line 15*b* between the VVGNDH and the VVGNDL. Even when the virtual ground voltage VVGND is switched between the VVGNDH and the VVGNDL, the voltage VVDD of the power supply line 15*a* is the power supply voltage VDD and constant. The power supply voltage in the standby state (the BI mode) is VDD−VVGNDL, and the power supply voltage in the low-voltage retention state (the ST mode) is VDD−VVGNDH.

Figure 50C:
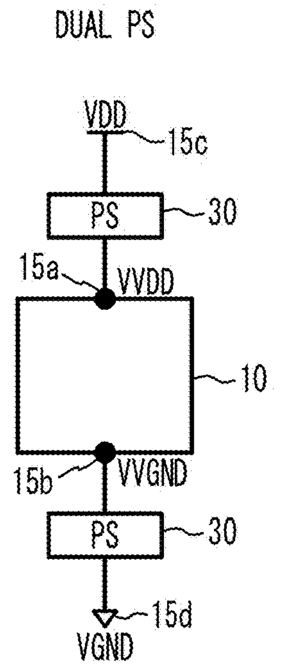

As illustrated in FIG. 50C, in the dual PS, the power switches 30 are connected both between the power supply line 15*a* and the power source 15*c* and between the ground line 15*b* and the ground 15*d*. The power switch 30 switches the virtual power supply voltage VVDD of the power supply line 15*a* between the VVDDH and the VVDDL, and another power switch 30 switches the virtual ground voltage VVGND of the ground line 15*b* between the VVGNDH and the VVGNDL. The power supply voltage in the standby state (the BI mode) is VVDDH−VVGNDL, and the power supply voltage in the low-voltage retention state (the ST mode) is VVDDL−VVGNDH.

Figure 50D:
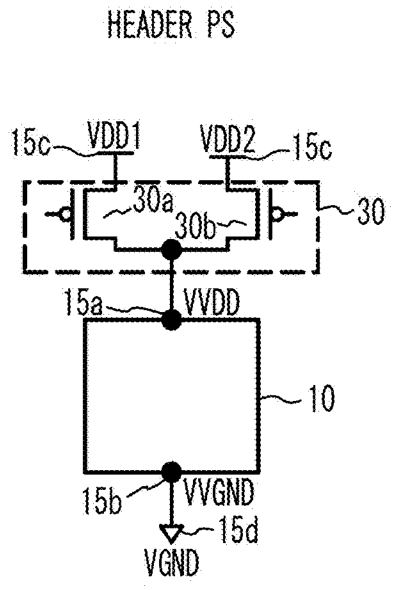

As illustrated in FIG. 50D, in the header PS, the power switch 30 may include the PFET 30*a* connected between a power source VDD1 and the power supply line 15*a*, and the PFET 30*b* connected between a power source VDD2 and the power supply line 15*a*. When the FET 30*a* is turned on and the FET 30*b* is turned off, the virtual power supply voltage VVDD becomes the VDD1, and when the FET 30*a* is turned off and the FET 30*b* is turned on, the VVDD becomes the VDD2. When the FETs 30*a* and 30*b* are turned off, the power is shut down.

Figure 50E:
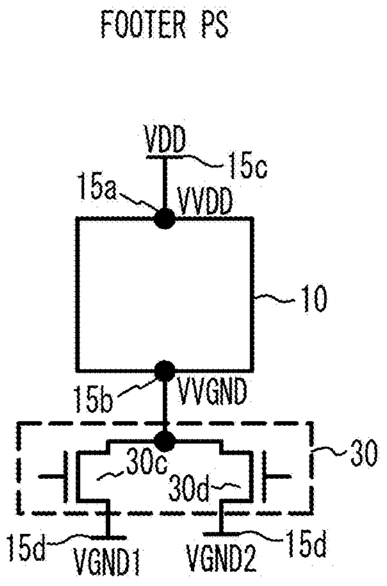

As illustrated in FIG. 50E, in the footer PS, the power switch 30 may include an NFET 30*c* connected between a VGND1 and the ground line 15*b* and an NFET 30*d* connected between a VGND2 and the ground line 15*b*. When the FET 30*c* is turned on and the FET 30*d* is turned off, the virtual ground voltage VVGND becomes the VGND1, and when the FET 30*c* is turned off and the FET 30*d* is turned on, the VVGND becomes the VGND2. When the FETs 30*c* and 30*d* are turned off, the power is shut down.

Figure 50F:
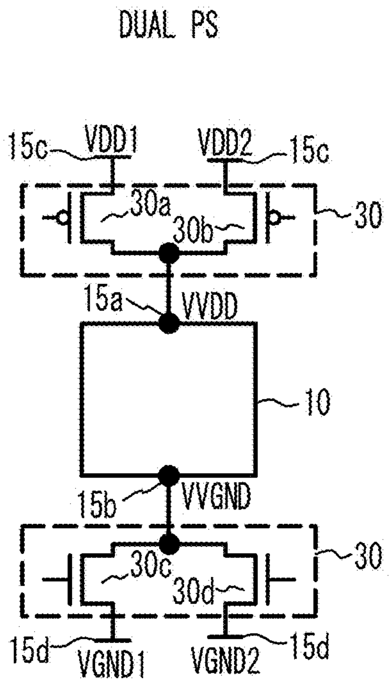

As illustrated in FIG. 50F, in the dual PS, the power switch 30 includes a PFET 30*a* connected between the VDD1 and the power supply line 15*a*, a PFET 30*b* connected between the VDD2 and the power supply line 15*a*, the NFET 30*c* connected between the VGND1 and the ground line 15*b*, and the NFET 30*d* connected between the VGND2 and the ground line 15*b*. By turning on and off the FET 30*a* to the FET 30*d* appropriately, the power supply voltage supplied between the virtual power supply line 15*a* and the virtual ground line can be appropriately switched.

[Description of the PDFB, the PUFB, and the PUPDFB]

The PDFB (pull-down type feedback) is a type where the FET m9 is fed back between the N channel FETs m2*a* and m2*b* of the inverter circuit 14 and the FET m10 is fed back between the N channel FETs m4*a* and m4*b* of the inverter circuit 16 as illustrated in FIG. 41.

The PUFB (pull-up type feedback) is a type where the FET m9*a* is fed back between the P channel FETs m1*a* and m1*b* of the inverter circuit 14 and the FET m10*a* is fed back between the P channel FETs m3*a* and m3*b* of the inverter circuit 16 as illustrated in FIG. 46.

The PUPDFB (pull-up pull-down type feedback) is a type where the FETs m9 and m10 of the PDFB and the FETs m9*a* and m10*a* of the PUFB are both provided as illustrated in FIG. 48 and FIG. 49.

[Description of the Type 1 and the Type 2]

Figure 51A:
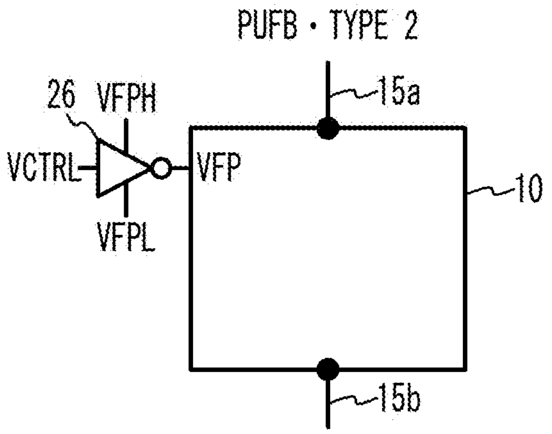
FIG. 51A to FIG. 51D illustrate the arrangement of a driver coupled to the cell.

FIG. 51A to FIG. 52C illustrate the arrangement of the driver connected to the cell. As illustrated in FIG. 51A, in the type 2 type of the PUFB, the driver 26 is provided. The driver 26 switches the voltage VFP between the voltage VFPH and the voltage VFPL based on the control signal VCTRL output by the control circuit 28. The inverter circuits 14 and 16 are in the BI mode when the voltage VFP is the VFPH (the high level), and are in the ST mode when the voltage VFP is the VFPL (the low level).

Figure 51B:
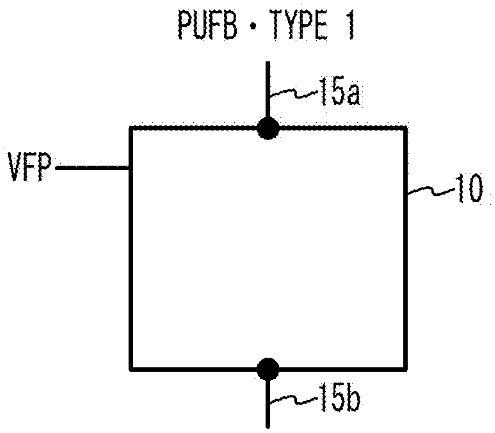

As illustrated in FIG. 51B, in the type 1 type of the PUFB, no driver 26 is provided. Although the VFP is a fixed bias, when the power supply voltage is switched, the inverter circuits 14 and 16 are switched between the BI mode and the ST mode.

Figure 51C:
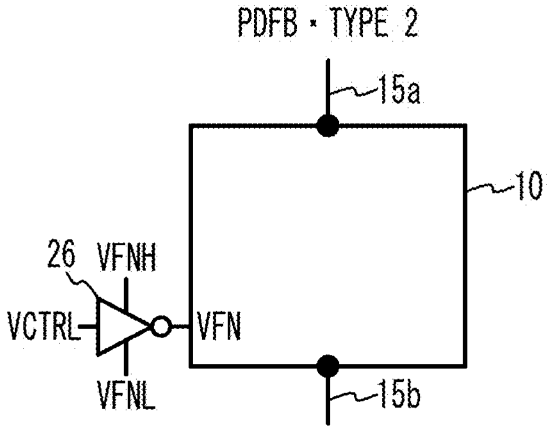

As illustrated in FIG. 51C, in the type 2 type of the PDFB, the driver 26 is provided. The driver 26 switches the voltage VFN between the voltage VFNH and the voltage VFNL based on the control signal VCTRL output by the control circuit 28. The inverter circuits 14 and 16 are in the BI mode when the voltage VFN is the VFNL (the low level), and are in the ST mode when the voltage VFN is the VFNH (the high level).

Figure 51D:
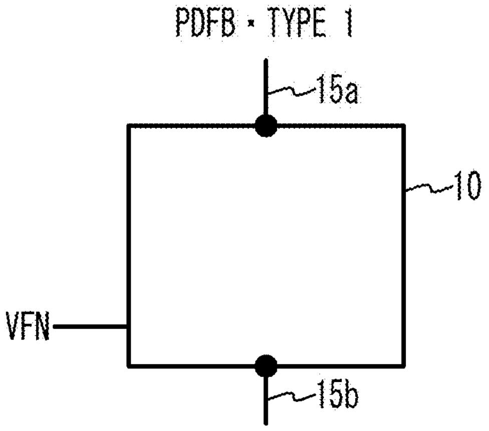

As illustrated in FIG. 51D, in the type 1 type of the PDFB, no driver 26 is provided. Although the VFN is a fixed bias, when the power supply voltage is switched, the inverter circuits 14 and 16 are switched between the BI mode and the ST mode.

Figure 52A:
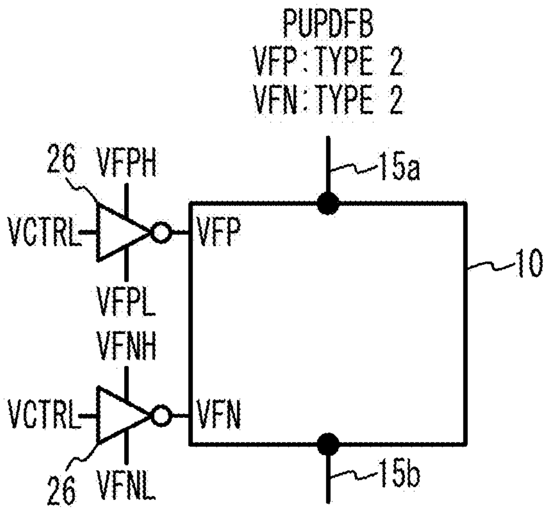
FIG. 52A to FIG. 52C illustrate the arrangement of the driver coupled to the cell.

As illustrated in FIG. 52A, the drivers 26 are provided to both control lines of the voltages VFP and VFN when both the VFP and the VFN of the PUPDFB are of the type 2 type. The inverter circuits 14 and 16 are in the BI mode when the voltage VFP is the VFPH and the voltage VFN is the VFNL, and are in the ST mode when the voltage VFP is the VFPL and the voltage VFN is the VFNH.

Figure 52B:
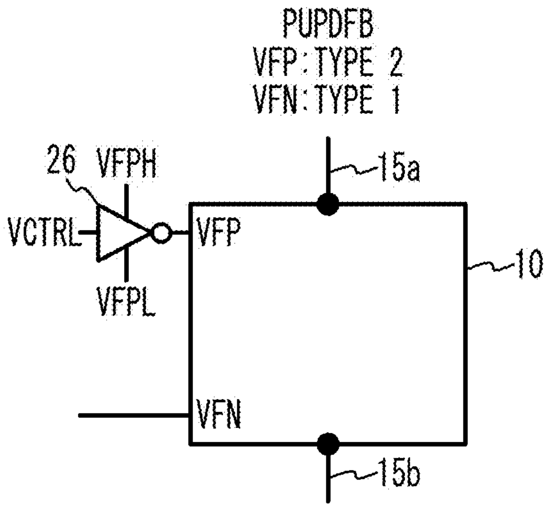

As illustrated in FIG. 52B, when the VFP of the PUPDFB is of the type 2 type and the VFN of the PUPDFB is of the type 1 type, the driver 26 is provided to the control line of the voltage VFP, and the VFN is a fixed bias. The inverter circuits 14 and 16 are in the BI mode when the voltage VFP is the VFPH, and are in the ST mode when the voltage VFP is the VFPL.

Figure 52C:
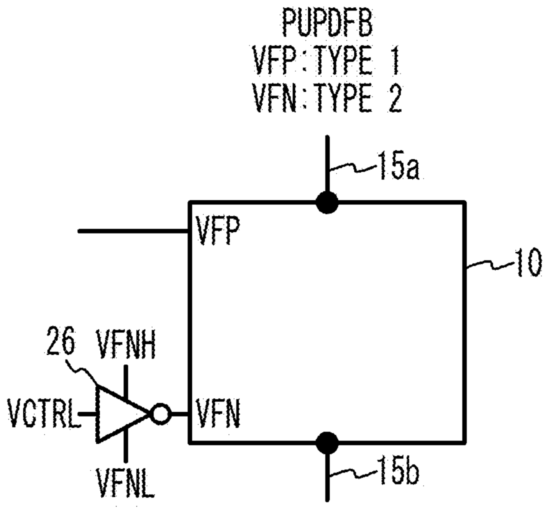

As illustrated in FIG. 52C, when the VFP of the PUPDFB is of the type 1 type and the VFN of the PUPDFB is of the type 2 type, the voltage VFP is a fixed bias, and the driver 26 is provided to the control line of the VFN. The inverter circuits 14 and 16 are in the BI mode when the voltage VFN is the VFNL, and are in the ST mode when the voltage VFN is the VFNH.

Figure 53A:
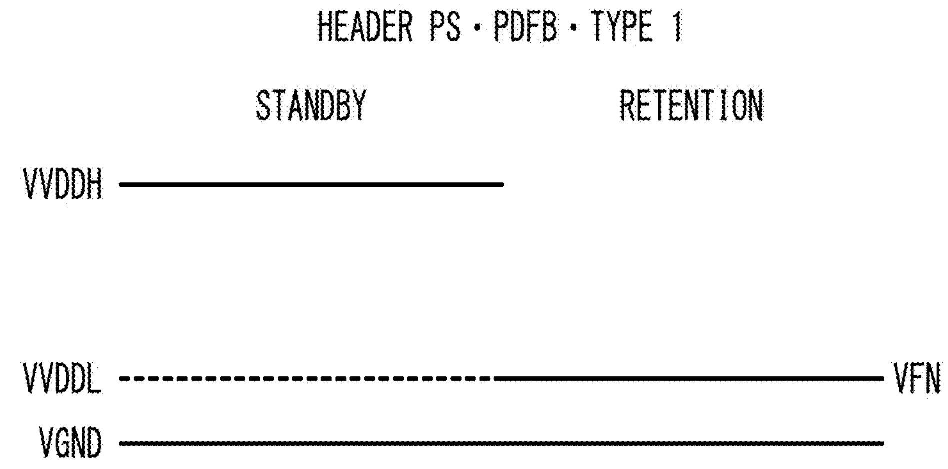
FIG. 53A illustrates voltages in a header PS·PDFB·type 1 type.
Figure 53B:
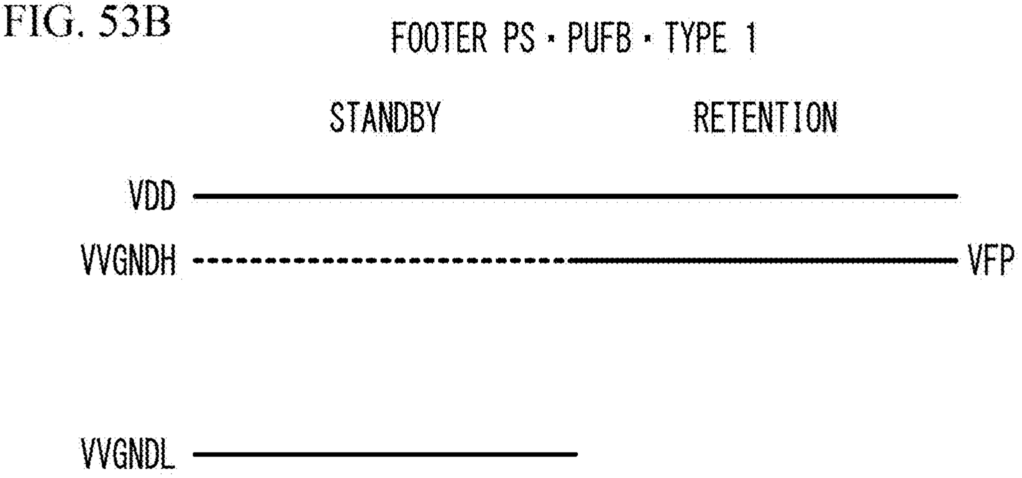
FIG. 53B illustrates voltages in a footer PS·PUFB type 1 type.

FIG. 53A and FIG. 53B illustrate the voltages of the header PS·PDFB·type 1 type and the footer PS·PUFB·type 1 type, respectively. In FIG. 53A, the VVDDH and the VVDDL with respect to the VGND are illustrated in the vertical direction, and in FIG. 53B, the VVGNDL and the VVGNDH with respect to the VDD are illustrated in the vertical direction.

As illustrated in FIG. 53A, in the header PS, the power supply line 15*a* is supplied with the VVDDH and the ground line 15*b* is supplied with the VGND in the standby state. In this case, when the VFN is a fixed bias of approximately the VVDDL, the inverter circuits 14 and 16 are in the BI mode because the VFN is sufficiently lower than the VVDDH. In the low-voltage retention state, the power supply line 15*a* is supplied with the VVDDL, and the ground line 15*b* is supplied with the VGND. In this case, when the VFN is set at approximately the VVDDL, the inverter circuits 14 and 16 are in the ST mode because the VFN is higher than the VGND.

The constant voltage VFN can be any voltage lower than the VVDDH and higher than the VGND. When the constant voltage VFN is too close to the VVDDH, it is difficult for the inverter circuits 14 and 16 to enter the BI mode when the virtual power supply voltage VVDD is set at the VVDDH. Thus, the constant voltage VFN is preferably equal to or less than the voltage intermediate between the VVDDH and the VGND (i.e., equal to or less than (VVDDH−VGND)/2+VGND), more preferably equal to or less than the voltage that is obtained by adding half of the difference voltage between the VVDDL and the VGND to the VVDDL (i.e., equal to or less than VVDDL+(VVDDL−VGND)/2). When the constant voltage VFN is too close to the VGND, it is difficult for the inverter circuits 14 and 16 to enter the ST mode when the virtual power supply voltage VVDD is set at the VVDDL. Thus, the constant voltage VFN is preferably equal to or greater than the voltage intermediate between the VVDDL and the VGND (i.e., equal to or greater than (VVDDL−VGND)/2+VGND).

In the header PS·PUFB, when the VFP is the high level, the inverter circuits 14 and 16 are in the BI mode, and when the VFP is the low level, the inverter circuits 14 and 16 are in the ST mode. Thus, when the memory cell is of the header PS·PUFB·type 1 type, the switching between the BI mode and the ST mode becomes impossible.

As illustrated in FIG. 53B, in the footer PS, in the standby state, the ground line 15*b* is supplied with the VVGNDL, and the power supply line 15*a* is supplied with the VDD. In this case, when the VFP is set at a fixed bias of approximately the VVGNDH, the inverter circuits 14 and 16 enter the BI mode because the VFP is sufficiently higher than the VVGNDL. In the low-voltage retention state, the ground line 15*b* is supplied with the VVGNDH, and the power supply line 15*a* is supplied with the VDD. In this case, when the VFP is set at approximately the VVGNDH, the inverter circuits 14 and 16 enter the ST mode because the VFP is low relative to the VDD.

The constant voltage VFP can be any voltage higher than the VVGNDL and lower than the VDD. When the constant voltage VFP is too close to the VVGNDL, it is difficult for the inverter circuits 14 and 16 to enter the BI mode when the virtual ground voltage VVGND is set at the VVGNDL. Thus, the constant voltage VFP is preferably equal to or greater than the voltage intermediate between the VDD and the VVGNDL (i.e., equal to or greater than (VDD−VVGNDL)/2+VVGNDL), more preferably equal to or greater the voltage obtained by subtracting half of the difference between the VDD and the VVGNDH from the VVGNDH (i.e., equal to or greater than VVGNDH−(VDD−VVGNDH)/2). When the constant voltage VFP is too close to the VVDD, it is difficult for the inverter circuits 14 and 16 to enter the ST mode when the virtual ground voltage VVGND is set at the VVGNDH. Thus, the constant voltage VFP is preferably equal to or less than the voltage intermediate between the VDD and the VVGNDH (i.e., equal to or less than (VDD−VVGNDH)/2+VVGNDL).

In the footer PS·PDFB, when the VFN is the low level, the inverter circuits 14 and 16 are in the BI mode, and when the VFN is the high level, the mode is the ST mode. Thus, when the memory cell is of the footer PS·PDFB·type 1 type, the switching between the BI and the ST mode is impossible.

Table 1 summarizes whether a fixed bias is possible.

TABLE 1

| FBTr | PS | Fixed bias |
|---|---|---|
| PDFB | Header | Possible |
| | Footer | Impossible |
| | Dual | Impossible |
| PUFB | Header | Impossible |
| | Footer | Possible |
| | Dual | Impossible |

TABLE 1-continued

| FBTr | PS | Fixed bias |
|---|---|---|
| PUPDFB | Header | Possible only at PD |
| | Footer | Possible only at PU |
| | Dual | Impossible |

As presented in Table 1, in the PDFB, a fixed bias is possible in the header PS. In the footer PS and the dual PS, a fixed bias is impossible, and the driver 26 is used.

In the PUFB, a fixed bias is possible in the footer PS. In the header PS and the dual PS, a fixed bias is impossible, and the driver 26 is used. In the PUPDFB, a fixed bias is possible only at the PD (i.e., VFN) side in the header PS. In the footer PS, a fixed bias is possible only at the PU (i.e., VFP) side. In the dual PS, a fixed bias is impossible.

In the third embodiment, the gate of the feedback FET m9 and/or m9*a* is coupled to the input node of the inverter circuit 14 or the output node of the inverter circuit 16, and the gate of the feedback FET m10 and/or m10*a* is coupled to the input node of the inverter circuit 16 or the output node of the inverter circuit 14. This will be referred to as a third embodiment type. In the case of the third embodiment type, the header PS·PDFB type 1 type in Table 1 is illustrated in FIG. 41, the footer PS·PUFB·type 1 type is illustrated in FIG. 46, the header PS·PUPDFB·PD side type 1 type is illustrated in FIG. 48, and the footer PS·PUPDFB·PU side type 1 type is illustrated in FIG. 49.

As in the second embodiment, the gate of the feedback FET m9 and/or m9*a* may be coupled to the output node of the inverter circuit 14, and the gate of the feedback FET m10 and/or m 10*a* may be coupled to the output node of the inverter circuit 16. This case will be referred to as a second embodiment type. Table 1 is also valid for the second embodiment type.

Figure 54:
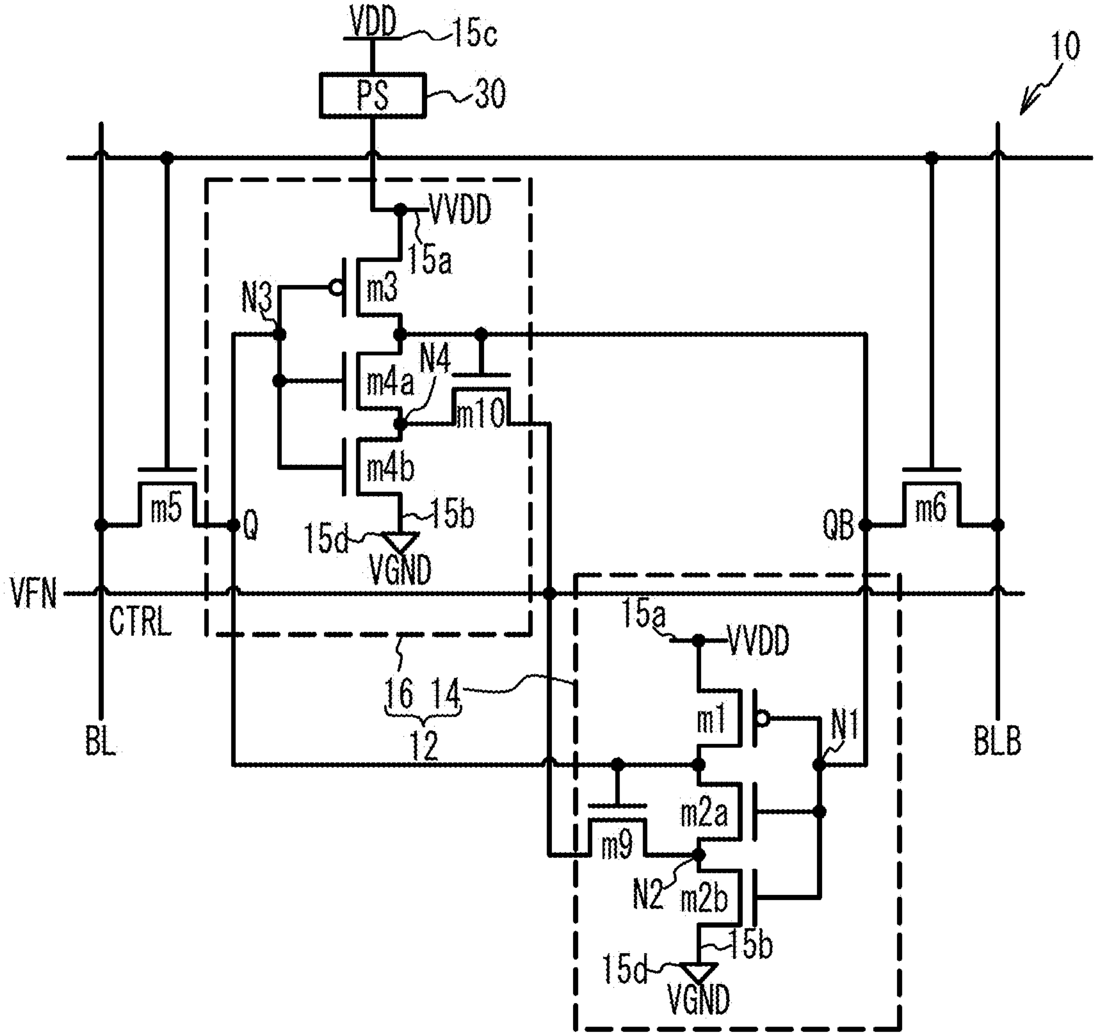
FIG. 54 is a circuit diagram of a header PS·PDFB·type 1 type memory cell in a fourth embodiment.

FIG. 54 is a circuit diagram of a header PS·PDFB·type 1 type memory cell in the fourth embodiment. As illustrated in FIG. 54, the FETs m9 (and m10) are N channel FETs, and the gates are coupled to the output nodes of the inverter circuits 14 (and 16). Other configurations are the same as those of the third embodiment illustrated in FIG. 41, and the description thereof is thus omitted.

Figure 55:
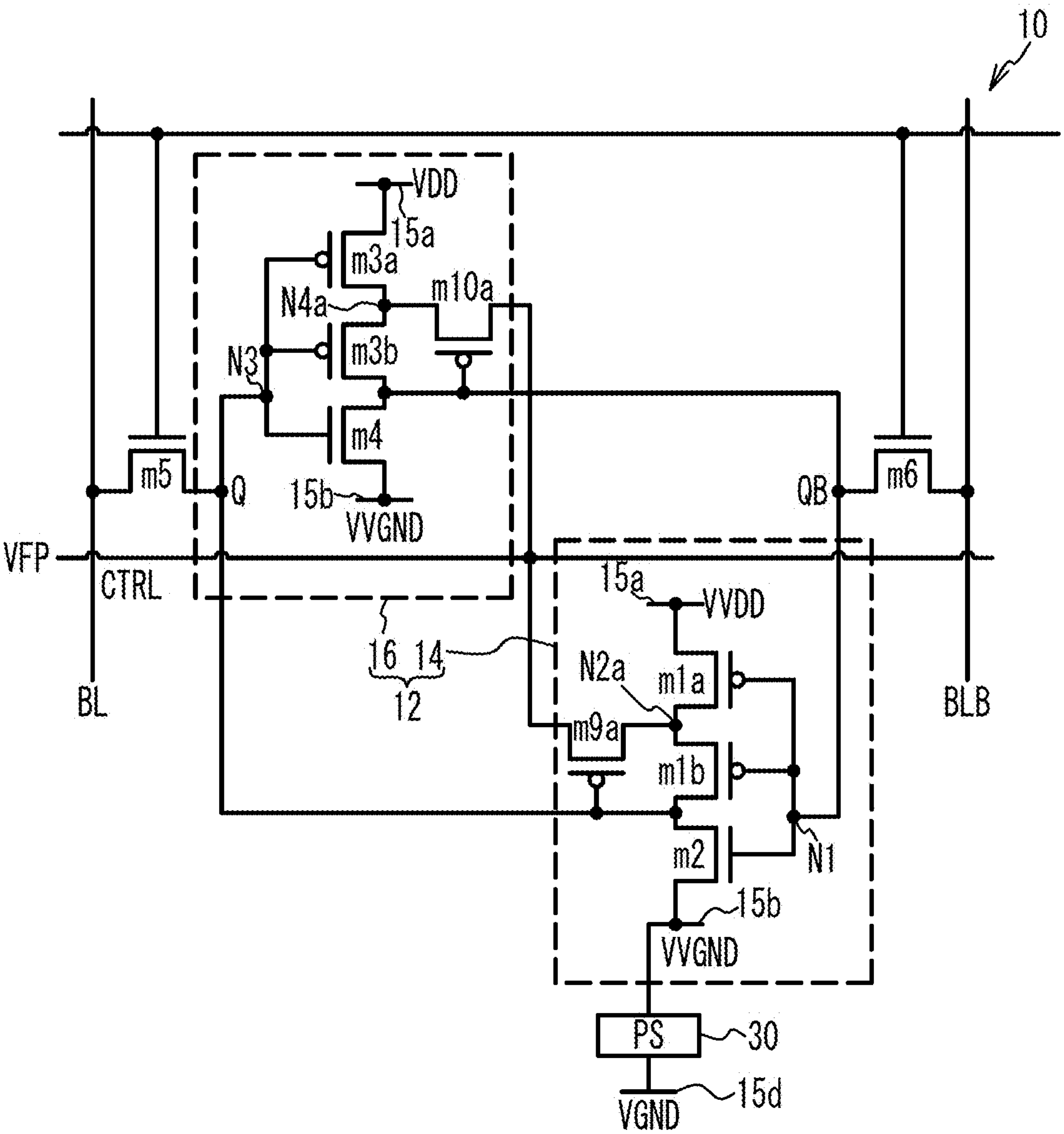
FIG. 55 is a circuit diagram of a footer PS·PUFB·type 1 type memory cell in the fourth embodiment.

FIG. 55 is a circuit diagram of a footer PS·PUFB·type 1 type memory cell in the fourth embodiment. As illustrated in FIG. 55, the FET m9*a* (and m10*a*) are P channel FETs, and the gates are coupled to the output nodes of the inverter circuits 14 (and 16). Other configurations are the same as those of the third embodiment illustrated in FIG. 46, and the description thereof is thus omitted.

Figure 56:
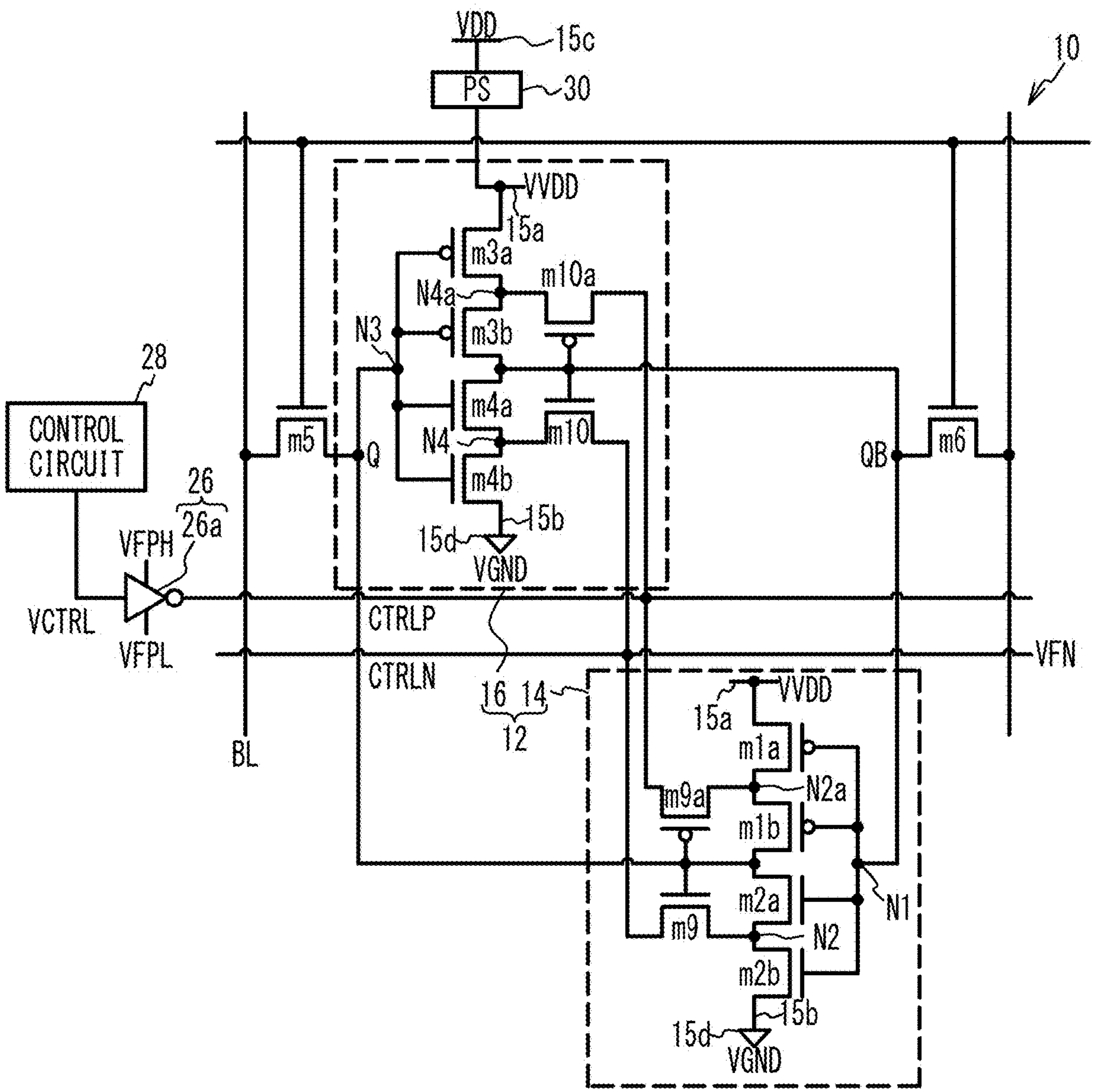
FIG. 56 is a circuit diagram of a header PS·PUPDFB·PD side type 1 type memory cell in the fourth embodiment.

FIG. 56 is a circuit diagram of a header PS·PUPDFB·PD side type 1 type memory cell in the fourth embodiment. As illustrated in FIG. 56, the FETs m9 (and m10) are N channel FETs, the FETs m9*a* (and m10*a*) are P channel FETs, and the gates are coupled to the output nodes of the inverter circuits 14 (and 16). Other configurations are the same as those of the third embodiment illustrated in FIG. 48, and the description thereof is thus omitted.

Figure 57:
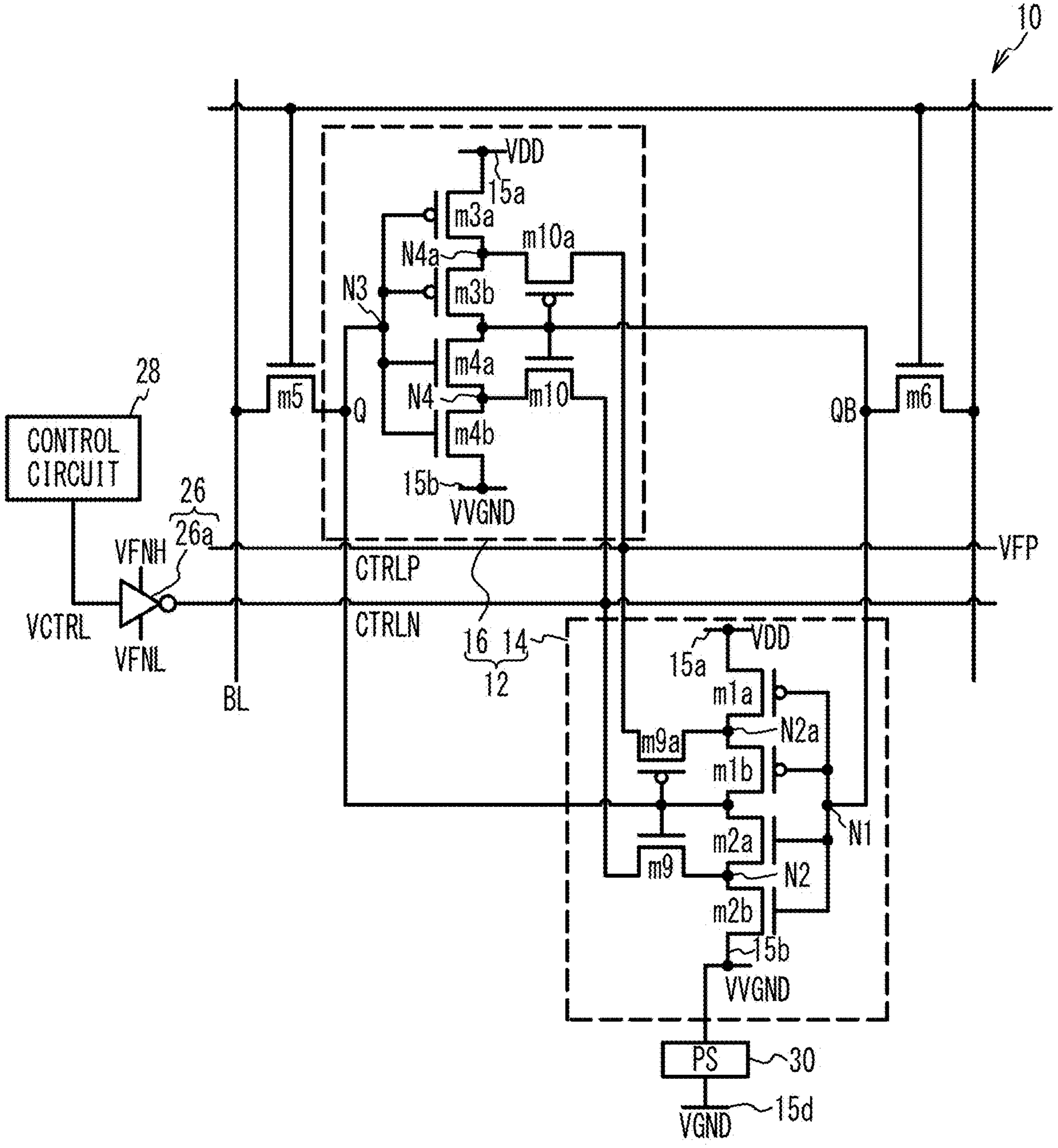
FIG. 57 is a circuit diagram of a footer PS·PUPDFB·PU side type 1 type memory cell in the fourth embodiment.

FIG. 57 is a circuit diagram of a footer PS·PUPDFB·PU side type 1 type memory cell in the fourth embodiment. As illustrated in FIG. 57, the FETs m9 (and m10) are N channel FETs, the FETs m9*a* (and m10*a*) are P channel FETs, and the gates are coupled to the output nodes of the inverter circuits 14 (and 16). Other configurations are the same as those of the third embodiment illustrated in FIG. 49, and the description thereof is thus omitted.

[Variation 1 of the Fourth Embodiment]

Figure 58:
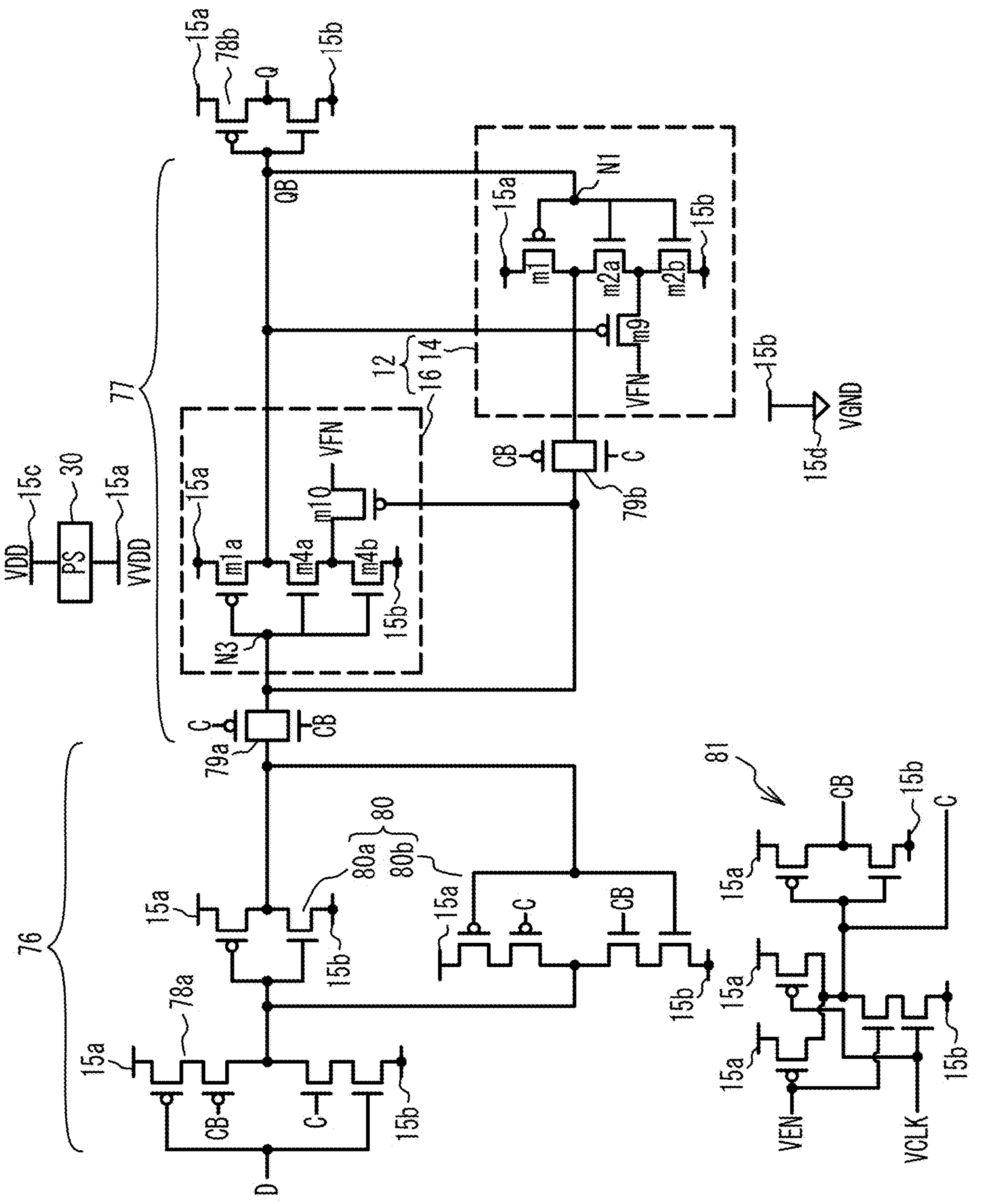
FIG. 58 is a circuit diagram of an electronic circuit in accordance with a variation 1 of the fourth embodiment.

A variation 1 of the fourth embodiment is an example of a master-slave type flip-flop circuit. FIG. 58 is a circuit diagram of an electronic circuit in accordance with the variation 1 of the fourth embodiment. As illustrated in FIG. 58, latch circuits (D latch circuits) 76 and 77 are provided. The latch circuit 76 is a master-side latch circuit, and the latch circuit 77 is a slave-side latch circuit. The latch circuit 76 includes a bistable circuit 80 including inverters 80*a* and 80*b*, and an inverter 78*a*. The inverter 78*a* operates when a clock signal C has the high level, and the inverter 80*b* operates when the clock signal C has the low level. The latch circuit 77 includes the bistable circuit 12 and a pass gate 79*a*. A pass gate 79*b* is provided in the loop of the bistable circuit 12. The pass gate 79*a* operates when the clock signal C has the low level, and the pass gate 79*b* operates when the clock signal C has the high level. The level of the node QB of the loop of the bistable circuit 12 is output as the Q signal through an inverter 78*b*.

A clock generation circuit 81 operates when an enable signal VEN has the high level, and does not operate when the enable signal VEN has the low level. The clock generation circuit 81 outputs the high level as the clock signal C and the low level as a clock signal CB when the low level is input as a clock signal VCLK, and outputs the low level as the clock signal C and the high level as the clock signal CB when the high level is input as the clock signal VCLK.

The power supply line 15*a* is supplied with the virtual power supply voltage VVDD from the power switch 30, and the ground line 15*b* is supplied with the ground voltage VGND, and the latch circuit 77 is of the header PS type. The feedback FETs of the inverter circuits 14 and 16 are the P channel FETs m9 and m10, and the latch circuit 77 is of the PDFB type. The voltage VFN is a constant voltage, and the latch circuit 77 is of the type 1 type. The gates of the FET m9 (and m10) are coupled to the output nodes of the inverter circuits 16 (and 14), and the latch circuit 77 is of the third embodiment type. Accordingly, the variation 1 illustrated in FIG. 58 is of the header PS·PDFB·type 1 type third embodiment type.

Table 1 is also valid for the master-slave type flip-flop circuit. That is, the master-slave type flip-flop circuit may be of the footer PS·PUFB·type 1 type, the header PS·PUPDFB·PD side type 1 type, or the footer PS·PUPDFB·PU side type 1 type. In addition, the bistable circuit 12 may be of the third embodiment type or the second embodiment type. The bistable circuit 12 may be used for the master-side latch circuit.

[Simulation]

The SNM and the standby power of the master-slave type flip-flop circuit were simulated. The simulated circuits were the following circuits A to C.

Circuit A: Typical delay flip-flop circuit

Circuit B: Header PS·PDFB·type 2 type second embodiment type

Circuit C: Header PS·PDFB·type 1 type third embodiment type (the circuit illustrated in FIG. 58)

The simulation conditions are as follows.

Circuit A:

The channel width W/the channel length L of each of the constituent transistors was determined with reference to a standard cell.

Circuit B:

The channel width W/the channel length L of each of the FETs in the latch circuit 77 is as follows.

$$FETs\ m1 \text{ and } m1a\text{: 180 nm/60 nm}$$

$$FETs\ m2a, m2b, m4a, \text{ and } m4b\text{: 385 nm/60 nm}$$

$$FETs\ m9 \text{ and } m10\text{: 150 nm/60 nm}$$

The inverter 26*a* is provided to the circuit B as in the second embodiment illustrated in FIG. 17, and the channel width W/the channel length L is as follows.

FET of the inverter 26*a:* 150 nm/60 nm

Circuit C:

The channel width W/the channel length L of each FET of the latch circuit 77 is as follows.

$$FETs\ m1 \text{ and } m1a\text{: 130 nm/60 nm}$$

$$FETs\ m2a, m2b, m4a, \text{ and } m4b\text{: 385 nm/60 nm}$$

$$FETs\ m9 \text{ and } m10\text{: 150 nm/60 nm}$$

Voltages are as follows.

$$VVDDH = 1.2\text{ V}$$

$$VVDDL = 0.2\text{ V}$$

$$VGND = 0\text{ V}$$

$$VFNH = 0.2\text{ V}$$

Figure 59A:
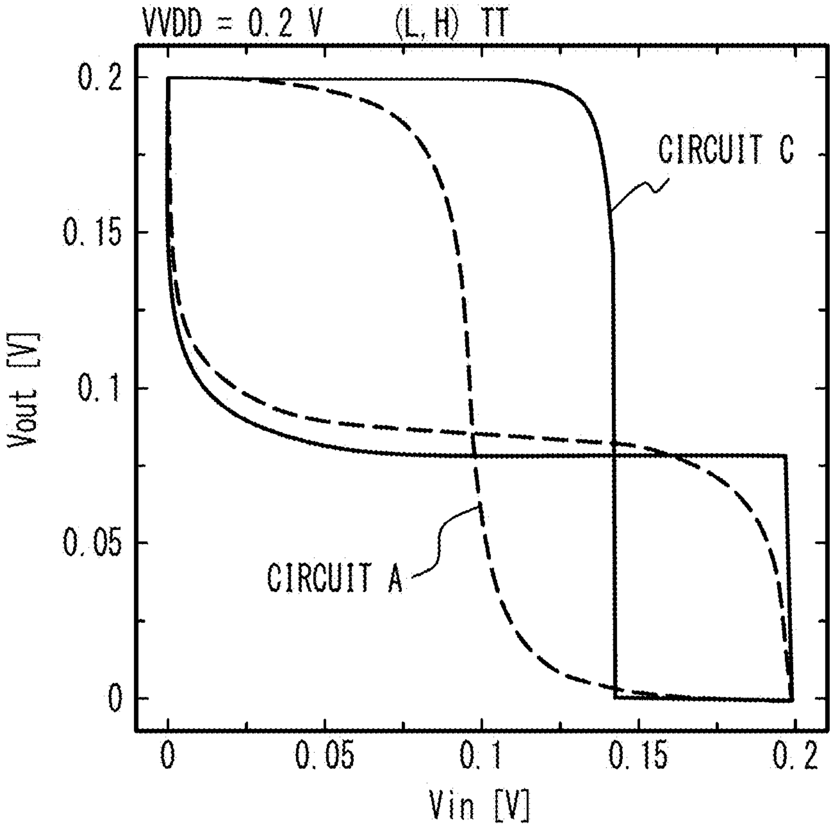
FIG. 59A and FIG. 59B present the butterfly curves of flip-flop circuits.
Figure 59B:
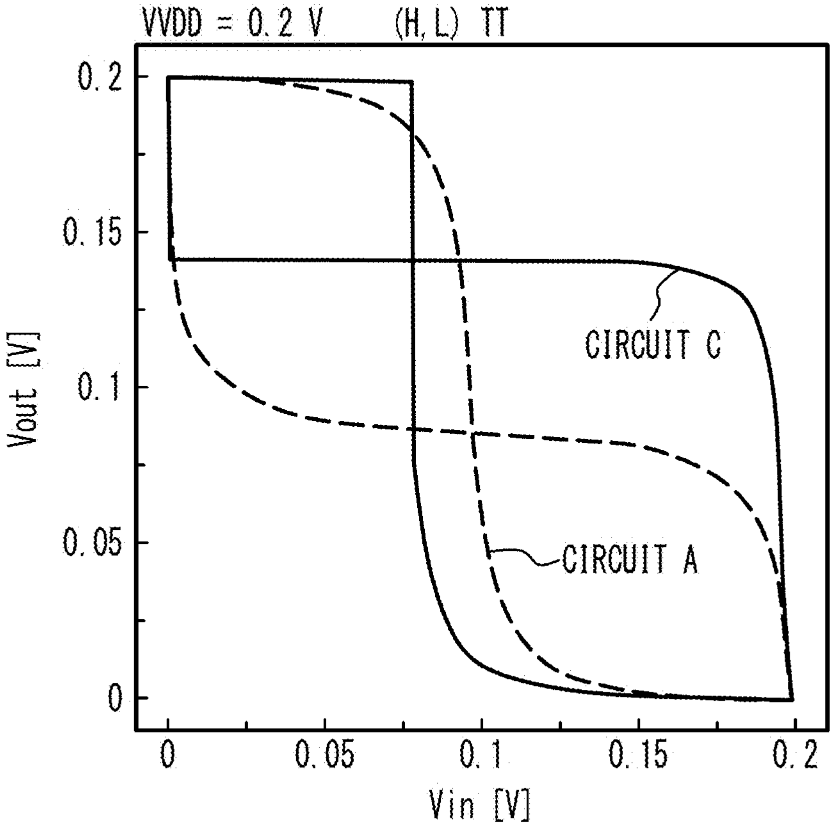

FIG. 59A and FIG. 59B present the butterfly curves of the flip-flop circuit. In FIG. 59A, the node where (Vin, Vout) is (L, H) is defined as the memory node, and in FIG. 59B, the node where (Vin, Vout) is (H, L) is defined as the memory node. In the circuit A, VVDD=0.2 V. In the circuit C, the mode was the ST mode, and VVDDL=0.2 V. For both circuits, TT is presented.

TT indicates the SNM when the threshold voltages of the PFET and the NFET are Typical. FF indicates the SNM when the threshold voltages of the PFET and the NFET are both shifted to the Fast (F) side (the lower side) from the Typical value by 30 due to the process variability. SS indicates the SNM when the threshold voltages of the PFET and the NFET are both shifted to the Slow(S) side (the higher side) from the Typical value by 3σ due to the process variability. FS and SF indicate the SNMs when one of the threshold voltages of the PFET and the NFET is shifted to the F side from the Typical value by 3σ and the other is shifted to the S side from the Typical value by 3σ. As long as the SNMs of TT, FF, SS, FS, and SF are secured, the SNM can be secured even when the threshold values of the PFET and the NFET vary within the range of ±3σ.

As presented in FIG. 59A and FIG. 59B, in the circuit A, the butterfly curve is substantially symmetric, the opening is small, and the noise margin is small. In the circuit C, the bistable circuit 12 enters the ST mode by setting VVDD =0.2 V, and the hysteresis of the transfer characteristics increases. This enlarges the opening at the memory node side, and thereby increases the noise margin.

Figure 60A:
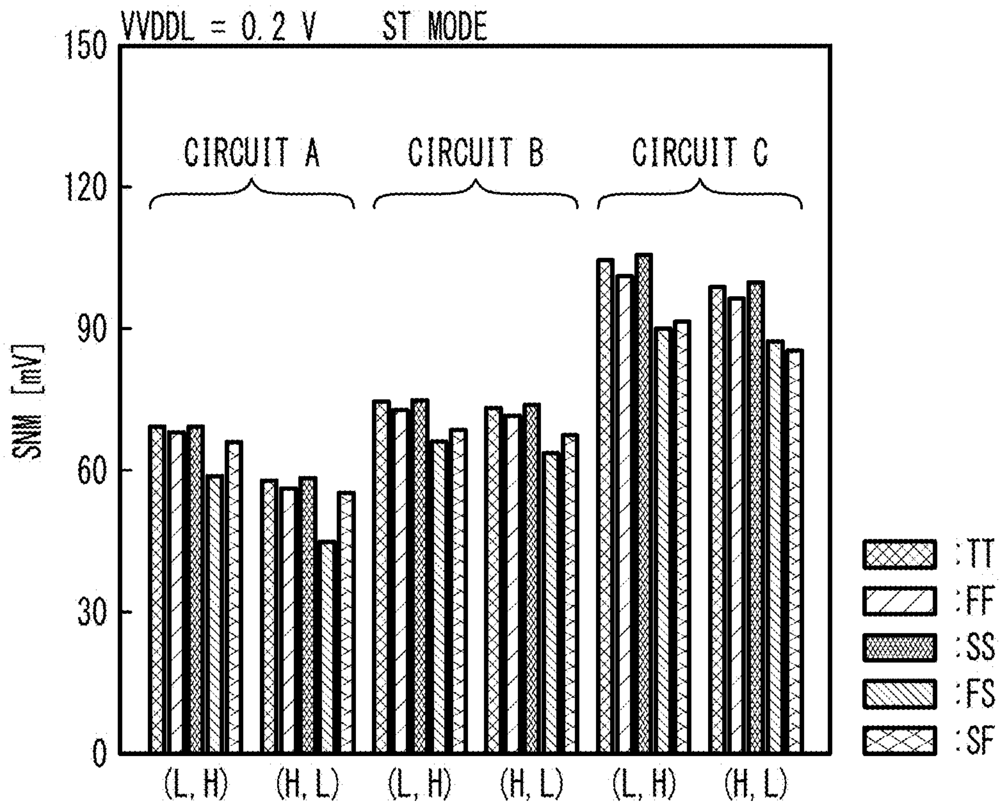
FIG. 60A presents SNMs.
Figure 60B:
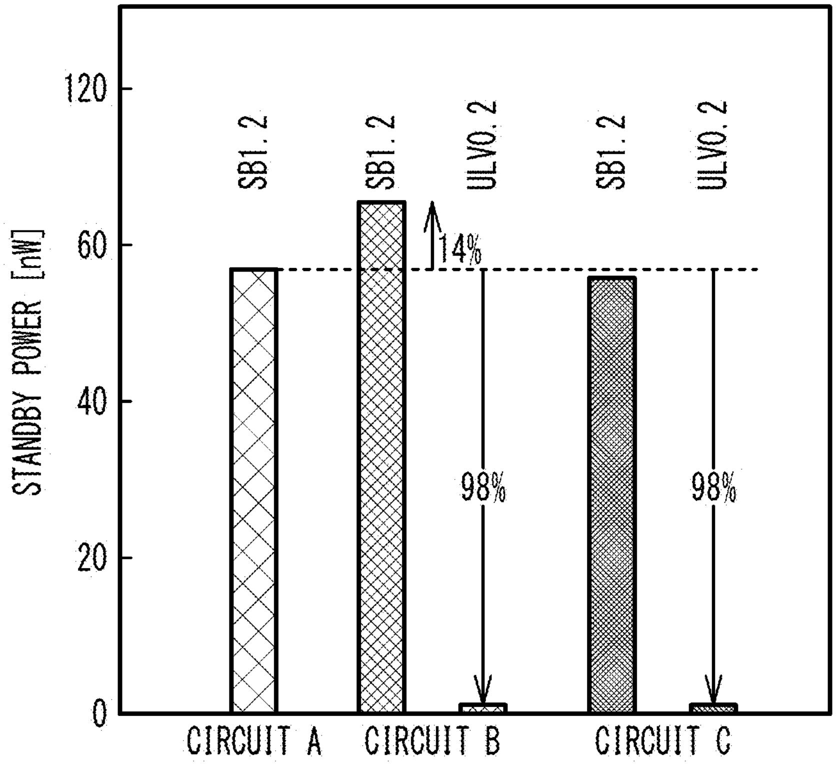
FIG. 60B presents standby power.

FIG. 60A presents the SNMs, and FIG. 60B presents the standby power. In FIG. 60A, for (L, H) and (H, L), the SNMs of TT, FF, SS, FS, and SF are presented. In the circuit A, VVDD=0.2V, while in the circuits B and the circuit C, the mode was the ST mode and VVDDL=0.2 V.

In the circuit A, the SNMs are approximately 60 mV. In the circuit B, the SNMs are slightly higher than those of the circuit A, and are approximately 70 mV to 80 mV. In the circuit C, the SNMs are approximately 90 m V to 100 mV, and the sufficient SNMs can be obtained. In the circuit C, when the SNM is set at 80 mV, the VVDDL can be reduced to lower than 0.2 V, and the power consumption can be further reduced.

In FIG. 60B, “SB1.2” represents the standby state where VVDD is 1.2 V, and “ULV0.2” represents the low-voltage retention state where VVDDL=0.2 V. In SB1.2, the standby power of the circuit B is greater than the standby power of the circuit A by approximately 14%. In the circuit C, the power of the standby state can be made to be approximately equal to that of the circuit A. In ULV0.2 of the circuits B and C, the standby power can be reduced by 98% compared with that of the circuit A. As described above, in the flip-flop circuit C of the variation 1 of the fourth embodiment, the standby power at VDD=1.2 V is approximately equal to that of the circuit A, and the standby power in the low-voltage retention state can be reduced by 98%.

Table 2 lists the power reduction effect, the chip area, the delay, the BET, the process cost, and the number of control steps for the circuit A, a balloon FF, an NVFF, and the circuit C. The balloon FF is a balloon type FF circuit, and the NVFF is an FF circuit using the nonvolatile memory element as in the first embodiment.

TABLE 2

| | Circuit A | Balloon FF | NVFF | Circuit C |
|---|---|---|---|---|
| Power reduction effect | | 95% | 99% | 98% |
| Area | 1 | 1.7 | 1.5 | 1.2 |
| Delay | 1/1 | 1.2/1.1 | 1.1/1.1 | 1.1/1.6 |
| BET | | 100 ns | 8 μs | 160 ns |
| Process cost | Low | Low | High | Low |
| Number of control steps | 0 | 3 | 3 | 0 |

The power reduction effect indicates the ratio of the reduction from the circuit A in the low-voltage retention state. In the NVFF and the circuit C, compared with the circuit A, the electric power can be reduced by 99% and 98%, respectively. For the area, the area of the circuit A is defined as 1. The area of the balloon FF is 1.7 times the area of the circuit A. The area of the NVFF is 1.5 times the area of the circuit A. The area of the circuit C is 1.2 times the area of the circuit A. The delay is compared with the circuit A for each of CLK-QH and CLK-QL, and the circuit A is defined as 1. The delays of the balloon FF and the NVFF are 1.1 to 1.2 compared with the circuit A. The delay of the circuit C is 1.6 for CLK-QL compared with the circuit A.

The BET of the balloon FF is 100 ns, while the BET of the NVFF is longer, 8 μs. By contrast, the BET of the circuit C is 160 ns, and is approximately equal to that of the balloon FF. The process cost of the NV-FF is high because the process cost of the non-volatile element is high. By contrast, since the circuit C can be fabricated by the CMOS process, the process cost of the circuit C is as low as those of the circuit A and the balloon FF. The number of control steps is the number of pulses necessary for the control not including the control of the power switch. The number of control steps of the balloon FF and the number of control steps of the NVFF are 3. By contrast, the number of control steps of the circuit C is the same as the number of control steps of the circuit A, 0.

As described above, the circuit C has a power reduction effect and a chip area approximately equal to those of the NVFF, has a BET approximately equal to that of the balloon FF, and has a process cost and the number of control steps approximately equal to those of the circuit A.

Figure 61A:
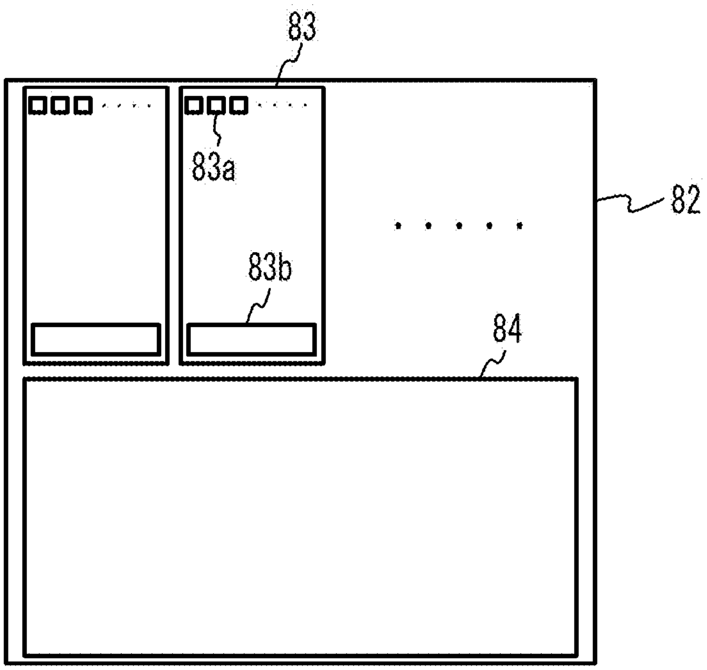
FIG. 61A is a conceptual drawing of a simulated logic system.

Assuming the logic system such as a system on a chip (SOC) or the like, the standby power was simulated. FIG. 61A is a conceptual drawing of the simulated logic system. It was assumed that 50% of the area of a system 82 was designated as a last-level cache (LLC) 84. It was also assumed that a plurality of cores 83 are provided in the remaining 50% of the system 82. It was assumed that 20% of the area of each core 83 is designated as flip-flops (FFs) 83*a*, and 10% is designated as a first-level cache (FLC) 83*b*. The simulated system is the following systems A and C.

System A: Cache using the 6T-SRAM and a flip-flop using the 6T-SRAM.

System C: Cache using the header PS·PDFB·type 1 type of the third embodiment and the flip-flop circuit illustrated in FIG. 58.

Figure 61B:
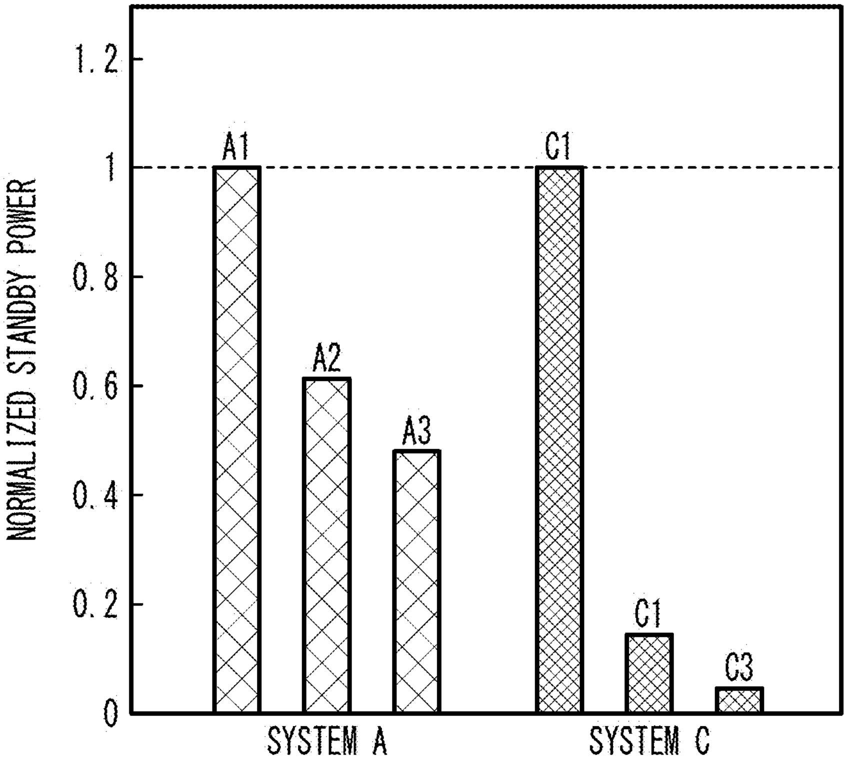
FIG. 61B presents standardized standby power of systems A to C.

FIG. 61B presents the normalized standby power of the systems A and C. A1 of the system A represents the state where both the cores 83 and the LLC 84 are in the standby state where VVDD=1.2 V. A2 represents the state where the FFs 83*a* of each core 83 are in the standby state where VVDD=1.2 V, the FLC 83*b* is in the sleep state where VVDD=0.8 V, all the circuits excluding the FFs 83*a* and the FLC 83*b* in each core 83 are shut down, and the LLC 84 is in the standby state where VVDD=1.2 V. A3 represents the state where the FFs 83*a* of each core 83 are in the standby state where VVDD=1.2 V, the FLC 83*b* is in the sleep state where VVDD=0.8 V, all the circuits excluding the FFs 83*a* and the FLC 83*b* in each core 83 are shut down, and the LLC 84 is in the sleep state where VVDD=0.8 V. The normalized standby power of A2 is approximately 0.6 of that of A1, and the normalized standby power of A3 is approximately 0.5 of that of A1.

C1 of the system C represents the state where both the cores 83 and the LLC 84 are in the standby state where VVDD=1.2 V. C2 represents the state where the FFs 83*a* in each core 83 are in the low-voltage retention state where VVDD=0.2 V, the FLC 83*b* is in the low-voltage retention state where VVDD=0.2V, all the circuits excluding the FFs 83*a* and the FLC 83*b* in each core 83 are shut down, and the LLC 84 is in the standby state where VVDD=1.2 V. C3 represents the state where the FFs 83*a* in each core 83 are in the low-voltage retention state where VVDD=0.2 V, the FLC 83*b* is in the low-voltage retention state where VVDD=0.2 V, all the circuits excluding the FFs 83*a* and the FLC 83*b* in each core 83 are shut down, and the LLC 84 is in the low-voltage retention state where VVDD=0.2 V. The normalized standby power of C2 is equal to or less than 0.2 of that of A1, and the normalized standby power of C3 is approximately 0.05 of that of C1.

As seen from the above, in the system C, the standby power can be made to be very small by putting the FFs 83*a*, the FLCs 83*b*, and the LLC 84 into the low-voltage retention state.

In the fourth embodiment and the variation 1 thereof, in the second embodiment type, the gates of the FETs m9 and m9*a* (the fourth FET) of the inverter circuit 14 (the first inverter circuit) are coupled to the output node of the inverter circuit 14 or the input node of the inverter circuit 16, and the gates of the FETs m10 and m10*a* of the inverter circuit 16 (the second inverter circuit) are coupled to the input node of the inverter circuit 14 or the output node of the inverter circuit 16. In this case, the conductivity types of the channels of the FETs m9 and m10 are the same as those of the FETs m2, m2*a*, m2*b*, m4, m4*a*, and m4*b*, and the conductivity types of the channels of the FETs m9*a* and m10*a* are the same as those of the FETs m1, m1*a*, m1*b*, m3, m3*a*, and m3*b*.

In the third embodiment type, the gates of the feedback FETs m9 and m9*a* of the inverter circuit 14 are coupled to the output node of the inverter circuit 16 or the input node of the inverter circuit 14, and the gates of the FETs m10 and m10*a* of the inverter circuit 16 are coupled to the input node of the inverter circuit 16 or the output node of the inverter circuit 14. In this case, the conductivity types of the channels of the FETs m9 and m10 are the same as those of the FETs m1, m1*a*, m1*b*, m3, m3*a*, and m3*b*, and the conductivity types of the channels of the FETs m9*a* and m 10*a* are the same as those of the FETs m2, m2*a*, m2*b*, m4, m4*a*, and m4*b*.

In both the second embodiment and the third embodiment, the power switch 30 (a power supply circuit) switches the power supply voltage VVDD–VVGND between a first voltage at which the bistable circuit 12 can write and read data and a second voltage that is lower than the first voltage and at which the bistable circuit 12 can retain data, and supplies the power supply voltage VVDD–VVGND. When the power switch 30 supplies either the first voltage or the second voltage to the bistable circuit 12, a fixed bias is supplied to the control nodes of the VFN and the VFP. This eliminates the need for the driver 26, and the electronic circuit can be miniaturized. In addition, the power consumption can be reduced.

As presented in FIG. 53A and Table 1, in the PDFB and the PUPDFB header PS, when the power supply voltage VVDD–VGND is switched between the first voltage and the second voltage, the constant ground voltage VGND (a third voltage) is supplied to the ground line 15*b* (the second power supply line), and the VVDDH (a fourth voltage) or the VVDDL (a fifth voltage) is supplied to the power supply line 15*a* (the first power supply line) by switching between the VVDDH and the VVDDL. As presented in FIG. 53B and Table 1, in the PUFB and the PUPDFB footer PS, when the power supply voltage VDD–VVGND is switched between the first voltage and the second voltage, the constant power supply voltage VDD (a third voltage) is supplied to the power supply line 15*a* (the second power supply line), and the VVGNDL (a fourth voltage) or the VVGNDH (a fifth voltage) is supplied to the ground line 15*b* (the first power supply line) by switching between the VVGNDL and the VVGNDH. This allows for switching between the BI mode and the ST mode even when the fixed biases VFN and VFP are supplied to the control line.

Although preferred embodiments of the present invention have been described so far, the present invention is not limited to those particular embodiments, and various changes and modifications may be made to them within the scope of the invention claimed herein.

What is claimed is:

1. An electronic circuit comprising:

a cell array including memory cells, each of the memory cells including a bistable circuit that stores data in a volatile manner, and a non-volatile element that stores the data stored in the bistable circuit in a non-volatile manner and restores the data stored in a non-volatile manner to the bistable circuit; and a control circuit configured to power off one or more first memory cells, which store, in a volatile manner, data that are not required to be stored in a non-volatile manner, among the memory cells regardless of whether the one or more first memory cells are rewritten in a volatile manner when powering off the cell array, and after powering off the one or more first memory cells, perform a store operation that stores, in the non-volatile element, the data stored in the bistable circuit in a volatile manner in remaining one or more second memory cells of the memory cells, and then power off the one or more second memory cells.

2. The electronic circuit according to claim 1, wherein the cell array is divided into blocks each including at least two memory cells, wherein the control circuit is configured to, when powering off the cell array, extract one or more first blocks, which store, in a volatile manner, data that are not required to be stored in a non-volatile manner, from among the blocks regardless of whether memory cells in a block are rewritten in a volatile manner, power off the one or more first blocks, perform the store operation in the memory cells in remaining one or more second blocks of the blocks after powering off the one or more first blocks, and power off the second block for which the store operation is completed.

3. The electronic circuit according to claim 2, wherein the control circuit is configured to perform the store operation in the memory cells in the one or more second blocks after powering off all the one or more first blocks.

4. The electronic circuit according to claim 2, further comprising:

a memory circuit that is provided outside the cell array and stores information indicating the one or more first blocks, the information being received from an external circuit, wherein the control circuit is configured to extract the one or more first blocks based on the information.

5. The electronic circuit according to claim 2, wherein the control circuit is configured to extract, from among the blocks, a block that stores, in a volatile manner, data that are not required to be stored in a non-volatile manner regardless of whether the memory cells in the block are rewritten in a volatile manner and a block in which no memory cell is rewritten in a volatile manner, as the one or more first blocks, power off the one or more first blocks, perform the store operation in the memory cells in remaining one or more second blocks of the blocks after powering off the one or more first blocks, and power off the second block for which the store operation is completed.

* * * * *